(12) United States Patent
Noguchi

(10) Patent No.: US 8,185,802 B2
(45) Date of Patent: May 22, 2012

(54) DATA MEMORY SYSTEM

(75) Inventor: Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 771 days.

(21) Appl. No.: 12/369,889

(22) Filed: Feb. 12, 2009

(65) Prior Publication Data

US 2009/0210772 A1    Aug. 20, 2009

(30) Foreign Application Priority Data

Feb. 15, 2008  (JP) .................................. 2008-035269
Dec. 5, 2008   (JP) .................................. 2008-311551

(51) Int. Cl.
 G11C 29/00    (2006.01)
(52) U.S. Cl. .................... 714/764; 365/185.09
(58) Field of Classification Search .................. 714/764; 365/185.09
 See application file for complete search history.

(56) References Cited

U.S. PATENT DOCUMENTS

| | | | |
|---|---|---|---|
| 6,901,011 B2* | 5/2005 | Micheloni et al. | 365/185.22 |
| 6,958,938 B2 | 10/2005 | Noguchi et al. | |
| 7,099,190 B2 | 8/2006 | Noguchi et al. | |
| 7,307,881 B2* | 12/2007 | Chen et al. | 365/185.09 |
| 7,334,179 B2* | 2/2008 | Zhang et al. | 714/764 |
| 7,430,693 B2 | 9/2008 | Noguchi et al. | |
| 7,453,728 B2* | 11/2008 | Noguchi et al. | 365/185.09 |
| 7,515,463 B2* | 4/2009 | Hemink | 365/185.02 |
| 8,103,940 B2* | 1/2012 | Roohparvar et al. | 714/768 |
| 2002/0174397 A1* | 11/2002 | Furukawa | 714/764 |
| 2006/0268608 A1* | 11/2006 | Noguchi et al. | 365/185.09 |
| 2008/0158958 A1* | 7/2008 | Sokolov et al. | 365/185.08 |
| 2009/0225598 A1* | 9/2009 | Han | 365/185.09 |

FOREIGN PATENT DOCUMENTS

| | | |
|---|---|---|
| JP | 11-339495 | 12/1999 |
| JP | 2002-150783 | 5/2002 |
| JP | 2005-243183 | 9/2005 |
| JP | 2007-221084 | 8/2007 |

* cited by examiner

Primary Examiner — Yolanda L Wilson
(74) Attorney, Agent, or Firm — Oblon, Spivak, McClelland, Maier & Neustadt, L.L.P.

(57) ABSTRACT

A data memory system includes a nonvolatile memory cell array which includes a plurality of memory cells, a page adjacently formed by the plurality of memory cells being collectively erased in the nonvolatile memory cell, at least binary pieces of digital data of "1" and "0" being stored as charges of a charge accumulation layer in the memory cell, a programming bit and an erasing bit being formed by a difference between the charges of the charge accumulation layer. And the system includes an error correcting code generation circuit, an error correcting code decoding circuit, and a code conversion circuit.

19 Claims, 63 Drawing Sheets

Flowchart explaining adjacent memory cell disturb reduction second-code conversion of first embodiment

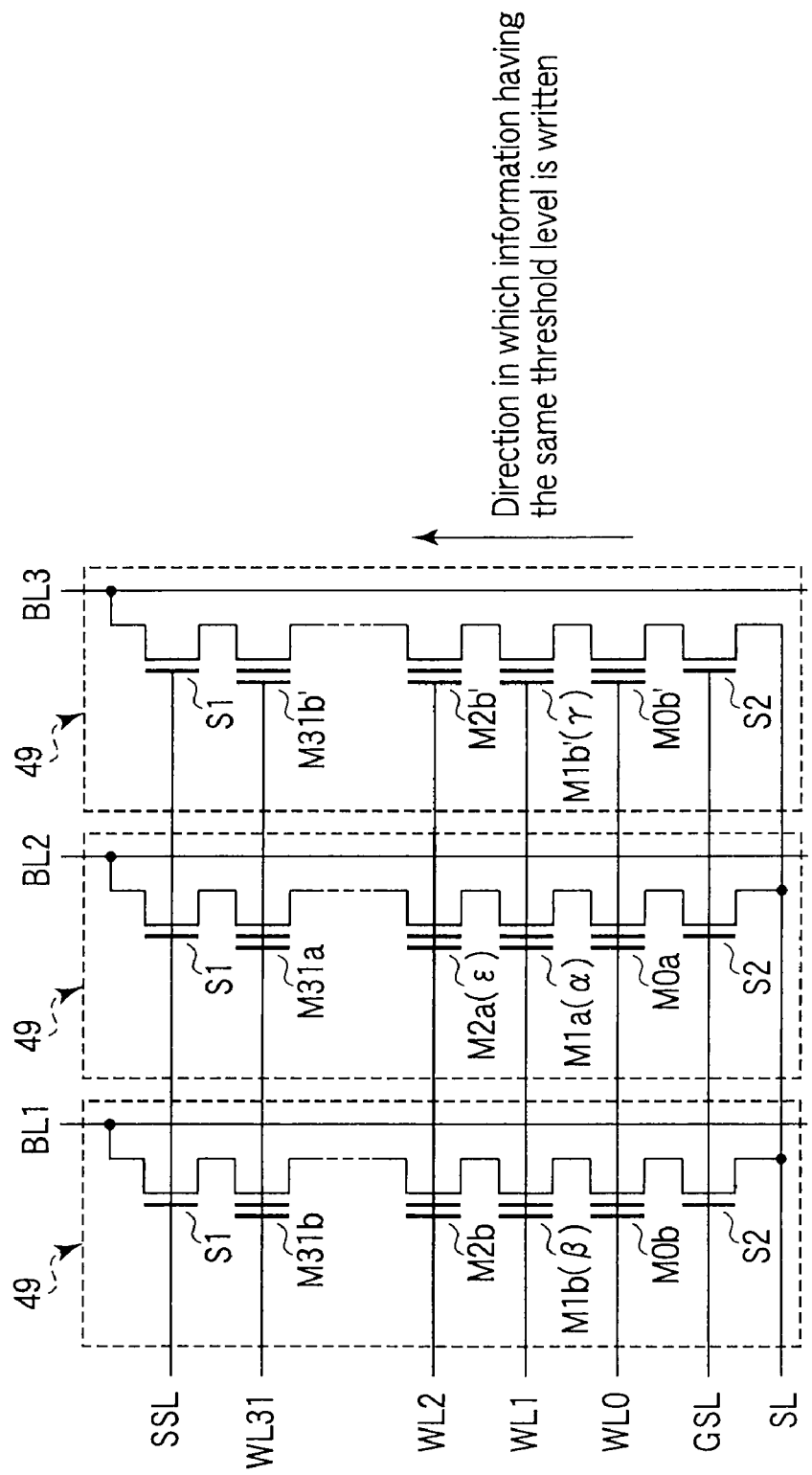
F I G. 1
View explaining NAND cell array structure of comparative example and problem of capacitive interference between adjacent cells View showing memory cell structure of first embodiment View showing memory cell structure of first embodiment

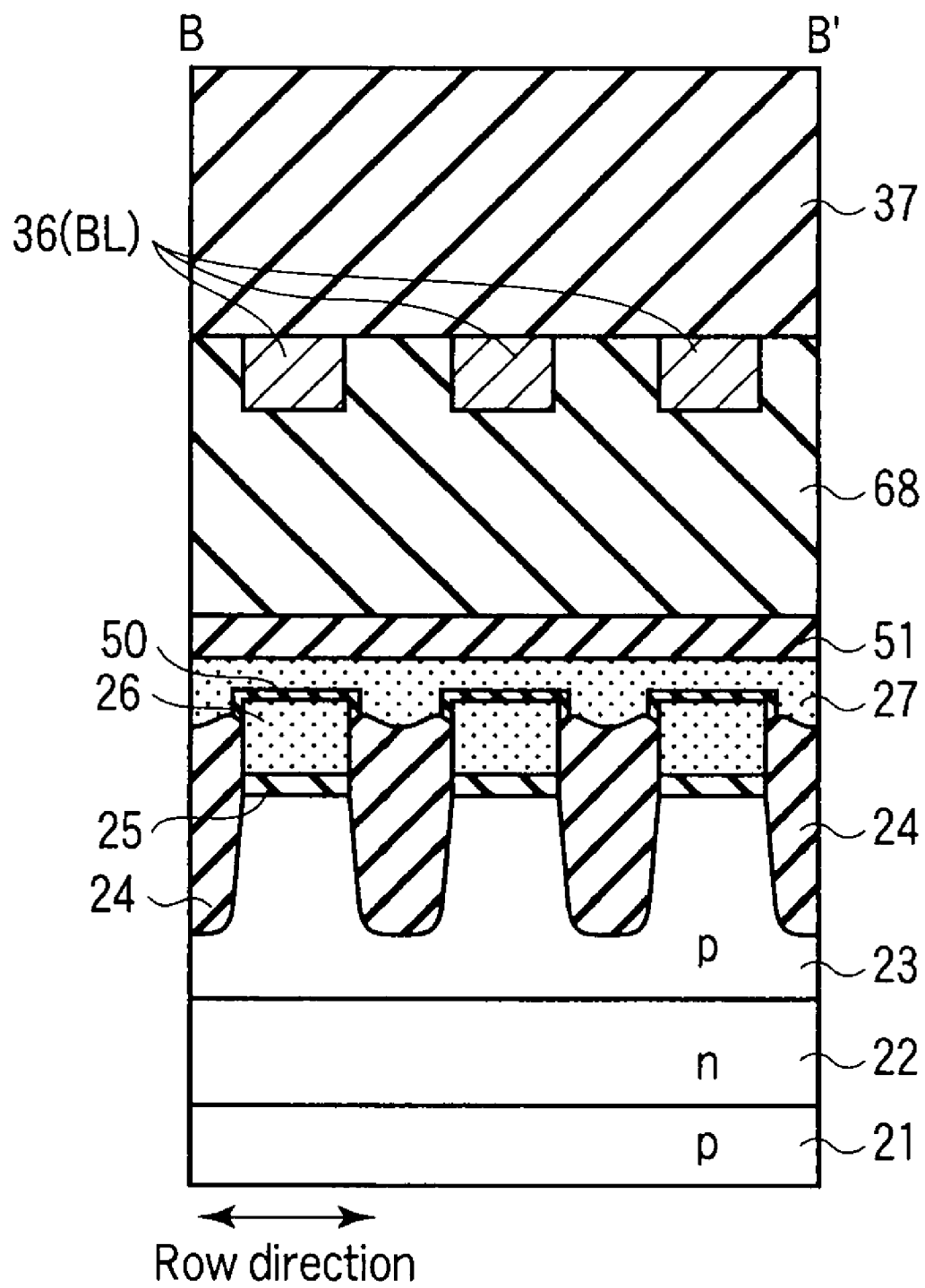
View explaining section of first embodiment
F I G. 6A

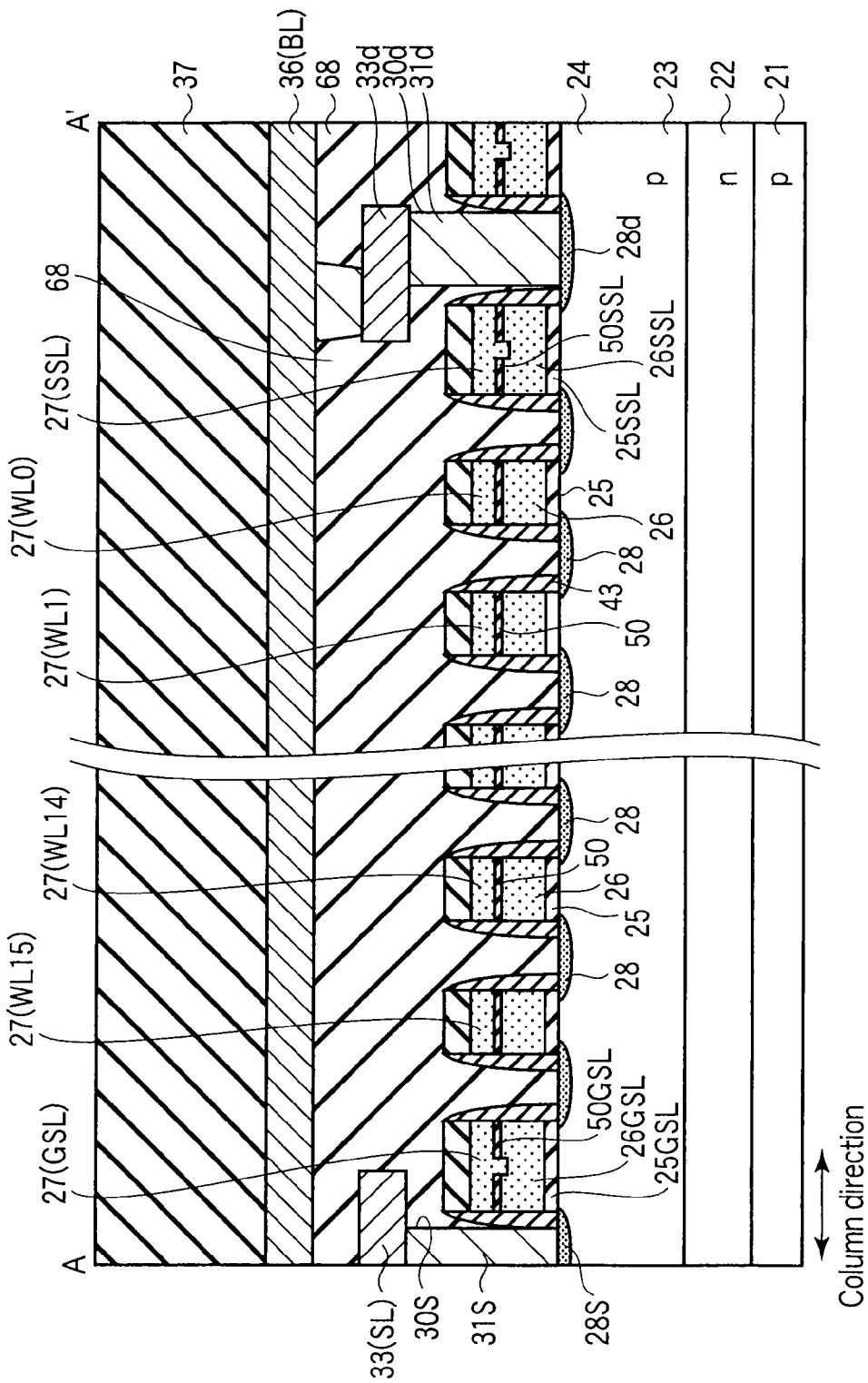
F I G. 6B
View explaining section of first embodiment

Flowchart explaining adjacent memory cell disturb reduction second-code conversion of first embodiment Flowchart explaining adjacent memory cell disturb reduction second-code conversion of first embodiment

|   | Information bit (k bits) | Flag 1 | Flag 2 | |
|---|---|---|---|---|
| (a1) Example of information bit fed into adjacent memory cell disturb reduction second-code conversion circuit 104 (conventional cell capacitive coupling worst pattern) | 01010101010....0101 | ------ | ------ | The number of "010" patterns: (k/2)−1<br>The number of "101" patterns: (k/2)−1 |
| (a2) State of adjacent memory disturb reduction second-code conversion circuit 104 after step SE4 (portion where bit is changed in exclusive OR is indicated by underline) | 00000000000....0000 | Set | Reset | The number of "010" patterns: zero<br>The number of "101" patterns: zero |
| (a3) State of adjacent memory disturb reduction second-code conversion circuit 104 before step SE9 | 00000000000....0000 | Set | Reset | The number of "010" patterns: zero |
| (a4) Example of output bit string of adjacent memory disturb reduction second-code conversion circuit 104 | Information bit (k bits)　Information corresponding to flag 1<br>00000000000....0000　11　00<br>　　　　　　　　　　　　Information corresponding to flag 2 | | | The number of "010" patterns: zero |

View explaining example of adjacent memory cell disturb reduction second-code conversion

View explaining example of adjacent memory cell disturb reduction second-code conversion (b1) Example of information bit fed into adjacent memory disturb reduction second-code conversion circuit 104

Information bit (k bits): 00000000000....0000

Flag 1 | Flag 2

The number of "010" patterns: zero
The number of "101" patterns: zero (b2) State of adjacent memory disturb reduction second-code conversion circuit 104 after step SE3 (no in step SE3)

Information bit (k bits): 0000000000....0000

Flag 1: Reset

The number of "010" patterns: zero
The number of "101" patterns: zero (b3) State of adjacent memory disturb reduction second-code conversion circuit 104 before step SE9

Information bit (k bits): 0000000000....0000

Flag 1: Reset | Flag 2: Reset

The number of "010" patterns: zero (b4) Example of output bit string of adjacent memory disturb reduction second-code conversion circuit 104

Information bit (k bits): 0000000000....0000 | 00 | 00

Information corresponding to flag 1
Information corresponding to flag 2

The number of "010" patterns: zero (c1) Example of information bit fed into adjacent memory disturb reduction second-code conversion circuit 104 (conventional cell capacitive coupling worst pattern)

Information bit (k bits)

| 10101010101.....1010 |

Flag 1 — — —
Flag 2 — — —

The number of "010" patterns: (k/2)−1
The number of "101" patterns: (k/2)−1

(c2) State of adjacent memory disturb reduction second-code conversion circuit 104 after step SE4

Information bit (k bits)

| 1111111111.....1111 |

Flag 1: Set
Flag 2: Reset

The number of "010" patterns: zero
The number of "101" patterns: zero (c3) State of adjacent memory disturb reduction second-code conversion circuit 104 before step SE9

Information bit (k bits)

| 1111111111.....1111 |

Flag 1: Set
Flag 2: Reset

The number of "010" patterns: zero (c4) Example of output bit string of adjacent memory disturb reduction second-code conversion circuit 104

Information bit (k bits)

| 1111111111.....1111 | 11 | 00 |

↑ Information corresponding to flag 1
↑ Information corresponding to flag 2

The number of "010" patterns: zero

FIG. 9C

View explaining example of adjacent memory cell disturb reduction second-code conversion (d1) Example of information bit fed into adjacent memory disturb reduction second-code conversion circuit 104 ("0100" repetitive pattern)

Information bit (k bits): 01000100010....0100

| | Flag 1 | Flag 2 |
|---|---|---|

The number of "010" patterns: (k/4)
The number of "101" patterns: zero (d2) State of adjacent memory disturb reduction second-code conversion circuit 104 after step SE3

Information bit (k bits): 01000100010....0100

| | Flag 1 | Flag 2 |
|---|---|---|
| | Reset | Reset |

The number of "010" patterns: (k/4)
The number of "101" patterns: zero (d3) State of adjacent memory disturb reduction second-code conversion circuit 104 before step SE9

Information bit (k bits): 1011101110 1....1011

| | Flag 1 | Flag 2 |
|---|---|---|
| | Reset | Set |

The number of "010" patterns: zero (d4) Example of output bit string of adjacent memory disturb reduction second-code conversion circuit 104

Information bit (k bits): 1011101110 1....1011  00  11

Information corresponding to flag 1 →
Information corresponding to flag 2 →

The number of "010" patterns: zero

View explaining example of adjacent memory cell disturb reduction second-code conversion

FIG. 9D

| | Flag 1 | Flag 2 | |
|---|---|---|---|
| (e1) Example of information bit fed into adjacent memory disturb reduction second-code conversion circuit 104 (cell capacitive coupling worst pattern of first embodiment) | Information bit (k bits)<br>10101010....1010  00000000....0000<br>(k/2)bit        (k/2)bit | --- | --- | The number of "010" patterns: (k/4)−1<br>The number of "101" patterns: (k/4)−1 |
| (e2) Bit diagram on the condition that sequence in step SE4 is performed in (e1) | Information bit (k bits)<br>11111111....1111  01010101....0101<br>(k/2)bit        (k/2)bit | Set | Reset | The number of "010" patterns: (k/4)−1<br>The number of "101" patterns: (k/4) |
| (e3) Bit diagram on the condition that sequence in step SE8 is performed in (e1) | Information bit (k bits)<br>01010101....0101  11111111....1111<br>(k/2)bit        (k/2)bit | Reset | Set | The number of "010" patterns: (k/4)<br>The number of "101" patterns: (k/4)−1 |
| (e4) Bit diagram on the condition that sequences in steps SE4 and SE8 are performed in (e1) | Information bit (k bits)<br>00000000....0000  10101010....1010<br>(k/2)bit        (k/2)bit | Set | Set | The number of "010" patterns: (k/4)<br>The number of "101" patterns: (k/4)−1 |

View explaining example of adjacent memory cell disturb reduction second-code conversion

F I G. 9E

Example of "010" symbol counter 108 and "101" symbol counter 109 of first embodiment Block diagram of data memory system of second embodiment Examples of symbol counters 112 and 113 of second embodiment Block diagram of data memory system of third embodiment

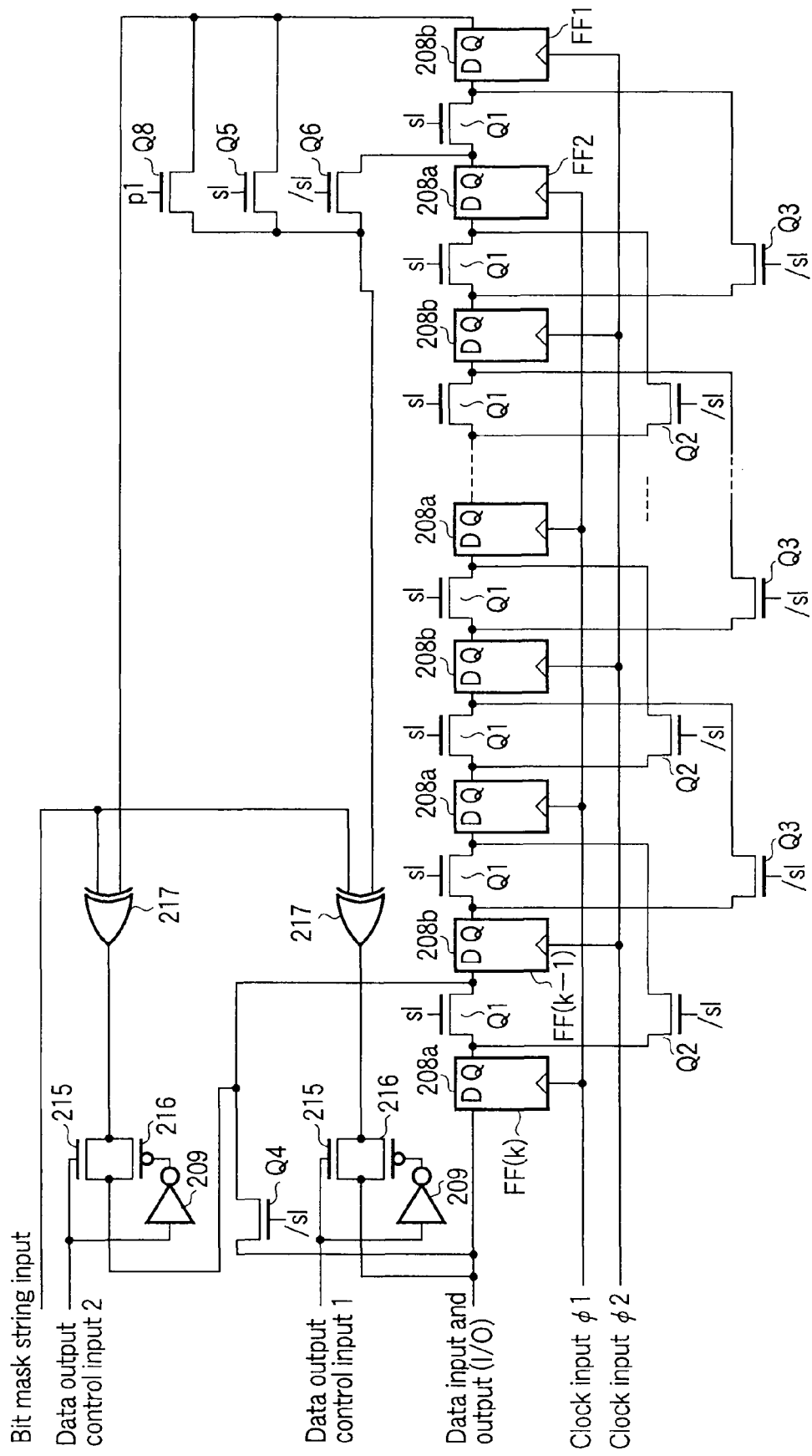
F I G. 16A
Configuration example of page buffer 114 which can perform bit rearrangement input and output in even number and odd number bits

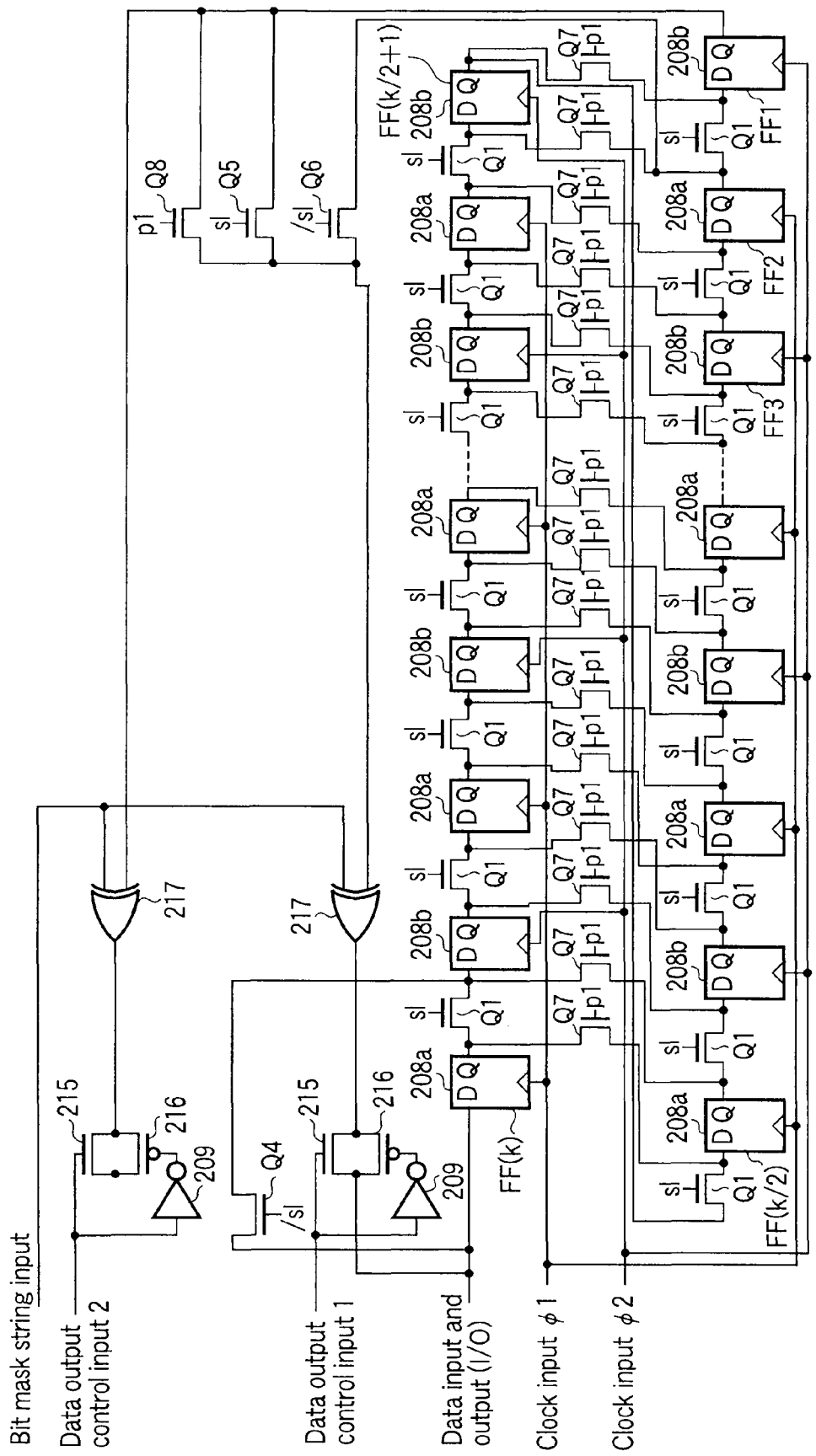
F I G. 16B

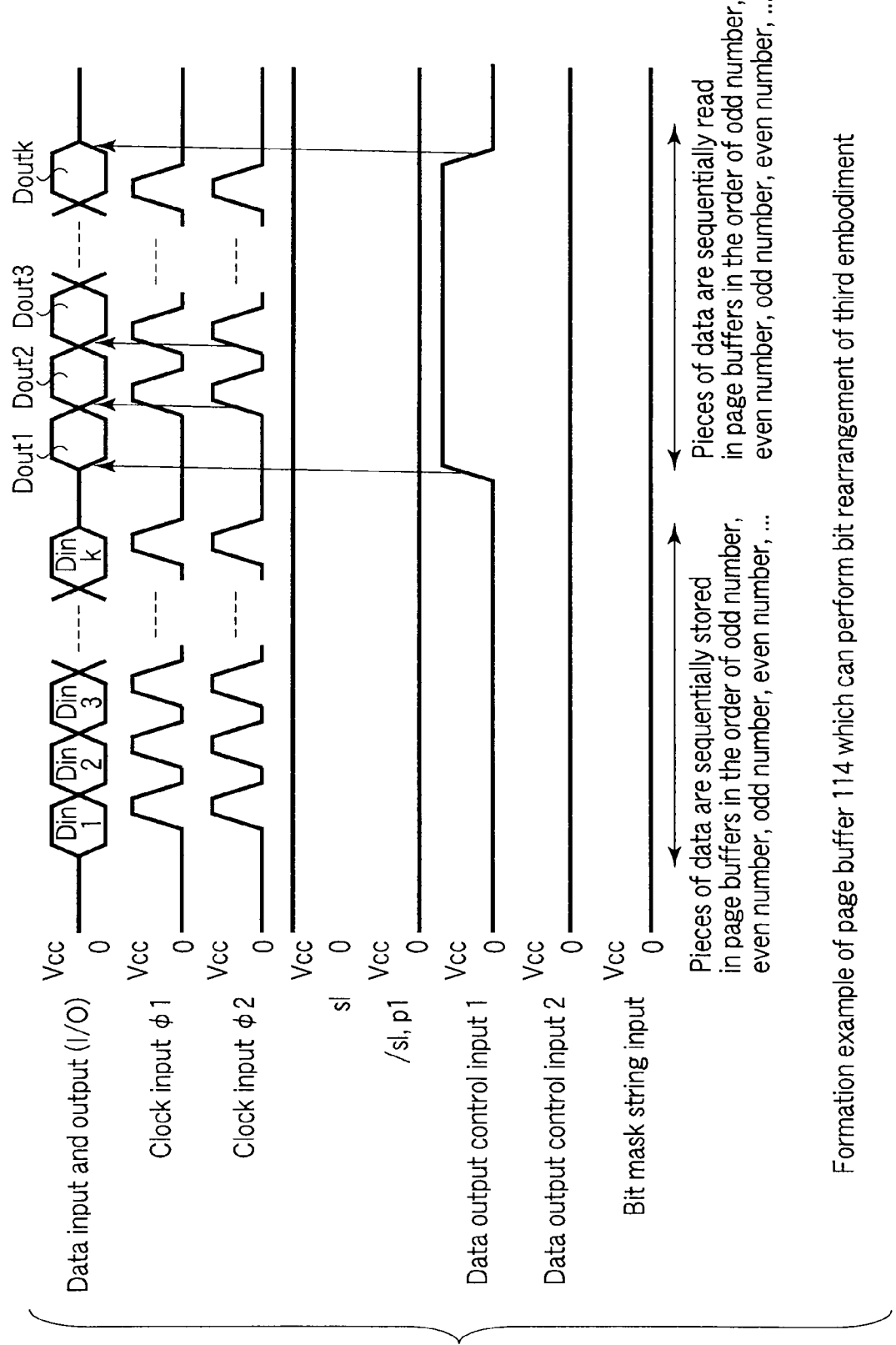
F I G. 17A

Formation example of page buffer 114 which can perform bit rearrangement of third embodiment

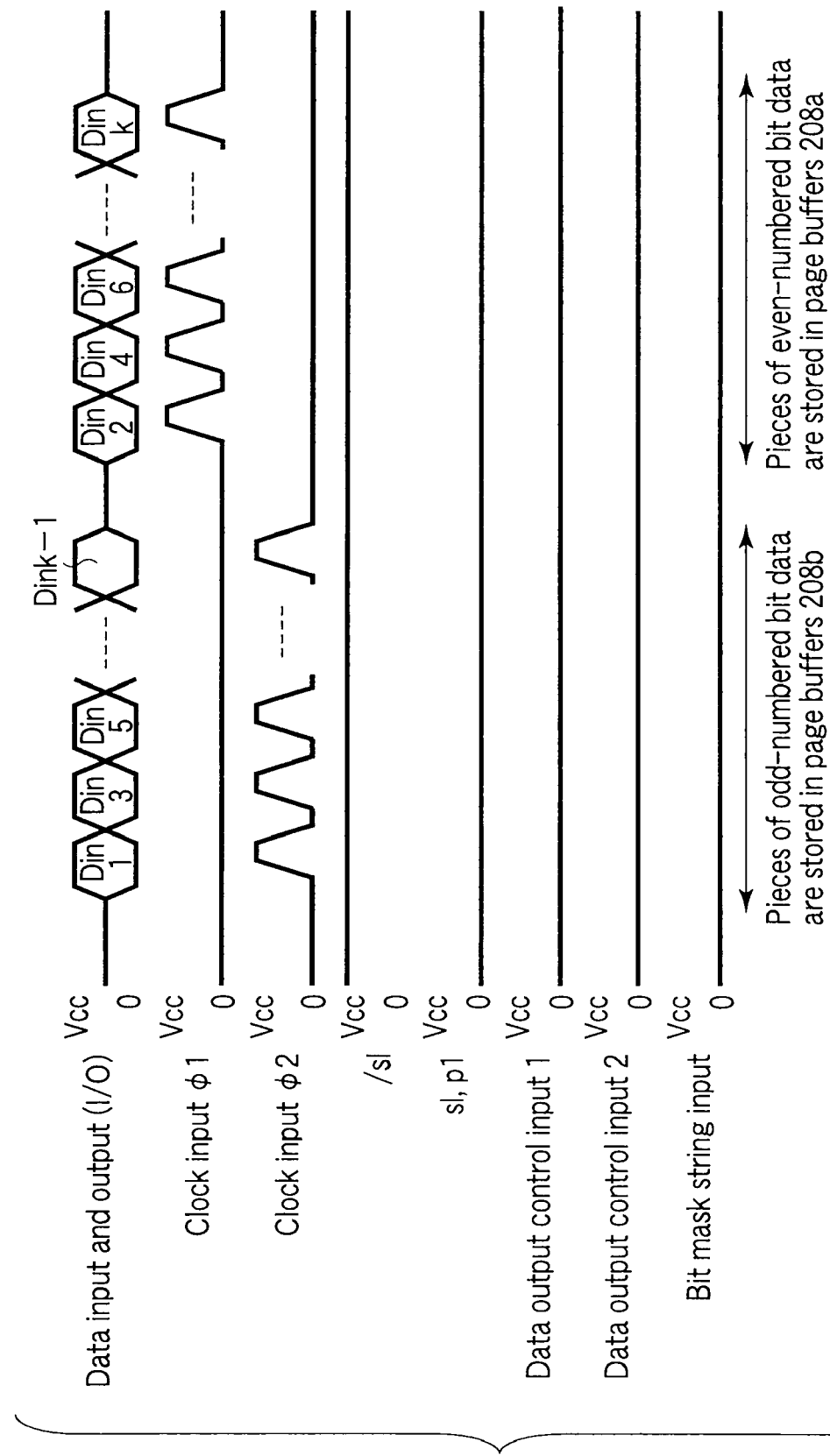
F I G. 17C
Formation example of page buffer 114 which can perform bit rearrangement of third embodiment

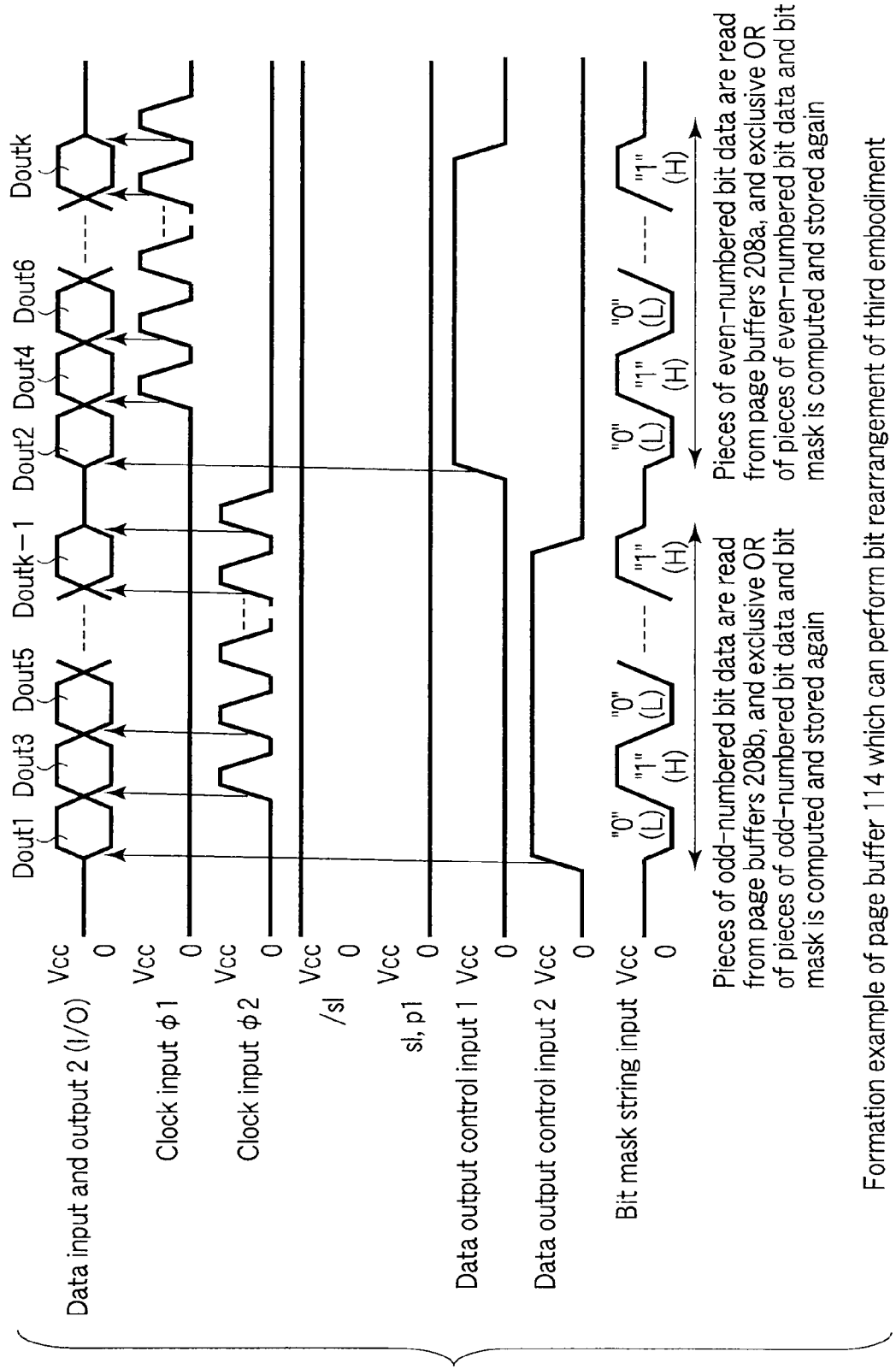
F I G. 17D

Formation example of page buffer 114 which can perform bit rearrangement of third embodiment

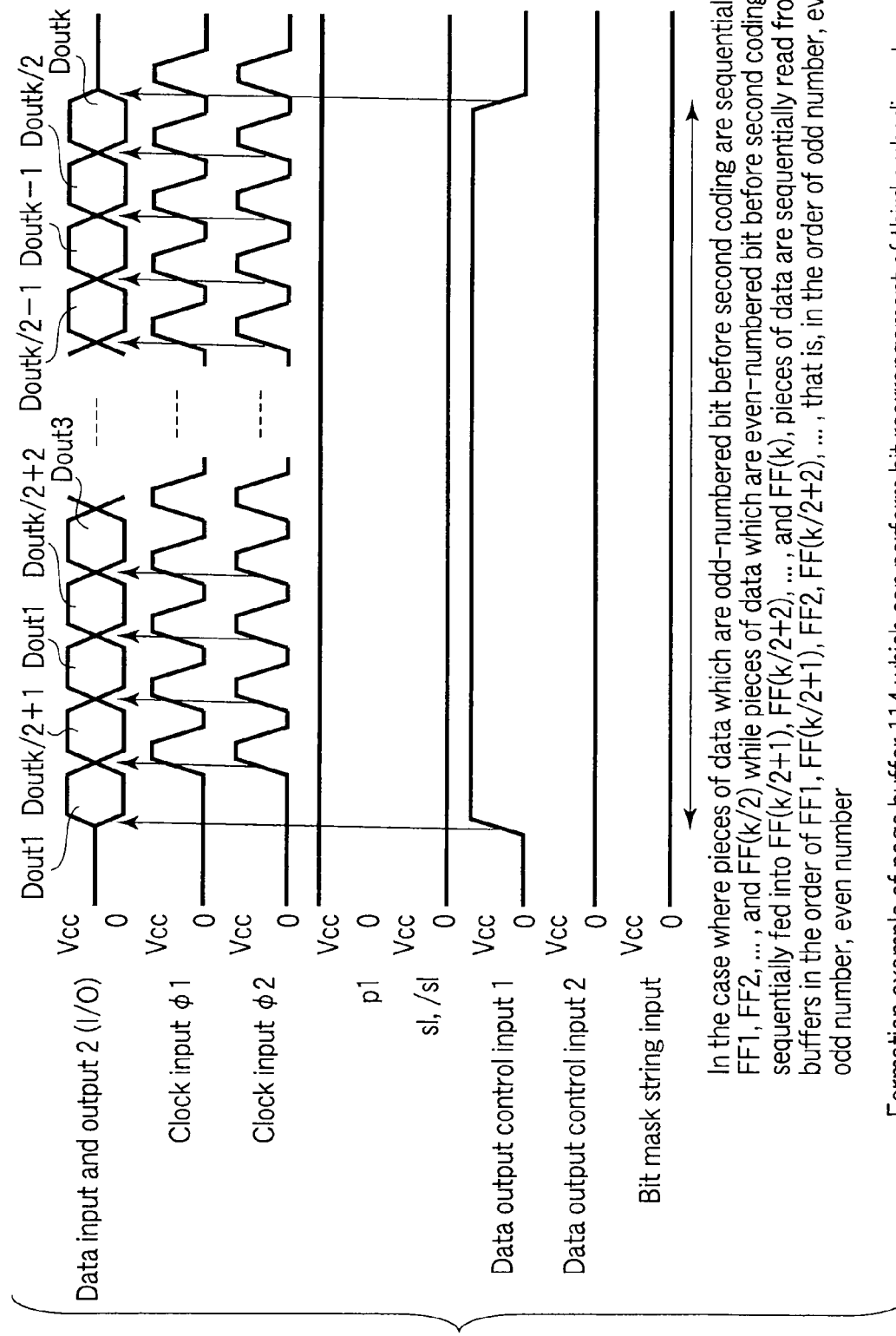

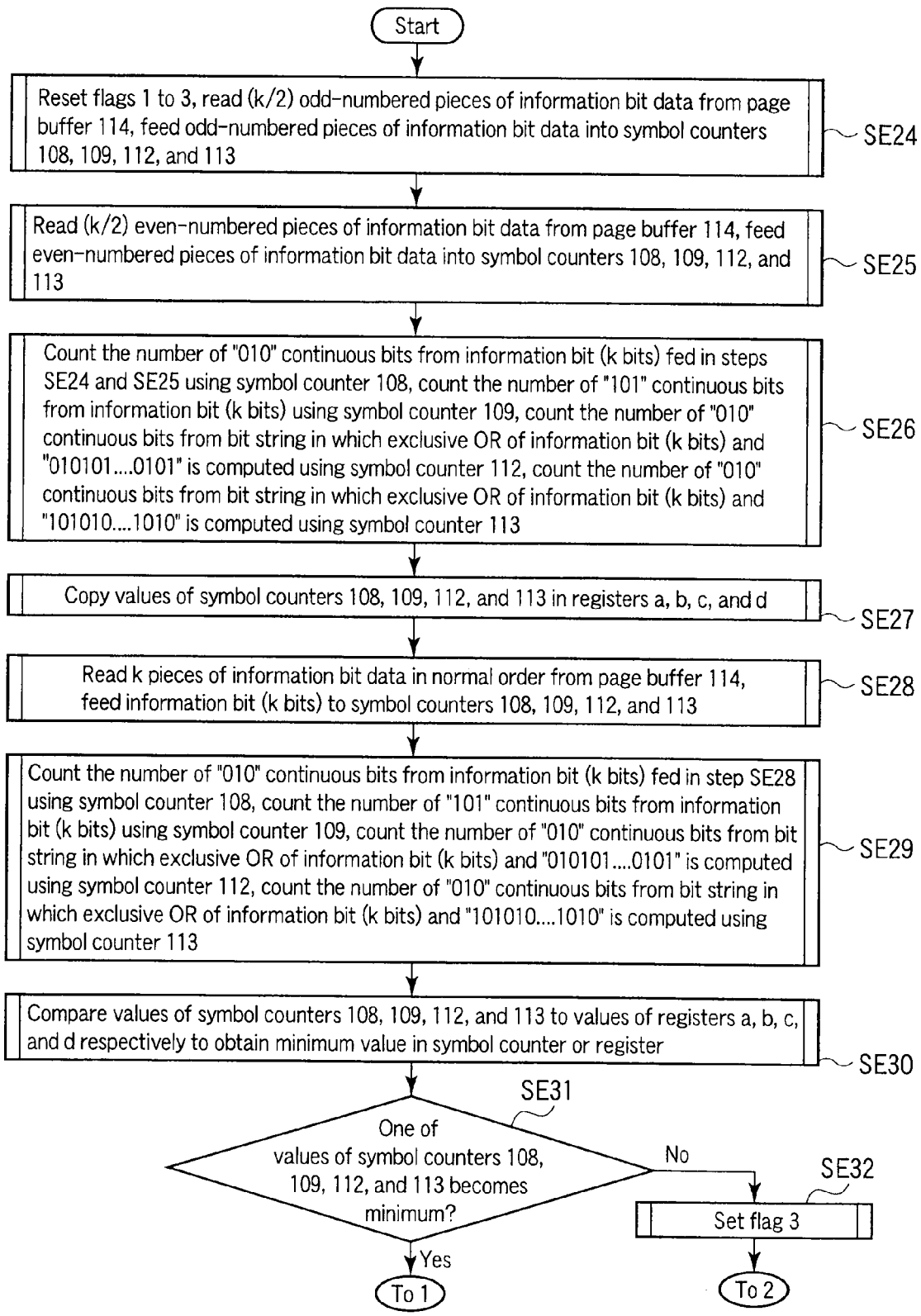
F I G. 18A

Flowchart explaining adjacent memory cell disturb reduction second-code conversion of third embodiment Flowchart explaining adjacent memory cell disturb reduction second-code conversion of third embodiment Flowchart explaining adjacent memory cell disturb reduction second-code reverse conversion of third embodiment View explaining example of adjacent memory cell disturb reduction second-code conversion of third embodiment

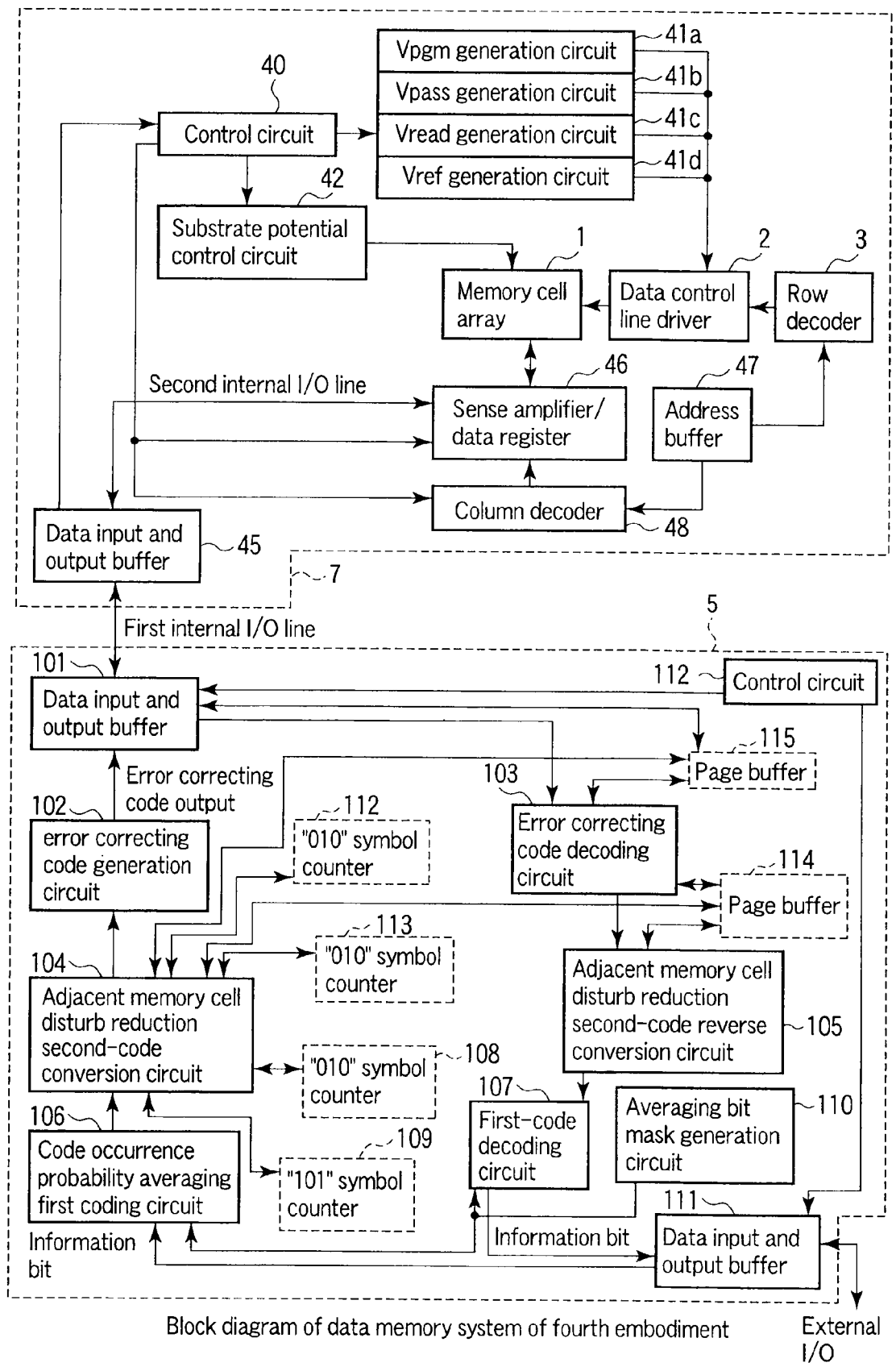
F I G. 21

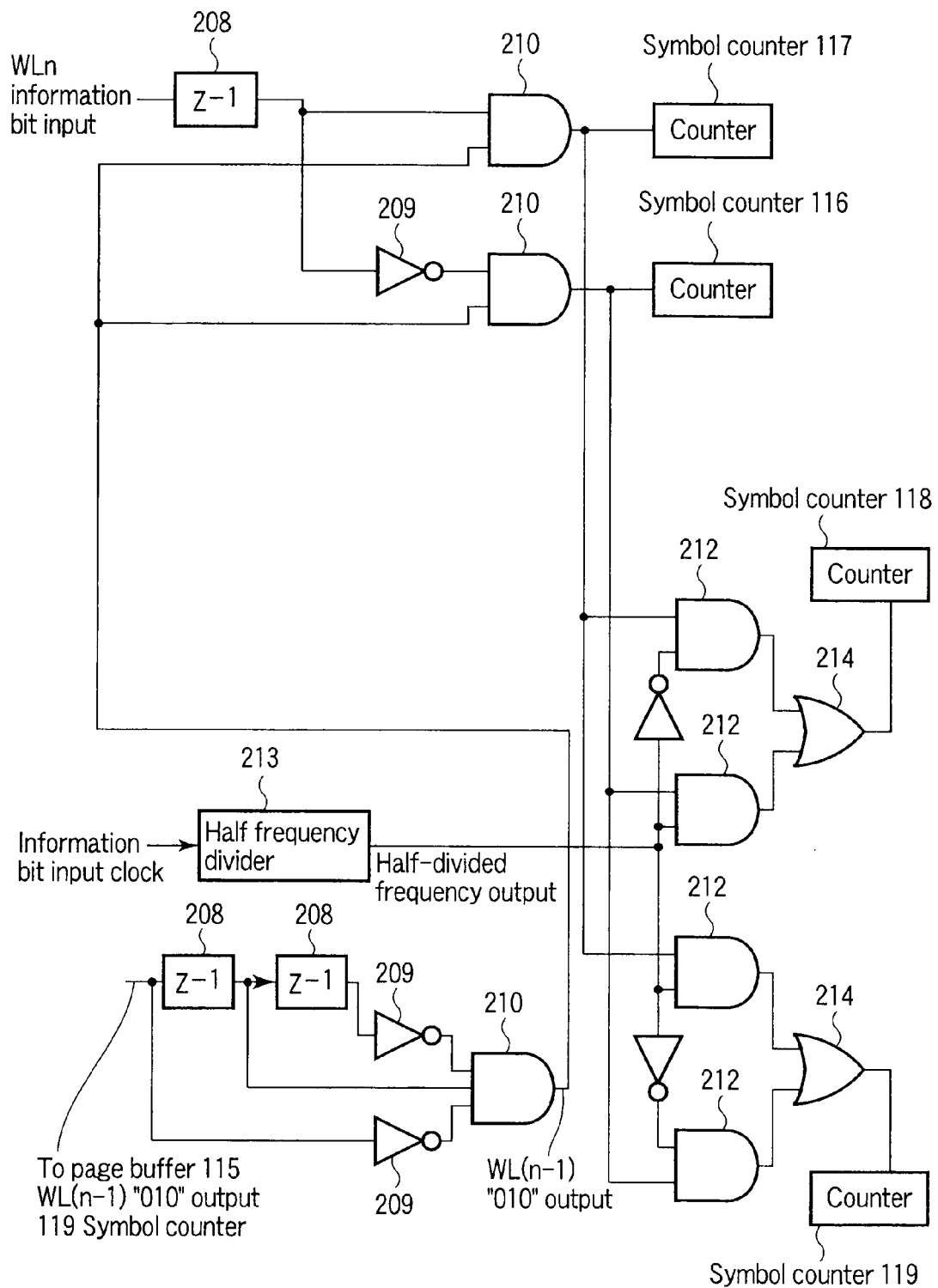
Configuration example of symbol counters 116, 117, 118, and 119 of fourth embodiment
F I G. 22

Flowchart explaining adjacent memory cell disturb reduction second-code conversion of fourth embodiment Flowchart explaining adjacent memory cell disturb reduction second-code conversion of fourth embodiment Flowchart explaining adjacent memory cell disturb reduction second-code conversion of fourth embodiment Flowchart explaining adjacent memory cell disturb reduction second-code conversion of fourth embodiment

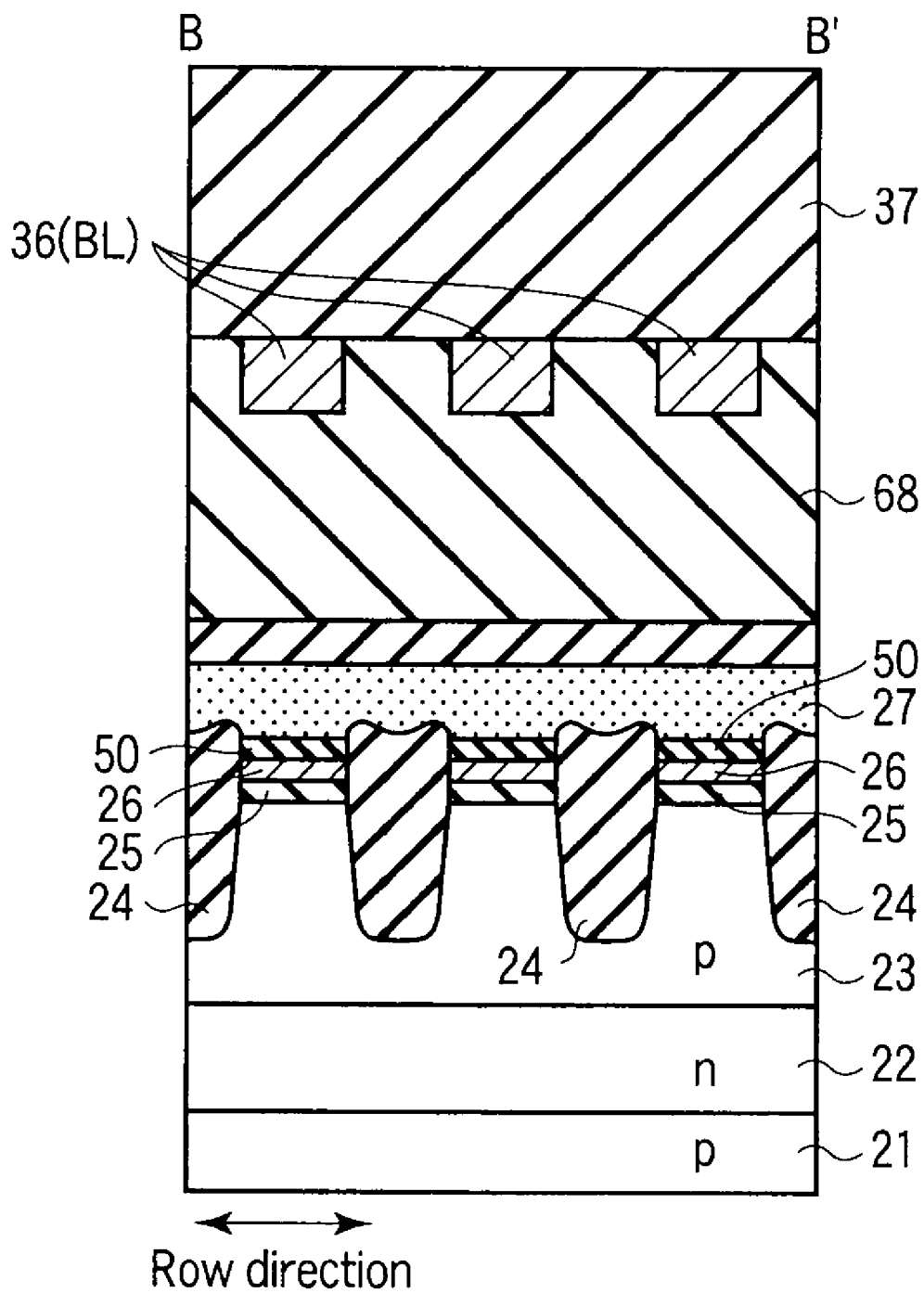
View explaining section of fifth embodiment
F I G. 24A

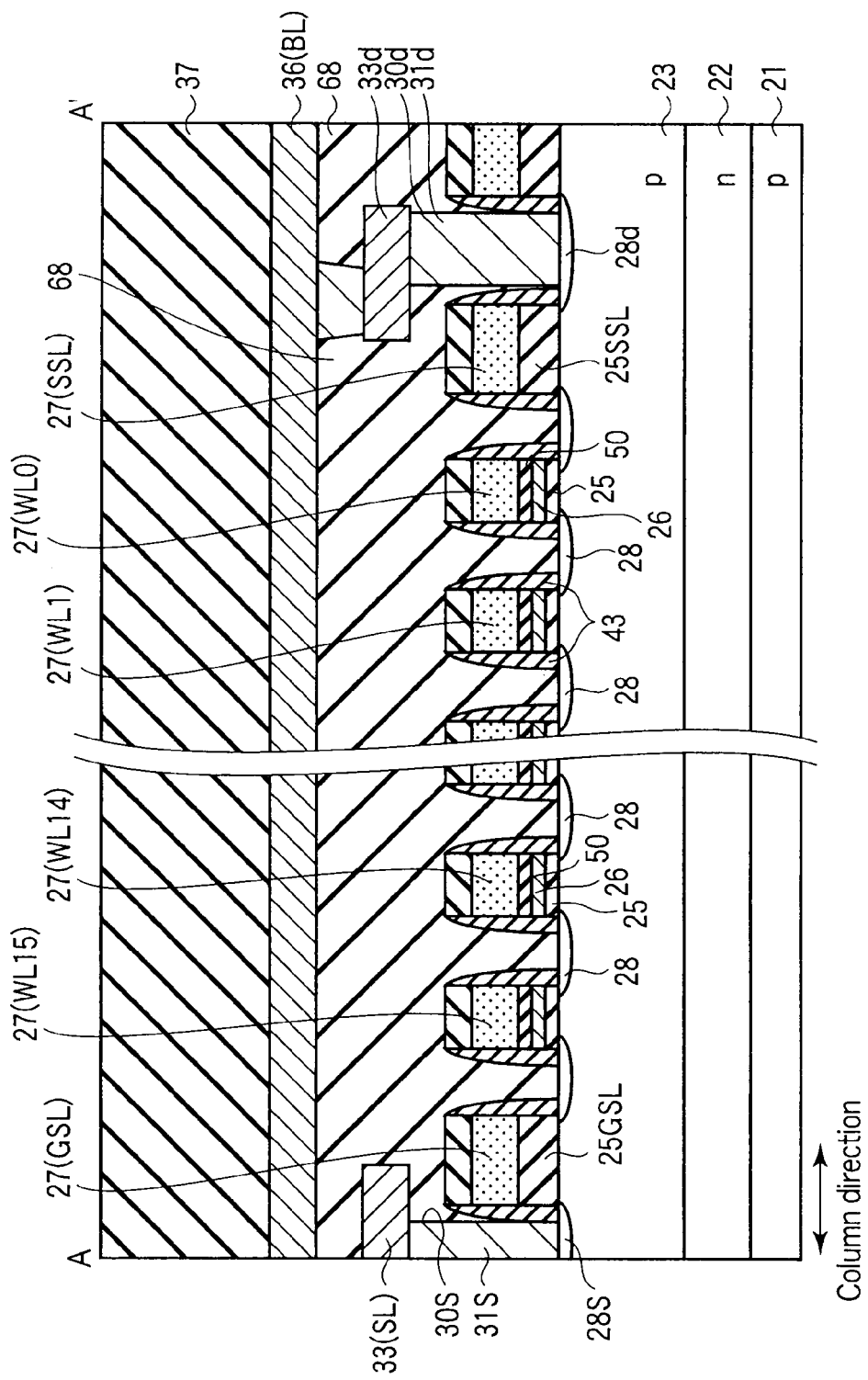
FIG. 24B  View explaining section of fifth embodiment

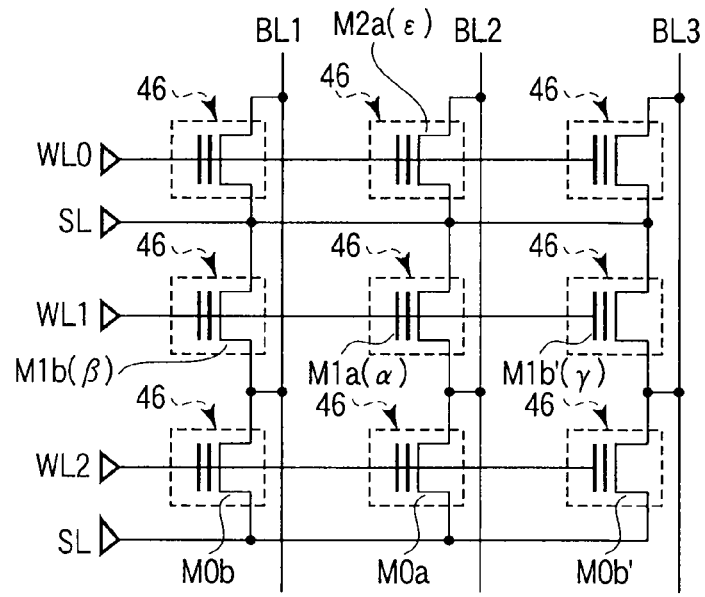
View showing memory cell structure of sixth embodiment
F I G. 25A
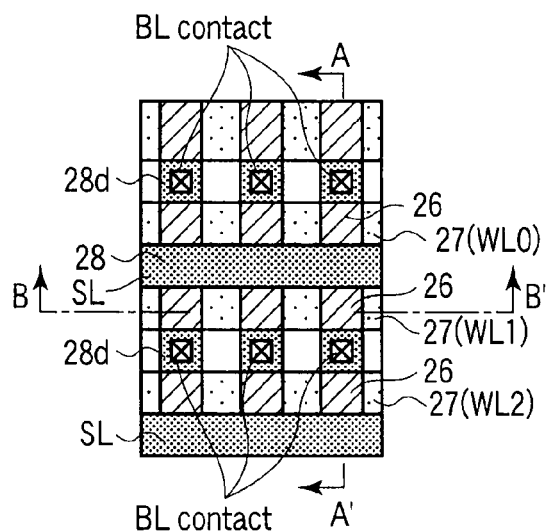
View showing memory cell structure of sixth embodiment
F I G. 25B

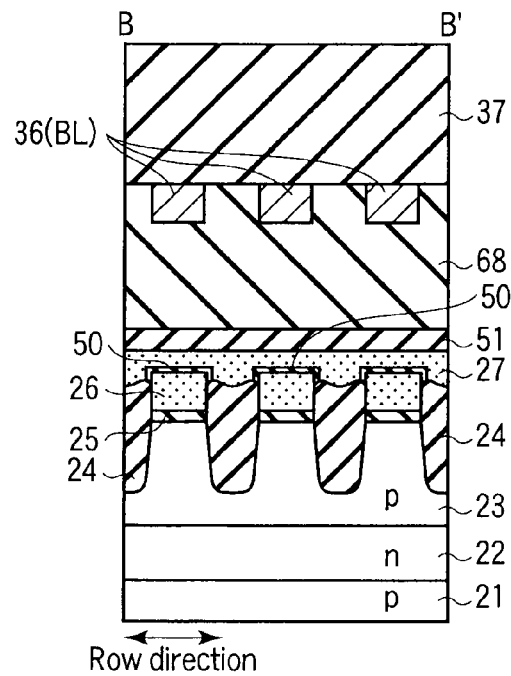
Row direction
View showing memory cell structure of sixth embodiment
F I G. 25C
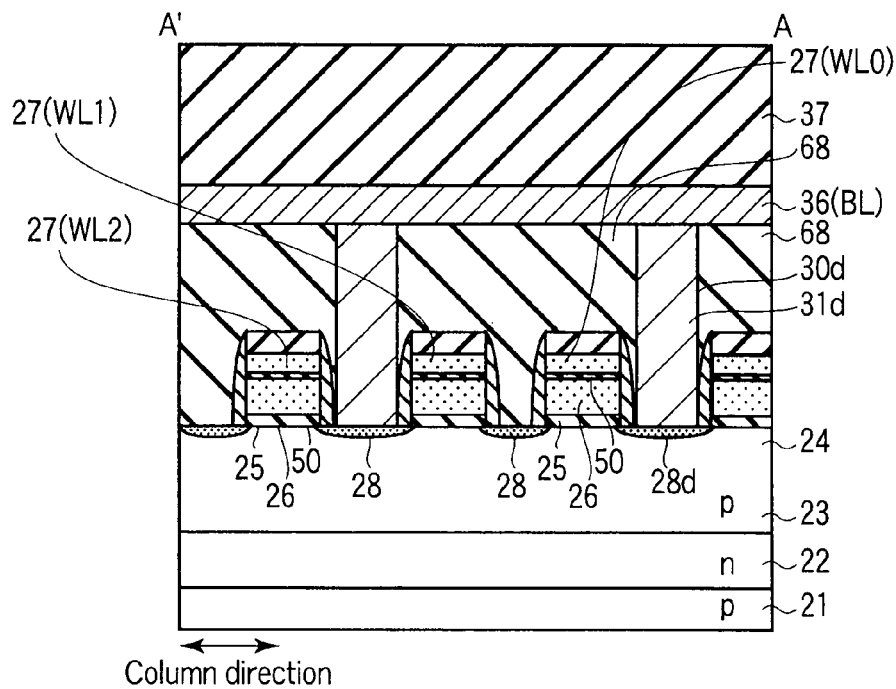
Column direction
View showing memory cell structure of sixth embodiment
F I G. 25D View explaining layout of NAND and NORM memory cells View explaining layout of NAND and NROM memory cells

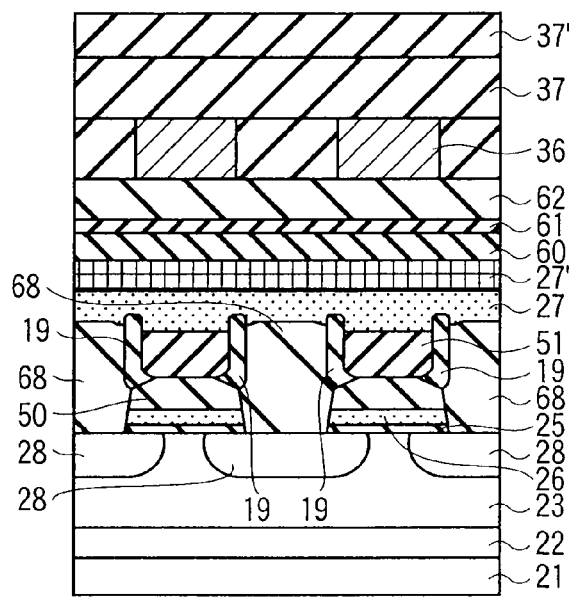
View showing sectional structure of NROM of seventh embodiment
F I G. 27
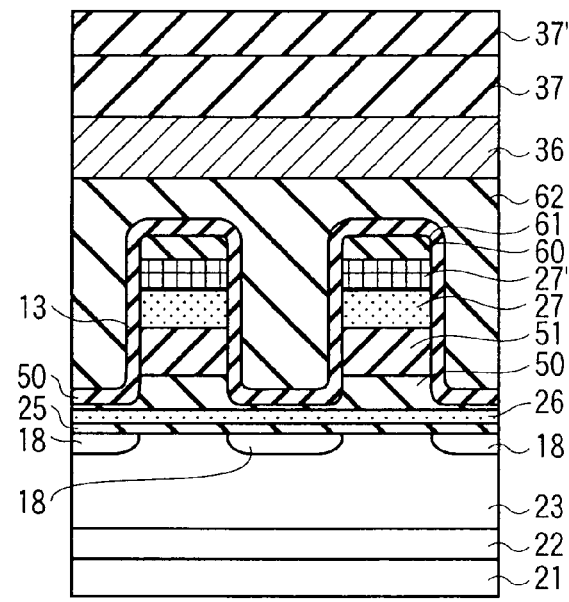
View showing sectional structure of NROM of seventh embodiment in direction orthogonal to FIG. 27
F I G. 28

Configuration of fifth circuit of eight embodiment

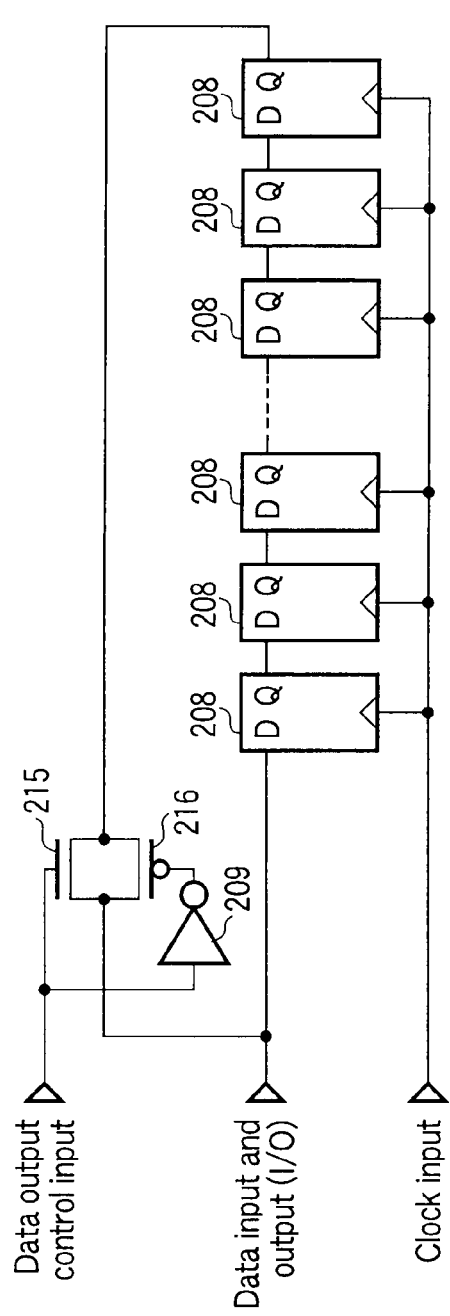
F I G. 32A
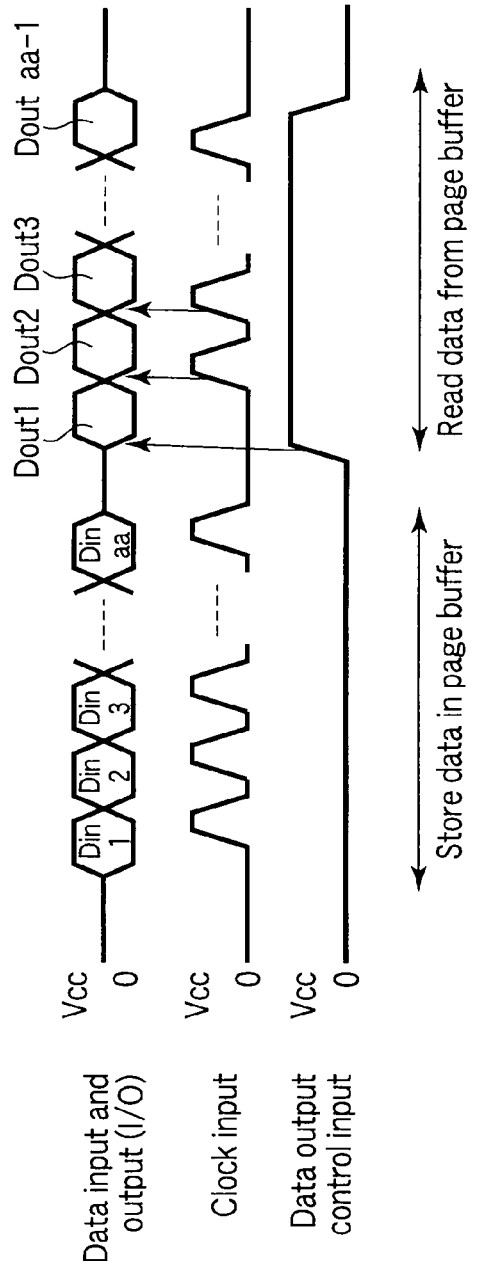
F I G. 32B

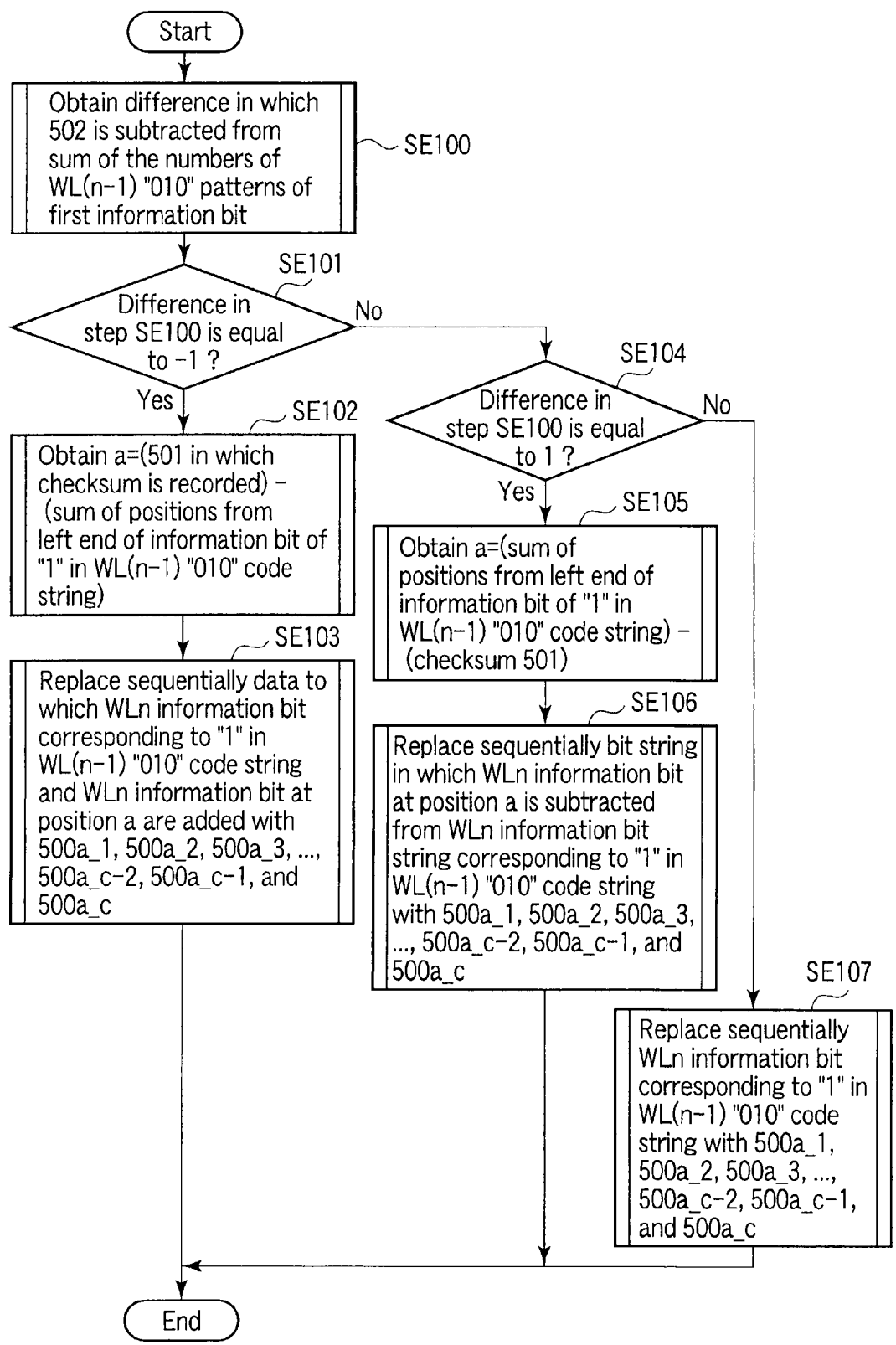
F I G. 35
Sequence for correcting position corresponding to one-word-error "010" of eighth embodiment

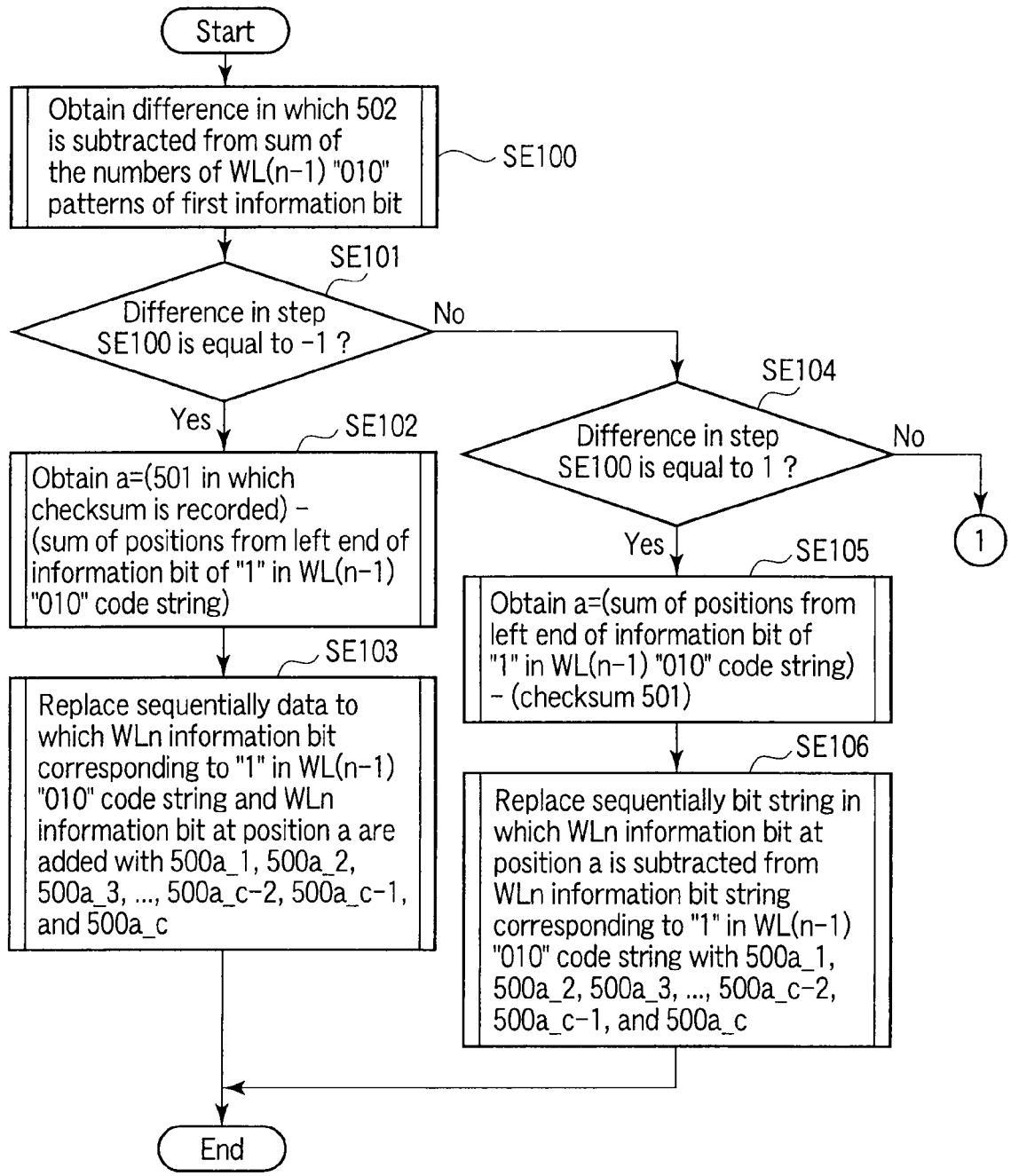
Sequence for correcting bit of position corresponding to WL(n-1) one-word error of modification of eighth embodiment
F I G. 37

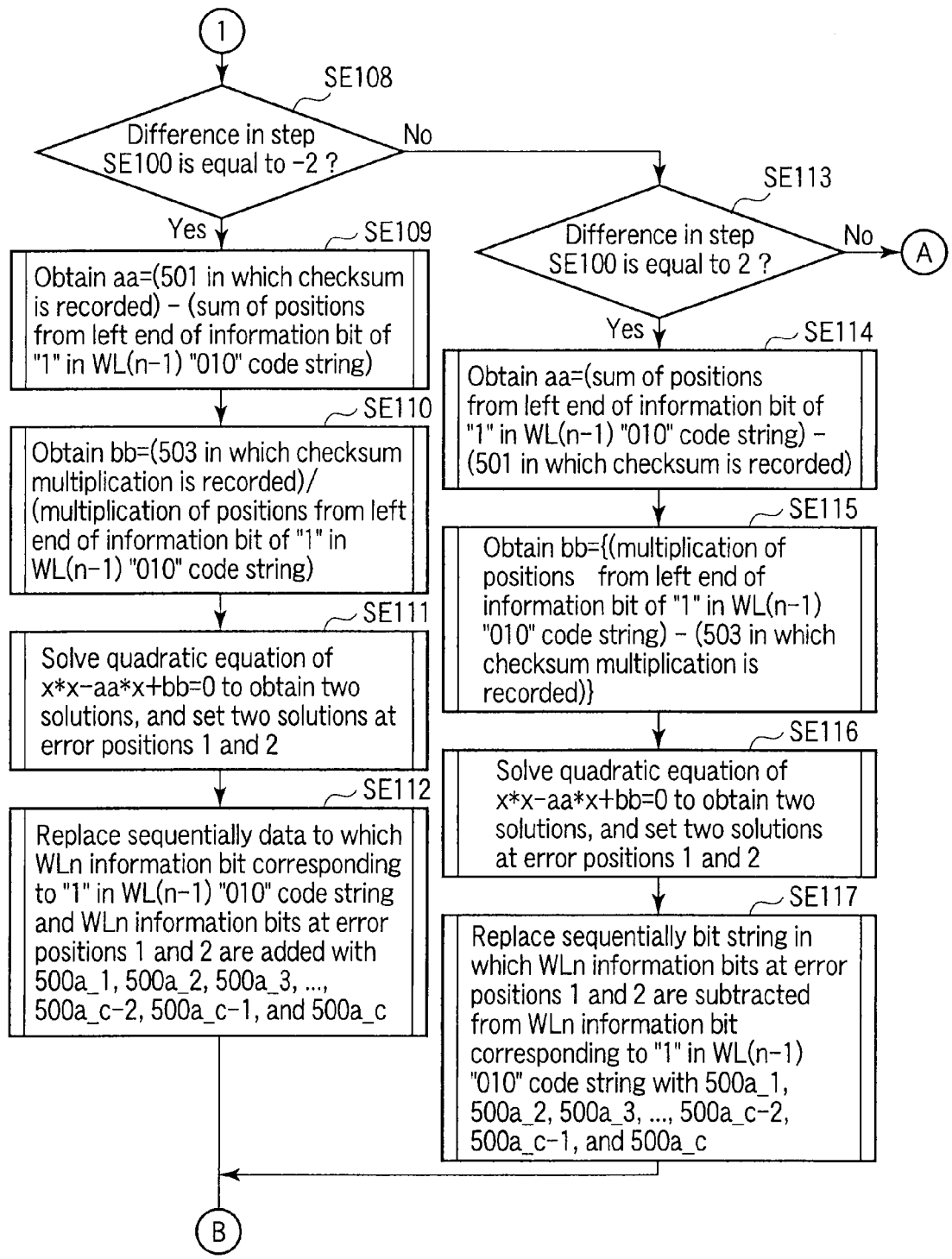
Sequence for correcting bit of position corresponding to WL(n-1) two-word error of modification of eighth embodiment
F I G. 38A View explaining example in which adjacent memory cell disturb reduction code conversion of eighth embodiment is recursively used View explaining example in which code conversion of modification of eighth embodiment is recursively used

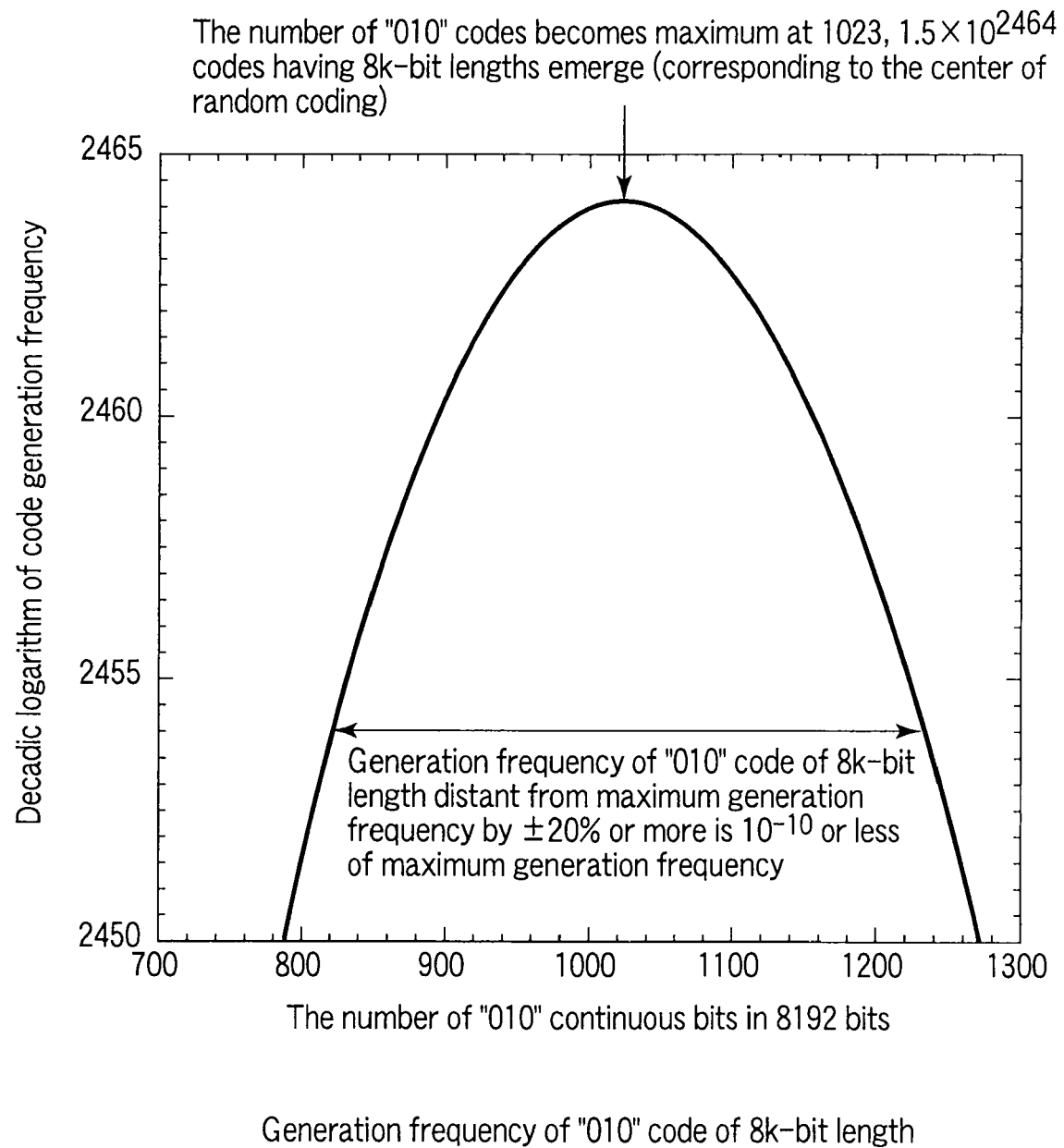
F I G. 40

DATA MEMORY SYSTEM

CROSS-REFERENCE TO RELATED APPLICATIONS

This application is based upon and claims the benefit of priority from prior Japanese Patent Applications No. 2008-035269, filed Feb. 15, 2008; and No. 2008-311551, filed Dec. 5, 2008, the entire contents of both of which are incorporated herein by reference.

BACKGROUND OF THE INVENTION

1. Field of the Invention

The present invention relates to a data memory system, and for example, the invention is applied to a high-reliability data memory system provided with a semiconductor memory device, in which a defective bit can be relieved even if the defective bit is generated.

2. Description of the Related Art

In the data memory system provided with the semiconductor memory device, there has been developed a nonvolatile semiconductor memory (EEPROM), in which charges injected into a charge accumulation layer from a channel through an insulator by a tunnel current are used for digital bit information storage and a change in conductance of MOS-FET is measured according to a charge amount to read the information. Among others, in a NAND type EEPROM (NAND type flash memory) in which plural memory cells are connected in series or in parallel to form a memory cell block, the number of selection transistor gates can significantly be decreased compared with the number of memory cells, and higher density can be achieved. In a structure of the NAND type EEPROM, a well in which the memory cells are formed is commonly used, erasing is collectively performed to a page formed by the plural memory cells, and programming is performed to individual memory cell, so that the higher density can be achieved. In the nonvolatile memory, unlike DRAM, data can be read plural times without destroying the data.

However, when a capacitive coupling of adjacent cells is increased with the further advance of miniaturization and high density, a threshold voltage is changed by the charge amounts of charge accumulation layers of the adjacent cells, thereby lowering a threshold voltage margin between information bits. Particularly, in the NAND type flash memory, program disturbance in which the bit to be kept in the erasing state is changed to the programming bit is generated even in collectively-erased erasing bits by a data pattern during the programming, which results in a problem that the threshold voltage margin is further lowered.

In order to solve the wrong bit problem, for example, Jpn. Pat. Appl. KOKAI Publication No. 2005-243183, applied by the inventors, discloses a method for performing error correction with ECC (Error Correcting Code). However, there is no characteristic, effective ECC producing method against a problem that the erasing threshold or programming threshold voltage is raised by the capacitive coupling because the adjacent memory cell is changed from the erasing threshold to the programming threshold, and a problem that the generation of the wrong programming is increased by a pattern of the adjacent memory cell.

More specifically, in the case where a BCH (Bose-Chaudhuri-Hocquenghem) code is used as ECC, a code length n is fixed to $2^m-1$ (m is a natural number) as a t-fold error correcting code, and the number of corresponding information bits k0 is restricted to $k0=2^m-1-mt$. In the case where an RS (Reed-Solomon) code is used as ECC, one byte is set at m bits as the t-fold error correcting code, the code length n is $2^m-1$ (byte), and the number of corresponding information bits k1 is restricted to $k1=2^m-1-2t$. Thus, the conventional BCH code and the RS code have a small degree of freedom due to the restrictions of the code length and the like, in order to obtain shorter ECC code.

As described above, the conventional BCH code producing method and RS code producing method are not a strong error correcting method against a particular series of code patterns such as "010", but are an error correcting method against a random single bit or a random certain number of bytes.

Therefore, the conventional BCH code producing method or RS code producing method cannot solve the particular problem that the erasing threshold voltage or programming threshold voltage is raised by the capacitive coupling because the adjacent memory cell is changed from the erasing threshold voltage to the programming threshold voltage, and the problem that the generation of the wrong programming is increased by the pattern of the adjacent memory cell. Conventionally an effective coding method is not disclosed even if the BCH code and the RS code are combined.

Thus, the conventional data memory system cannot deal with the particular-pattern problem in which the programming disturbance is generated by the pattern of the adjacent memory cell in changing the erasing threshold voltage or programming threshold voltage due to the capacitive coupling, but the data memory system can deal with the error correction of the random single bit or a random certain number of bytes. As a result, the strong error correction cannot be performed to the particular series of code patterns such as "010".

BRIEF SUMMARY OF THE INVENTION

A data memory system according to one aspect of the present invention comprises: a nonvolatile memory cell array which includes a plurality of memory cells, a page adjacently formed by said plurality of memory cells being collectively erased in the nonvolatile memory cell, at least binary pieces of digital data of "1" and "0" being stored as charges of a charge accumulation layer in the memory cell, a programming bit and an erasing bit being formed by a difference between the charges of the charge accumulation layer; an error correcting code generation circuit which generates a code for correcting error data of at least one bit from an information bit, and produces an error correcting code recorded in the page; an error correcting code decoding circuit which corrects an error from the error correcting code to restore the information bit by digital data recorded in the page; and a code conversion circuit which computes exclusive OR of the fed information bit or the fed error correcting code and a plurality of bits in which a sequence of "programming bit-erasing bit" is repeated a plurality of times, and supplies the exclusive OR to the error correcting code generation circuit.

A data memory system according to one aspect of the present invention comprises: a nonvolatile memory cell array which includes a plurality of memory cells, a page adjacently formed by said plurality of memory cells being collectively erased in the nonvolatile memory cell, at least binary pieces of digital data of "1" and "0" being stored as charges of a charge accumulation layer in the memory cell, a programming bit and an erasing bit being formed by a difference between the charges of the charge accumulation layer; an error correcting code generation circuit which generates a code for correcting error data of at least one bit from an information bit, and produces an error correcting code recorded in the page; an error correcting code decoding circuit which corrects an error from the error correcting code to restore the information bit by digital data recorded in the page; a first counter circuit which detects the number of "programming bit-erasing bit-programming bit" continuous bits of the fed information bit or the fed error correcting code; a second counter circuit which computes exclusive OR of the fed information bit or the fed error correcting code and a plurality of bits in which a sequence of "programming bit-erasing bit" is repeated a plurality of times, and detects the number of "programming bit-erasing bit-programming bit" continuous bits; and a code conversion circuit which selectively computes exclusive OR of the fed information bit or the fed error correcting code and a plurality of bits in which a sequence of "programming bit-erasing bit" is repeated a plurality of times when the number of "programming bit-erasing bit-programming bit" continuous bits of the second counter circuit is smaller than the number of "programming bit-erasing bit-programming bit" continuous bits of the first counter circuit, the code conversion circuit supplying the exclusive OR to the error correcting code generation circuit.

A data memory system according to one aspect of the present invention comprises: a nonvolatile memory cell array which includes a plurality of memory cells, a page adjacently formed by said plurality of memory cells being collectively erased in the nonvolatile memory cell, at least binary pieces of digital data of "1" and "0" being stored as charges of a charge accumulation layer in the memory cell, a programming bit and an erasing bit being formed by a difference between the charges of the charge accumulation layer; an error correcting code generation circuit which generates a correcting code for correcting error data of at least one bit from an information bit; an error correcting code decoding circuit which corrects an error from the correcting code to restore the information bit; a code conversion circuit which computes exclusive OR of an error correcting code in which the correcting code supplied from the error correcting code generation circuit is added to the fed information bit and a plurality of bits in which a sequence of "programming bit-erasing bit" is repeated a plurality of times, the code conversion circuit producing data to be recorded in the page; and a code reverse conversion circuit which computes exclusive OR of an output of the error correcting code decoding circuit and a plurality of bits in which a sequence of "programming bit-erasing bit" is repeated a plurality of times, and restores the error correcting code.

A data memory system according to one aspect of the present invention comprises: a nonvolatile memory cell array which includes a plurality of memory cells, a page adjacently formed by said plurality of memory cells being collectively erased in the nonvolatile memory cell, at least binary pieces of digital data of "1" and "0" being stored as charges of a charge accumulation layer in the memory cell, a programming bit and an erasing bit being formed by a difference between the charges of the charge accumulation layer; an error correcting code generation circuit which generates a correcting code for correcting error data of at least one bit from an information bit; an error correcting code decoding circuit which corrects an error from the correcting code to restore the information bit; a code conversion circuit which computes exclusive OR of an error correcting code in which the correcting code supplied from the error correcting code generation circuit is added to the fed information bit and a plurality of bits in which a sequence of "programming bit-erasing bit" is repeated a plurality of times, and produces data to be recorded in the page; and a code reverse conversion circuit into which digital data recorded in the page is fed, the code reverse conversion circuit computing exclusive OR of the fed digital data and a plurality of bits in which a sequence of "programming bit-erasing bit" is repeated a plurality of times, the code reverse conversion circuit restoring the error correcting code, wherein the code conversion circuit includes: a first counter circuit which detects the number of "programming bit-erasing bit-programming bit" continuous bits of the fed error correcting code; and a second counter circuit which computes exclusive OR of the fed error correcting code and a plurality of bits in which a sequence of "programming bit-erasing bit" is repeated a plurality of times, and detects the number of "programming bit-erasing bit-programming bit" continuous bits, and exclusive OR of the fed error correcting code and a plurality of bits in which a sequence of "programming bit-erasing bit" is repeated a plurality of times is selectively computed and recorded in the page, when the number of "programming bit-erasing bit-programming bit" continuous bits of the second counter circuit is smaller than the number of "programming bit-erasing bit-programming bit" continuous bits of the first counter circuit.

BRIEF DESCRIPTION OF THE SEVERAL VIEWS OF THE DRAWING

FIG. 1 shows a NAND cell array structure of a comparative example and a problem of capacitance interference between adjacent cells;

FIG. 6A shows a section of the memory cell of the first embodiment;

FIG. 6B shows the memory cell structure of the first embodiment;

FIG. 9A shows an example of the second code conversion of the first embodiment;

FIG. 9B shows an example of the second code conversion of the first embodiment;

FIG. 9C shows an example of the second code conversion of the first embodiment;

FIG. 9D shows an example of the second code conversion of the first embodiment;

FIG. 9E shows an example of the second code conversion of the first embodiment;

FIG. 16A is an equivalent circuit diagram showing a configuration example of a page buffer of the third embodiment;

FIG. 16B is an equivalent circuit diagram showing the configuration example of the page buffer of the third embodiment;

FIG. 17A is a timing chart showing a formation example of the page buffer of the third embodiment;

FIG. 17C is a timing chart showing a formation example of the page buffer of the third embodiment;

FIG. 17D is a timing chart showing a formation example of the page buffer of the third embodiment;

FIG. 17F is a timing chart showing a formation example of the page buffer of the third embodiment;

FIG. 18A is a flowchart showing second code conversion of the third embodiment;

FIG. 21 is a block diagram showing a data memory system according to a fourth embodiment of the invention;

FIG. 22 is an equivalent circuit diagram showing a configuration example of a symbol counter of the fourth embodiment;

FIG. 24A is a sectional view showing a memory cell array according to a fifth embodiment of the invention;

FIG. 24B is a sectional view of the memory cell array of the fifth embodiment;

FIG. 25A is an equivalent circuit diagram showing a memory cell array according to a sixth embodiment of the invention;

FIG. 25B is a plan view showing the memory cell array of the sixth embodiment;

FIG. 25C is a sectional view showing the memory cell array of the sixth embodiment;

FIG. 25D is a sectional view showing the memory cell array of the sixth embodiment;

FIG. 27 is a sectional view showing an NROM type memory cell array according to a seventh embodiment of the invention;

FIG. 28 is a sectional view showing the NROM type memory cell array of the seventh embodiment;

FIGS. 32A and 32B are circuit diagrams showing a configuration of a page buffer of the eighth embodiment;

FIG. 35 is a flowchart showing a correction sequence of a position corresponding to a one-word error of the eighth embodiment;

FIG. 37 is a flowchart showing a correction sequence of a position corresponding to a one-word error of the eighth embodiment;

FIGS. 38A and 38B are flowcharts showing a correction sequence of a position corresponding to a two-word error of the eighth embodiment;

FIG. 39Ab is a view explaining the example in which adjacent memory cell disturb reduction code conversion is recursively used;

FIG. 39Bb is a view explaining an example in which adjacent memory cell disturb reduction code conversion is recursively used; and FIG. 40 shows a distribution of a generation frequency of "010" continuous bit of the eighth embodiment.

DETAILED DESCRIPTION OF THE INVENTION

COMPARATIVE EXAMPLE

For the purpose of comparison with data memory systems according to first to eighth embodiments of the invention, a data memory system of a comparative example will be described with reference to FIGS. 1 to 3. FIG. 1 shows a circuit configuration of a memory cell element in a NAND-type EEPROM semiconductor device of the comparative example.

As shown in FIG. 1, nonvolatile memory cells M0 to M31 are formed by MOS transistors having charge accumulation electrodes, and the nonvolatile memory cells M0 to M31 are connected in series. One end of the series-connected nonvolatile memory cells M0 to M31 is connected to a data transfer line BL through a selection transistor S1, and the other end is connected to a common source line SL through a selection transistor S2. Each transistor is formed on the same P-type well 23. Control electrodes of the memory cells M0 to M31 are connected to data selection lines (hereinafter referred to as word line WL) WL0 to WL31, respectively. The control electrode of the selection transistor S1 is connected to a block selection line SSL in order that one memory cell block is selected from plural memory cell blocks along the data transfer line BL to connect the selected memory cell block to the data transfer line BL. The control electrode of the selection transistor S2 is connected to a block selection line GSL to form a so-called NAND-type memory cell block 49 (area shown by a dotted line). In the comparative example, in the memory cell elements adjacent to each other in a horizontal direction of FIG. 1, control interconnections SSL and GSL of the selection gates are connected by a conductive material located in the same layer as a charge accumulation layers 26 of the control interconnections WL0 to WL31 of the memory cell element. In the comparative example, the structure in which the memory cell array is connected to three data transfer lines (BL1, BL2, and BL3) will be described for the sake of easy understanding of the problem. However, obviously the memory cell array is not limited to the three memory cell blocks, but the memory cell array may have 2100, 4200, 8400, 16800, or 33600 memory cell blocks.

Figure 2:
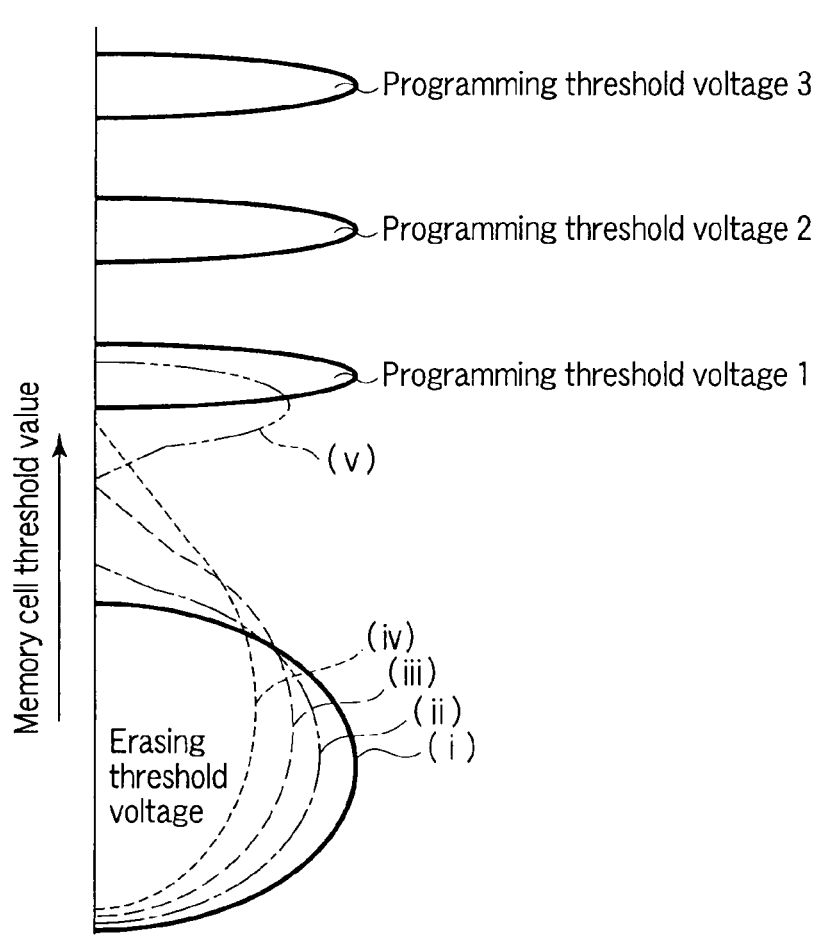
FIG. 2 shows a threshold distribution and a decrease in margin of a NAND cell of the comparative example.

FIG. 2 shows a threshold voltage distribution of a cell M1a(α) formed at an intersecting point of the word line WL1 and the data transfer line BL2 in order to describe the problem that a potential at the charge accumulation electrode is changed by the capacitive coupling of the adjacent memory cells. In a multiple-value memory cell provided with the charge accumulation layer, when negative charges are accumulated in the adjacent memory cell, unfortunately the threshold voltage is raised by the capacitive coupling of the adjacent memory cells. In order to describe the problem, FIG. 2 shows a fluctuation in threshold voltage of a memory cell M1a(α) when the memory cells M1b(β) and M1b'(γ) and a memory cell M2a(∈) are changed from the erasing state to the programming state. The memory cells M1b(β) and M1b'(γ) are adjacent to the memory cell M1a(α) in the direction perpendicular to the data transfer line BL. The memory cell M2a(∈) is adjacent onto an S1 terminal side in a direction perpendicular to the word line WL, and is series-connected to the M1a(α).

A part (i) of FIG. 2 shows an erasing threshold voltage distribution of the memory cell M1a(α) when the memory cells M1b(β) and M1b'(γ) which are adjacent to the memory cell M1a(α) on both sides in the word line direction and the memory cell M2a(∈) which is adjacent to the memory cell M1a(α) on the side of the selection transistor S1 in the data transfer line direction are in the erasing state. In FIG. 2, it is assumed that, in a four-value programming state, programming threshold voltages are set in the descending order, that is, a programming threshold voltage 3, a programming threshold voltage 2, and a programming threshold voltage 1.

A part (ii) of FIG. 2 shows an erasing threshold voltage distribution of the memory cell M1a(α) when the memory cell M1b'(γ) is in the programming state while the memory cell M1b(β) on the opposite side and the memory cell M2a(∈) on the word line side of the selection transistor S1 are in the erasing state. In the case of the part (ii), because the memory cell M1b'(γ) is in the programming state, electrons are accumulated compared with the state in which the memory cells M1b(β), M1b'(γ), and M2a (∈) are in the erasing state. Therefore, compared with the part (i), the threshold voltage of the memory cell M1a(α) is raised by the capacitive coupling of the adjacent memory cells. The problem that the threshold voltage is raised to generate spreading of an upper foot of the distribution due to the wrong programming will be described below. In the NAND type flash memory, a potential of about 15V to about 30V is applied to the memory cells commonly connected to the word line WL, the electrically connected data transfer line BL is set at a potential of 0V, and a source electrode, a drain electrode, and a channel potential of the memory cell in which the programming is selected is set at 0V. On the other hand, in the memory cell which is kept in the erasing state without selecting the programming, that is, in a non-selection memory cell, the source electrode, the drain electrode, and the channel potential are maintained at a potential of 5V to 10V, thereby preventing the programming due to a small potential difference between the data selection line and the data transfer line. In order to realize the non-selection memory cell, the potential at the electrically connected data transfer line BL is raised more than 0V. In the NAND type flash memory, in order to decrease a distribution width of the programming threshold voltage, verify read is performed after programming to selectively raise the potential at the data transfer line BL from 0V for the memory cell which reaches a lower-limit threshold voltage (programming verify threshold voltage) of the programming. Therefore, generation of additional programming is prevented.

In the case where the potential of about 15V to about 30V is applied to the word line WL1 in order to perform the programming to another memory cell connected to the word line WL1 while the memory cell M1a(α) connected to the word line WL1 is kept in the erasing state, that is, in the case of the programming state shown in the part (ii), the source electrode, drain electrode, and channel potential of the memory cell M1b'(γ) to which the programming is performed are set at 0V, and the source electrode, drain electrode, and channel potential of the memory cell M1a(α) are kept in the range of about 5V to about 10V.

On the other hand, in the case of the state shown in the part (i), the source electrodes, drain electrodes, and channel potentials of the memory cells M1b'(γ) and M1a(α) are kept in the range of about 5V to about 10V. Therefore, in the case of the programming state shown in the part (ii), a current is passed from the source electrode or drain electrode of the memory cell M1a(α) to the source electrode or drain electrode of the memory cell M1b'(γ), thereby lowering the potential at the source electrode or drain electrode of the memory cell M1a (α). Otherwise, because the case shown in the part (ii) is lower than the case shown in the part (i) in the potentials at the source electrode, drain electrode, and channel portion of the memory cell M1b'(γ), the potential at the channel portion of the memory cell M1a(α) is also lowered by the capacitive coupling in the direction perpendicular to the data transfer line BL. Therefore, in the case shown in the part (ii), because the potential is lowered at the channel portion of the memory cell M1a(α) compared with the case shown in the part (i), the program disturbance in which the programming is performed to the non-selection memory cell is generated, which results in the problem that the threshold voltage is raised for the memory cell M1a(α) in the erasing state. Particularly, in the memory cell which suffers a programming stress and an erasing stress repeatedly, a charge trap is formed in a tunnel insulator, and a Stress Induced Leakage Current (SILC) is easily flowed from the charge accumulation layer by the weak programming stress. In such cases, the case shown in the part (ii) is larger than the case shown in part (i) in a difference in accumulation charge amount in the charge accumulation layer between the adjacent memory cells, and an electric field stress is applied more in the adjacent memory cell direction. Therefore, SILC is flowed more during the program disturbance stress to easily generate the spreading of the upper foot of the erasing threshold voltage distribution.

The problem that the upper foot of the erasing threshold voltage distribution is spread in the case shown in the part (ii) is similarly generated in the erasing threshold voltage distribution of the memory cell M1a(α) when the memory cell M1b(β) is in the programming state while the memory cells M1b'(γ) and M2a(∈) are in the erasing state.

A part (iii) of FIG. 2 shows an erasing threshold voltage distribution of the memory cell M1a(α) when the memory cells M1$b$($\beta$) and M1$b'$($\gamma$) are in the programming state while the memory cell M2$a$($\in$) is in the erasing state. In the case shown in the part (iii), compared with the case shown in the part (ii), because the memory cells M1$b$($\beta$) and M1$b'$($\gamma$) which are adjacent to the memory cell M1$a$($\alpha$) on both the sides in the direction perpendicular to the data transfer line BL are in the programming state, the electrons are more accumulated than the erasing state. Therefore, compared with the case shown in the part (ii), the threshold voltage of the memory cell M1$a$($\alpha$) is raised by the capacitive coupling of the adjacent memory cells. Additionally, compared with the case shown in the part (ii), the threshold voltage of the memory cell M1$a$($\alpha$) is further raised by the so-called program disturbance stress, thereby generating the spreading of the upper foot of the erasing threshold voltage distribution.

In the case where the potential of about 15V to about 30V is applied to the word line WL1 in order to perform the programming to another memory cell connected to the word line WL1 while the memory cell M1$a$($\alpha$) connected to the word line WL1 is kept in the erasing state, that is, in the case of the programming state shown in the part (iii), the source electrodes, drain electrodes, and channel potentials of the memory cells M1$b$($\beta$) and M1$b'$($\gamma$) to which the programming is performed are set at 0V, and the source electrode, drain electrode, and channel potential of the memory cell M1$a$($\alpha$) are kept in the range of about 5V to about 10V. On the other hand, in the case of the state shown in the part (i), the source electrodes, drain electrodes, and channel potentials of the memory cells M1$b$($\beta$), M1$b'$($\gamma$) and M1$a$($\alpha$) are kept in the range of about 5V to about 10V. Therefore, in the case of the programming state shown in the part (iii), the current is flowed from the source electrode or drain electrode of the memory cell M1$a$($\alpha$) to the source electrode or drain electrode of the memory cell M1$b'$($\gamma$) or M1$b$($\beta$) thereby lowering the potential at the source electrode or drain electrode of the memory cell M1$a$($\alpha$) compared with the case shown in the part (ii). Otherwise, because the case shown in the part (iii) is lower than the case shown in the part (i) in the potentials at the source electrode, drain electrode, and channel portion of the adjacent memory cells M1$b$($\beta$) and M1$b'$($\gamma$), the potential at the channel portion of the memory cell M1$a$($\alpha$) is also lowered by the capacitive coupling in the direction perpendicular to the data transfer line BL. Therefore, in the case shown in the part (iii), because the potential is lowered at the channel portion of the memory cell M1$a$($\alpha$) compared with the case shown in the part (i), the wrong programming in which the programming is performed to the non-selection memory cell is generated to raise the threshold of the memory cell M1$a$($\alpha$). Additionally, in the case shown in the part (iii), because the potentials are lowered at the channel portions of the memory cells adjacent to the memory cell M1$a$($\alpha$) on both the sides in the direction of the data transfer line BL, the programming disturbance is easily generated compared with the case shown in the part (ii). Therefore, in the case shown in the part (iii), the problem that the threshold is further raised for the memory cell M1$a$($\alpha$) in the erasing state frequently occurs compared with the case shown in the part (ii).

A part (iv) of FIG. 2 shows an erasing threshold distribution of the memory cell M1$a$($\alpha$) when the memory cells M1$b$($\beta$), M1$b'$($\gamma$), and M2$a$($\in$) are in the programming state. In the case shown in the part (iv), compared with the case shown in the part (iii), because the memory cell M2$a$($\in$) which is adjacent to the memory cell M1$a$($\alpha$) on the selection transistor S1 side in the direction perpendicular to the data transfer line BL is in the programming state, the electrons are accumulated compared with the erasing state. Therefore, the threshold of the memory cell M1$a$($\alpha$) is further raised by the capacitive coupling of the memory cell M2$a$($\in$) compared with the case shown in the part (iii). A contribution of the capacitive coupling of the memory cell in a diagonal direction to the word line WL and the data transfer line BL is as small as 1% to 40% of a contribution of the capacitive coupling of other memory cells in the directions of the word line WL and data transfer line BL. Therefore, in the case shown in the part (iv) of the multiple-value memory cell, the upper foot of the erasing threshold distribution is further spread compared with the cases shown in the parts (i) to (iii).

Conventionally, in the multiple-value NAND type flash memory, the pieces of data having the same multiple-value levels are sequentially written on the side of the data transfer line BL from the memory cell on the side of the common source line SL. Therefore, because the data having the same multiple-value level is written in the memory cell M2$a$($\in$) which is adjacent to the memory cell M1$a$($\alpha$) on the side of the selection transistor S1 in the direction of the data transfer line BL after the data is written in the memory cell M1$a$($\alpha$), the memory cell M1$a$($\alpha$) is influenced by the programming threshold of the adjacent memory cell M2$a$($\in$). Because the problem that the upper foot of the erasing threshold distribution of the memory cell M1$a$($\alpha$) is spread when the memory cells M1$b$($\beta$), M1$b'$($\gamma$), and M2$a$($\in$) are in the programming state is generated by the capacitive coupling between the adjacent memory cells, the problem is also generated for the programming threshold distribution of the memory cell M1$a$($\alpha$). That is, although the description and illustration are omitted in order to clarify the main problem of the invention, the problem of raising the threshold is also generated for the programming thresholds 1, 2, and 3 of FIG. 2.

A part (v) of FIG. 2 shows a distribution of the programming threshold 1 when the data is retained at a temperature of 85° for one to ten years after a certain value is written and erased 10 to 100000 times (generally known as endurance). After the endurance, in the programming threshold, an electronic trap is formed near a semiconductor substrate of the tunnel insulator by the tunnel current or the electric field stress. The electronic trap has the feature in which, compared with the charges accumulated in the charge accumulation area, the charges trapped in the tunnel insulator are easily emitted by the charges being left for a long time after the electrons are trapped during the programming. Therefore, in the case shown in the part (v), unfortunately the threshold is lowered due to the electron emission compared with the threshold immediately after the programming. After the endurance, obviously the electronic trap or hole trap is formed in the tunnel insulator by the tunnel current or electric field stress, which results in the problem that the leakage current is passed through a trap level. When the problem is generated, a lower foot of the threshold distribution is easily spread as shown in the part (v) of FIG. 2. After the charges are retained, compared with the threshold immediately after the programming, the programming threshold is lowered to generate a tendency to spread the threshold distribution.

At this point, it is assumed that the programming thresholds 1, 2, and 3 are higher than a neutral threshold. This is a reasonable assumption in the conventional NAND type semiconductor memory device. When the programming threshold 3 is excessively higher, because an electric field of the tunnel insulator is increased in retaining the charges, the leakage current passed through the tunnel insulator is increased to deteriorate a data retaining characteristic. When the programming threshold 3 is excessively higher, because the electric field is increased in the programming of a so-called inter-poly insulator between the charge accumulation layer and the control electrode or in retaining the charges, the increase in leakage current or the dielectric breakdown is generated to deteriorate the data retaining characteristic and memory cell reliability. Therefore, the programming threshold has an upper limit for maintaining the memory cell reliability. For example, the upper limit of the programming threshold is set in the range of about 4V to about 8V. On the other hand, when the erasing threshold is excessively lower, because the electric field is increased in the erasing of the inter-poly insulator between the charge accumulation layer and the control electrode, the increase in leakage current or the dielectric breakdown is generated to deteriorate the data retaining characteristic and the memory cell reliability. Therefore, the erasing threshold has a lower limit for maintaining the memory cell reliability. For example, the lower limit of the erasing threshold is set in the range of about −4V to about −10V. In order to prevent the deterioration of the memory cell reliability and the generation of the dielectric breakdown, it is necessary that the programming threshold distribution and erasing threshold distribution of the memory cell be set so as to fall within the range between the upper limit of the programming threshold and the lower limit of the erasing threshold. The erasing threshold distribution is shifted toward the higher side by the capacitive coupling between the adjacent memory cells or the wrong programming, and the threshold is lowered after the programming threshold is retained, whereby the erasing threshold distribution and the programming threshold distribution overlap each other as shown in the parts (iv) and (v) of FIG. 2. Therefore, unfortunately the programming bit is mistaken for the erasing bit during the detection or error correction, and the erasing bit is mistaken for the programming bit during the detection or error correction. Because the range where the threshold can be set is restricted by the upper and lower limits as described above, it is necessary to narrow a programming program voltage step in order to narrow the programming threshold distribution. Therefore, a trade-off with lowering of a programming speed becomes a significant problem. When a physical gap between the adjacent memory cells is narrowed to increase the capacitive coupling between the adjacent memory cells, the programming thresholds 1 and 2 are fluctuated by the charge amount of the charge accumulation layers of the adjacent cell, and unfortunately the threshold width is increased. Accordingly, in the high-density NAND type memory cell in which the memory cell is miniaturized, the wrong bit problem is hardly restrained only by the threshold distribution control.

In order to relieve the wrong bit problem, for example, Jpn. Pat. Appln. KOKAI Publication No. 2005-243183 applied by the inventors discloses the method for performing the error correction with ECC (Error Correcting Code). However, there is no characteristic, effective ECC producing method against the problem that the erasing threshold or programming threshold is raised by the capacitive coupling because the adjacent memory cell is changed from the erasing threshold to the programming threshold, and the problem that the generation of the wrong programming is increased by the pattern of the adjacent memory cell.

More specifically, in the case where the BCH code is used as ECC, a code length n is fixed to $2^m-1$ (m is a natural number) as a t-fold error correcting code, and the number of corresponding information bits k0 is restricted to $k0=2^m-1-mt$. In the case where the RS code is used as ECC, one byte is set at m bits as the t-fold error correcting code, the code length n is $2^m-1$ (byte), and the number of corresponding information bits k1 is restricted to $k1=2^m-1-2t$. Thus, the conventional BCH code and the RS code have a small degree of freedom.

Figure 3:
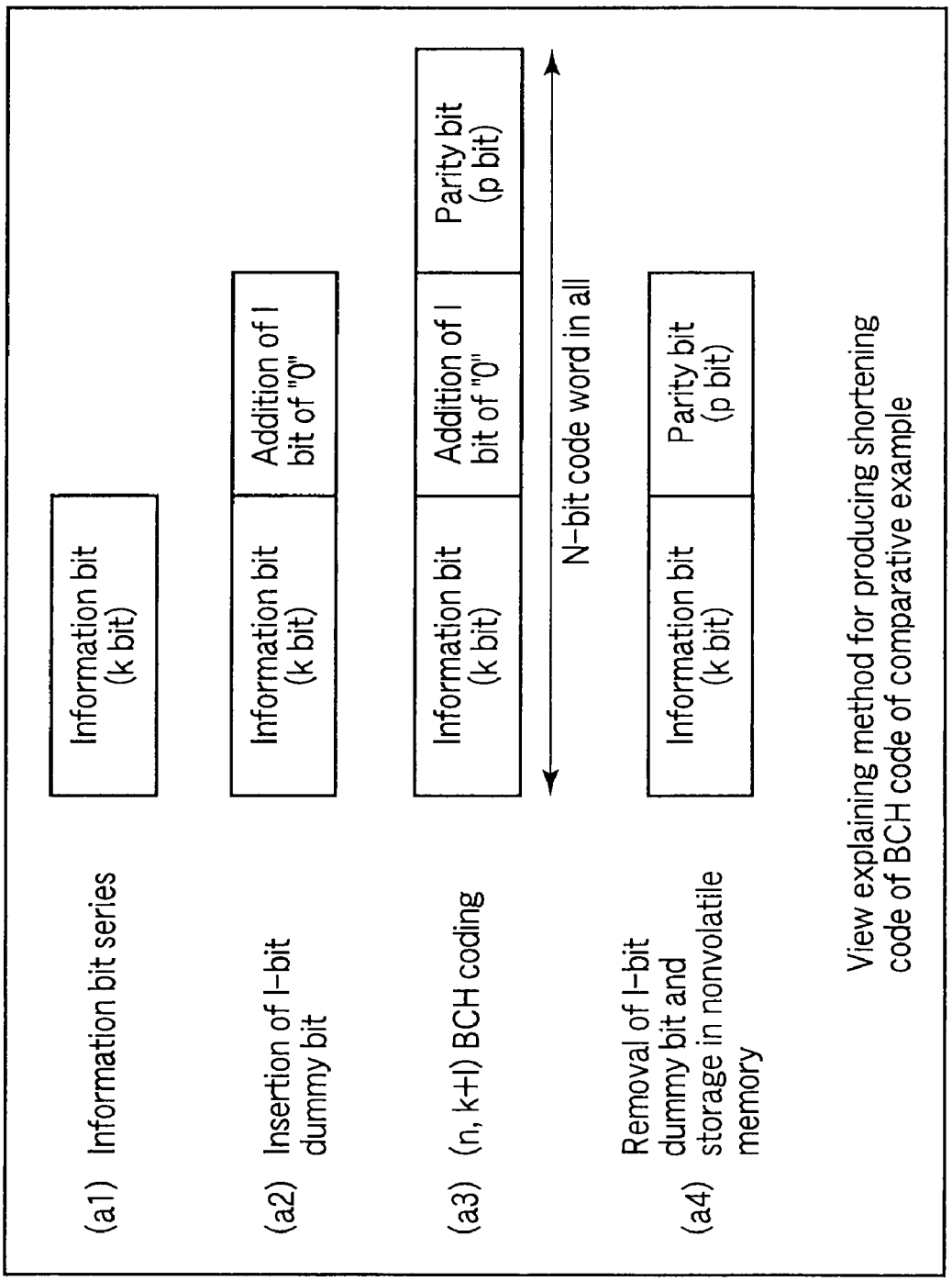
FIG. 3 shows a method for producing a shortening code of a BCH code of the comparative example.

FIG. 3 shows a method for producing the shortening code of the BCH code of the comparative example.

As shown in a part (a1) of FIG. 3, an information bit having k bits lower than the k0 bits is prepared. Then, as shown in a part (a2) of FIG. 3, 1-bits of "0" are added to equalize the number of bits of the information bit to the number of bits corresponding to the k0 bit. Additionally, BCH coding is performed to the information series in which the 1-bits of "0" are added, and an n-bit code word is formed as shown in a part (a3) of FIG. 3. A parity bit which becomes an inspection bit is added to the n-bit code word. As shown in a part (a4) of FIG. 3, the 1-bits of "0" are removed from the coded code word, and the (n−1)-bit code word is stored in a nonvolatile memory. Thus, the ((n−1), k(=k0−1)) BCH shortening code is formed from the (m,k0) BCH code. At this point, the information bit is separated from the inspection bit without change after the BCH code. This feature of the information bit also exists in the RS code.

However, as described above, the BCH shortening code producing method and RS shortening code producing method are not the strong error correcting method against a particular series of code patterns such as "010", but are the error correcting method against a random single bit or a random certain number of bytes. Therefore, the BCH shortening code producing method and RS shortening code producing method cannot solve the problem that the erasing threshold voltage or programming threshold voltage is raised by the capacitive coupling because the adjacent memory cell is changed from the erasing threshold voltage to the programming threshold voltage, and the problem that the generation of the program disturbance is increased by the pattern of the adjacent memory cell.

Thus, the data memory system of the comparative example cannot deal with the particular-pattern problem in which the program disturbance is generated by the pattern of the adjacent memory cell in changing the erasing threshold voltage or programming threshold voltage due to the capacitive coupling, but the data memory system can deal with the error correction of the random single bit or a random certain number of bytes. As a result, disadvantageously the strong error correction cannot be performed to the particular series of code patterns such as "010".

Embodiments of the invention will be described below. In the following description, the same component is designated by the same numeral.

[First Embodiment]

A data memory system and an error correction operation according to a first embodiment of the invention will be described with reference to FIGS. 4 to 9.

<1. Configuration>

Figure 4:
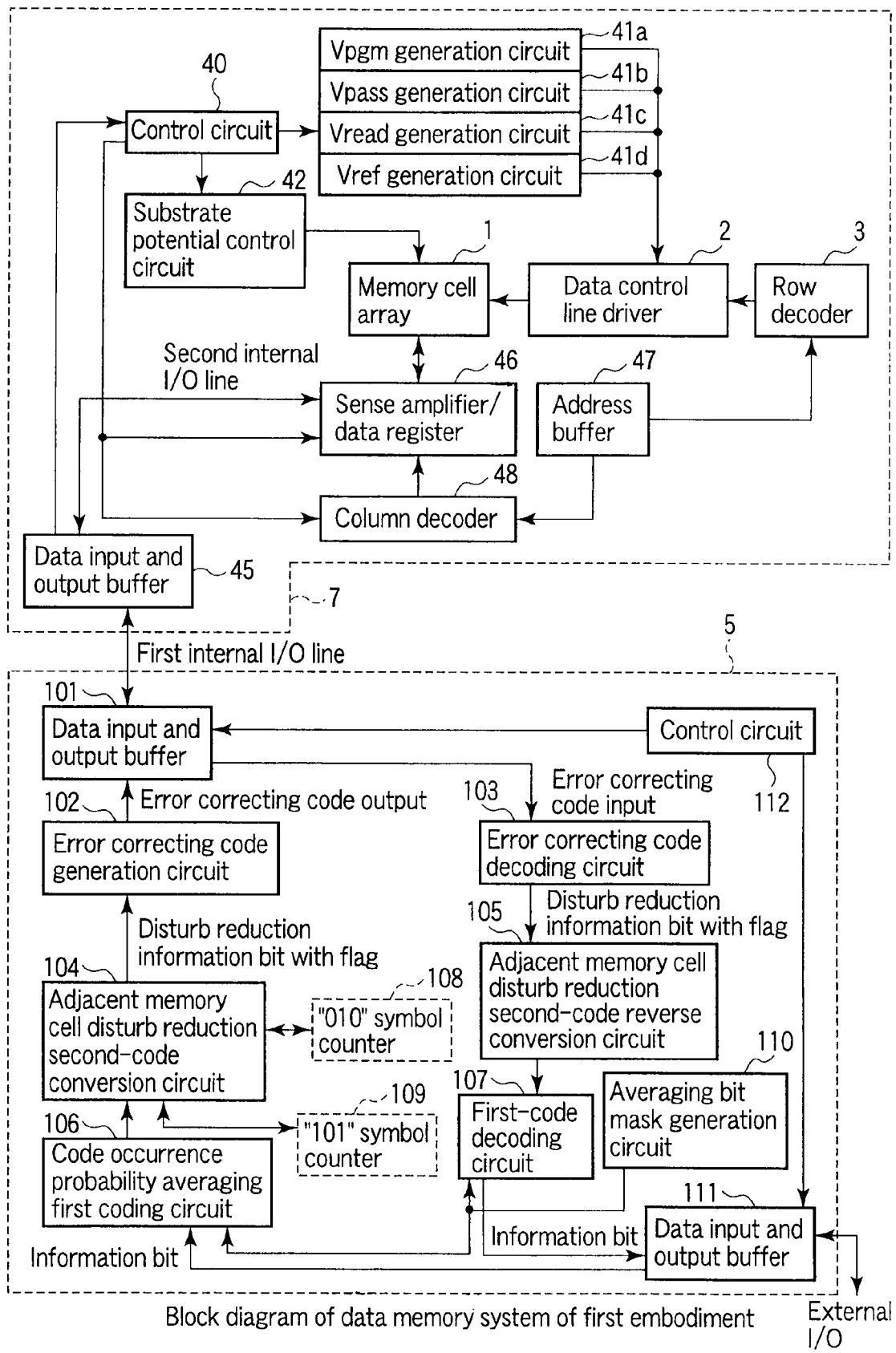
FIG. 4 is a block diagram showing a data memory system according to a first embodiment of the invention.

An entire configuration of the data memory system of the first embodiment will be described with reference to FIG. 4. FIG. 4 is a block diagram showing the data memory system of the first embodiment.

Referring to FIG. 4, the data memory system includes a memory device 7 and a memory controller 5.

A portion surrounded as the memory device 7 by a dotted line is formed in the form of a NAND type flash memory on one semiconductor substrate. A portion surrounded as the memory controller 5 by a dotted line shows a circuit configuration corresponding to a so-called flash memory controller, and the memory controller 5 is usually formed on a semiconductor substrate that is different from that of the memory device 7. Obviously the memory controller 5 may be formed on the same semiconductor substrate as the memory device 7.

The memory controller 5 and the memory device 7 are formed in the same package, board, or card to constitute the data memory system.

A data input and output buffer 45 is connected to a data input and output buffer 101 of the flash memory controller 5 through a first internal I/O line.

Figure 5A:
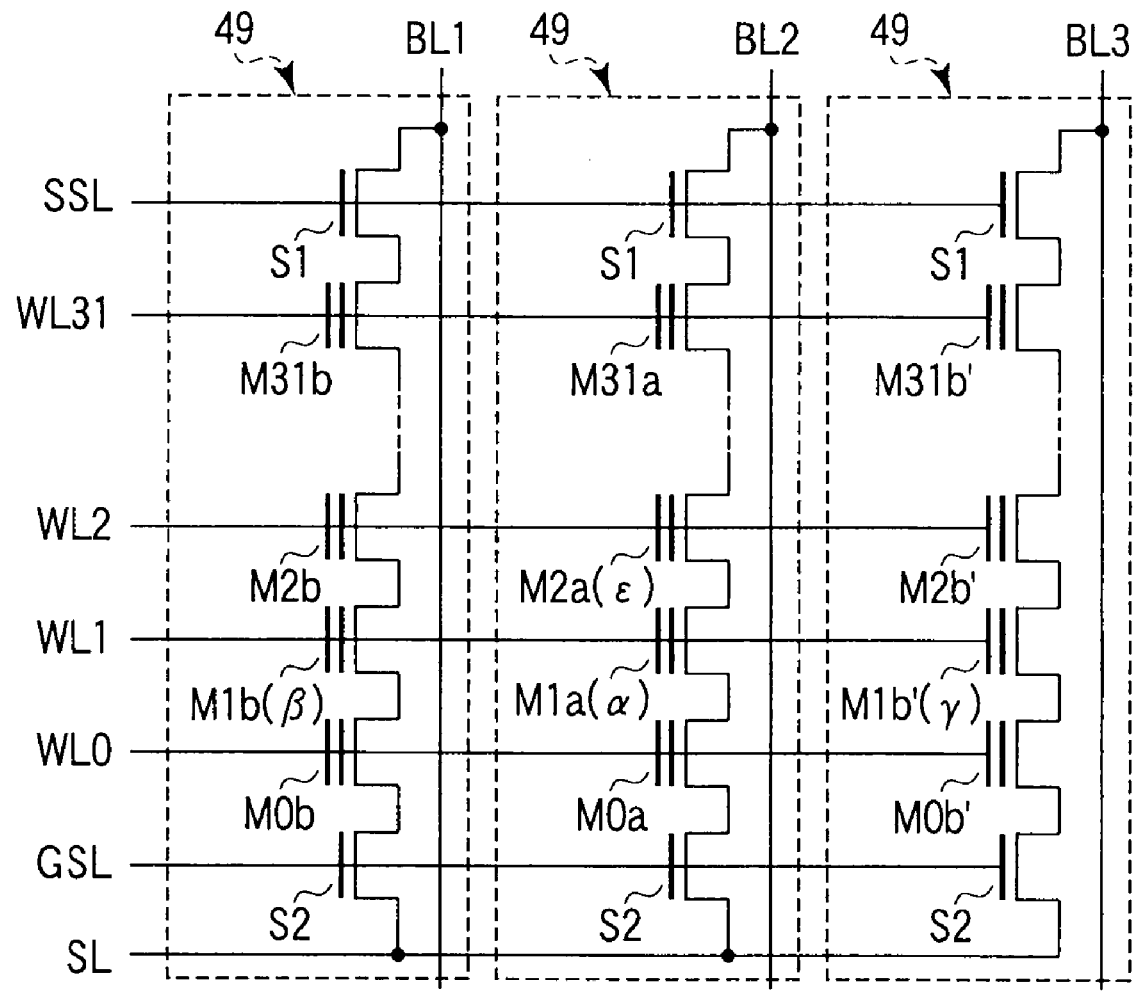
FIG. 5A shows a memory cell structure of the first embodiment.

In the first to seventh embodiments, it is assumed that data can be read plural times without destroying the data in the memory cell. A specific configuration of a memory cell block 49 will be described below. According to established practice of the flash memory, a logical value in an erasing state is set at "1", and a logical value in a programming state is set at "0". For the sake of convenience, in the first to eighth embodiments, a threshold voltage of a binary memory cell is described unless otherwise noted. However, obviously the first to seventh embodiments can be applied to a multiple-value memory cell. In such cases, when the threshold voltage distributions are arrayed in the descending order of the memory cell threshold voltage in order to indicate each data retaining bit, in two adjacent threshold voltage distributions a and b (the threshold voltage distribution a is lower than the threshold voltage distribution b), threshold voltage distributions not more than the threshold voltage distribution a can be set at "1" while threshold voltage distributions not lower than the threshold voltage distribution b are set at "0". In the NAND type flash memory, the erasing memory cells connected to the same data control line are simultaneously erased, and the simultaneous and collective erasing method is also adopted in the NAND cell block 49, so that the erasing threshold voltage has the distribution of 2V to 6V which is wider than the distribution of 0.1V to 1V of the programming threshold voltage. In the case where the threshold voltage of one of the adjacent memory cells M1$b$($\beta$), M1$b'$($\gamma$), and M2$a$ ($\in$) of FIG. 5A is changed from the erasing threshold voltage to the programming threshold voltage, the change in threshold voltage of the memory cell M1$a$($\alpha$) is most influenced. Therefore, in the multiple-value memory cell, desirably a logical value of the erasing state is set at "1" while logical values of other programming states are set at "0".

Figure 5B:
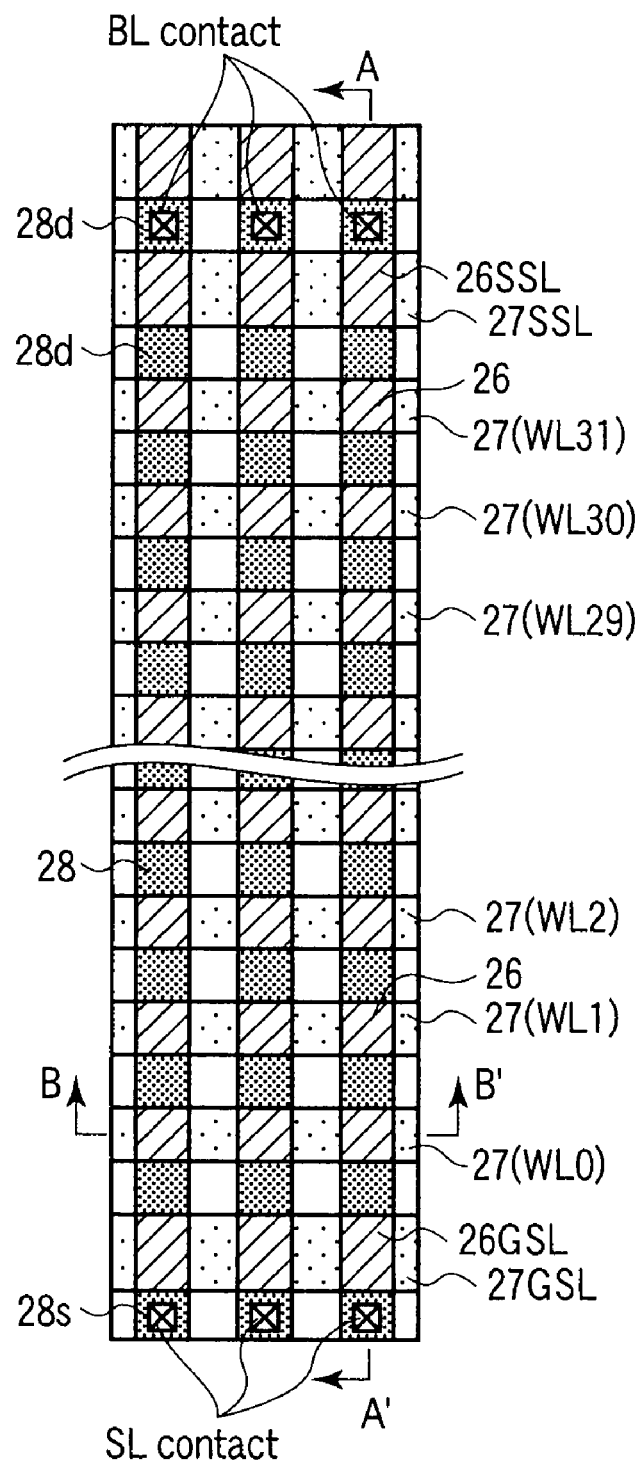
FIG. 5B shows the memory cell structure of the first embodiment.

A planar structure of a memory cell array will be described with reference to FIGS. 5A and 5B. FIGS. 5A and 5B are an equivalent circuit and a plan view of the NAND memory cell block 49, respectively.

FIG. 5B shows a structure in which three memory cell blocks 49 of FIG. 5A are arranged in parallel. Particularly, for the sake of easy understanding of a cell structure, FIG. 5B shows only the structure below a control gate electrode 27. Referring to FIG. 5A, the nonvolatile memory cells M0 to M31 including the MOS transistors having the charge accumulation electrodes 26 are connected in series, one end of the series-connected memory cells M0 to M31 is connected to the data transfer line BL through the selection transistor S1, and the other end is connected to the common source line SL through the selection transistor S2. Each transistor is formed on the same P-type well 23. The control electrodes of the memory cells M0 to M31 are connected to the data selection lines WL0 to WL31 (hereinafter referred to as word line WL), respectively. The control electrode of the selection transistor S1 is connected to the block selection line SSL in order that one memory cell block is selected from plural memory cell blocks along the data transfer line BL to connect the selected memory cell block to the data transfer line BL. The control electrode of the selection transistor S2 is connected to the block selection line GSL to form the so-called NAND type memory cell block 49 (area shown by a dotted line). In the first embodiment, in the memory cell elements adjacent to each other in the horizontal direction of FIG. 5A, the control interconnections SSL and GSL of the selection gates are connected by a conductive material located in the same layer as the charge accumulation layers 26 of the control interconnections WL0 to WL31 of the memory cell element. In the first embodiment, it is only necessary to provide at least one of the block selection lines SSL and GSL in the memory cell block 49, and desirably the block selection lines SSL and GSL are formed in the same direction as the word lines WL0 to WL31 for the purpose of high density. Although the 32=$2^5$ memory cells are connected to the memory cell block 49 in the first embodiment, it is only necessary that the plural memory cells be connected to the data transfer line and the word line. Desirably $2^n$ (n is a positive integer) memory cells or $2^n+2$ (n is a positive integer) memory cells in which dummy memory cells are added between the selection transistor S2 and the word line WL0 and between the selection transistor S1 and the word line WL31 are formed in order to perform address decoding of the multiple-value memory cell block.

A sectional configuration of the memory cell array will be described with reference to FIGS. 6A and 6B. FIGS. 6A and 6B are sectional views taken on lines B-B' and A-A' of FIG. 5B. The sectional view in the B-B' direction of FIG. 6A corresponds to a sectional view of a memory cell portion. Referring to FIGS. 6A and 6B, charge accumulation layers 26, 26SSL, and 26GSL are formed in a p-type silicon region 23 with tunnel gate insulators interposed therebetween. The p-type silicon region 23 has a boron impurity concentration of $10^{14}$ cm$^{-3}$ to $10^{19}$ cm$^{-3}$. The charge accumulation layers 26, 26SSL, and 26GSL are made of polysilicon in which phosphorous or arsenic of $10^{18}$ cm$^{-3}$ to $10^{21}$ cm$^{-3}$ is doped, and the charge accumulation layers 26, 26SSL, and 26GSL have thicknesses of 10 nm to 500 nm. The tunnel gate insulators are formed by silicon oxide films or oxynitride films 25, 25SSL, and 25GSL having thicknesses of 3 nm to 15 nm. The charge accumulation layers 26, 26SSL, and 26GSL and the tunnel gate insulators are formed in a self-alignment fashion in a region where an isolation insulator 24 including a silicon oxide film is not formed. After the tunnel gate insulators 25 and the charge accumulation layers 26 are deposited in a semiconductor region 23, patterning is performed to etch the tunnel gate insulators 25 and the charge accumulation layers 26 to the semiconductor region 23, and the semiconductor region 23 is etched up to a depth of 0.05 μm to 0.5 μm to embed the isolation insulator 24. Thus, the tunnel gate insulators 25 and the charge accumulation layers 26 are formed with no step, so that the films can be deposited with improved uniformity and even characteristic.

Control gates 27 are formed on the charge accumulation layers 26 with block insulators 50, 50SSL, and 50GSL interposed therebetween. The control gate 27 has a thickness of 10 nm to 500 nm, and is formed by polysilicon in which phosphorous, arsenic, or boron of $10^{17}$ cm$^{-3}$ to $10^{21}$ cm$^{-3}$ is doped, a stacked structure of WSi (tungsten silicide) and polysilicon, a stacked structure of W and polysilicon, or a stacked structure of NiSi, MoSi, TiSi, or CoSi and polysilicon. The block insulators 50, 50SSL, and 50GSL have thicknesses of 5 nm to 30 nm, and are formed by a silicon oxide film or an oxynitride film, silicon oxide film/silicon nitride film/silicon oxide film, or a laminated film of an oxide film including aluminum, hafnium, lanthanum, or zirconium element, a silicon oxide film, and a silicon nitride film. In FIG. 5B, the control gates 27 are formed to block boundaries in the horizontal direction of FIG. 5B so as to be connected to adjacent memory cell blocks, and the control gates 27 constitute the word lines WL0 to WL31. In the p-type silicon region (semiconductor region) 23, desirably the voltage can be applied independently of a p-type semiconductor substrate 21 by an n-type silicon region 22 in order to reduce a load on a boosting circuit to restrain power consumption during the erasing. In a gate shape of the first embodiment, because a sidewall of the semiconductor region 23 is covered with the isolation insulator 24, the semiconductor region 23 is not exposed by the etching before the floating gate electrode 26 is formed, and the floating gate electrode 26 can be prevented from being located below the semiconductor region 23. Therefore, a parasitic transistor in which the gate electric field concentration or the lowering of the threshold voltage is generated is hardly generated at a boundary between the semiconductor region 23 and the isolation insulator 24. Additionally, a phenomenon in which the programming threshold voltage is lowered due to the electric field concentration, that is, a sidewalk phenomenon is hardly generated, so that the high-reliability transistor can be formed.

As shown in FIG. 6B, n-type diffusion layers 28 are formed on both sides of the gate electrode 26 while the gate electrode 26 is sandwiched between sidewall insulators 43. The n-type diffusion layer 28 constitutes a source or drain electrode. The sidewall insulator 43 having a thickness of 5 nm to 200 nm is formed by a silicon nitride film or a silicon oxide film. The floating gate type EEPROM cell is formed by the diffusion layer 28, the charge accumulation layer 26, and the control gate 27. In the floating gate type EEPROM cell, the amount of charges accumulated in the charge accumulation layer 26 is used as an information amount. A gate length of the control gate 27 ranges from 0.5 μm to 0.01 μm. The n-type diffusion layer 28 of the source or drain is formed in a depth of 10 nm to 500 nm such that a surface concentration of phosphorous, arsenic, or antimony ranges from $10^{17}$ cm$^{-3}$ to $10^{21}$ cm$^{-3}$. The n-type diffusion layer 28 is shared by the adjacent memory cells, thereby realizing a NAND connection. In FIG. 6B, the gate electrodes 26SSL and 26GSL are connected to the block selection lines SSL and GSL, and are formed in the same layer as the floating gate electrode of the floating gate type EEPROM. The gate lengths of the gate electrodes 26SSL and 26GSL are longer than that of the memory cell gate electrode. For example, when the gate electrodes 26SSL and 26GSL have the gate lengths of 0.02 μm to 1 μm, an on-off ratio can largely be ensured during selecting and non-selecting the block to prevent the program disturbance or read disturbance.

An n-type diffusion layer 28d formed on one side of a control gate 27(SSL) constitutes the source or drain electrode, and the n-type diffusion layer 28d is connected to a data transfer line 36(BL) through a contact 31d. The data transfer line 36(BL) is made of tungsten, tungsten silicide, titanium, titanium nitride, copper, or aluminum. The data transfer line 36(BL) is formed to the block boundary in the vertical direction of FIG. 5B so as to be connected to adjacent memory cell blocks. On the other hand, an n-type diffusion layer 28S formed on one side of a control gate 27(GSL) constitutes the source or drain electrode, and the n-type diffusion layer 28S is connected to the source line 33(SL) through a contact 31S. The source line 33(SL) is formed to the block boundary in the horizontal direction of FIG. 5B so as to be connected to adjacent memory cell blocks. Alternatively, the n-type diffusion layer 28S may be formed to the block boundary in the horizontal direction of FIG. 5B to form the source line. The contact 31d and the contact 31S are filled with n-type or p-type doped polysilicon or tungsten and tungsten silicide, Al, TiN, or Ti to form a conductive region. A gap between the source line 33(SL) and the transistor and a gap between the data transfer line 36(BL) and the transistor are filled with an inter-layer film 68 made of $SiO_2$ or SiN. An insulator protective layer 37 made of $SiO_2$, SiN, or a polyimide and an upper interconnection (not shown) made of W, Al, or Cu are formed on the data transfer line 36(BL).

As shown in FIG. 5A, the memory cell blocks 49 in which the nonvolatile memory cells are connected in series or in parallel are arrayed in the memory cell array 1. A sense amplifier/data register 46 is provided through the selection transistor S1 of the data transfer line BL in order to sense the data on the data transfer line BL of the memory cell array 1 or to retain the programming data. The sense amplifier/data register 46 is also used as a data register, and is mainly formed by a flip-flop circuit. The sense amplifier/data register 46 is connected to a data input and output buffer 45. The connection between the sense amplifier/data register 46 and the data input and output buffer 45 is controlled by an output of a column decoder 48, which receives an address signal from the address buffer 47. The data fed into the data input and output buffer 45 can be written in the memory cell array 1, and the data can be read onto a first internal I/O line of FIG. 4. A row decoder 3 is provided in order to select a memory cell of the memory cell array 1, specifically to control the word lines WL0 to WL31 and the block selection lines SSL and GSL.

A substrate potential control circuit 42 is provided so as to control a potential at a p-type substrate 21 (or p-type well) in which the memory cell array 1 is formed, and desirably the substrate potential control circuit 42 is formed so as to be boosted to an erasing voltage of 10V or more during the erasing. A Vpgm generation circuit 41a is formed in order to generate a programming voltage Vpgm in programming the data in the selected memory cell of the memory cell array 1. The programming voltage Vpgm is boosted higher than a power supply voltage. A Vpass generation circuit 41b, a Vread generation circuit 41c, and a Vref generation circuit 41d are provided in addition to the Vpgm generation circuit 41a. The Vpass generation circuit 41b generates a programming intermediate voltage Vpass which is applied to the non-selection memory cell in programming the data. The Vread generation circuit 41c generates a reading intermediate voltage Vread which is applied to the non-selection memory cell in reading the data. The Vref generation circuit 41d generates a threshold voltage determination voltage Vref which is applied to the selection memory cell. A control circuit 40 controls the Vpgm generation circuit 41a, the Vpass generation circuit 41b, the Vread generation circuit 41c, and the Vref generation circuit 41d such that a necessary voltage output is applied to a data control line driver 2 in each of the programming, erasing, and reading states. The programming voltage Vpgm ranges from 6V to 30V, the programming intermediate voltage Vpass ranges from 3V to 15V, and the reading intermediate voltage Vread ranges from 1V to 9V. In the case of the NAND type memory cell array, desirably a voltage that is higher than the upper limit of programming threshold voltage by about 1V sufficiently ensures the reading current to prevent the read disturbance. The reference threshold voltage Vref is set in the middle of adjacent threshold voltages of the memory cell, for example, in the middle of the threshold voltages of "1" and "0" in the threshold voltage distribution. The data control line driver 2 is a switch circuit which applies the voltage output to the word lines WL0 to WL15 and the block selection lines SSL and GSL of the memory cell necessary to write or read the data in accordance with is the output of the row decoder 3.

In all the embodiments of the invention, in the case where the number of data bits read by a series of sequences ranges from $[2^{m-1}-t\times(m-1)-1]$ to $(2^m-t\times m-1)$ (m and t are natural numbers), at least $(2^m-1)$ memory cell blocks 49 are provided in parallel in the horizontal direction of FIGS. 5A and 5B, that is, in the direction in which the word line WL is extended, and the ($2^m$−1) memory cell blocks 49 are used as one page. From the viewpoint of feature of the first embodiment, in order to add two to six additional bits to the information bit to obtain the effect, it is necessary that the natural number m be more than three in order to restrain the increase in array area in the first embodiment, and usually the natural number m is used in the range of 8 to 20 in the NAND type flash memory. For the memory cells belonging to one page, when plural memory cells commonly connected to one word line are set at one page, desirably the plural memory cells can be simultaneously selected by one-time data selection. When the memory cells are prepared in the above-described manner, the bit error of t bits read from the memory cell array 1 by the series of sequences is detected using the BCH code, and a position of the bit error can be obtained. Because the pieces of data in one byte are simultaneously read in the case of the RS code, the memory cell blocks 49 are provided in the horizontal direction of FIGS. 5A and 5B, that is, in the direction in which the word line WL is extended, and the memory cell blocks 49 are used as one page.

The input and output of the sense amplifier/data register 46 are connected to the control circuit 40 which controls the reading, programming, and erasing of the memory cell. The control circuit 40 controls the reading, programming, and erasing of the memory cell while the data fed into the data input and output buffer 45 is used as a command input. Although not shown in FIG. 4 for the sake of simplification, the control circuit 40 supplies a control signal for controlling an operation of the sense amplifier/data register 46 and control signals sel1 and sel2. The memory device 7 surrounded by the dotted line is formed as the NAND type flash memory on one semiconductor substrate. The circuit block disclosed in Jpn. Pat. Appln. KOKAI Publication No. 2002-150783 can be used for each configuration of the memory device 7, so that the detailed description is omitted.

In the following description, for the sake of easy understanding, according to established practice, it is assumed that a data string before coding is referred to as information bit while a bit added after coding is referred to as inspection bit. The BCH code and the RS code constitute a code by adding the inspection bit to the original information bit. As described in the conventional technique, usually the inspection bit is added behind the information bit in order to simplify coding and decoding circuit configurations.

The flash memory controller 5 surrounded by the dotted line in FIG. 4 is usually formed on the semiconductor substrate that is different from that of the memory device 7. Obviously the memory controller 5 may be formed on the same semiconductor substrate as the memory device 7. The memory controller 5 and the memory device 7 are formed in the same package, board, or card to constitute the data memory system. The data input and output buffer 45 is connected to the data input and output buffer 101 of the flash memory controller 5 through the first internal I/O line.

On the other hand, an external input and output (I/O) is connected to a data input buffer 111, and programming/erasing/reading address and data control information of the flash memory is fed into the external I/O. In the flash memory controller 5, a controller control circuit 112 controls data input and output for the data input and output buffers 101 and 111. The information bit fed through the external I/O is fed into a code occurrence probability averaging first coding circuit 106 from the data input and output buffer 111. At this point, it is assumed that the number of information bits fed into the code occurrence probability averaging first coding circuit 106 is k0 bit. The code occurrence probability averaging first coding circuit 106 is used to substantially equally distribute a probability of input data of "0" and "1". Although the code occurrence probability averaging first coding circuit 106 may be eliminated, it is desirably provided. In the code occurrence probability averaging first coding circuit 106, a periodic code generation circuit or an M-sequence (Maximum length code) generation circuit in which the M-sequence code has a period of an a1 bit shorter than the k bit can be used as an averaging bit mask generation circuit 110. Therefore, in the generated M-sequence code, "0" bits and "1" bits are arranged in a period M1 while dispersed, and the "0" bits and the "1" bits are characteristically generated with an equal probability in one period. Accordingly, the information bit is sequentially divided in each a1 bits, exclusive OR of the divided information bit and the a1 bits of the generated M-sequence is computed and supplied to a second-code conversion circuit to reduce the adjacent memory cell disturbance 104, and a period starting position is changed with a proper increment in each word line WL or each a1 block. Instead of the period starting position, a second M-sequence code having a length of a2 bits is generated, the information bit is sequentially divided in each a1 bit, and the exclusive OR of the divided information bit and each a1 bits of the generated M-sequence is computed. Then the information bit is sequentially divided in each a2 bits, and the exclusive OR of the divided information bit and each a2 bits of the generated M-sequence is computed. Specifically, because a two-bit Linear Feedback Shift Register (LFSR) has a primitive polynomial of x+1, the exclusive OR of the second bit (x) and the first bit (1) is set at the first bit of the next code, and the second bit is obtained by shifting the first bit, thereby obtaining $2^2$−1=3 states of "10", "01", and "11". Because four states in which "00" which is a zero vector is added to the three states constitutes the M-sequence, the information bit is sequentially divided in each two bits, and the exclusive OR of the divided information bit and each two bit of "10 01 11 00 10 01 11 00 . . . " can be computed.

Therefore, even if the information bit includes all the "0" bits or all the "1" bits, the first coded information bit in which the "0" bits and the "1" bits are appropriately dispersed between the word lines is transmitted to the adjacent memory cell disturb reduction second-code conversion circuit 104. Even if the information bit is randomly imparted from the external I/O, the information bit is fed into the adjacent memory cell disturb reduction second-code conversion circuit 104 with a probability P=0.5 in which the number of "0" bits is equal to the number of "1" bits, so that the states of the adjacent memory cells can be homogenized. Obviously the M-sequence circuit or the second M-sequence circuit is shared by the averaging bit mask generation circuit 110 and the first-code decoding circuit 107, which allows the averaging bit mask generation circuit 110 to correctly perform the decoding by computing the exclusive OR of the information bit and each of the a1 and a2 bits of the same generated M-sequence as the first-code decoding circuit 107.

The adjacent memory cell disturb reduction second-code conversion circuit 104 forms a bit string of an information bit with a flag from the information bit which is averaged by the "0" bit and "1" bit. In the information bit with the flag, disturb of the adjacent memory cell is reduced. The disturb reduction information bit with the flag is fed into an error correcting code generation circuit 102. A well-known BCH code generation circuit or RS code generation circuit can be used as the error correcting code generation circuit 102. For example, the error correcting code generation circuit 102 can be realized using the BCH coding circuit disclosed in Jpn. Pat. Appln. KOKAI Publication No. 2005-243183 applied by the inventors, so that the description of the error correcting code generation circuit 102 is omitted. Therefore, the error correcting code generation circuit 102 supplies an error correcting code output, and the error correcting code output is stored in the nonvolatile semiconductor memory device 7 through the data input and output buffer 101.

Because the invention relates to the coding for reducing the capacitive interference between the physically adjacent memory cells or the program disturbance problem, it is assumed that the adjacent time-series information bit imparted to the nonvolatile semiconductor memory device 7 is substantially written in the physically adjacent memory cells except for a well boundary and a source-shunt region. Obviously the coding can be performed by properly performing physical-logical mapping.

On the other hand, a code string possibly having an error, which is read from the nonvolatile memory 7, is fed through the data input and output buffer 101 into an error correcting code decoding circuit 103 which decodes the error correcting code. The error correcting code decoding circuit 103 performs the error correction to the code string to form a bit string in which a flag is added to the information bit whose adjacent memory cell disturb is reduced. A well-known BCH code decoding circuit or RS code decoding circuit can be used as the error correcting code decoding circuit 103. For example, the BCH decoding circuit can be realized using the BCH coding circuit disclosed in Jpn. Pat. Appln. KOKAI Publication No. 2005-23183 applied by the inventors, so that the description of the error correcting code decoding circuit 103 is omitted. Similarly, because the RS code is a kind of the extended BCH code, it is well known that the decoding circuit can be formed for the RS code.

Then the bit string in which the flag is added to the information bit whose adjacent memory cell disturb is reduced is fed into an adjacent memory cell disturb reduction second-code reverse conversion circuit 105, which decodes the bit string into an information bit to which a first code is performed. The information bit to which the first code is performed is fed into the first-code decoding circuit 107, which decodes the information bit to which the first code is performed into the original information bit. The original information bit is supplied from the external I/O through the data input and output buffer 111.

As described above, the first-code decoding circuit 107 computes the exclusive OR of the information bit and the M-sequence generated by the averaging bit mask generation circuit 110 during the decoding, and the code occurrence probability averaging first coding circuit 106 computes the exclusive OR of the information bit and the M-sequence during the coding. Therefore, it is clear that the original information bit can be restored. FIG. 9 shows an input to the adjacent memory cell disturb reduction second-code conversion circuit 104, a state of a mid-flow sequence, and an output example in various information bit patterns. In the point indicated by " . . . ", it is assumed that the four-bit pattern on the right side of " . . . " is periodically repeated. Generally, in the case where the input information bit has k bits, although the probability of occurrence is averaged by the code occurrence probability averaging first coding circuit 106, there is the need to think of all the states in which all the information bits are arbitrarily changed to "0" and "1". The code occurrence probability averaging first coding circuit 106 can perform the coding and the first-code decoding circuit 107 can perform the decoding. Therefore, in the k-bit information bit, $2^k$ states exist, $2^k \times 2^k$ combinations exist between the two adjacent word lines, and the probability of occurrence of the $2^k$ states is substantially averaged by the code occurrence probability averaging first coding circuit 106. In the first to eighth embodiments, the error correcting code generation circuit 102, the adjacent memory cell disturb reduction second-code conversion circuit 104, the code occurrence probability averaging first coding circuit 106, the error correcting code decoding circuit 103, the adjacent memory cell disturb reduction second-code reverse conversion circuit 105, the first-code decoding circuit 107, the averaging bit mask generation circuit 110, the "010" symbol counter 112 after the exclusive OR of the information bit and "01010101 . . . 0101" is computed, the "010" symbol counter 113 after the exclusive OR of the information bit and "10101010 . . . 1010", the "010" symbol counter 108, the "101" symbol counter 109, the symbol counter 116, the symbol counter 117, the symbol counter 118, the symbol counter 119, the page buffer 114 which performs rearrangement of the information bit, and the page buffer 115 in which data on one source line side is stored may be implemented by a hardware circuit or may be realized by software or firmware or a combination thereof as long as a computation processing time is tolerated. In the first to eighth embodiments, for the sake of convenience, it is assumed that the number of information bits k is divisible by an even number, for example, by 2 or 4. In the case where the number of information bits cannot be divided, the information bit may be enlarged by adding "1" until the information bit becomes multiples of 4. For example, in the case of the information bit having five bits of "10101", when the five bits of "10101" are enlarged to eight bits of "10101111" (enlarged code portion is indicated by an underline), the eight bits of "10101111" can clearly be divided by 2 or 4. For the additional code, "1" is better than "0" in order to prevent the new generation of the "010" pattern by the additional code.

<2. Error Correcting Code and Decoding Operation>

Figure 7:
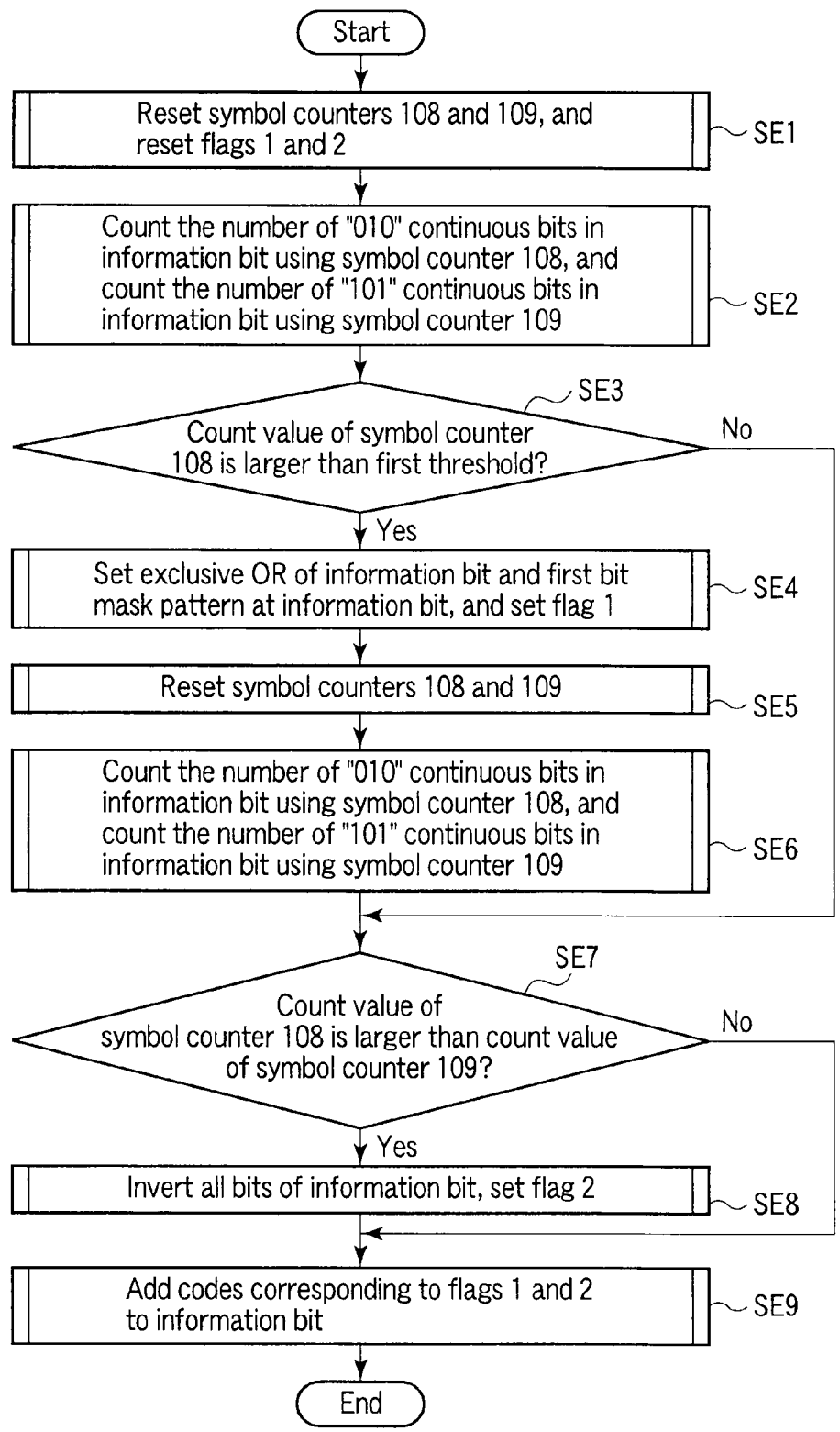
FIG. 7 is a flowchart showing second code conversion of the first embodiment.

An error correcting code and a decoding operation of the data memory system of the first embodiment will be described below with reference to FIGS. 7 to 9. FIG. 7 shows a specific sequence of the adjacent memory cell disturb reduction second-code conversion circuit 104. The following description is made based on the sequences of FIGS. 7 and 8.

In Step SE1, the adjacent memory cell disturb reduction second-code conversion circuit 104 resets the "010" symbol counter 108 and the "101" symbol counter 109, and also resets flags 1 and 2. The "010" symbol counter 108 counts the number of "010" continuous symbols in the information bit. The "101" symbol counter 109 counts the number of "101" continuous symbols in the information bit. The flags 1 and 2 indicate coding states. In the following description, it is assumed that an "abc" symbol indicates three continuous and side-by-side bits shown by "abc" in the information bit or the code.

In Step SE2, the "010" symbol counter 108 counts the number of "010" continuous symbols in the k-bit information bit, and the count value is stored in the "010" symbol counter 108. The "101" symbol counter 109 also counts the number of "101" continuous symbols in the k-bit information bit, and the count value is stored in the "101" symbol counter 109.

Figure 10:
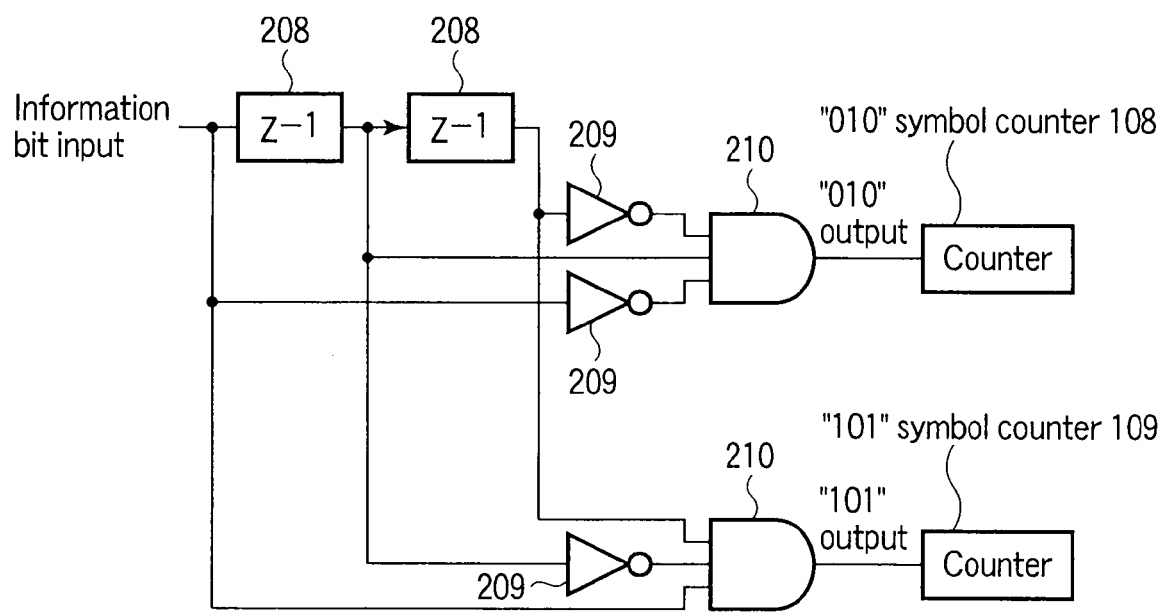
FIG. 10 is an equivalent circuit diagram showing a configuration example of a symbol counter of the first embodiment.

As shown in FIG. 10, for example, the symbol counter 108 can easily be realized such that the information bit is fed into a shift register with a clock synchronized with the information bit to combine a "010" detection circuit. In FIG. 10, "$Z^{-1}$" of the numeral 208 designates a one-bit unit time delay element, the numeral 209 designates an inverter, and the numeral 210 designates a three-input AND gate. It is assumed that the series of information bits is fed in time series through an information bit input. In a unit time in which the "010" continuous symbol is sequentially fed, the output of the "010" continuous symbol is changed from "L" to "H" in the case of the unit time in which the last "0" of the "010" continuous symbol is fed, and the "010" continuous symbol becomes "L" in other cases. The output of the "010" continuous symbol is synchronized with a unit time in which the information bit is fed, and a trigger is activated to start the counting when a logical value of the output of the "010" continuous symbol is stabilized in the unit time, so that the number of "010" continuous symbols in the information bit can be counted. The number of "101" continuous symbols can similarly be counted, and a well-known binary counter can be used as the symbol counter of FIG. 10. Therefore, the detailed description of the symbol counter is omitted. For example, a D-type flip-flop or a latch circuit is used as the one-bit unit time delay element designated by "$Z^{-1}$" of the numeral 208. Particularly the one-bit unit time delay element can easily be realized by use of an edge trigger type flip-flop. In the edge trigger type flip-flop, the output is fixed at the moment the clock input rises from "L" ("L" is set at 0V for descriptive purpose) to "H" ("H" is set at Vcc for descriptive purpose), after which the output is not changed even if the clock input is kept at "H" or "L" or changed from "H" to "L".

In Step SE3 of FIG. 7, the adjacent memory cell disturb reduction second-code conversion circuit 104 determines whether or not the count value of the "010" symbol counter 108 is larger than a first threshold. When the count value of the "010" symbol counter 108 is larger than the first threshold, in Step SE4, the adjacent memory cell disturb reduction second-code conversion circuit 104 computes exclusive OR of the information bit and a first bit mask pattern "01010101 . . . 0101" ("01" is repeatedly generated k-bit times), and replaces the information bit with the exclusive OR to set the flag 1. "10101010 . . . 1010" in which "10" is repeatedly generated k-bit times may be used as the first bit mask pattern. In consideration of a half of ((k/2)−1) "010" continuous symbols of the maximum number of "010" continuous symbols shown in the parts (a1) and (c1) of FIG. 9 in the information bit, and in consideration of k "010" continuous symbols which cannot be divided by 2 or 4, desirably the first threshold is set at (value in which (k/4) is rounded up to the nearest integer)−1 in order to restrain the upper limit of the number of "010" continuous symbols to a certain value.

In Step SE5 after Step SE4 is performed, the adjacent memory cell disturb reduction second-code conversion circuit 104 resets the "010" symbol counter 108 and the "101" symbol counter 109, and also resets flags 1 and 2. The "010" symbol counter 108 counts the number of "010" continuous symbols in the information bit. The "101" symbol counter 109 counts the number of "101" continuous symbols in the information bit. The flags 1 and 2 indicate coding states. In Step SE6, the "010" symbol counter 108 counts the number of "010" continuous symbols in the k-bit information bit, and the count value is stored in the "010" symbol counter 108. The "101" symbol counter 109 also counts the number of "101" continuous symbols in the k-bit information bit, and the count value is stored in the "101" symbol counter 109.

In Step SE7 after "No" is determined in Step SE3, the adjacent memory cell disturb reduction second-code conversion circuit 104 determines whether or not the count value of the "010" symbol counter 108 is larger than the count value of the "101" symbol counter 109. When the count value of the "010" symbol counter 108 is larger than the count value of the "101" symbol counter 109, in Step SE8, the adjacent memory cell disturb reduction second-code conversion circuit 104 inverts all the bits of the k-bit information bit, that is, the "0" bit is changed to the "1" bit and the "1" bit is changed to the "0" bit, and the adjacent memory cell disturb reduction second-code conversion circuit 104 sets the flag 2. In Step SE9 after "No" is determined in Step SE7, the adjacent memory cell disturb reduction second-code conversion circuit 104 adds codes corresponding to the flags 1 and 2 to the information bit.

(Sequence of Adjacent Memory Cell Disturb Reduction Second-Code Reverse Conversion Circuit 105)

Figure 8:
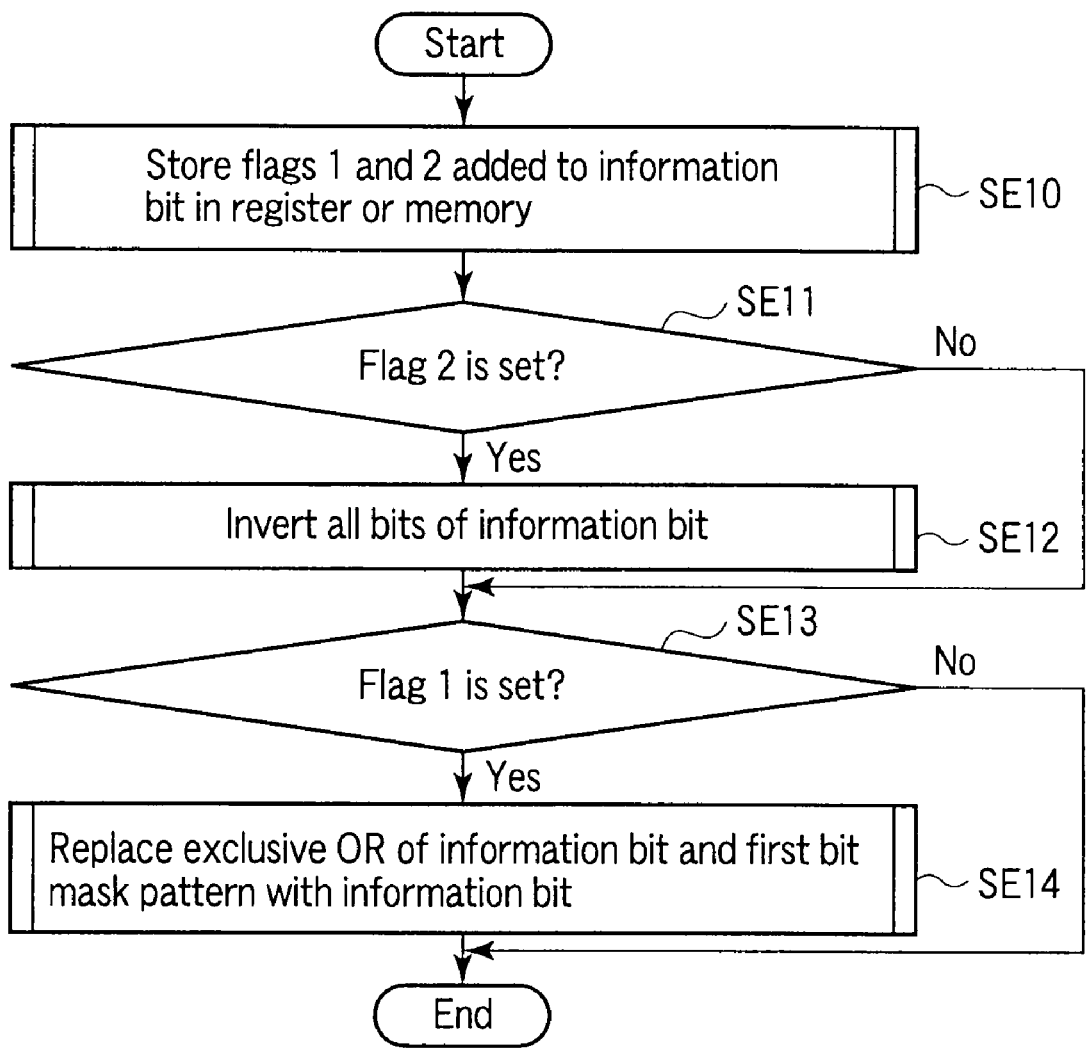
FIG. 8 is a flowchart showing second code reverse conversion of the first embodiment.

FIG. 8 shows a specific sequence of the adjacent memory cell disturb reduction second-code reverse conversion circuit 105. In Step SE10, the adjacent memory cell disturb reduction second-code reverse conversion circuit 105 stores the information corresponding to the flags 1 and 2 added to the information bit in a register or a temporary memory.

In Step SE11, the adjacent memory cell disturb reduction second-code reverse conversion circuit 105 determines whether or not the flag 2 is set. When the flag 2 is set, in Step SE12, the adjacent memory cell disturb reduction second-code reverse conversion circuit 105 inverts all the bits of the k-bit information bit, that is, the "0" bit is changed to the "1" bit and the "1" bit is changed to the "0" bit, and the adjacent memory cell disturb reduction second-code reverse conversion circuit 105 replaces the information bit with the inverted information bit. Then, in Step SE13 after "No" is determined in Step SE11, the adjacent memory cell disturb reduction second-code reverse conversion circuit 105 determines whether or not the flag 1 is set. When the flag 1 is set (YES in Step SE13), the adjacent memory cell disturb reduction second-code reverse conversion circuit 105 computes exclusive OR of the information bit and the first bit mask pattern "01010101 . . . 0101" ("01" is repeatedly generated k-bit times), and replaces the information bit with the exclusive OR. In the first bit mask pattern "01010101 . . . 0101", the same mask bit "1010101010 . . . 1010" ("10" is repeatedly generated k-bit times) can be used when the adjacent memory cell disturb reduction second-code conversion circuit 104 performs the coding.

As shown in (iii) and (iv) of FIG. 2 of the comparative example, in the pattern in which disadvantageously the erasing threshold voltage is raised by the increase in threshold voltage of the adjacent memory cell, the memory cell M1a(α) is in the erasing state, and the memory cells M1b(β) and M1b'(γ) adjacent to the memory cell M1a(α) in the direction of the data transfer line BL are in the programming state. Therefore, the bit string of the memory cells M1a(α), M1b(β) and M1b'(γ) corresponds to the "010" continuous symbol. As shown in the parts (a1) to (a4) of FIG. 9A, in the configuration of the comparative example in which the sequence of the adjacent memory cell disturb reduction second-code conversion circuit 104 is eliminated, ((k/2)−1) "010" continuous symbols are included in the k-bit sequence of "01010101 . . . 0101", the problem of raising the erasing threshold voltage due to the increase in threshold voltage of the adjacent memory cell is probably generated at the ((k/2)−1) "010" continuous symbols. For example, in the memory cell M1a (α), assuming that p0 is a probability P0 of wrongly recognizing the erasing bit as the programming bit when the erasing threshold voltage overlaps the programming threshold voltage shown by the part (v) of FIG. 2, the defect of ((k/2)−1)×p0 is generated when the probability p0 is sufficiently smaller than 1. The part (a1) of FIG. 9A and the part (c1) of FIG. 9C are the worst pattern in which the largest number of "010" continuous symbols is generated in the comparative example. In the part (a1) of FIG. 9A, ((k/2)−1) "010" continuous symbols exist in the data pattern fed into the adjacent memory cell disturb reduction second-code conversion circuit 104. When the sequence of Step SE3 of the adjacent memory cell disturb reduction second-code conversion circuit 104 of first embodiment is performed, the number of "010" continuous symbols can be restrained to (value in which (k/4) is rounded up to the nearest integer)−1 or less in front of Step SE7. In Step SE3, when the count value of the symbol counter 108 is larger than the first threshold (YES in Step SE3), the number of "010" continuous symbols is larger than (value in which (k/4) is rounded up to the nearest integer)−1, "01010101 . . . 0101" is occupied by at least ((k/2)+1) "010" continuous symbols when the "010" continuous symbols are arranged most densely in the worst case. Therefore, other patterns except for the "010" continuous symbol, the number of bits where the "000" continuous symbol exists is lower than the (k/2) bits. In the case where the exclusive OR of the information bit and the mask "0101011 . . . 0101" is computed, the number of points at which the "000" continuous symbol is inverted into the "010" continuous bit to increase the number of "010" continuous symbols is increased at most to (value in which (k/4) is rounded up to the nearest integer)−1 or less.

On the other hand, in the case where the exclusive OR of the "010" continuous symbol and the mask "01010101 . . . 0101" is computed, the exclusive OR of the "010" continuous symbol and one of the "010" and "101" continuous symbols in the mask "01010101 . . . 0101" is computed according to the starting position of the "010" continuous symbol. The exclusive OR of the "010" continuous symbol and the "010" continuous symbol in the mask "01010101 . . . 0101" and the exclusive OR of the "010" continuous symbol and the "101" continuous symbol in the mask "01010101 . . . 0101" are converted into the "000" and "111" continuous symbols, respectively. Therefore, in both the cases, the number of "010" continuous symbol is decreased to (value in which (k/4) is rounded up to the nearest integer)−1 or less as a whole. Obviously the use of the mask "01010101 . . . 0101", in which "01" is repeated, most effectively decreases the number of "010" continuous symbols in the information bit. However, in the well contact or the source shunt contact, sometimes one to 16 dummy memory cells are formed between the memory cell in which the information is stored and the well contact or source shunt contact while being adjacent to the memory cell perpendicular to the bit-line direction. Jpn. Pat. Appln. KOKAI Publication No. 2007-221084 applied by the inventors discloses a configuration of the dummy memory cell, so that the detailed description is omitted. Because the programming and erasing of the memory cell are not performed according to the information data in the dummy memory cell, the problem of the threshold change due to the adjacent memory cell is hardly generated at the end of the memory cell string adjacent to the dummy memory cell. Therefore, either "01010101 . . . 0101" ("01" is repeatedly generated) or "10101010 . . . 1010" ("10" is repeatedly generated) can be appropriately used at each breakpoint of the memory cell array such as the well contact and the source shunt contact. Alternatively, the information bit is divided at each breakpoint of the memory cell array into partial strings of the information bit, the number of "010" continuous symbols and the number of "101" continuous symbols are counted for each partial string, and the adjacent memory cell disturb reduction second-code conversion circuit 104 adds the flags 1 and 2 corresponding to each partial string, thereby reducing the probability of occurrence of the "010" continuous symbol. The same holds true for the following embodiments. As described above, when the number of "010" continuous symbols is larger than the first threshold, advantageously the number of "010" continuous symbols in the information bit can be decreased to (value in which (k/4) is rounded up to the nearest integer)−1 or less, which is about a half of the worst value of ((k/2)−1) of the comparative example, by computing the exclusive OR of the information bit and "01010101 . . . 0101" or "10101010 . . . 1010". Thus, compared with the worst value of ((k/2)−1) of the comparative example, the number of "010" continuous symbols in the information bit can be restrained to (value in which (k/4) is rounded up to the nearest integer)−1 or less by the sequence of FIG. 7. Because the exclusive OR of the information bit and the bit mask "01010101 . . . 0101" is computed, the original information can be restored by computing the exclusive OR of the information bit and the same bit mask after the coding. Assuming that t is the number of error correcting symbols, an information conversion time is substantially increased in proportion to the square of t in decoding the BCH code or RS code, which results in a problem of high-speed decoding. On the other hand, in the adjacent memory cell disturb reduction second-code conversion circuit 104 and the adjacent memory cell disturb reduction second-code reverse conversion circuit 105, only the information conversion time which is increased in proportion to the one power of the information bit length is required even if the information bit is lengthened in the coding and decoding. In the case where t is at least three, the information conversion time is almost equal to LFSR shift information conversion time necessary for coding the BCH code or RS code which is much less than the information conversion time for the decoding. Therefore, even in the code length which is longer than 1000 bits, the conversion into the second code or reverse conversion from the second code can be performed at a sufficiently short time.

Parts (a1), (b1), (c1), (d1), and (e1) of FIGS. 9A, 9B, 9C, 9D, and 9E show various examples of the information bit input and the number of "010" continuous symbols and the number of "101" continuous symbols at right ends. Parts (a2), (b2), (c2), and (d2) of FIGS. 9A, 9B, 9C, and 9D show states of the adjacent memory cell disturb reduction second-code conversion circuit 104 after Step SE3. In FIGS. 9A and 9C, the number of "010" continuous symbols is larger than (value in which (k/4) is rounded up to the nearest integer)−1 of the first threshold, the branch in Step SE3 becomes affirmation, and the flag 1 is set in Step SE4. In FIGS. 9A and 9C, the number of "010" continuous symbols is not more than the first threshold in Step SE3, and the branch in Step SE3 becomes negation. Parts (a3), (b3), (c3), and (d3) of FIGS. 9A, 9B, 9C, and 9D show states of the adjacent memory cell disturb reduction second-code conversion circuit 104 after Step SE9.

As shown in (iii) and (iv) of FIG. 2 of the comparative example, in the pattern in which disadvantageously the erasing threshold voltage is raised by the increase in threshold voltage of the adjacent memory cell, the memory cell M1$a(\alpha)$ is in the erasing state, and the memory cells M1$b(\beta)$ and M1$b'(\gamma)$ adjacent to the memory cell M1$a(\alpha)$ in the direction perpendicular to the data transfer line BL are in the programming state. Therefore, the bit string of the memory cells M1$a(\alpha)$, M1$b(\beta)$ and M1$b'(\gamma)$ corresponds to the "010" continuous symbol, and the problem of the comparative example is not generated in the bit-inverted "101". The "010" bit string is obtained by the bit inversion of the "101" continuous symbol, and the number of "010" continuous symbols and the number of "101" continuous symbols are compared in Step SE7. Therefore, the number of "010" continuous symbols can effectively be decreased only by the rearrangement of the two kinds of the patterns. The parts (d1) to (d4) of FIG. 9D show examples in which the flag 2 is set in Step SE8. As shown in the part (d1) of FIG. 9D, the (k/4) "010" continuous symbols and the zero "101" continuous symbol exist in the pattern of the information bit in which the "0100" continuous symbol is repeated. Therefore, in Step SE7 after "No" is determined in Step SE3, the adjacent memory cell disturb reduction second-code conversion circuit 104 determines whether or not the number of "010" continuous symbols counted by the symbol counter 108 is larger than the number of "101" continuous symbols counted by the symbol counter 109, and the flow goes to Step SE8. In Step SE8, the adjacent memory cell disturb reduction second-code conversion circuit 104 inverts all the bits to obtain the zero "010" continuous symbol and the (k/4) "101" continuous symbols. Accordingly, the number of "010" continuous symbols can be decreased. Obviously, in Step SE7, the adjacent memory cell disturb reduction second-code conversion circuit 104 previously determines whether or not the number of "010" continuous symbols counted by the symbol counter 108 is larger than the number of "101" continuous symbols counted by the symbol counter 109, and the bit inversion is not performed when the number of "010" continuous symbols is smaller than or equal to the number of "101" continuous symbols (NO in Step SE7). In such cases, the number of "010" continuous symbols is not increased.

Thus, the number of "010" continuous symbols in the information bit is already restrained to (value in which (k/4) is rounded up to the nearest integer)−1 or less in front of Step SE7 by the use of the sequence in Steps SE7 and SE8 of the adjacent memory cell disturb reduction second-code conversion circuit 104 of the first embodiment. Therefore, the number of "010" continuous symbols is not more than (value in which (k/4) is rounded up to the nearest integer)−1 before Step SE8, and the information bit in which the "010" continuous symbol is generated can effectively be converted into the information bit in which the "010" continuous symbol is not generated.

This is attributed to the following fact. That is, because only the exclusive OR of the information bit and the mask pattern is computed in the sequence in Steps SE3 to SE6, the code occurrence probability averaging first coding circuit 106 substantially equally averages the probability of getting "0" of each information bit and the probability of getting "1", and the probability of getting "0" is equal to the probability of getting "1" in the information bit fed into the adjacent memory cell disturb reduction second-code conversion circuit 104. In the case of all the $2^k$ combinations of the information bit in the branch in Step SE7, the probability that the count value of the symbol counter 108 is larger than the count value of the symbol counter 109 is equal to the probability that the count value of the symbol counter 108 is smaller than the count value of the symbol counter 109. The probability of generating the "010" continuous symbol can be lowered to effectively realize the information bit having less "010" continuous symbols by performing the sequence in Steps SE7 and SE8 in the information bit except for the information bit string in which the count value of the symbol counter 108 is equal to the count value of the symbol counter 109, for example, "1010101111111111 . . . 1111".

In the first embodiment, the flags 1 and 2 are added to the information bit in the form of the continuous two-bit data. In this method, the "010" state is not generated irrespective of the states of the flags 1 and 2. Alternatively, the two bits may be allocated to the flag 1 while one bit is allocated to the flag 2. In FIG. 9, the bits corresponding to the flags 1 and 2 become aabb (a and b are states "0" and "1" corresponding to the flags 1 and 2). However, the bits whose positions are changed such as bbaa, aab, and bba may be added as the bits corresponding to the flag. The bits corresponding to the flag are not added to each end of the information bit, but the information bit may be divided into two to embed the bits such as bbaa between the information bits. The information bit may be divided into three to embed the bits of bb and aa among the information bits.

The inspection bit (parity bit) is divided into several bits after the error correcting coding, the flag such as aa and bb which includes at least the same two bits may be rearranged (interleaved) so as to be sandwiched between inspection bits. Therefore, the bit adjacent to the flag including at least the same two bits does not become the "010" continuous symbol, so that the probability of generating the "010" continuous symbol can be reduced in the inspection bit.

Parts (e1) to (e4) of FIG. 9 show a worst pattern example in which the "010" pattern is generated in the first embodiment. As shown in the part (e1) of FIG. 9, in the case of the k-bit information bit in which "10" is repeated (k/4)-bit times and "00" is repeated (k/4)-bit times, the number of "010" continuous symbols becomes (k/4)−1 and the number of "101" continuous symbols becomes (k/4)−1. Therefore, in the sequence of FIG. 7, the flag 1 remains reset and the flag 2 remains reset. The parts (e2), (e3), and (e4) of FIG. 9 show the information bits on the condition that the sequence in Step SE4, Step SE8, and Steps SE4 and SE8 are performed. In each case, the number of "010" continuous symbols becomes (k/4) or (k/4)−1, and the number of "101" continuous symbols becomes (k/4) or (k/4)−1. Therefore, even if the sequence in Step SE4 or Step SE8 is performed, the number of "010" continuous symbols becomes (k/4)−1, and the (k/4)−1 "010" continuous symbols become an example of the worst pattern in the k-bit information bit. The worst pattern can further be improved by a method according to a third embodiment of the invention.

In the first embodiment, compared with the later-described second and third embodiments, advantageously additional symbol counters 112 and 113 are not required, a number of circuits is reduced, and the data memory system can be formed by a small-area circuit.

<3. Effect of First Embodiment>

The following effects (1) and (2) are obtained in the data memory system of the first embodiment.

(1) In the characteristic error correction, the data memory system of the first embodiment is advantageously used for the particularly "010" continuous pattern.

As described above, in the first embodiment, the number of worst states in which the "010" continuous symbol is generated can effectively be restrained from (k/2)−1 to (value in which (k/4) is rounded up to the nearest integer)−1 or less, that is, to about a half or less by adding at most three to four bits (two bits in the form of information) to the k-bit information bit.

Figure 29:
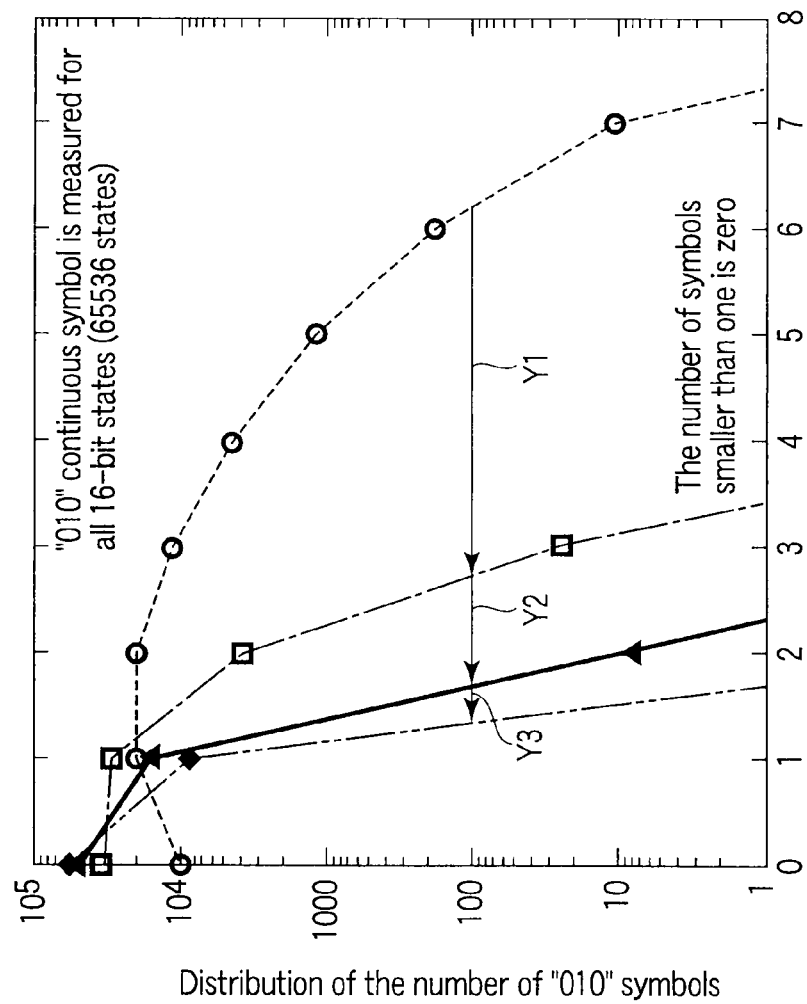
FIG. 29 shows an example of rearrangement of the first to third embodiments.

For example, as shown by an arrow Y1 of FIG. 29, in the case where the frequency of "010" continuous symbols is around 100, the number of worst states in which the "010" continuous symbol is generated can be restrained to about a half or less compared with the comparative example.

The number of "010" continuous symbols in the information bit fed into the adjacent memory cell disturb reduction second-code conversion circuit 104 is always equal to or smaller than the number of "010" continuous symbols in the information bit of the output of the adjacent memory cell disturb reduction second-code conversion circuit 104. Therefore, in any state of the k-bit information bit in the $2^k$ states, the program disturbance or the threshold voltage rising due to the capacitive coupling of the memory cells adjacent in the direction parallel to the data transfer line BL can be restrained even in the worst pattern. Because the increase in code length caused by the addition of the flag bit relative to the information bit length k is restrained up to 4/k, the number of worst states in which the "010" continuous symbol is generated is effectively decreased when the information bit sufficiently becomes at least four bits. Additionally, even if the number of information bits k is increased, the high-speed coding and decoding can be achieved because the number of information bits is increased at most in proportion to the k bits in the coding and decoding. Therefore, the increase in programming threshold voltage caused by the capacitive coupling of the adjacent memory cell is prevented, the electric field of the tunnel insulator is decreased in retaining the charges, and the leakage current through the tunnel insulator is restrained, so that the problem of deteriorating the data retaining characteristic can be prevented. Because the increase in programming threshold voltage can be prevented, the electric field of the inter-poly dielectric film can be restrained between the charge accumulation layer and the control electrode in performing the programming. Therefore, the leakage current can be restrained, the dielectric breakdown can be prevented, and the data retention properties and memory cell reliability can be maintained. Because the program disturbance and the increase in programming threshold voltage caused by the capacitive coupling of the memory cells adjacent in the direction parallel to the data transfer line BL can be prevented in the worst pattern, a threshold voltage separation margin can be ensured between the erasing threshold voltage and the adjacent programming threshold voltage. The threshold voltage separation margin can be ensured, for example, between the programming threshold voltage 1 and the programming threshold voltage 2, and between the programming threshold voltage 2 and the programming threshold voltage 3 of FIG. 2. The increasing bit movement, caused by the program disturbance and the capacitive coupling of the adjacent memory cells, can be prevented in the erasing threshold voltage distribution. In the characteristic after the programming threshold voltage is retained, when the threshold voltage is lowered to generate the overlapping between the threshold distributions like the parts (iv) and (v) of FIG. 2, unfortunately the programming bit is wrongly detected as the erasing bit or the erasing bit is wrongly detected as the programming bit. However, the data memory system of the first embodiment can prevent the problem.

The lower limit of erasing threshold voltage and the upper limit of programming threshold voltage are fixed by the reliability of the inter-poly insulator or tunnel insulator, and it is necessary to narrow the program voltage step in order to narrow the programming threshold voltage distribution. The use of the data memory system of the first embodiment can widely ensure the threshold voltage distribution, widen the programming step, and enhance the programming speed.

(2) The data memory system of the first embodiment has an advantage in a high-speed operation.

In the first embodiment, the BCH code and the RS code are used as the error correcting code. In the BCH code and the RS code, the whole code string including the inspection code is read in the decoding, and the error code and the generation position thereof are computed to perform the error correction. Therefore, from the necessity to perform and supply the correction of the leading-end portion of the code, the error correcting code decoding circuit 103 includes or is connected to one-page buffer in which one code length is stored, that is, the nonvolatile semiconductor device 7 includes or is connected to the page buffer in which one page is stored. From the necessity to read and supply the corrected data at high speed, the page buffer is formed by a volatile memory such as SRAM and a shift register which can read the data at high speed. Therefore, because the second coding sequence in Steps SE4, SE6, and SE8 of the first embodiment and the decoding sequence in Steps SE12 and SE14 can be performed to the information bit copied on the page register, the additional page register circuit area is not required, and the high-speed operation can be realized.

Instead of the BCH code and the RS code, when a so-called separation code is used as the error correcting code, the feature of the second coding of the first embodiment is maintained. In the separation code, the information bit and the inspection bit are separated, and the information bit is included in the code word. This is because the data memory system of the first embodiment has the effect of decreasing the maximum number of "010" continuous symbols in the information bit, and this is the feature which is also retained in the code word in the case of the separation code. Therefore, a majority code may be used instead of the BCH code and the RS code, namely, a cyclic code located on a difference set, which can be decoded by majority logic, may be used. Even in a so-called Low-Density-Parity-Check (LDPC) code, the separation code, in which the information bit is included in the code word while the information bit and the inspection bit are separated, can be used in the first embodiment.

[Second Embodiment (Example Including Counter Circuits 112 and 113)]

Figure 11:
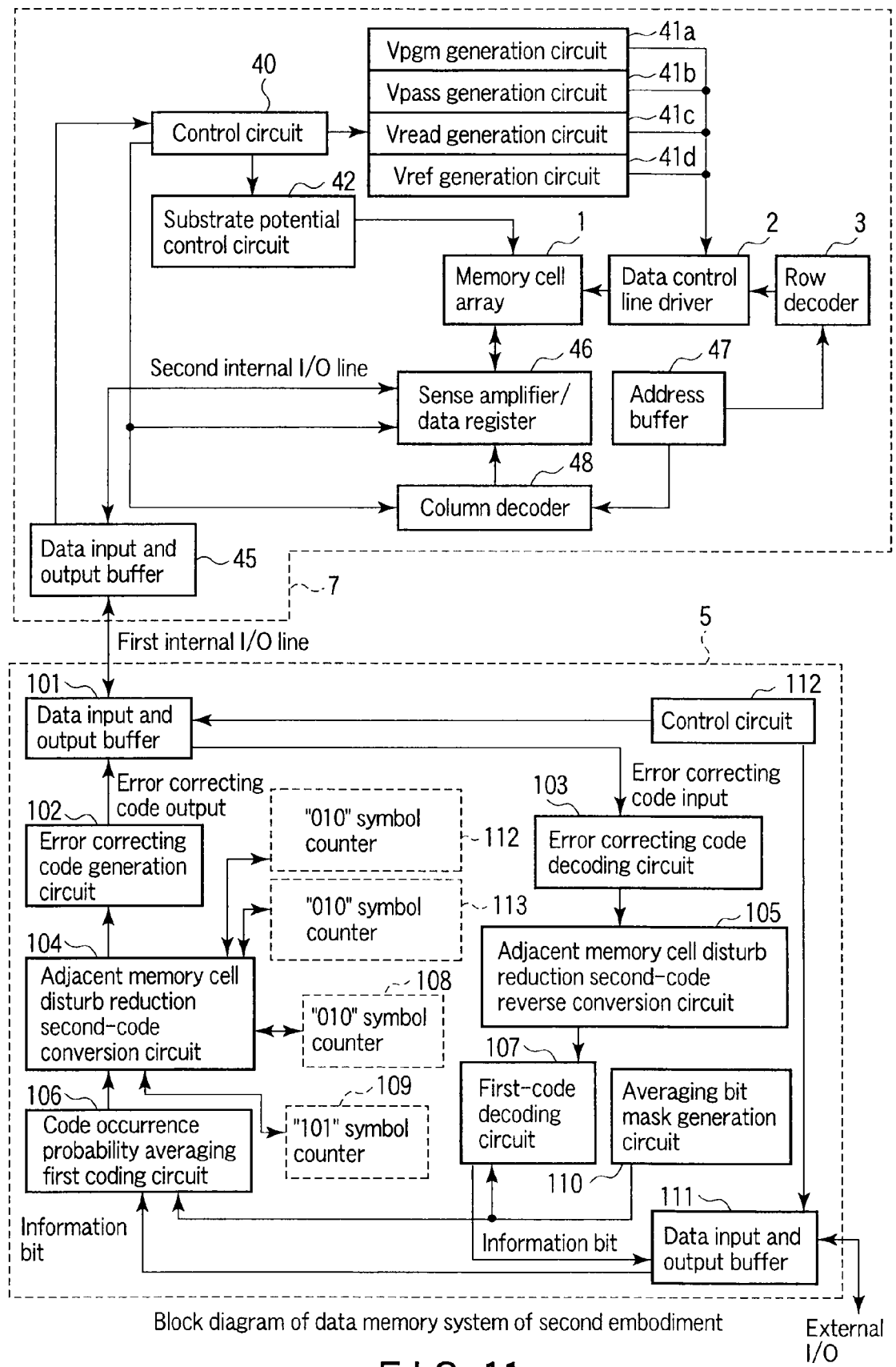
FIG. 11 is a block diagram showing a data memory system according to a second embodiment of the invention.

A data memory system according to a second embodiment of the invention will be described with reference to FIGS. 11 to 14. FIG. 11 is a block diagram showing the data memory system of the second embodiment.

The data memory system of the second embodiment is substantially similar to that of the first embodiment except that the exclusive OR of the information bit and the bit mask of "01010101 . . . 0101" is computed, and the number of "010" continuous symbols of the exclusive OR is counted to make a quantitative comparison determination, thereby securely decreasing the number of "010" continuous symbols of the code bit. In the second embodiment, the same component as the first embodiment is designated by the same numeral, and the detailed description is omitted.

Additionally, as can be seen from the comparison of FIGS. 11 and 4, the first and second embodiments differ from each other in that the data memory system of the second embodiment includes a symbol counter 112 which counts the number of "010" continuous symbols generated in the bit string of the exclusive OR of the k-bit information bit and "01010101 . . . 0101" ("01" is repeatedly generated k-bit times). The data memory system of the second embodiment also includes a symbol counter 113 which counts the number of "010" continuous symbols generated in the bit string of the exclusive OR of the k-bit information bit and "10101010 . . . 1010" ("10" is repeatedly generated k-bit times). Therefore, for the four cases in which the code conversion is performed in Steps SE4 and SE8 of the first embodiment, the number of "010" continuous symbols is previously counted in the information bit to which the code conversion is already performed, and the quantitative comparison is performed to decrease the probability of occurrence of the "010" continuous symbol.

<Sequence of Error Correcting Code of Adjacent Memory Cell Disturb Reduction Second-Code Conversion Circuit>

Figure 12:
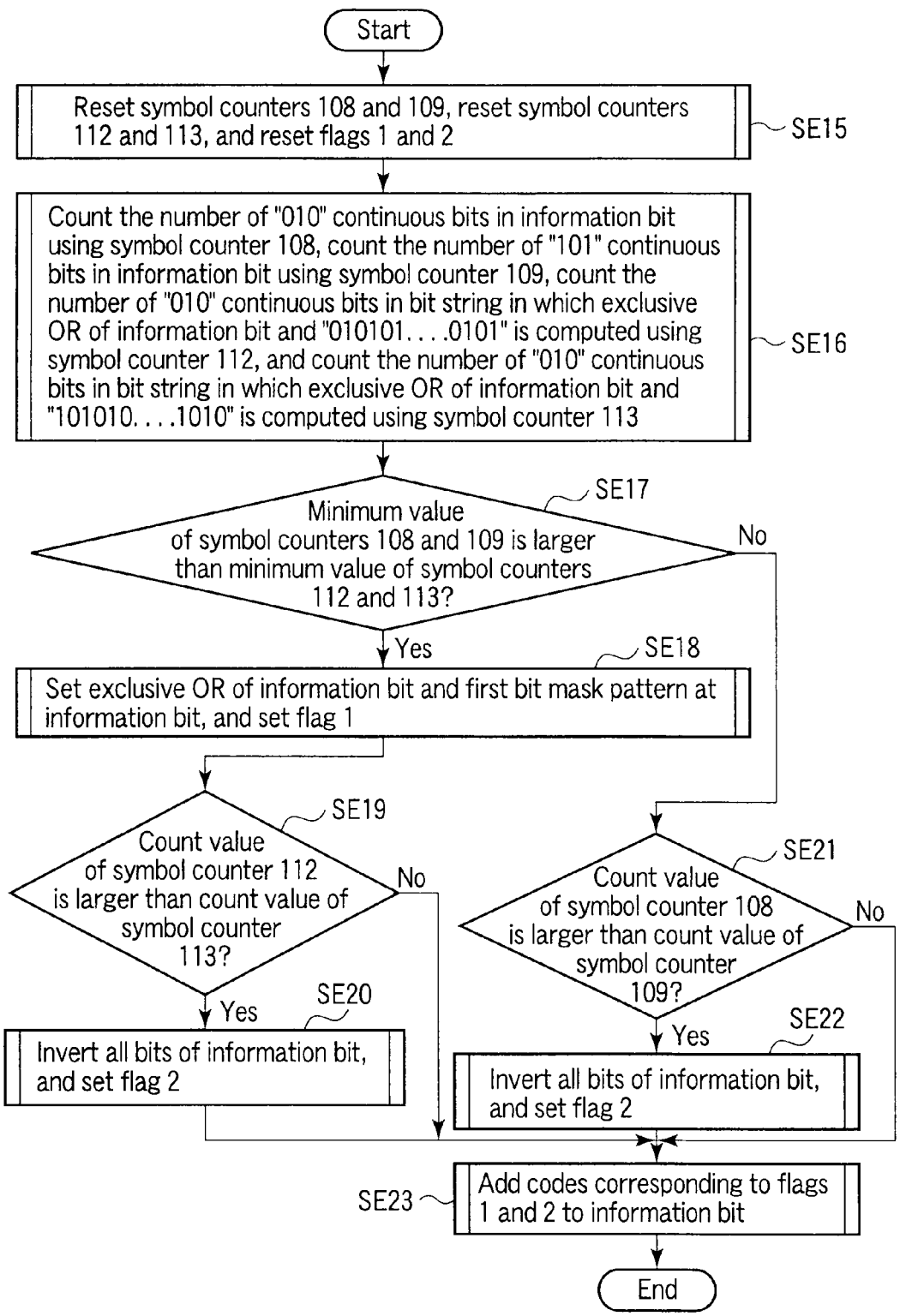
FIG. 12 is a flowchart showing second code conversion of the second embodiment.

FIG. 12 shows a specific sequence of the adjacent memory cell disturb reduction second-code conversion circuit 104 of the second embodiment.

In Step SE15, the adjacent memory cell disturb reduction second-code conversion circuit 104 resets the "010" symbol counter 108, the "101" symbol counter 109, and the symbol counters 112 and 113, and also resets flags 1 and 2. The "010" symbol counter 108 counts the number of "010" continuous symbols in the information bit. The "101" symbol counter 109 counts the number of "101" continuous symbols in the information bit. The flags 1 and 2 indicate coding states.

In Step SE16, the "010" symbol counter 108 counts the number of "010" continuous symbols in the k-bit information bit, and the count value is stored in the "010" symbol counter 108.

The "101" symbol counter 109 also counts the number of "101" continuous symbols in the k-bit information bit, and the count value is stored in the "101" symbol counter 109. The symbol counter 112 counts the number of "010" continuous symbols in the bit string of the exclusive OR of the k-bit information bit and "01010101 . . . 0101" ("01" is repeatedly generated k-bit times), and the count value is stored in the "010" symbol counter 112. The symbol counter 113 counts the number of "010" continuous symbols in the bit string of the exclusive OR of the k-bit information bit and "10101010 . . . 1010" ("10" is repeatedly generated k-bit times), and the count value is stored in the "010" symbol counter 113.

<Configuration of Symbol Counters 112 and 113>

Figure 13:
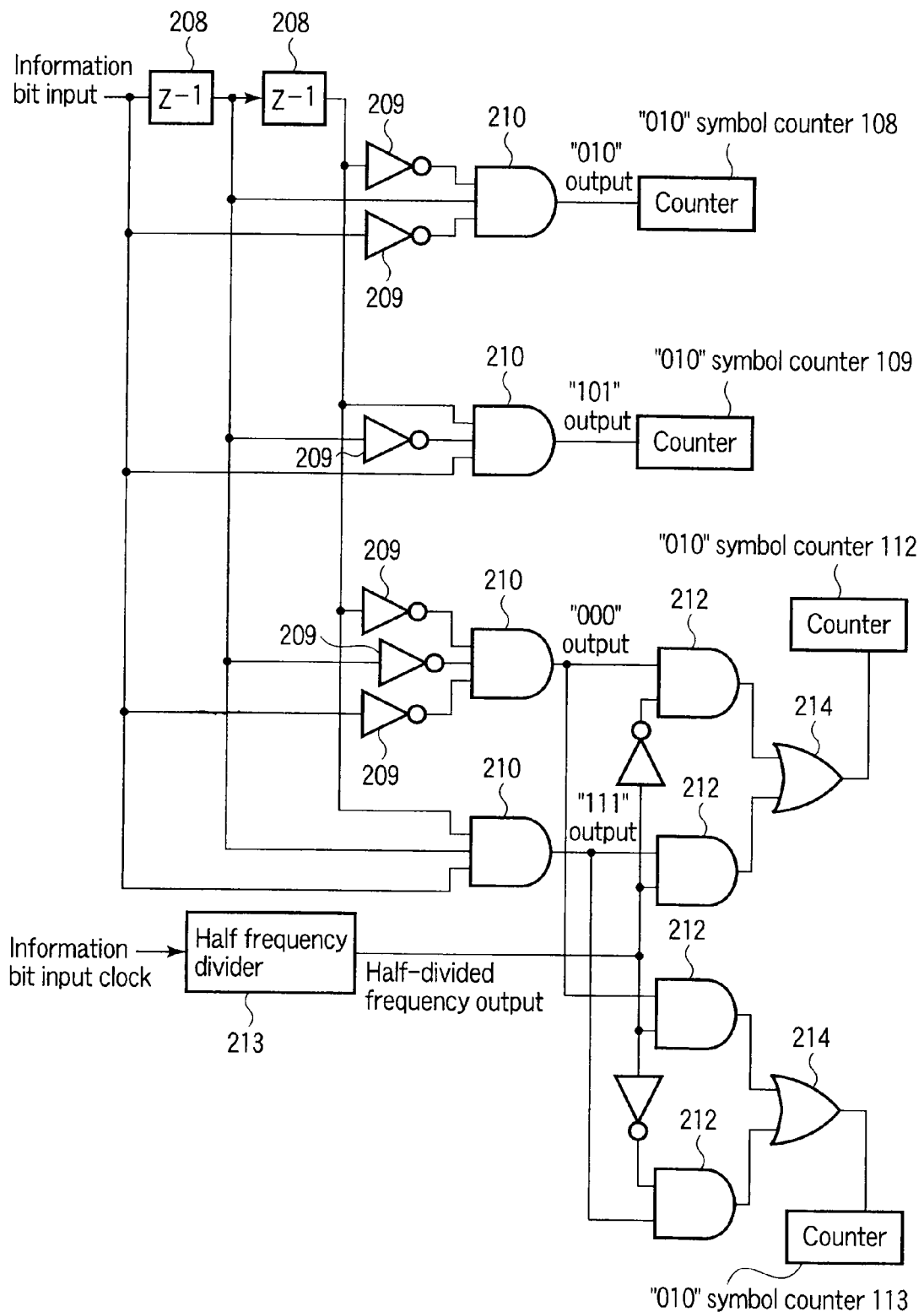
FIG. 13 is an equivalent circuit diagram showing a configuration example of a symbol counter of the second embodiment.
Figure 14:
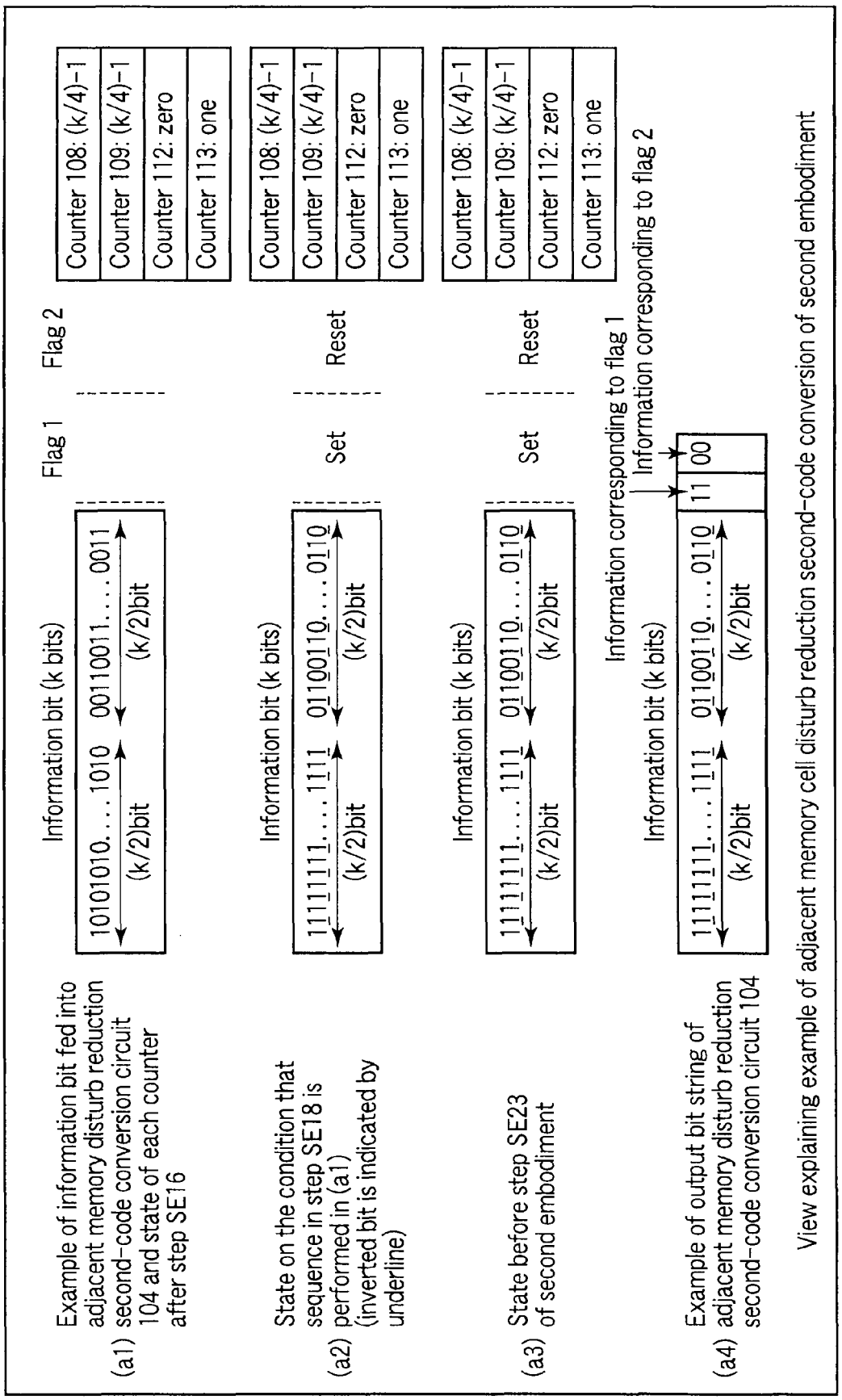
FIG. 14 shows an example of the second code conversion of the second embodiment.

FIG. 13 shows configurations of the symbol counters 112 and 113 of the second embodiment. Referring to FIG. 13, the symbol counters 112 and 113 can be realized such that the information bit is fed into the shift register to combine a "000" detection circuit and a "111" detection circuit. In FIG. 13, the numeral 212 designates a two-input AND circuit and the numeral 214 designates a two-input OR circuit. In FIG. 13, because the circuit connected to the symbol counters 108 and 109 is identical to the circuit of FIG. 10, the description is omitted. It is assumed that the series of information bits is fed in time series through an information bit input. In the circuit of FIG. 13 which is indicated by the "000" output and connected to the symbol counter 112, the "000" output is changed from "L" to "H" in the case of the unit time in which the "000" continuous symbol is sequentially fed, and the "000" continuous symbol becomes "L" in other cases. The "000" continuous symbol corresponds to the exclusive OR of the information bit of the "010" continuous symbol and the bit mask "01010101 . . . 0101". In the circuit of FIG. 13 which is indicated by the "111" output and connected to the symbol counter 112, the "111" output is changed from "L" to "H" in the case of the unit time in which the "111" continuous symbol is sequentially fed, and the "111" continuous symbol becomes "L" in other cases. The "111" continuous symbol corresponds to the exclusive OR of the information bit of the "010" continuous symbol and the bit mask "01010101 . . . 0101". When the frequency of the clock which imparts the information bit is divided by a half frequency divider 213, the "1" bit and the "0" bit are supplied at the even-numbered and the odd-number x-th bits of the information bit, respectively. Therefore, the input electrically connected to the symbol counter 112 becomes inclusive OR of (logic of the "000" output is "H" and the x-th bit is the odd number) and (logic of the "111" output is "H" and the x-th bit is the even number). When the "010" continuous symbol exists in the bit string of exclusive OR of the information bit and "01010101...0101", the input electrically connected to the symbol counter 112 becomes "H" in the unit time the last symbol of the three continuous symbols is fed, and the input becomes "L" in other cases. On the other hand, the input electrically connected to the symbol counter 113 becomes inclusive OR of (logic of the "111" output is "H" and the x-th bit is the odd number) and (logic of the "000" output is "H" and the x-th bit is the even number). When the "010" continuous symbol exists in the bit string of exclusive OR of the information bit and "10101010 . . . 1010", the input electrically connected to the symbol counter 113 becomes "H" in the unit time the last symbol of the three continuous symbols is fed, and the input becomes "L" in other cases. Therefore, the outputs of the two-input OR circuits 214 are synchronized with the unit time of the information bit input, a trigger is activated to start the counting when a logical value of the inclusive OR output is stabilized in the unit time, so that the symbol counter 112 can count the number of "010" continuous symbols in the bit string of the exclusive OR of the k-bit information bit and "01010101 . . . 0101" ("01" is repeatedly generated k-bit times) and the symbol counter 113 can count the number of "010" continuous symbols in the bit string of the exclusive OR of the k-bit information bit and "10101010 . . . 1010" ("10" is repeatedly generated k-bit times). Because the symbol counter of FIG. 13 can be formed by a well-known binary counter, the detailed description of the symbol counter is omitted.

In Step SE17 of FIG. 12, the adjacent memory cell disturb reduction second-code conversion circuit 104 determines whether or not a minimum value of the count values of the symbol counters 108 and 109 is larger than a minimum value of the count values of the symbol counters 112 and 113.

When the minimum value of the count values of the symbol counters 108 and 109 is larger than the minimum value of the count values of the symbol counters 112 and 113 (YES in Step SE17), in Step SE18, the adjacent memory cell disturb reduction second-code conversion circuit 104 computes the exclusive OR of the information bit and a first bit mask pattern "01010101 . . . 0101" ("01" is repeatedly generated k-bit times), and replaces the information bit with the exclusive OR to set the flag 1.

In Step SE19, the adjacent memory cell disturb reduction second-code conversion circuit 104 determines whether or not the count value of the symbol counter 112 is larger than the count value of the symbol counter 113.

When the count value of the symbol counter 112 is larger than the count value of the symbol counter 113, in Step SE20, the adjacent memory cell disturb reduction second-code conversion circuit 104 inverts all the bits of the k-bit information bit, that is, the "0" bit is changed to the "1" bit and the "1" bit is changed to the "0" bit, and the adjacent memory cell disturb reduction second-code conversion circuit 104 sets the flag 2.

In Step SE23, the adjacent memory cell disturb reduction second-code conversion circuit 104 adds codes corresponding to the flags 1 and 2 to the information bit. On the other hand, when the minimum value of the count values of the symbol counters 108 and 109 is not larger than the minimum value of the count values of the symbol counters 112 and 113 (NO in Step SE17), in Step SE21, the adjacent memory cell disturb reduction second-code conversion circuit 104 determines whether or not the count value of the "010" symbol counter 108 is larger than the count value of the "101" symbol counter 109.

When the count value of the "010" symbol counter 108 is larger than the count value of the "101" symbol counter 109, in Step SE22, the adjacent memory cell disturb reduction second-code conversion circuit 104 inverts all the bits of the k-bit information bit, that is, the "0" bit is changed to the "1" bit and the "1" bit is changed to the "0" bit, and the adjacent memory cell disturb reduction second-code conversion circuit 104 sets the flag 2.

In Step SE23, the adjacent memory cell disturb reduction second-code conversion circuit 104 adds the codes corresponding to the flags 1 and 2 to the information bit.

Therefore, for the four cases in which the code conversion is performed in Steps SE4 and SE8 of the first embodiment, the number of "010" continuous symbols is previously counted in the information bit to which the code conversion is already performed, and the quantitative comparison is performed to decrease the probability of occurrence of the "010" continuous symbol. The method for decoding the second code of the second embodiment is similar to that of the first embodiment, so that the description is omitted.

As shown in (iii) and (iv) of FIG. 2 of the comparative example, in the pattern in which disadvantageously the erasing threshold voltage is raised by the increase in threshold voltage of the adjacent memory cell, the memory cell M1$a$($\alpha$) is in the erasing state, and the memory cells M1$b$($\beta$) and M1$b'$($\gamma$) adjacent to the memory cell M1$a$($\alpha$) in the direction parallel to the data transfer line BL are in the programming state. Therefore, the bit string of the memory cells M1$a$(x), M1$b$($\beta$) and M1$b'$($\gamma$) corresponds to the "010" continuous symbol. As shown in the parts (a1) to (a4) of FIG. 9A, in the configuration of the comparative example in which the sequence of the adjacent memory cell disturb reduction second-code conversion circuit 104 is eliminated, ((k/2)–1) "010" continuous symbols are included in the k-bit sequence of "01010101 . . . 0101", the problem of raising the erasing threshold voltage due to the increase in threshold voltage of the adjacent memory cell is probably generated at the ((k/2)–1) "010" continuous symbols. For example, in the memory cell M1$a$($\alpha$), assuming that p0 is a probability P0 of wrongly recognizing the erasing bit as the programming bit when the erasing threshold overlaps the programming threshold shown by the part (v) of FIG. 2, the defect of ((k/2)–1)×p0 is generated when the probability p0 is sufficiently smaller than 1.

FIG. 14A shows an example in which the probability of generating the "010" continuous symbol can be reduced in the second embodiment rather than the first embodiment.

As shown in FIG. 14A, in the data pattern fed into the adjacent memory cell disturb reduction second-code conversion circuit 104 of second embodiment, ((k/4)–1) which is the number of "010" continuous symbols generated is stored in the symbol counter 108, ((k/4)–1) which is the number of "101" continuous symbols generated is stored in the symbol counter 109, zero which is the number of "010" continuous symbols in the bit string of the exclusive OR of the information bit and "01010101 . . . 0101" ("01" is repeatedly generated k-bit times) is stored in the symbol counter 112, and one which is the number of "010" continuous symbols in the bit string of the exclusive OR of the information bit and "10101010 . . . 1010" ("10" is repeatedly generated k-bit times) is stored in the symbol counter 113. In the sequence of the adjacent memory cell disturb reduction second-code conversion circuit 104 of the first embodiment, the number of "010" continuous symbols generated is kept at (k/4)–1 at the output of the adjacent memory cell disturb reduction second-code conversion circuit 104. On the other hand, in the sequence of the adjacent memory cell disturb reduction second-code conversion circuit 104 of the second embodiment, the number of "010" continuous symbols generated can be decreased to zero at the output of the adjacent memory cell disturb reduction second-code conversion circuit 104. The effects (1) and (2) of the first embodiment can also be obtained in the second embodiment.

In the comparison among the symbol counters of the second embodiment, the numbers of "010" continuous symbols are compared more accurately as compared to Step SE3 for the four cases which are identical to those of the first embodiment. Therefore, as shown in FIGS. 9A and 9C, even if the ((k/2)–1) "010" continuous symbols of the comparative example are generated in the worst case, the number of "010" continuous symbols can clearly be restrained to (value in which (k/4) is rounded up to the nearest integer)–1 or less. For example, in the memory cell M1$a$($\alpha$), assuming that p0 is a probability of wrongly recognizing the erasing bit as the programming bit when the erasing threshold voltage overlaps the programming threshold voltage shown by the part (v) of FIG. 2, the probability ((k/2)–1)×p0 of generating the defect of the comparative example can be lowered to ((value in which (k/4) is rounded up to the nearest integer)–1)×p0 when the probability p0 is sufficiently smaller than 1. FIG. 9E shows an example of the worst pattern of the bit string in which the largest number of "010" continuous symbols occurs in the second embodiment.

[Third Embodiment (Example Further Including Page Buffer 114)]

Figure 15:
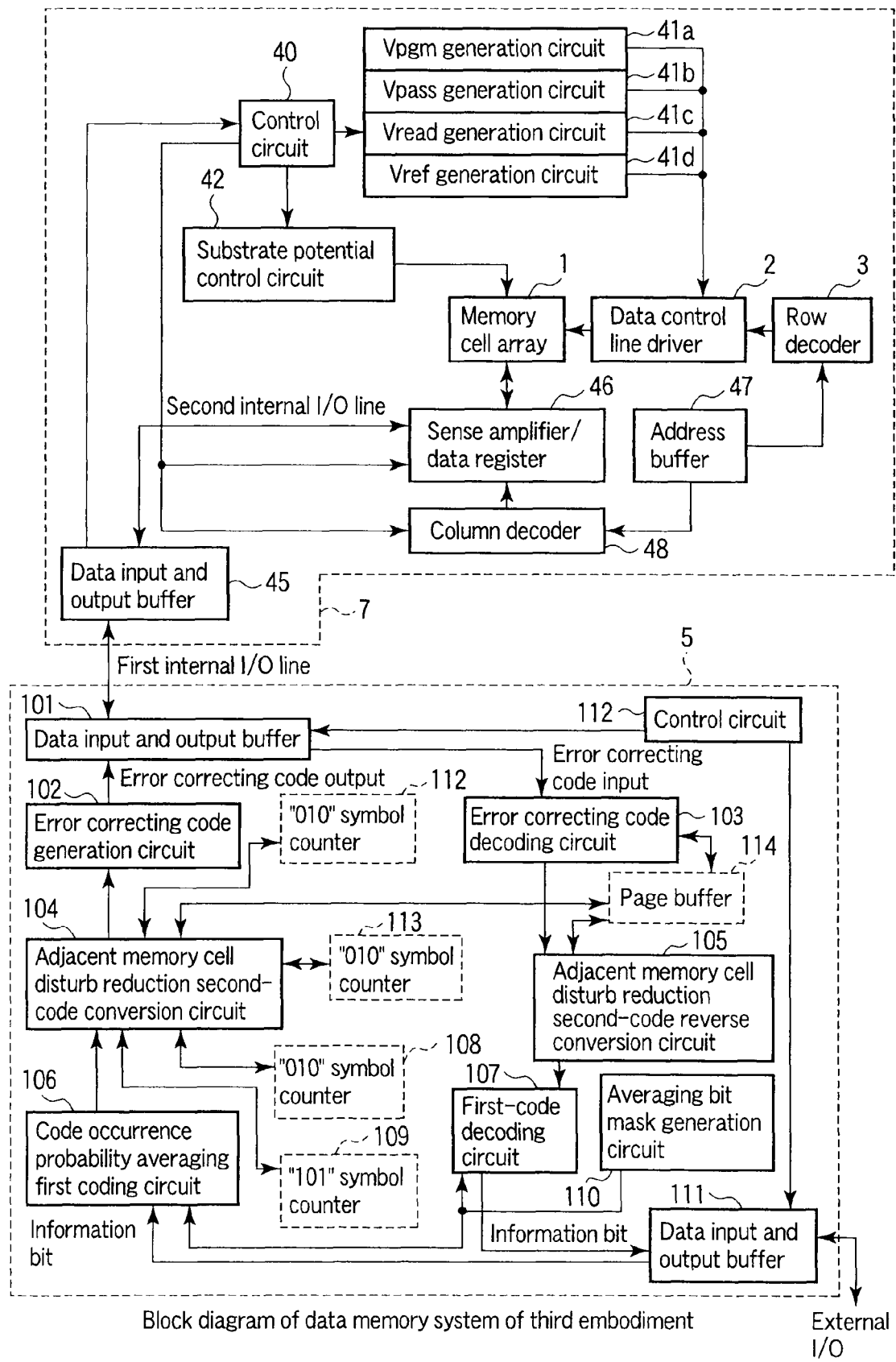
FIG. 15 is a block diagram showing a data memory system according to a third embodiment of the invention.

A data memory system according to a third embodiment of the invention will be described with reference to FIGS. 15 to 19. FIG. 15 shows an entire configuration of the data memory system of the third embodiment.

In the third embodiment, the probability of generating the "010" continuous symbol can further be reduced compared with the second embodiment. In the third embodiment, the same component as the first and second embodiments is designated by the same numeral, and the detailed description is omitted. In the following descriptions and drawings, it is assumed that the k-bit information bit is supplied or fed in time series, a bit which has an even number when counted from the beginning of the time series is simply referred to as even-numbered bit, and a bit which has an odd number when counted from the beginning of the time series is simply referred to as odd-numbered bit.

As is clear from the comparison of FIG. 11 and FIG. 15, the data memory system of the third embodiment differs from the data memory system of the second embodiment in that the data memory system of the third embodiment includes a page buffer 114 which rearranges the even-numbered bit and the odd-numbered bit of the information bit. In the third embodiment, in addition to the second coding of the second embodiment, the information bit is divided into an odd-numbered bit and an even-numbered bit using the page buffer 114. After the odd-numbered information bit is sequentially supplied to the error correcting code generation circuit 102, the even-numbered information bit is sequentially rearranged and supplied to the error correcting code generation circuit 102. In the decoding, the adjacent memory cell disturb reduction second-code reverse conversion circuit 105 reversely rearranges the even-numbered information bit to decrease the number of "010" continuous symbols. In the third embodiment, it is assumed that the total number of k-bit information bits is the even number. In the usual NAND input and output, and in the data transmission through the first internal I/O line of FIG. 15, a practical issue is not generated because the data input and output is performed in units of an integral multiple of one byte (=eight bits). In the case of the odd-numbered bit, the extended code can be formed by the method described in the first embodiment.

The page buffer 114 which rearranges the information bit is connected to the adjacent memory cell disturb reduction second-code conversion circuit 104 which reduces the disturbance of the adjacent memory cell or the second-code reverse conversion circuit 105 which reduces the disturbance of the adjacent memory cell. The page buffer 114 includes at least page buffers whose number of pieces is equal to the number of k information bits. For example, the flip-flop of the n-bit shift register used in the error correcting code decoding circuit 103 is shared by the k page buffers, thereby the circuit scale can be decreased. In the case where the need for decreasing the circuit scale does not arise, the page buffers may be formed independently of the n-bit shift registers used in the error correcting code decoding circuit 103.

<Specific Circuit of Page Buffer 114>

FIGS. 16A and 16B show specific examples of the circuit of the page buffer 114 in the third embodiment. For the purpose of easy understanding, in FIG. 16A, the information bit is divided into the odd-numbered bit and the even-numbered bit, and a circuit portion which supplies the data to the error correcting code generation circuit 102 is omitted. FIG. 16B shows the circuit portion which supplies the data to the error correcting code generation circuit 102.

The transistors Q2 and Q3 and the interconnection of FIG. 16A are applied to the corresponding portion of FIG. 16B to form the whole of the circuit configuration. The NMOS transistor is used as the transistors Q1 to Q8 by way of example. When the input is inverted, the PMOS transistor may be used as the transistors Q1 to Q8, or a later-mentioned bidirectional switch may also be used as the transistors Q1 to Q8.

In FIG. 16A, a part of the n-bit shift registers used in the error correcting code decoding circuit 103 is assumed, k-bit D type flip-flops 208a and 208b are connected in series with the transistor Q1 interposed therebetween, and the k-bit shift registers whose number of pieces is equal to the number of information bits are formed. At this point, the D-type flip-flops 208a and 208b are used by way of example. Alternatively, the circuit may be formed by a latch circuit or other types of the flip-flop circuits. In this case, an edge trigger type flip-flop is used as the D-type flip-flop. In the edge trigger type flip-flop, at a rising edge from the "L" state (for convenience sake, 0V) to the "H" state (for convenience sake, Vcc) in a clock input indicated by a mark "Δ", the Q output is fixed by data fed into the D input, and then the output is not changed even if the clock input is kept at the "H" or "L" state or even if the clock input is changed from the "H" state to the "L" state. Gate electrodes of the transistors Q1 are commonly connected to an input s1. When the input s1 is changed from a cut-off state (0V) to a conduction state (Vcc), the output of the series-connected (i+1)-th flip-flop 208a or 208b is connected to the input of the i-th flip-flop 208a or 208b (i is an integer of 1 to (k−1)). That is, the edge trigger type flip-flop is operated as the k-bit shift register as a whole. From the viewpoint of operation as the shift register, a suffix of the bit which is fed and shifted first is allocated to the flip-flop having the small number, that is, the flip-flops are designated in the order by FF1, FF2, FF(k/2), FF(k/2+1), . . . , and FF(k) in FIGS. 16A and 16B. Although the flip-flops FF1, FF2, . . . , and FF(k/2) and the flip-flops FF(k/2+1), . . . , and FF(k) are shown in a folded-back manner in FIG. 16B, the flip-flops of FIG. 16B have the same connection circuit as the flip-flops of FIG. 16A.

A bidirectional switch is formed by an NMOS transistor 215, a PMOS transistor 216, and an inverter 209. In the bidirectional switch, the current terminals of the transistors 215 and 216 become the conduction state in the case where the data output control input 1 or 2 is in the "H" state, and the current terminals of the transistors 215 and 216 become the cut-off state in the case where the data output control input 1 or 2 is in the "L" state. The bidirectional switch has an advantage that the voltage can be transferred between the current terminals of the NMOS transistor 215 and PMOS transistor 216 without the threshold voltage lowering. In the case where the problem of lowering the output caused by the threshold voltage lowering is not generated, the PMOS transistor 216 may be replaced with the NMOS transistor. The output of the flip-flop FF1 is fed-back to the input of the flip-flop FF(k) by an element 217 which computes the exclusive OR of the output of the FF1 and the bit mask string input, that is, a so-called Linear Feedback Shift Resistor (LFSR) is formed. Therefore, the pieces of k-bit information retained in the flip-flops FF1, FF2, . . . , and FF(k) can sequentially be supplied in First-In-First-Out (FIFO) according to the clock input by the k-stage shift register. FIG. 17A shows the operation of the circuit. The input s1 is set at Vcc ("H"), and inputs /s1 and p1 and the bit mask string input are set at 0V ("L") in order that the D-type flip-flop is operated as the series of k-bit shift registers.

In the case where the data is stored in the D-type flip-flop, the data output control inputs 1 and 2 are set at "L" such that the output of the flip-flop 208 is not supplied to the data input and output line. The first-bit digital data Vcc ("H") or 0V ("L") is imparted to the data input and output (I/O) line, and the clock inputs φ1 and φ2 are changed from the "L" state to the "H" state. Therefore, the first-bit digital data is retained by the leftmost flip-flop FF(k) of FIG. 16A. Then the second digital data Vcc ("H") or 0V ("L") is imparted to the data input and output (I/O) line, and the clock inputs φ1 and φ2 are changed from the "L" state to the "H" state. Therefore, the first-bit digital data is transferred to and retained in the second leftmost flip-flop FF(k−1) of FIG. 16A, and the second digital data is retained in the leftmost flip-flop FF(k). Then, the k [bit] pieces of digital data are sequentially imparted to the data input and output (I/O) line, and the clock inputs φ1 and φ2 are imparted. The pieces of digital data are sequentially retained in the flip-flops from the right side in FIG. 16A, and the k [bit] pieces of data can be retained.

In reading the data from the adjacent memory cell disturb reduction second-code conversion circuit 104, the data output control input 1 is set at "H", the data output control input 2 and the bit mask string input are set at "L", and the output of the rightmost flip-flop FF1 is supplied to the data input and output line. Therefore, the same data as the first bit digital data is supplied to the data input and output line.

The clock inputs φ1 and φ2 are changed from the "L" state to the "H" state. Therefore, because one-bit data is transferred to and retained in the flip-flop from the left to the right, the same data as the first bit digital data is supplied to the data input and output line. The clock inputs φ1 and φ2 are changed from the "L" state to the "H" state (k−1) times, and the data is sequentially supplied to the data input and output line from the right flip-flop in FIG. 16A, which allows the k pieces of data to be supplied. Thus, the k-bit data can be sequentially stored and read in the stored order by the circuit of FIG. 16A.

On the other hand, in FIG. 16A, the gate electrodes of the transistors Q2 and Q3 are commonly connected to the input /s1. When the gate input /s1 of the transistor Q3 is changed from the cut-off state (0V) to the conduction state (Vcc), the transistor Q3 can electrically connect the odd-numbered D-type flip-flops 208b of the k-bit shift register in series to form (k/2) shift registers. Specifically, a (2i+1)-th output 208b is connected to a (2i−1)-th input 208b through the transistor Q3 (i is an integer of 1 to (k/2)−1). When the gate input /s1 of the transistor Q2 is changed from the cut-off state (0V) to the conduction state (Vcc), the transistor Q2 can electrically connect the even-numbered D-type flip-flops 208a of the k-bit shift register in series to form (k/2) shift registers. Specifically, a (2i+2)-th output 208a is connected to a 21-th input 208a (i is an integer of 1 to (k/2)−1).

The output of the flip-flop FF1 is fed-back to the input of the flip-flop FF(k−1) by the element 217 which computes the exclusive OR of the output of the flip-flop FF1 and the bit mask string input, that is, the so-called Linear Feedback Shift Resistor (LFSR) is formed. In the case where the gate input /s1 is set at Vcc ("H"), the transistor Q4 connects the input of the flip-flop FF(k−1) to the data input and output (I/O) line. Therefore, the pieces of (k/2)-bit information retained in the flip-flops FF1, FF3, FF5, . . . , and FF(k−1) can sequentially be supplied in First-In-First-Out (FIFO) according to the clock input φ2 by the (k/2)-stage shift register.

The output of the flip-flop FF2 is fed-back to the input of the flip-flop FF(k) by the element 217 which computes the exclusive OR of the output of the flip-flop FF2 and the bit mask string input, that is, the so-called Linear Feedback Shift Resistor (LFSR) is formed. Therefore, the pieces of (k/2)-bit information retained in the flip-flops FF2, FF4, FF6, . . . , and FF(k) can sequentially be supplied in First-In-First-Out (FIFO) according to the clock input φ1 by the (k/2)-stage shift register. The pieces of (k/2)-bit information can independently be read and stored while the even-numbered bit and the odd-numbered bit are not mixed.

Figure 17B:
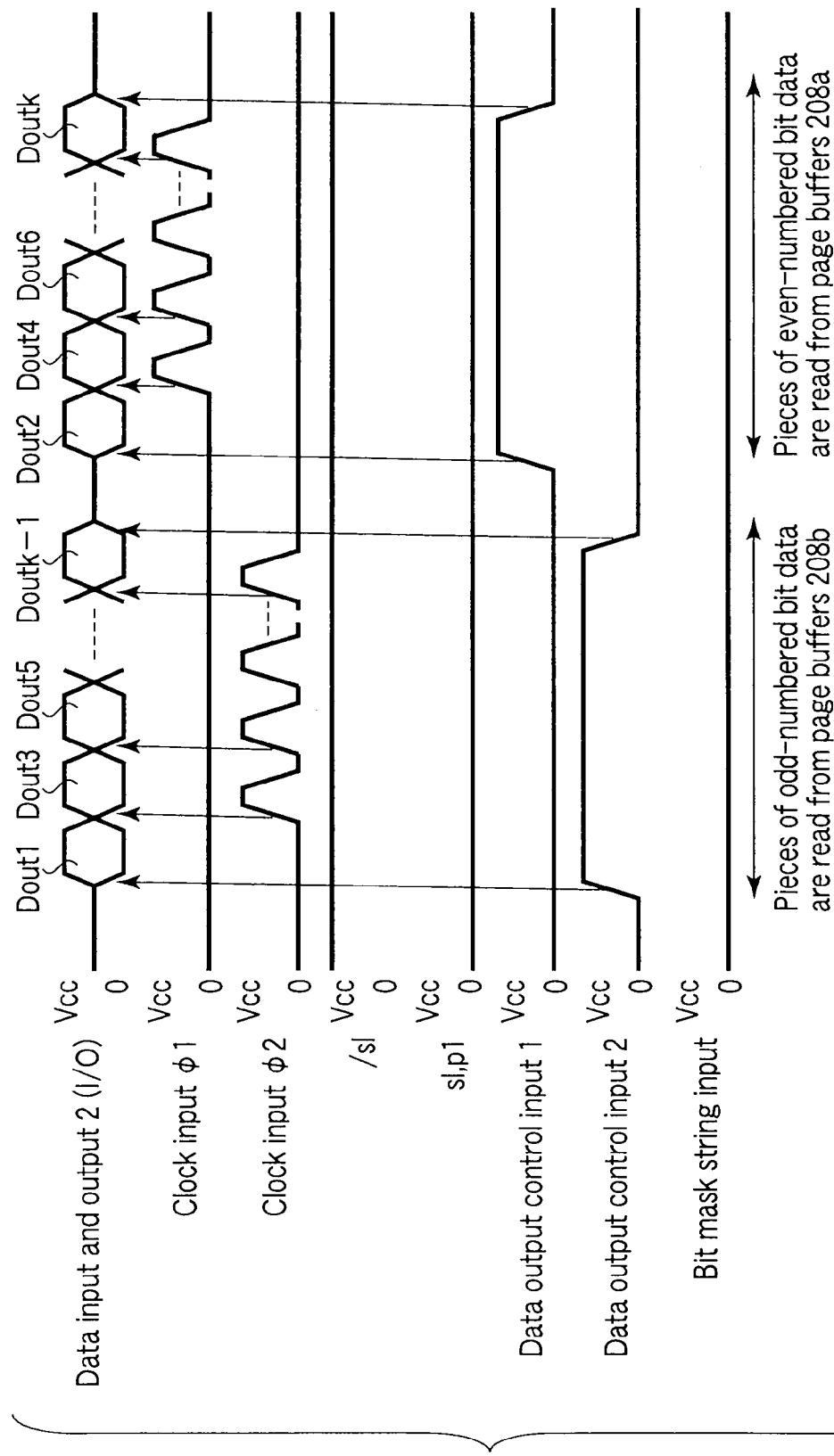
FIG. 17B is a timing chart showing a formation example of the page buffer of the third embodiment.

FIGS. 17B and 17C show reading and programming operations of the circuit. The input /s1 is set at Vcc ("H"), and the inputs s1 and p1 and the bit mask string input are set at 0V ("L") in order that the D-type flip-flop is operated as the series of (k/2)-bit shift registers.

At first the programming operation of FIG. 17C will be described. In the case where the odd-numbered bit data is stored in the D-type flip-flop, the data output control inputs 1 and 2 are set at "L" such that the output of the flip-flop 208 is not supplied to the data input and output line. The first-bit digital data Vcc ("H") or 0V ("L") is imparted to the data input and output (I/O) line, and then the clock input φ2 is changed from the "L" state to the "H" state. Therefore, the first-bit digital data (corresponding to the first bit) is retained by the second leftmost flip-flop FF(k−1) of FIG. 16A. Then the second digital data Vcc ("H") or 0V ("L") (corresponding to the third bit) is imparted to the data input and output (I/O) line, and the clock input φ2 is changed from the "L" state to the "H" state. Therefore, the first-bit digital data is transferred to and retained in the fourth leftmost flip-flop FF(k−3) of FIG. 16A, and the second digital data is retained in the second leftmost flip-flop FF(k−1). Then the pieces of digital data are sequentially imparted to the data input and output (I/O) line up to (k−1) [bit], and the clock input φ2 is imparted. Therefore, the pieces of odd-numbered digital data are sequentially retained in the flip-flops at intervals of two flip-flops of FIG. 16A, and the (k/2) [bit] pieces of data can be retained.

In the case where the even-numbered bit data is stored in the D-type flip-flop, the data output control inputs 1 and 2 are set at "L" such that the output of the flip-flop 208 is not supplied to the data input and output line. The first-bit digital data Vcc ("H") or 0V ("L") is imparted to the data input and output (I/O) line, and the clock input φ1 is changed from the "L" state to the "H" state. Therefore, the first-bit digital data (corresponding to the second bit) is retained by the leftmost flip-flop FF(k) of FIG. 16A. Then the second digital data Vcc ("H") or 0V ("L") (corresponding to the fourth bit) is imparted to the data input and output (I/O) line, and the clock input φ1 is changed from the "L" state to the "H" state. Therefore, the first-bit digital data is transferred to and retained in the third leftmost flip-flop FF(k−2) of FIG. 16A, and the second digital data is retained in the leftmost flip-flop FF(k). Then the pieces of digital data are sequentially imparted to the data input and output (I/O) line up to k [bit], and the clock input φ1 is imparted. Therefore, the pieces of even-numbered digital data are sequentially retained in the flip-flops at intervals of two flip-flops of FIG. 16A, and the (k/2) [bit] pieces of data can be retained.

The reading operation of FIG. 17B will be described below. In reading the odd-numbered bit data from the adjacent memory cell disturb reduction second-code conversion circuit 104, the data output control input 2 is set at "H", the data output control input 1 is set at "L", and the output of the rightmost flip-flop FF1 is supplied to the data input and output line. Therefore, the same data as the first-bit digital data of the odd-numbered bit is supplied to the data input and output line. The clock input φ2 is changed from the "L" state to the "H" state. Therefore, the output of the flip-flop FF3 is transferred to and retained in the flip-flop FF1, and the pieces of odd-numbered bit data are sequentially transferred to and retained in the flip-flops from the left to the right. Accordingly, the same data as the second-bit digital data (corresponding to the third bit) of the odd-numbered bit is supplied to the data input and output line. The clock input φ2 is changed from the "L" state to the "H" state (k/2−1) times, and the data is sequentially supplied to the data input and output line from the right flip-flop at intervals of two flip-flops in FIG. 16A, which allows the (k/2) pieces of odd-numbered bit data to be supplied. At this point, because the clock input φ1 is not changed, the even-numbered bit data is unchanged and retained.

On the other hand, in reading the even-numbered bit data from the adjacent memory cell disturb reduction second-code conversion circuit 104, the data output control input 1 is set at "H", the data output control input 2 is set at "L", and the output of the second rightmost flip-flop FF2 is supplied to the data input and output line. Therefore, the same data as the first-bit digital data of the even-numbered bit is supplied to the data input and output line. The clock input φ1 is changed from the "L" state to the "H" state. Therefore, the output of the flip-flop FF4 is transferred to and retained in the flip-flop FF2, and the pieces of even-numbered bit data are sequentially transferred to and retained in the flip-flops from the left to the right. Accordingly, the same data as the second-bit digital data (corresponding to the fourth bit) of the even-numbered bit is supplied to the data input and output line. The clock input φ1 is changed from the "L" state to the "H" state (k/2−1) times, and the data is sequentially supplied to the data input and output line from the right flip-flop at intervals of two flip-flops, which allows the (k/2) pieces of even-numbered bit data to be supplied. At this point, because the clock input φ2 is not changed, the odd-numbered bit data is unchanged and retained.

The left of FIG. 17D shows a method, in which the exclusive OR of the odd-numbered bit data string retained in the flip-flop 208b and the bit mask "01010101 . . . 0101" is computed and the data of the exclusive OR is stored again in the flip-flop 208b while being supplied. In this case, the input pulse "01010101 . . . 0101" which becomes the bit mask is fed into the bit mask string input in synchronization with the clock input.

Figure 17E:
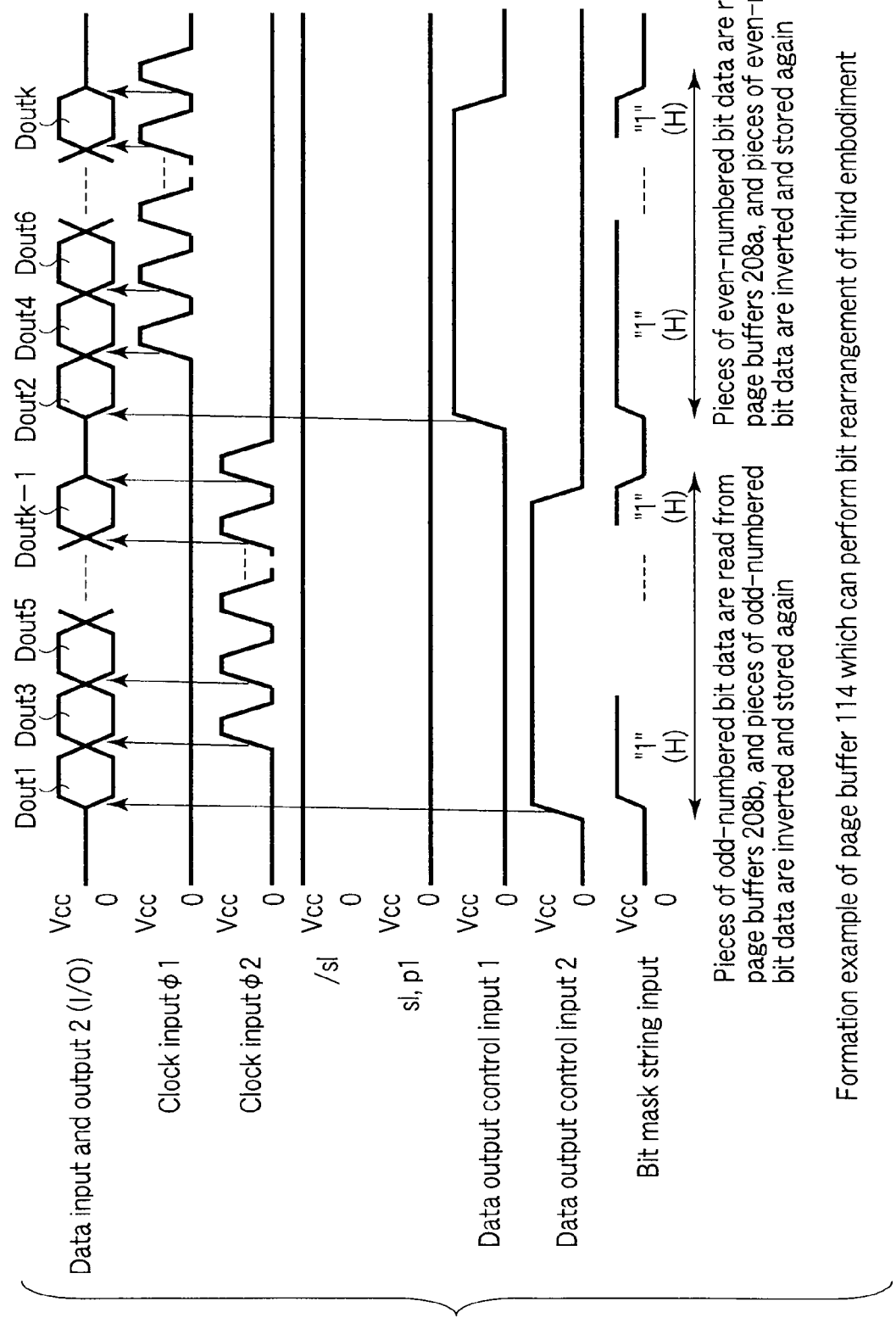
FIG. 17E is a timing chart showing a formation example of the page buffer of the third embodiment.

The data output control input 2 is set at "H", and the data output control input 1 is set at "L". The exclusive OR element 217 computes the exclusive OR of the output of the rightmost flip-flop FF1 and the first bit "0" of the bit mask string input and supplies the exclusive OR to the data input and output line. Therefore, the same data as the first-bit digital data of the odd-numbered bit is supplied to the data input and output line. The clock input φ2 is changed from the "L" to the "H" state. Therefore, the output of the flip-flop FF3 is transferred to and retained in the flip-flop FF1, and the pieces of odd-numbered bit data are sequentially transferred to and retained in the flip-flops from the left to the right. Accordingly, the exclusive OR element 217 computes the exclusive OR of the output of the rightmost flip-flop FF1 and the second bit "1" of the bit mask string input and supplies the exclusive OR to the data input and output line. Therefore, the inverted data of the second-bit digital data (corresponding to the third bit) is supplied to the data input and output line. Then the clock input φ2 are changed from the "L" state to the "H" state (k/2−1) times, and the data is sequentially supplied to the data input and output line from the right flip-flop at intervals of two flip-flops in FIG. 16A, thereby sequentially supplying the exclusive ORs of the first to (k−1)-th odd-numbered bits and the first to (k/2)-th bit mask string inputs, respectively. Finally the (k/2)-time clock input φ2 is changed from the "L" to the "H" state, whereby the exclusive ORs of the first to (k−1)-th odd-numbered bits and the first to (k/2)-th bit mask string inputs are stored again in the flip-flops FF1, FF3, FF5, . . . , and FF(k−1). At this point, because the clock input φ1 is not changed, the even-numbered bit data is unchanged and retained. Although the pattern "01010101 . . . 0101" is used as the bit mask string input by way of example, other patterns may be used. For example, the use of "11111111 . . . 1111" can easily realize the method for storing the inverted data of the odd-numbered bit data string retained in the flip-flop 208b again while supplying the inverted data as shown in the left of FIG. 17E.

The right of FIG. 17D shows a method, in which the exclusive OR of the even-numbered bit data string retained in the flip-flop 208a and the bit mask "01010101 . . . 0101" is computed and the data of the exclusive OR is stored again in the flip-flop 208a while being supplied. In this case, the input pulse "01010101 . . . 0101" which becomes the bit mask is fed into the bit mask string input in synchronization with the clock input.

The data output control input 1 is set at "H", and the data output control input 2 is set at "L". The exclusive OR element 217 computes the exclusive OR of the output of the second rightmost flip-flop FF2 and the first bit "0" of the bit mask string input and supplies the exclusive OR to the data input and output line. Therefore, the same data as the first-bit digital data of the even-numbered bit is supplied to the data input and output line. The clock input φ1 is changed from the "L" state to the "H" state. Therefore, the output of the flip-flop FF4 is transferred to and retained in the flip-flop FF2, and the pieces of even-numbered bit data are sequentially transferred to and retained in the flip-flops from the left to the right. Accordingly, the exclusive OR element 217 computes the exclusive OR of the output of the rightmost flip-flop FF2 and the second bit "1" of the bit mask string input and supplies the exclusive OR to the data input and output line. Therefore, the inverted data of the second-bit digital data (corresponding to the fourth bit) is supplied to the data input and output line. Then the clock input φ1 is changed from the "L" state to the "H" state (k/2−1) times, and the data is sequentially supplied to the data input and output line from the right flip-flop at intervals of two flip-flops in FIG. 16A, thereby sequentially supplying the exclusive ORs of the second to k-th even-numbered bits and the first to (k/2)-th bit mask string inputs, respectively. Finally the (k/2)-time clock input φ1 is changed from the "L" to the "H" state, whereby the exclusive ORs of the second to k-th even-numbered bits and the first to (k/2)-th bit mask string inputs are stored again in the flip-flops FF2, FF4, FF6, . . . , and FF(k). At this point, because the clock input φ2 is not changed, the odd-numbered bit data is unchanged and retained. Although the pattern "01010101 . . . 0101" is used as the bit mask string input by way of example, other patterns may be used. For example, the use of "11111111 . . . 1111" can easily realize the method for storing the inverted data of the even-numbered bit data string retained in the flip-flop 208a again while supplying the inverted data as shown in the right of FIG. 17E. When the M-sequence output of the averaging bit mask generation circuit 110 is fed as the bit mask string input as shown in the first embodiment, the code occurrence probability averaging first coding circuit 106 and the first-code decoding circuit 107 can be realized using the sequence of FIG. 17.

In FIG. 16B, the gate electrodes of the transistors Q7 are commonly connected to the input p1. When the input p1 of the transistor Q7 is changed from the cut-off state (0V) to the conduction state (Vcc), the output of the flip-flop FF(k/2+i) is connected to the input of the i-th flip-flop FF(i) (i is an integer of 1 to k/2). Further, the output of the flip-flop FF(i+1) is connected to the input of the flip-flop FF(k/2+i) (i is an integer of 1 to k/2−1). Therefore, as shown in FIG. 17F, the adjacent memory cell disturb reduction second-code reverse conversion circuit 105 can reversely convert the information bit string which is divided into the even-numbered bit string and the odd-numbered bit string by the coding into the original bit string of odd number-even number-odd number-even number, . . . and supply the original bit string.

In FIG. 17F, when the input p1 is set at "H", the pieces of data which are odd-numbered bits before the second coding are sequentially fed into the flip-flops FF1, FF2, . . . , and FF(k/2), and the pieces of data which are even-numbered bits before the second coding are sequentially fed into the flip-flops FF(k/2+1), FF(k/2+2), . . . , and FF(k). In such cases, the pieces of data can be read from the page buffer in the order of flip-flops FF1, FF(k/2+1), FF2, and FF(k/2+2), that is, in the order of odd number-even number-odd number-even number, . . . .

In this case, the pieces of data which are odd-numbered bits before the second coding are sequentially fed as the form of the output after the decoding of the error correcting code into the flip-flops FF1, FF2, . . . , FF(k/2), and the pieces of data which are even-numbered bits before the second coding are sequentially fed as the form of the output after the decoding of the error correcting code into the flip-flops FF(k/2+1), FF(k/2+2), . . . , and FF(k), and the code string is fed into the page buffer 114. In reading and programming the data, the input p1 is set at Vcc ("H"), and inputs s1 and /s1 and the bit mask string input are set at 0V ("L") in order that the page buffer 114 is operated as series of k-bit resisters.

The adjacent memory cell disturb reduction second-code reverse conversion circuit 105 reversely converts the bit string into the bit string of odd number-even number-odd number-even number, . . . before the second coding and supplies the reversely-converted bit string to the first-code decoding circuit 107. That is, the data output control input 1 is set at "H", the data output control input 2 is set at "L", and the output of the rightmost flip-flop FF1 is supplied to the data input and output line. Therefore, the same data as the first-bit digital data of the odd-numbered bit is supplied to the data input and output line. The clock inputs φ1 and φ2 are changed from the "L" state to the "H" state. Therefore, the output of the flip-flop FF(k/2+1) is transferred to and retained in the flip-flop FF1, the output of the flip-flop FF2 is transferred to and retained in the flip-flop FF(k/2+1), and the one bit data is transferred to and retained in the flip-flop through the interconnection electrically connected to a current terminal of the transistor Q7. Accordingly, the same data as the (k/2+1)-th-bit digital data is supplied to the data input and output line. The clock inputs φ1 and φ2 are changed from the "L" state to the "H" state. Therefore, the same data as the second-bit digital data is supplied to the data input and output line.

Then the clock input φ1 is changed from the "L" state to the "H" state (k−1) times, and the data is sequentially supplied to the flip-flops in the order of the flip-flops FF1, FF(k/2+1), FF2, FF(k/2+2), FF(k/2), and FF(k) before the data is read onto the data input and output line. That is, the reverse conversion is performed to the case in which the original bit string is divided into the odd-numbered bit data and the even-numbered bit data and the odd-numbered bit data and the even-numbered bit data are arranged in time series, and the bit string of odd number-even number-odd number-even number, . . . of the original code is restored and supplied in time series.

Thus, using the ((information bit−1)×3+8) transistors, the two inverters, and the two two-input exclusive OR elements, the page counter 114 of the third embodiment can realize the information bit code conversion circuit for the necessary second coding in the third embodiment with respect to the error code decoding circuit in which the conventional shift register is used.

<Sequence of Adjacent Memory Cell Disturb Reduction Second-Code Conversion Circuit 104>

A specific sequence of the adjacent memory cell disturb reduction second-code conversion circuit 104 of the third embodiment will be described with reference to FIG. 18.

In Step SE24, the adjacent memory cell disturb reduction second-code conversion circuit 104 resets the flags 1 to 3 to read the (k/2) pieces of information bit data, that is, the first to (k−1)-th odd-numbered bits. The odd-numbered information bits can be supplied to the symbol counter by the method of the left of FIG. 17B and fed into the circuit of FIG. 13.

In Step SE25, the adjacent memory cell disturb reduction second-code conversion circuit 104 reads the (k/2) pieces of information bit data, that is, the second to k-th even-numbered bits. After the odd-numbered bits are supplied, the even-numbered information bits can be supplied to the symbol counter by the method of the right of FIG. 17B and fed into the circuit of FIG. 13.

In Step SE26, the symbol counter 108 counts the number of "010" continuous symbols in the information bit, the symbol counter 109 counts the number of "101" continuous symbols, and the symbol counter 112 counts the number of "010" continuous symbols in which the exclusive OR of the k-bit-length string of the consecutive odd-numbered bit and even-numbered bit and "01010101 ... 0101" ("01" is repeatedly generated k-bit times) is computed. Additionally the symbol counter 113 counts the number of "010" continuous symbols in which the exclusive OR of the k-bit-length information bit and "10101010 ... 1010" ("10" is repeatedly generated k-bit times) is computed.

The sequence in Step SE26 can be performed by feeding the information bit in Steps SE24 and SE25 into the information bit input of FIG. 13.

In Step SE27, the adjacent memory cell disturb reduction second-code conversion circuit 104 copies the count values of the symbol counters 108, 109, 112, and 113 in registers a, b, c, and d, respectively.

In Step SE28, the k-bit information bit data is read from the page buffer 114 of the third embodiment in the order of the first, second, third, ..., and k-th information bits, that is, in the usual order. The processing in Step SE28 can be performed by supplying the information bit by the method of the right of FIG. 17A.

In Step SE29, the symbol counter 108 counts the number of "010" continuous symbols in the k-bit-length information bit in which the first, second, third, and k-th information bits are arranged, the symbol counter 109 counts the number of "101" continuous symbols, and the symbol counter 112 counts the number of "010" continuous symbols in which the exclusive OR of the k-bit-length information bit and "01010101 ... 0101" ("01" is repeatedly generated k-bit times) is computed. Additionally the symbol counter 113 counts the number of "010" continuous symbols in which the exclusive OR of the k-bit-length information bit and "10101010 ... 1010" ("10" is repeatedly generated k-bit times) is computed. The processing in Step SE29 can be performed by feeding the information bit output in Step SE28 into the information bit input of FIG. 13.

In Step SE30, the adjacent memory cell disturb reduction second-code conversion circuit 104 compares contents of the symbol counters 108, 109, 112, and 113 to contents of the registers a, b, c, and d to determine whether the counter or the register includes the contents which become the minimum value.

In Step SE31, the adjacent memory cell disturb reduction second-code conversion circuit 104 determines whether or not one of the symbol counters 108, 109, 112, and 113 becomes the minimum value rather than the registers a, b, c, and d.

When the counters 108, 109, 112, and 113 become the minimum value (YES in Step SE31), the processing in Steps SE17 to SE22 are performed while the flag 3 is reset.

Then, instead of Step SE23, in Step SE33, the adjacent memory cell disturb reduction second-code conversion circuit 104 adds the codes corresponding to the flags 1 to 3 to the k-bit information bit, and supplies the information bit to the error correcting code generation circuit 102.

When the counters 108, 109, 112, and 113 do not become the minimum value (NO in Step SE31), the flag 3 is set in Step SE32.

Then the information bit is divided into the odd-numbered bit and the even-numbered bit, and the sequences in Steps SE17 to SE22 are performed to the information bit in which the first, third, fifth, and (k−1)-th bits and the second, fourth, ..., and k-th bits are arranged.

In Step SE34, the adjacent memory cell disturb reduction second-code conversion circuit 104 determines whether or not the minimum values of the registers a and b are larger than the minimum value of the register c or d.

When the minimum values of the registers a and b are larger than the minimum value of the register c or d (YES in Step SE34), in Step SE35, the flag 1 is set to perform the sequence of the exclusive OR of the odd-numbered bit in the information bit and the first bit mask pattern "01010101 ... 0101" ("01" is repeatedly generated (k/2)-bit times), and the exclusive OR is stored in the page buffer 114 again. The processing in Step SE35 can be performed by the sequence of the left of FIG. 17D.

In Step SE36, the adjacent memory cell disturb reduction second-code conversion circuit 104 performs the sequence of the exclusive OR of the even-numbered bit in the information bit and the first bit mask pattern "01010101 ... 0101" ("01" is repeatedly generated (k/2)-bit times), and the exclusive OR is stored in the page buffer 114 again. The processing in Step SE36 can be performed by the sequence of the right of FIG. 17D.

In Step SE37, the adjacent memory cell disturb reduction second-code conversion circuit 104 determines whether or not the register c in which the count value of the symbol counter 112 is stored is larger than the register d in which the count value of the symbol counter 113 is stored. When the register c is larger than the register d (YES in Step SE37), in Step SE38, all the k information bits are inverted, that is, the "0" bit is changed to the "1" bit and the "1" bit is changed to the "0" bit, and the flag 2 is set. The processing in Step SE38 can be performed by the sequence of FIG. 17E.

On the other hand, when the register c is not larger than the register d (NO in Step SE37), in Step SE39, the adjacent memory cell disturb reduction second-code conversion circuit 104 determines whether or not the register a in which the count value of the "010" symbol counter 108 is stored is larger than the register b in which the count value of the "101" symbol counter 109 is stored. When the register a is larger than the register b (YES in Step SE39), in Step SE40, all the k information bits are inverted, that is, the "0" bit is changed to the "1" bit and the "1" bit is changed to the "0" bit, and the flag 2 is set. The processing in Step SE40 can be performed by the sequence of FIG. 17E.

In Step SE41, the adjacent memory cell disturb reduction second-code conversion circuit 104 reads the first to (k−1)-th bits of the odd-numbered data in the information bit fed into the flip-flops 208b and supplies the first to (k−1)-th bits of the odd-numbered data to the error correcting code generation circuit 102. The information output in Step SE41 can be performed by the sequence of the left of FIG. 17B.

In Step SE42, the adjacent memory cell disturb reduction second-code conversion circuit 104 reads the second to k-th bits of the even-numbered data in the information bit fed into the flip-flops 208a and supplies the second to k-th bits of the even-numbered data to the error correcting code generation circuit 102. The information output in Step SE42 can be performed by the sequence of the right of FIG. 17B.

In Step SE43, the adjacent memory cell disturb reduction second-code conversion circuit 104 supplies the codes corresponding to the flags 1 to 3 to the error correcting code generation circuit 102.

Similarly to the first embodiment, the method for adding the flags 1 to 3 to the information bit includes the method for adding each flag in the form of continuous two bits to the information bit. In the method for adding each flag in the form of continuous two bits to the information bit, the flags 1 and 2 are selected such that the "010" continuous symbol is not generated in any state of the flags 1 and 2. Alternatively, there may be adopted other coding methods. For example, any two of the flags 1 to 3 may be allocated to the same two bits and the remaining flag is allocated to one bit. The bits corresponding to the flags 1 to 3 are added to the leading end or rear end of the information bit, and the bits become aabbcc (a, b, and c are states "0" and "1" corresponding to the flags 1 to 3). The bits such as ccbbaa, aabbc, and ccbba whose turns are appropriately changed may be added as the bits corresponding to the flags. The bits corresponding to the flags are not added to the leading end or rear end of the information bit, the information bit may be divided into two, and ccbbaa may be embedded between the information bits. The information bit is divided into four, and aa, bb, and cc may be embedded in the gaps formed by the four information bits. Alternatively, after the error correcting coding is performed, the inspection bit (parity bit) is divided into several bits, the flag including at least the two same bits such as aa, bb, and cc is rearranged (interleaved) so as to be sandwiched between the inspection bits. Therefore, the bits located on both sides of the flag including at least the two same bits do not become the "010" pattern, so that the possibility of generating the "010" pattern is decreased in the inspection bit.

<Decoding Sequence of Adjacent Memory Cell Disturb Reduction Second-Code Reverse Conversion Circuit 105>

Figure 19:
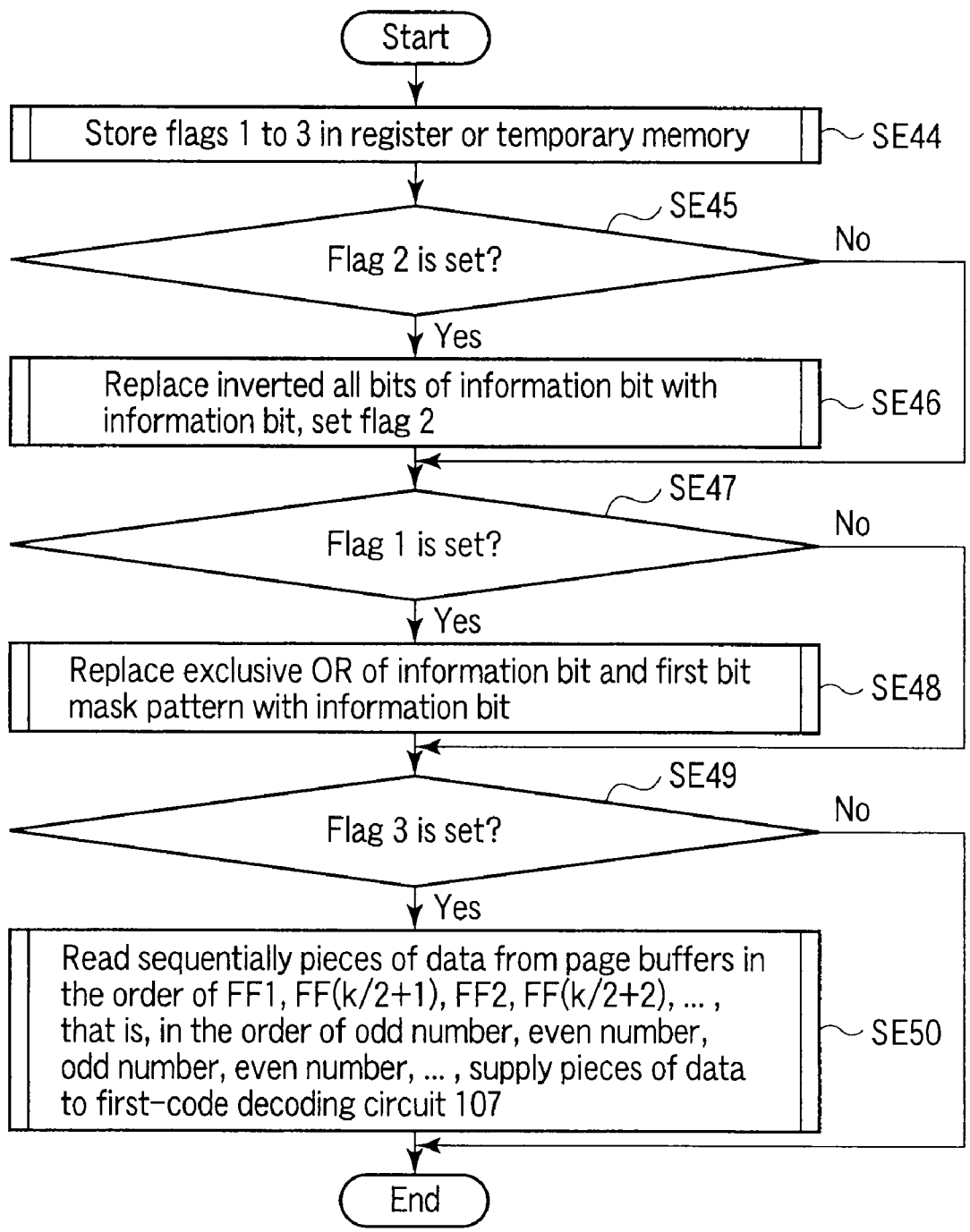
FIG. 19 is a flowchart showing second code reverse conversion of the third embodiment.

A specific decoding sequence of the adjacent memory cell disturb reduction second-code reverse conversion circuit 105 of the third embodiment will be described with reference to FIG. 19.

In Step SE44, the adjacent memory cell disturb reduction second-code reverse conversion circuit 105 stores the information added to the information bit in a register or a temporary memory. The information added to the information bit corresponds to the flags 1 to 3.

In Step SE45, the adjacent memory cell disturb reduction second-code reverse conversion circuit 105 determines whether or not the flag 2 is set. When the flag 2 is set, in Step SE46, the adjacent memory cell disturb reduction second-code reverse conversion circuit 105 inverts all the bits of the k-bit information bit, that is, the "0" bit is changed to the "1" bit and the "1" bit is changed to the "0" bit, and the adjacent memory cell disturb reduction second-code reverse conversion circuit 105 replaces the information bit with the inverted bits.

In Step SE47 after "No" is determined in Step SE45, the adjacent memory cell disturb reduction second-code reverse conversion circuit 105 determines whether or not the flag 1 is set.

When the flag 1 is set (YES in Step SE47), in Step SE48, the adjacent memory cell disturb reduction second-code reverse conversion circuit 105 computes the exclusive OR of the information bit and the first bit mask pattern "01010101 . . . 0101" ("01" is repeatedly generated k-bit times), and replaces the information bit with the exclusive OR. In the first bit mask pattern, the same mask bit "1010101010 . . . 1010" ("10" is repeatedly generated k-bit times) can be used when the adjacent memory cell disturb reduction second-code conversion circuit 104 performs the coding by using the mask bit "1010101010 . . . 1010".

In Step SE49 after "No" is determined in Step SE47, the adjacent memory cell disturb reduction second-code reverse conversion circuit 105 determines whether or not the flag 3 is set.

When the flag 3 is set (YES in Step SE49), the pieces of odd-numbered bit data before the second coding are sequentially fed into the flip-flops FF1, FF2, . . . , and FF(k/2), and the pieces of even-numbered bit data before the second coding are sequentially fed into the flip-flops FF(k/2+1), FF(k/2+2), . . . , and FF(k). Therefore, in Step SE50, the adjacent memory cell disturb reduction second-code reverse conversion circuit 105 reads the data from the page buffer to supply the data to the first-code decoding circuit 107 in the order of the flip-flops FF1, FF(k/2+1), FF2, and FF(k/2+2), . . . , that is, in the order of the odd-numbered data and the even-numbered data before the second coding. For example, the sequence shown in FIG. 17 can be used in Step SE50.

When the flag 3 is not set (NO in Step SE49), the adjacent memory cell disturb reduction second-code reverse conversion circuit 105 reads the k-bit information bit data to supply the data to the first-code decoding circuit 107 in the order of odd number-even number-odd number-even number, that is, in the usual order.

Therefore, for the eight cases in which the code conversion is performed in the third embodiment, the number of "010" continuous symbols is previously counted in the information bit to which the code conversion is already performed, and the quantitative comparison is performed to decrease the probability of occurrence of the "010" continuous symbol.

Figure 20A:
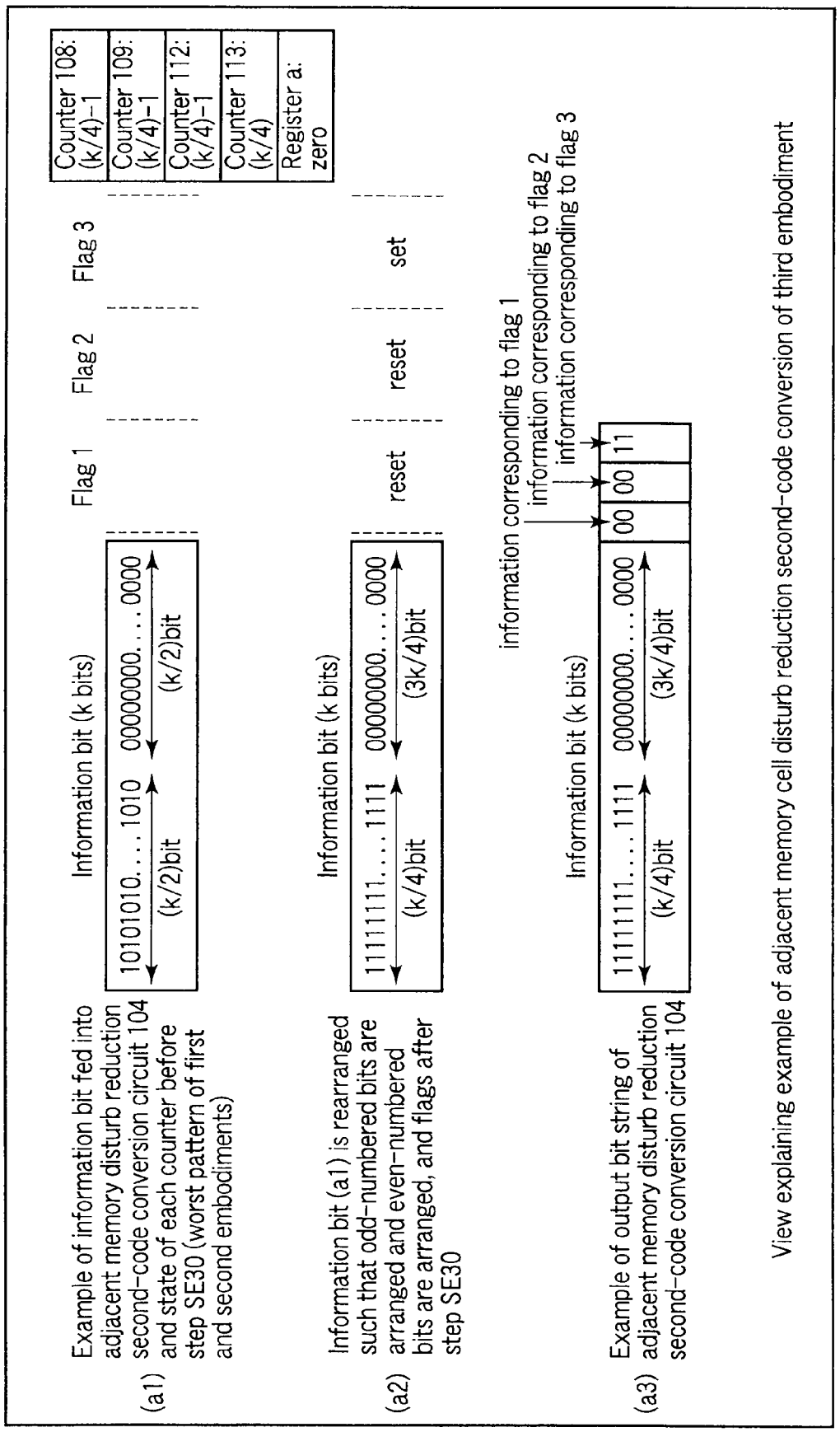
FIG. 20A shows an example of the second code conversion of the third embodiment.

The reason why the probability of generating the "010" continuous symbol string in the third embodiment can be more decreased than the first and second embodiments will be described below with reference to FIG. 20A. FIG. 20A shows the case in which the bit string shown in FIG. 9E is fed. The bit string of FIG. 9E is an example of the worst pattern in which the number of "010" continuous symbols becomes the maximum in the second embodiment. In FIG. 20A, the odd-numbered bits and the even-numbered bits are rearranged in the first bit, third bit, fifth bit, . . . , (k−1)-th bit, second bit, fourth bit, sixth bit, . . . , k-th bit, whereby the (k/2) information bits of "10101010 . . . 1010" and (k/2) information bits of "00000000 . . . 0000" shown in the part (a1) of FIG. 20A are rearranged into the (k/4) information bits of "11111111 . . . 1111" and (3k/4) information bits of "00000000 . . . 0000" shown in the part (a2) of FIG. 20A. Therefore, the number of "010" continuous symbols can be decreased to zero. Therefore, the data corresponding to the information bit of FIG. 20A is rearranged, and the flags 1 to 3 are reset, reset, and set, respectively. The part (a3) of FIG. 20A shows an example of the code string supplied to the error correcting code generation circuit 102. Accordingly, the number of "010" continuous symbols can be decreased to zero using the information bit including the flags. The exclusive OR of "01010101 . . . 0101" and the inversion of all the bits or the information bit is not computed for the sake of easy understanding. However, similarly the number of "010" continuous symbols can be decreased to zero by the sequence of the third embodiment, even if the exclusive OR of "01010101 . . . 0101" and the inversion of all the bits or the information bit is computed, or even if both the exclusive OR of "01010101 . . . 0101" and the inversion of all the bits and the exclusive OR of "01010101 . . . 0101" and the information bit are computed. This corresponds not only to the information bit of "10101010 . . . 101000000000 . . . 0000", but also to the information bit of "10101010 . . . 101011111111 . . . 1111".

Therefore, in the k-bit information bits which are larger than 16 bits, the worst number of "010" continuous symbols can be decreased to (value in which (k/6) is rounded up to the nearest integer)−1 or less using the third embodiment. Similarly to the discussion of the first and second embodiments, it is assumed that the number of "010" continuous symbols is larger than (value in which (k/6) is rounded up to the nearest integer)−1 in the information bit to which the code conversion of the third embodiment is performed.

Figure 20B:
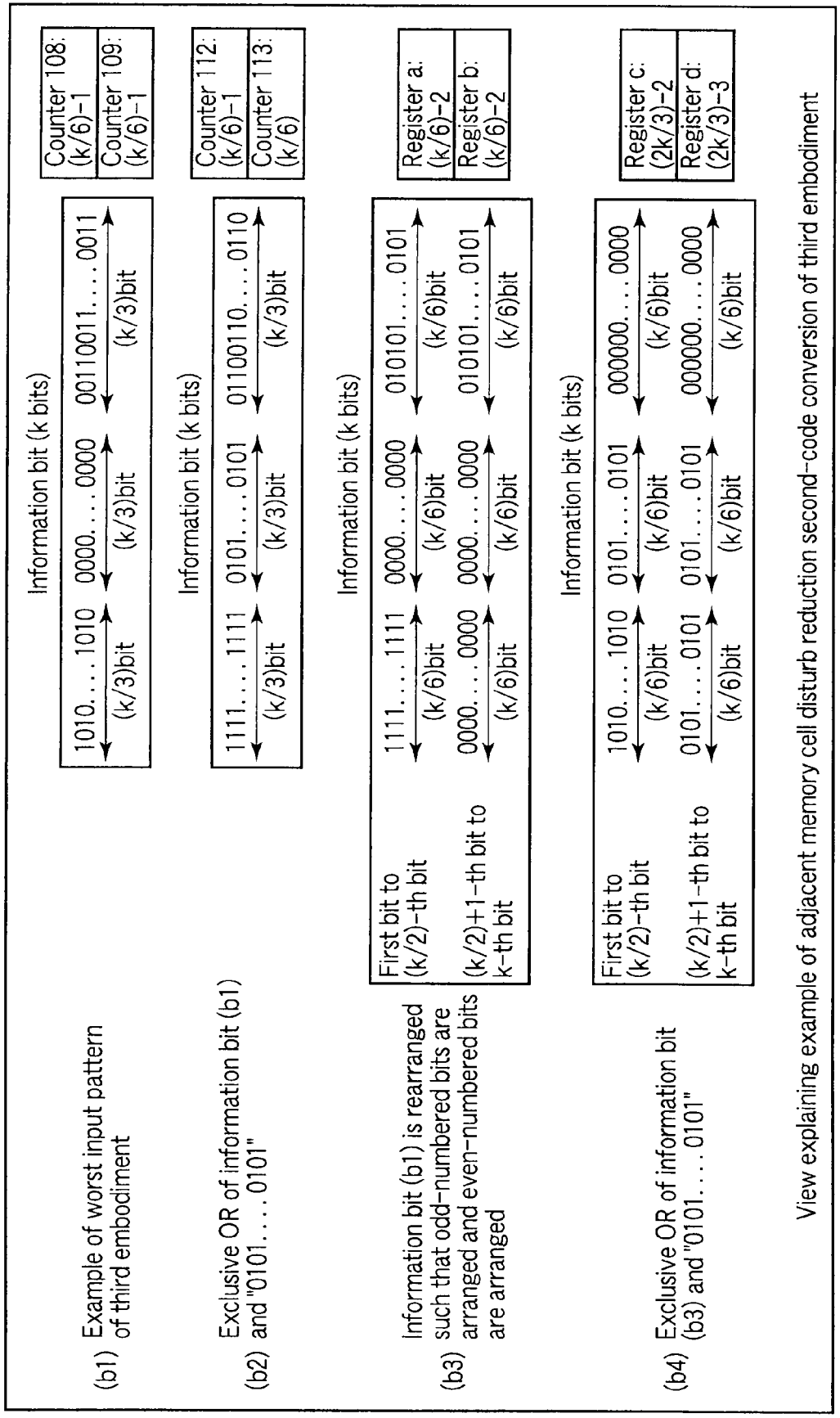
FIG. 20B shows an example of the second code conversion of the third embodiment.

In the worst case of "01010101 . . . 010" in which the "010" continuous symbols are arranged in the densest manner, "01010101 . . . 010" is continuously occupied by at least ((k/3)+1) "010" continuous symbols. Therefore, the number of bits of the patterns except for the "010" continuous symbol is not more than (2k/3)−1 bits. At this point, "00000000 . . . 0000" is the pattern in which the number of "010" continuous symbols is increased by the exclusive OR of the "01010101 . . . 010" and "00000000 . . . 0000", and the increasing number of "010" continuous symbols becomes largest per partial code length. In the case where the exclusive OR of the information bit and "01010101 . . . 010" is computed, the minimum partial code pattern which restricts the point of the worst number of "010" continuous symbols to (value in which (k/6) is rounded up to the nearest integer)−1 becomes the bits having the ((k/3)−1)-bit length of "00000000 . . . 0000" and at least ((k/3)+1)-bit length of "01010101 . . . 010" (hereinafter referred to as continuous bit a pattern). Therefore, in order to satisfy the assumption, in consideration of overlapping of the "0" bit at the end of the continuous bit a pattern, it is necessary that a combination of information bits in which the number of "010" continuous symbols is larger than (value in which (k/6) is rounded up to the nearest integer)−1 exists after the second coding of the third embodiment in the number of bits which is not more than the remaining (k/3)+1 bits except for the continuous bit a pattern in the whole of k-bit information bit. From the viewpoint of coding discussion of FIG. 20A in the second and third embodiments, the sequence of rearranging the odd-numbered bit and the even-numbered bit into the first bit, third bit, fifth bit, . . . , (k−1)-th bit, second bit, fourth bit, sixth bit, . . . , k-th bit can be performed independently of the sequence of the bit inversion of the code of the first and second embodiments and the sequence of the exclusive OR of the bit mask of "01010101 . . . 0101" and the information bit, and the eight states indicated by the flags 1 to 3 can be divided. In FIG. 20A, in the "01010101 . . . 0101" and "00000000 . . . 0000" patterns, the number of "010" continuous symbols can be decreased to zero only by rearranging the even-numbered bit and the odd-numbered bit. Therefore, in order to satisfy the assumption, it is necessary that the pattern in which the number of "010" continuous symbols is increased larger than (value in which (k/6) is rounded up to the nearest integer)−1 exist in at least the (k/3)+1 bits except for the "01010101 . . . 0101" and "00000000 . . . 0000" patterns, particularly in the rearrangement of the even-numbered bit and the odd-numbered bit. A pattern of "0x1x0x" (x is "0" or "1") is the pattern in which the number of "010" continuous symbols is increased in the rearrangement of the even-numbered bit and the odd-numbered bit. Particularly a repetitive pattern of "00110011 . . . 001100" becomes the pattern in which the increasing number of "010" continuous symbols becomes the largest in the rearrangement of the even-numbered bit and the odd-numbered bit. Other examples of the pattern in which the number of "010" continuous symbols is increased in the rearrangement include a pattern in which the repetitive pattern of "00110011 . . . 001100" is inverted, a pattern in which the exclusive OR of the repetitive pattern and "01010101 . . . 0101" is computed, and a pattern to which both the bit inversion and the exclusive OR are applied. The right end of the part (b1) of FIG. 20B corresponds to the pattern in which the number of "010" continuous symbols is increased in the rearrangement, and the (k/3) bits on the rear sides of the codes shown in the parts (b2), (b3), and (b4) of FIG. 20B show the pattern change when the second coding processing of the third embodiment is performed. At this point, in the part (b3) of FIG. 20B, only the ((k/6)−2) "010" continuous symbols are generated at the minimum. Particularly, it is noted that the "010" continuous symbol is not generated in the portion of "00110011 . . . 0011" in the combination of the bit inversion shown in the second embodiment and the exclusive OR of the information bit and "01010101 . . . 0101".

Generally, "00110011 . . . 001100" having at least ((k/3)+4) bits is required in order that the number of "010" continuous symbols is increased larger than (value in which (k/6) is rounded up to the nearest integer)−1 by the rearrangement. When the overlapping of the two bits of "00" at the end of the continuous bit a pattern is excluded, at least ((k/3)+2) bits are required. When the number of "010" continuous symbols is larger than (value in which (k/6) is rounded up to the nearest integer)−1 in the information bits to which the code conversion of the third embodiment is performed, the assumption is contradictory. Therefore, the number of "010" continuous symbols is not more than (value in which (k/6) is rounded up to the nearest integer)−1 in the information bits to which the code conversion of the third embodiment is performed.

The pattern in which bit inversion of the second embodiment is performed to "00110011 . . . 0011", the pattern in which the exclusive OR of the repetitive pattern and "01010101 . . . 0101" is computed, and the pattern to which the bit inversion and the exclusive OR are applied also become the repetitive pattern of "0011", for example, "01100110 . . . 0110", so that at most the ((k/6)−1) "010" continuous symbols are generated.

Thus, the part (b1) of FIG. 20B shows the example in which the large number of "010" continuous symbols exists even if the code conversion of the third embodiment is performed. In the part (b1) of FIG. 20B, the number of "010" continuous symbols is restricted to (k/6)−2, and the worst number of "010" continuous symbols is decreased to (value in which (k/6) is rounded up to the nearest integer)−1 or less. When the whole bit inversion or the exclusive OR of information bit and "01010101 . . . 1010" of the second embodiment is applied to the code shown by the part (b1) of FIG. 20B, or when both the whole bit inversion and the exclusive OR are applied to the code shown by the part (b1) of FIG. 20B, similarly the number of "010" continuous symbols can be decreased to (value in which (k/6) is rounded up to the nearest integer)−1 or less by the coding of the third embodiment.

Figure 20C:
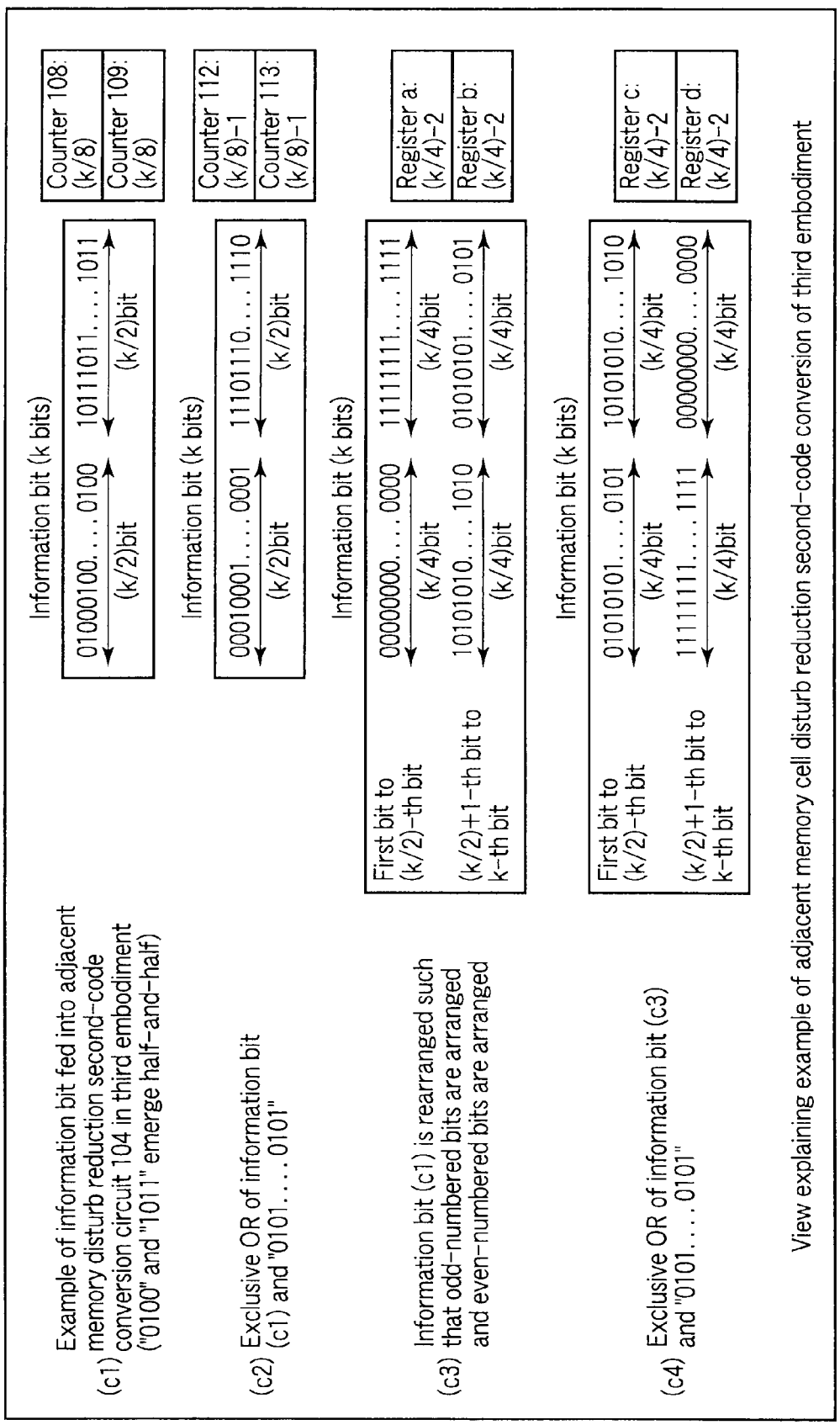
FIG. 20C shows an example of the second code conversion of the third embodiment.

A part (c1) of FIG. 20C shows an example of the code in which a generation frequency of "010" continuous symbol becomes high even if the whole bit inversion or the exclusive OR of information bit and "0101010 . . . 1010" is applied, or even if both the whole bit inversion and the exclusive OR are applied. The right of FIG. 20C also shows the values of the registers a, b, c, and d and the counters 108, 109, 112, and 113. The code pattern shown in the part (c1) of FIG. 20C is formed by the repetition of the four bits "0100" or "0001", and the number of "010" continuous symbols cannot be decreased even if the even-numbered bit and the odd-numbered bit are rearranged. Because the number of "010" continuous symbols is an invariant in the time-series inversion of the code, the repetition of "0010" or "1000" has the same number of "010" continuous symbols when the time-series inversion is performed. In the code pattern of the part (c1) of FIG. 20C, similarly the number of "010" continuous symbols can be decreased to (value in which (k/6) is rounded up to the nearest integer)−1 or less, that is, to (k/8) or less by performing the sequence of the third embodiment. The code pattern of the part (c1) of FIG. 20C is smaller than the code pattern of FIG. 20B in the number of "010" continuous symbols. The generation frequency of "010" continuous symbol becomes about (bit length/2)−1 in the continuous bit of "01010101 . . . 0101" or "101010101010". However, in the case where the code is produced by adding another bit to the rear end of the "010" continuous symbol, for example, in the case of continuous bit of "01000100 . . . 0100", the number of "010" continuous symbols can be decreased to about (bit length/4)−1 at the maximum. Therefore, in the case where the "010" continuous symbols are dispersed as shown in FIG. 20C, when the length of the continuous bit is longer than 16 bits, the number of bits per partial information bit of "010" continuous symbol becomes a half or less of the case in which the continuous bit of "01010101 . . . 0101" or "10101010 . . . 1010" is generated by the coding of the third embodiment.

On the other hand, a ratio of the upper limit of the number of "010" continuous symbols in the first and second embodiments and the upper limit of the number of "010" continuous symbols in the third embodiment, that is, a ratio of the value of (value in which (k/4) is rounded up to the nearest integer)−1 and the value of (value in which (k/6) is rounded up to the nearest integer)−1 becomes double or less when k is 16 bits or more. The ratio is smaller than double when k is larger than 19 bits. Therefore, in the case where the "010" continuous symbols are dispersed, compared with the continuous bit of "10101010 . . . 1010", the number of "010" continuous symbols is not more than the upper limit of the worst number of "010" continuous symbols when k is 16 bits or more, and the number of "010" continuous symbols becomes lesser when k is larger than 19 bits.

Thus, the effects (1) and (2) are similarly obtained in the third embodiment.

Even in the worst case, the number of "010" continuous symbols can be restrained to the (value in which (k/6) is rounded up to the nearest integer)−1 or less by performing the second code conversion of the third embodiment. Therefore, compared with the first and second embodiments, the worst amount of "010" continuous symbols can be decreased to (value in which (k/6) is rounded up to the nearest integer)−1 or less by performing the operation of the third embodiment.

For example, when the information bit has about 100 "010" continuous symbols as shown by an arrow Y3 of FIG. 29, the worst number of "010" continuous symbols can further be decreased compared with the first and second embodiments.

As is clear from the part (b4) of FIG. 20B and the part (c4) of FIG. 20C, the pattern after the even-numbered bit and the odd-numbered bit are rearranged in the third embodiment becomes the combination of the partial information bit strings "01010101 . . . 0101", "10101010 . . . 1010", "0000000 . . . 0000", and "11111111 . . . 1111". Therefore, rearrangement of the even-numbered bit and the odd-numbered bit is performed to the information bit string to which the rearrangement of the even-numbered bit and the odd-numbered bit is already performed, and then the whole bit inversion or the exclusive OR of the information bit and "01010101 . . . 0101" is applied or both the whole bit inversion and the exclusive OR are applied, whereby the number of "010" continuous symbols can further be decreased. At this point, it is clear that a new one-bit flag 4 and a code corresponding to the flag 4 are added to the information bit like the flag 3, so that the description is omitted.

FIG. 29 shows an actual example in which the second and third embodiments and the rearrangement of the even-numbered bit and the odd-numbered bit are performed. In the actual example of FIG. 29, on the assumption that all the information bit arrangements are generated in the binary 16 bits, that is, $2^{16}$=65536 of the code length k=16, the number of "010" continuous symbols is counted. A horizontal axis indicates the number of "010" continuous symbols included in the 16-bit code, and a vertical axis indicates the accumulation number of information bits including the number of "010" continuous symbols. For the purpose of easy understanding of a correlation among the "010" continuous symbols, although the numbers of "010" continuous symbols are connected by a line, only a discrete value of zero or a natural number has the meaning, and the value smaller than one means that the number of "010" continuous symbols is zero.

As described above, the worst amount of "010" continuous symbols included in one information bit becomes (k/2)−1=7 in the comparative example shown by the mark "o", the worst amount of "010" continuous symbols becomes (value in which (k/4) is rounded up to the nearest integer)−1=3 in the second embodiment shown by the mark "□", and the worst number of "010" continuous symbols becomes (value in which (k/6) is rounded up to the nearest integer)−1=2 in the third embodiment shown by the mark "Δ" in which the arrangement of the even-numbered bit and the odd-numbered bit is performed once. Advantageously the worst amount of "010" continuous symbols can clearly be decreased. The mark "♦" and the alternate long and two dashes line show the above-described example of the third embodiment wherein the rearrangement of the even-numbered bit and the odd-numbered bit is performed again to the information bit to which the rearrangement of the even-numbered bit and the odd-numbered bit is performed once. Specifically, this corresponds to the case in which assuming that a, b, c, d, e, f, g, h, . . . , m, n, o, and p are one bit, an information bit string of "abcdefgh . . . mnop" is divided in each 16 bits, the rearrangement of "aceg . . . mobdfh . . . np" is performed, and the rearrangement of "ae . . . mbf . . . ncg . . . odh . . . p" is finally performed. After the rearrangement, when the whole bit inversion or the exclusive OR of information bit and "0101010 . . . 1010" is applied, or when both the whole bit inversion and the exclusive OR are applied, the minimum number of "010" continuous symbols is extracted and plotted in the case of the (8+4)=12 sets. Thus, in the actual example, the number of "010" continuous symbols included in the information bit can be decreased to one or less by performing the rearrangement of the even-numbered bit and the odd-numbered bit twice, and the number of "010" continuous symbols can be decreased compared with the comparative example even in the information bit including one "010" continuous symbol. In the second coding, because only the whole bit conversion or the exclusive OR is performed to the information bit, the loss of the information is not generated in the coding, and clearly the reverse conversion can easily be performed.

In the third embodiment, the rearrangement of the even-numbered bit and the odd-numbered bit is performed while the odd-numbered bits are located in front of the even-numbered bits. Alternatively, the rearrangement may be performed while the even-numbered bits are located in front of the odd-numbered bits. The rearrangement of the even-numbered bit and the odd-numbered bit is performed twice in the third embodiment. Alternatively, the rearrangement may be performed three or four times when the information bit length becomes longer.

Obviously the action and effect of the second embodiment and the features (1) and (2) of the first embodiment are obtained in the third embodiment. In the third embodiment, compared with the second embodiment, the one bit which is the information on flag 3 and the two bits which are the physical bit are added to the information bit, whereby the number of "010" continuous symbols can be decreased to (value in which (k/6) is rounded up to the nearest integer)−1 or less from (value in which (k/4) is rounded up to the nearest integer)−1 which is the upper limit of the number of "010" continuous symbols generated in the second embodiment. For example, in the memory cell M1$a$(α), assuming that p0 is a probability P0 of wrongly recognizing the erasing bit as the programming bit when the erasing threshold voltage overlaps the programming threshold voltage shown by the part (v) of FIG. 2, the probability of generating the defect of ((k/2)−1)× p0 of the comparative example can be lowered to ((value in which (k/6) is rounded up to the nearest integer)−1)×p0 when the probability p0 is sufficiently smaller than 1.

The prominent feature of the first to third embodiments is to clearly impart the upper limit value of the number of "010" continuous symbols generated. Therefore, as described in Step SE59 of a later-mentioned fourth embodiment, another improvement technique can be used at the same time while the upper limit of the number of "010" continuous symbols is restrained to a predetermined value or less.

[Fourth Embodiment]

A data memory system according to a fourth embodiment of the invention will be described with reference to FIGS. 21 to 23. FIG. 21 shows an entire configuration of the data memory system of the fourth embodiment.

In addition to the effect of the first to third embodiments, particularly in addition to the effect of the third embodiment, the number of combinations of the "1"-bit memory cell M1$a$ (α) located in the center of the "010" continuous symbol of FIG. 1 and the memory cell M2$a$(∈) having the programming bit of "0", which is physically adjacent to the memory cell M1$a$(α) in the direction of the word line WL, is decreased in the data memory system of the fourth embodiment. Therefore, the problem of increasing the threshold due to the capacitive coupling of the adjacent memory cell can be reduced. Although the data memory system of the fourth embodiment can be used independently of the data memory systems of the first to third embodiments, desirably the data memory system of the fourth embodiment is used in combination with the data memory system of the first to third embodiments because the same effect as the first to third embodiments, that is, the effect of reducing the influence of capacitive interference of the adjacent memory cell is obtained in the data memory system of the fourth embodiment. In the fourth embodiment, the same component as the first to third embodiments is designated by the same numeral, and the detailed description is omitted. Although the data memory system of the fourth embodiment can be applied to any one of the data memory systems of the first to third embodiments, an example in which the data memory system of the fourth embodiment is applied to the data memory system of the third embodiment will be described below because of the highest effect.

The data memory system of the fourth embodiment differs from the data memory systems of the first to third embodiments in the configuration. That is, as can be seen from the comparison of FIGS. 15 and 21, the data memory system of the fourth embodiment further includes a page buffer 115. The threshold of the information bit of the word line (data selection line) including the memory cell adjacent in the direction of the word line WL of the memory cell to which the programming is performed, particularly the threshold of the word-line information bit including the memory cell in which the programming is already performed is stored in the page buffer 115.

In the multiple-value NAND flash memory, the pieces of same-level multiple-value data are sequentially written from the side close to the source line. Therefore, desirably the page buffer 115 is a buffer in which the data of the memory cell formed in the adjacent word line on the source line side is stored. Hereinafter the word line including the memory cell to which the programming is performed is abbreviated to WLn, and the word line which is physically adjacent to WLn and includes the memory cell to which the programming is already performed is abbreviated to WLn−1 or WL(n−1).

The information bit of the word line including the memory cell which is connected to the error correcting code decoding circuit 103 and to which the programming is already performed from the flash memory 7 is stored in page buffer 115. Because of a small number of error bits, desirably the data in which determination of "0" or "1" is already performed by the threshold voltage is stored in the page buffer 115. However, in the case where the error correction time and the circuit scale is increased, the information bit of the code before error correction from the data input and output buffer 101 may directly be used as the WLn−1 information bit. That is, the error correcting code in the fourth embodiment is a separation code in which the information bit and the inspection bit are separated and the information bit is directly included in the error correcting code. In the reading method of the fourth embodiment, similarly to the first to third embodiments, it is not necessary to read WLn−1 unlike the case in which WLn−1 is written, and the bit error is not directly generated by the bit error of WLn−1 during the reading. In the case where the configuration of the fourth embodiment is applied to the configuration of third embodiment, it is necessary to read the WLn−1 data plural times for the coding of the data during the programming. Therefore, in the case where the processing time is not troublesome because the reading of the information bit from the nonvolatile memory 7 is performed at sufficiently high speed, the page buffer 115 is removed, and the pieces of data may sequentially be read from the nonvolatile memory 7. The specific configuration of the page buffer 115 is similar to that of the page buffer 114, so that the description is omitted.

Additionally the data memory system of the fourth embodiment differs from the data memory systems of the first to third embodiments in that symbol counters 116, 117, 118, and 119 are provided. The symbol counters 116, 117, 118, and 119 count the number of combinations of the "1"-bit memory cell M1$a$(α) and the memory cell M2$a$(∈) having the programming bit of "0". The programming is already performed to the "1"-bit memory cell M1a(α), and the "1"-bit memory cell M1a(α) is located in the center of WLn−1 in which the "010" continuous symbol is generated. The memory cell M2a(∈) is formed in WLn in which the programming is performed from now, and the memory cell M2a(∈) is adjacent to the memory cell M1a(α). For the eight code conversion combinations used for WLn in the third embodiment, the number of WLn−1 "010" continuous symbols in the information string of the memory cell and the number of WLn "x0x" (x is a bit of "0" or "1") continuous symbols after each conversion are previously counted to perform the quantitative comparison, thereby decreasing the probability of occurrence of the state shown in the part (iv) of FIG. 2 which becomes more troublesome than the case of the part (iii) of FIG. 2 described in the first to third embodiments.

<Circuit Configuration of Symbol Counters 116 to 119>

FIG. 22 shows circuit configurations of the symbol counters 116, 117, 118, and 119 of the fourth embodiment.

For example, as shown in FIG. 22, the symbol counters 116 and 117 can easily be realized as follows. That is, the series of information bits is sequentially fed in time series from the leading end of the WLn information bit into the one unit time delay element 208, a circuit for detecting the numerical value in which the center bit of the "010" continuous symbols in WLn−1 becomes "1" in WLn and a circuit for detecting the numerical value in which the center bit of the "010" continuous symbols in WLn−1 becomes "0" in WLn are combined, and the symbol counter counts the number of unit time when the output becomes "H". Referring to FIG. 22, in the input connected to the symbol counter 116, in the case where WLn−1 becomes the "010" continuous symbol in the unit time the "010" continuous symbol is sequentially fed into WLn−1, and in the case where the WLn becomes "x0x", the output is changed from "L" to "H" for one unit time in the unit time the last "0" of the "010" continuous symbol in WLn−1 is fed. The output becomes "L" in other cases. In FIG. 22, in the input connected to the symbol counter 117, in the case where WLn−1 becomes the "010" continuous symbol in the unit time the "010" continuous symbol is sequentially fed into WLn−1, and in the case where the WLn becomes "x1x", the output is changed from "L" to "H" for one unit time in the unit time the last "0" of the "010" continuous symbol in WLn−1 is fed. The output becomes "L" in other cases. The "1" detection circuit and the "0" detection circuit can be realized in such a manner that the symbol counter counts the logical AND with a circuit (corresponding to the lower left portion of FIG. 22) for detecting the "010" continuous symbol in WLn−1. At this point, it is assumed that the page buffer 115 into which the WLn−1 information bit is fed sequentially feeds the series of information bits in time series from the leading end of the information bit in synchronization with the input of the WLn information bit.

On the other hand, in the case where WLn−1 is the "010" continuous symbol, and in the case where WLn becomes the "x0x" continuous symbol after the exclusive OR of the information bit and the bit mask of "01010101 . . . 0101" is computed, similarly to the circuit of FIG. 13, the circuit can be realized by the circuit of FIG. 22. When the half frequency divider 213 divides the frequency of the clock imparting the information bit, in the output of the half frequency divider 213, the "1" and "0" bits in the y-bit even number and odd number are supplied as y-th bit of the information bit, respectively. Therefore, the input electrically connected to the symbol counter 118 becomes the logical AND of the WLn−1 of the "010" continuous symbol and (the case in which WLn is the "x1x" continuous symbol and y-th bit is the even number) or the logical AND of the WLn−1 of the "010" continuous symbol and (the case in which WLn is the "x0x" continuous symbol and y-th bit is the odd number). In the case where the "x0x" continuous symbol exists in the bit string in which the exclusive OR of the WLn information bit and "01010101 . . . 0.0101" is computed while WL(n−1) is the "010" continuous symbol, the output becomes "H" for one unit time in the unit time the last "0" of the "010" continuous symbol of WLn−1 is fed. The output becomes "L" in other cases. On the other hand, the input electrically connected to the symbol counter 119 becomes the logical AND of the WL(n−1) of the "010" continuous symbol and (the case in which WLn is the "x1x" continuous symbol and y-th bit is the odd number) or the logical AND of the WL(n−1) of the "010" continuous symbol and (the case in which WLn the "x0x" continuous symbol and y-th bit is the even number). In the case where the "x0x" continuous symbol exists in the bit string in which the exclusive OR of the WLn information bit and "10101010 . . . 1010" is computed while WL(n−1) is the "010" continuous symbol, the output becomes "H" for one unit time in the unit time the last "0" of the "010" continuous symbol of WLn−1 is fed. The output becomes "L" in other cases. Therefore, the outputs of the two-input OR circuits 214 are synchronized with the unit time of the information bit input, and the trigger is activated to start the counting when a logical value of the OR output is stabilized in the unit time, so that the symbol counters 118 and 119 can count the outputs of the two-input OR circuits 214. Because a well-known binary counter can be used as the symbol counter of FIG. 22, the detailed description of the symbol counter is omitted.

<Specific Sequence of Adjacent Memory Cell Disturb Reduction Second-Code Conversion Circuit 104 of the Fourth Embodiment>

FIG. 23 shows a specific sequence of the adjacent memory cell disturb reduction second-code conversion circuit 104 of the fourth embodiment.

In Step SE51, the adjacent memory cell disturb reduction second-code conversion circuit 104 resets the flags 1 to 3 to read the (k/2) pieces of WLn information bit data, that is, the WLn first to (k−1)-th odd-numbered bits in which the programming is performed from the page buffer 114. The adjacent memory cell disturb reduction second-code conversion circuit 104 also reads the (k/2) pieces of WLn−1 information bit data, that is, the WLn−1 first, second, third, . . . , and (k/2)-th bits in which the programming is already performed from the nonvolatile memory circuit 7 or the page buffer 115. WLn−1 is adjacent to WLn. The odd-numbered information bits can be supplied to the symbol counter by the method of the left of FIG. 17B.

In Step SE52, the adjacent memory cell disturb reduction second-code conversion circuit 104 reads the (k/2) pieces of WLn information bit data, that is, the WLn second to k-th even-numbered bits in which the programming is performed from the page buffer 114. The adjacent memory cell disturb reduction second-code conversion circuit 104 also reads the (k/2) pieces of WLn+1 information bit data, that is, the WLn+1 ((k/2)+1)-th, ((k/2)+2)-th, ((k/2)+3)-th, . . . , and k-th bits in which the programming is already performed from the page buffer 115. WLn+1 is adjacent to WLn. After the odd-numbered bits are supplied, the even-numbered information bits can be supplied to the symbol counter by the method of the right of FIG. 17B.

In Step SE53, the symbol counter 108 counts the number of "010" continuous symbols in the WLn information bit, the symbol counter 109 counts the number of "101" continuous symbols, and the symbol counter 112 counts the number of "010" continuous symbols in which the exclusive OR of the k-bit-length string of the consecutive odd-numbered bit and even-numbered bit and "01010101 . . . 0101" ("01" is repeatedly generated k-bit times) is computed. Additionally the symbol counter 113 counts the number of "010" continuous symbols in which the exclusive OR of the k-bit-length information bit and "10101010 . . . 1010" ("10" is repeatedly generated k-bit times) is computed. The sequence in Step S53 can be performed by feeding the information bit in Steps SE51 and SE52 into the information bit input of FIG. 13.

In Step SE54, the adjacent memory cell disturb reduction second-code conversion circuit 104 detects the "010" continuous symbol in the WLn−1 information bit and the adjacent WLn "x0x" continuous symbol after the second code conversion. The circuit shown in FIG. 22 may be used to detect the symbols. When the symbols are detected, the following sequence is performed. The symbol counter 116 counts the number of "x0x" (the programming is performed in the second bit) continuous symbols in the WLn information bit (k-bit), and the symbol counter 117 counts the number of "x1x" (the erasing is performed in the second bit) continuous symbols in the WLn information bit (k-bit). The symbol counter 118 counts the number of "x0x" continuous symbols in which the exclusive OR of the WLn information bit (k-bit) and "01010101 . . . 0101" is computed, and the symbol counter 119 counts the number of "x0x" continuous symbols in which the exclusive OR of the WLn information bit (k-bit) and "10101010 . . . 1010" is computed. The sequence in Step S54 can be performed by feeding the WLn and WLn−1 information bits in Steps SE51 and SE52 into the information bit input of FIG. 22.

In Step SE55, the adjacent memory cell disturb reduction second-code conversion circuit 104 copies the counts values of the symbol counters 108, 109, 112, 113, 116, 117, 118, and 119 to the registers a, b, c, d, e, f, g, and h, respectively.

In Step SE56, the page buffer 114 of the third embodiment reads the k pieces of information bit data from the WLn page buffers to which the programming is performed in the order of the first, second, third, and k-th bits, that is, the usual output order. The k pieces of information bit data can be supplied by the method of the right of FIG. 17A. The page buffer 114 also reads the k pieces of WLn−1 information bit data, that is, the WLn−1 first, second, third, . . . , k-th bits to which the programming is already performed from the nonvolatile memory circuit 7 or the page buffer 115. WLn−1 is adjacent to WLn. At this point, because the WLn−1 data in Steps SE51 and SE52 is identical to the WLn−1 data in Step SE56 in the output order and the output contents, the page buffer 115 can perform the reading faster than the usual nonvolatile memory 7. Therefore, the data is written in the page buffer 115 from the nonvolatile memory 7 in Step SE51, and the data is read from the page buffer 115 in Step SE56, which allows the realization of the high-speed processing.

In Step SE57, the symbol counter 108 counts the number of "010" continuous symbols in the WLn information bit, the symbol counter 109 counts the number of "101" continuous symbols, and the symbol counter 112 counts the number of "010" continuous symbols in which the exclusive OR of the k-bit-length string of the consecutive information bit having the usual bit output order and "01010101 . . . 0101" ("01" is repeatedly generated k-bit times) is computed. Additionally the symbol counter 113 counts the number of "010" continuous symbols in which the exclusive OR of the k-bit-length information bit and "10101010 . . . 1010" ("10" is repeatedly generated k-bit times) is computed. The sequence in Step S57 can be performed by feeding the information bit in Step SE56 into the information bit input of FIG. 13.

In Step SES8, the adjacent memory cell disturb reduction second-code conversion circuit 104 detects the "010" continuous symbol in the WLn−1 information bit and the adjacent WLn "x0x" continuous symbol after the second code conversion. The circuit shown in FIG. 22 can be used to detect the symbols. When the symbols are detected, the following sequence is performed. The symbol counter 116 counts the number of "x0x" (the programming is performed in the second bit) continuous symbols in the WLn information bit (k-bit), and the symbol counter 117 counts the number of "x1x" (the erasing is performed in the second bit) continuous symbols in the WLn information bit (k-bit). The symbol counter 118 counts the number of "x0x" continuous symbols in which the exclusive OR of the WLn information bit (k-bit) and "01010101 . . . 0101" is computed, and the symbol counter 119 counts the number of "x0x" continuous symbols in which the exclusive OR of the WLn information bit (k-bit) and "10101010 . . . 1010" is computed. The sequence in Step S58 can be performed by feeding the WLn and WLn−1 information bits in Step SE56 into the information bit input of FIG. 22.

In Step SE59, the adjacent memory cell disturb reduction second-code conversion circuit 104 compares the values of the symbol counters 108, 109, 112, and 113 to the values of the registers a, b, c, and d, respectively, and selects all the symbol counters and registers whose values are not more than a second threshold voltage. The processing in threshold voltage is referred to as selection a. In the case where the data memory system of the third embodiment is simultaneously used, the predetermined second threshold voltage is set at (value in which (k/6) is rounded up to the nearest integer)−1. In the case where the data memory system of the first or second embodiment is simultaneously used, the predetermined second threshold voltage is set at (value in which (k/4) is rounded up to the nearest integer)−1. The values of (value in which (k/6) is rounded up to the nearest integer)−1 and (value in which (k/4) is rounded up to the nearest integer)−1 become the upper limit of the number of "010" continuous symbols, and the detailed description is made in the first to third embodiments, so that the description is omitted here. According to the first to third embodiments, it is clear that the number of "010" continuous symbols can be coded to not more than the predetermined second threshold voltage using any combination of the $2^k$ k-bit information bits. Therefore, the code of the fourth embodiment satisfies the string in which the number of "010" continuous symbols is not more than the second threshold voltage of the simultaneously-utilized embodiment.

When the symbol counter 116 is selected in Steps SE59 and SE60, the symbol counter 108 corresponding to the same coding processing performed to WLn is also selected. When the symbol counter 117 is selected, the symbol counter 109 corresponding to the same coding processing performed to WLn is also selected. When the symbol counter 118 is selected, the symbol counter 112 corresponding to the same coding processing performed to WLn is also selected. When the symbol counter 119 is selected, the symbol counter 113 corresponding to the same coding processing performed to WLn is also selected.

When the register e is selected in Steps SE59 and SE60, the register a corresponding to the same coding processing performed to WLn is also selected. When the register f is selected, the register b corresponding to the same coding processing performed to WLn is also selected. When the register g is selected, the register c corresponding to the same coding processing performed to WLn is also selected. When the register h is selected, the register d corresponding to the same coding processing performed to WLn is also selected.

In Step SE60, in the registers and symbol counter in which the selection a is made, the adjacent memory cell disturb reduction second-code conversion circuit 104 compares contents of the symbol counters 116, 117, 118, and 119 to contents of the registers e, f, g, and h to determine whether the symbol counter or the register includes the contents which become the minimum value. In Step SE61, the adjacent memory cell disturb reduction second-code conversion circuit 104 determines whether or not a minimum value of the count values of the symbol counters 108, 109, 112, and 113 is smaller than a minimum value of the count values of the registers a, b, c, and d.

Figure 18B:
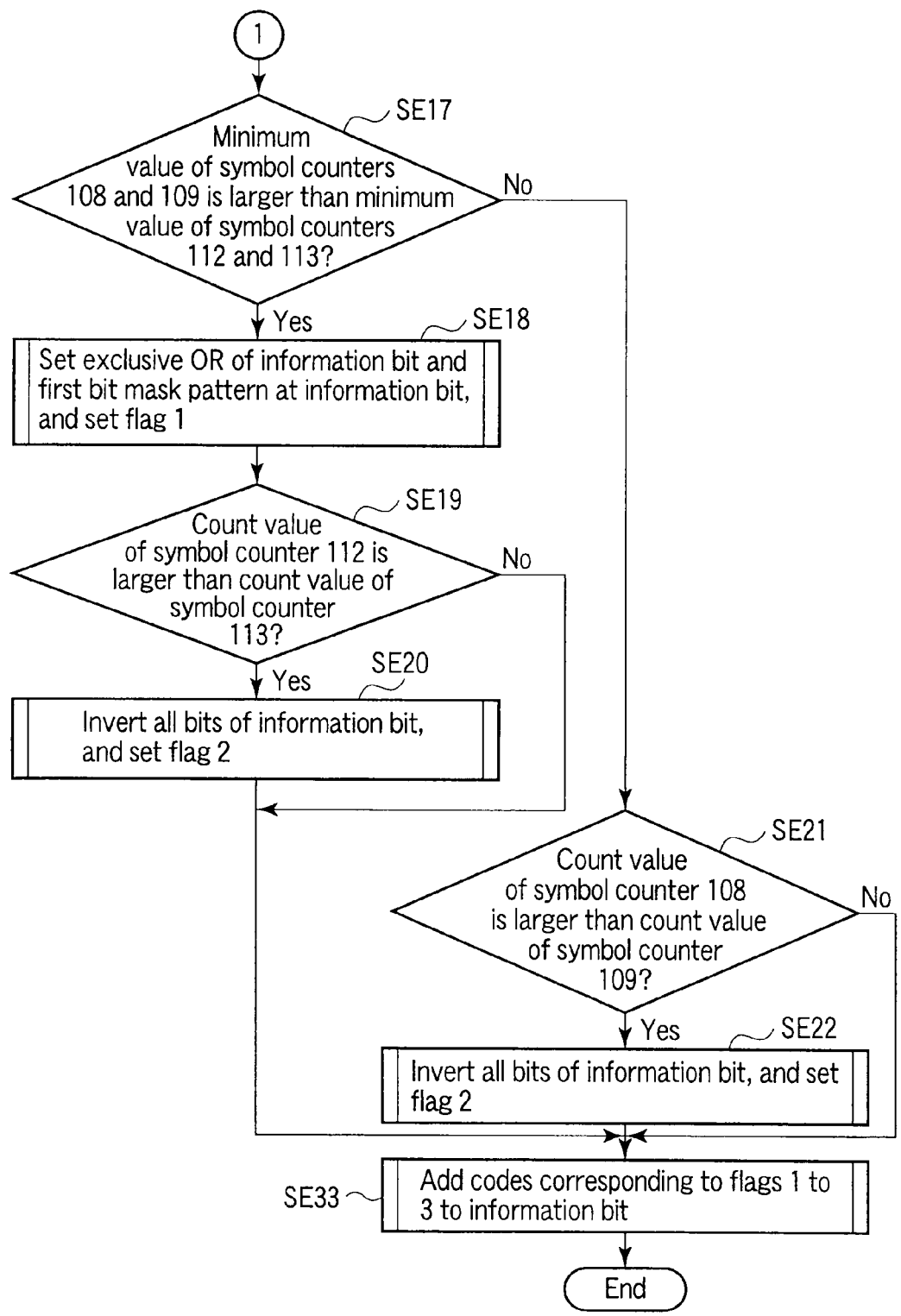
FIG. 18B is a flowchart showing the second code conversion of the third embodiment.
Figure 23A:
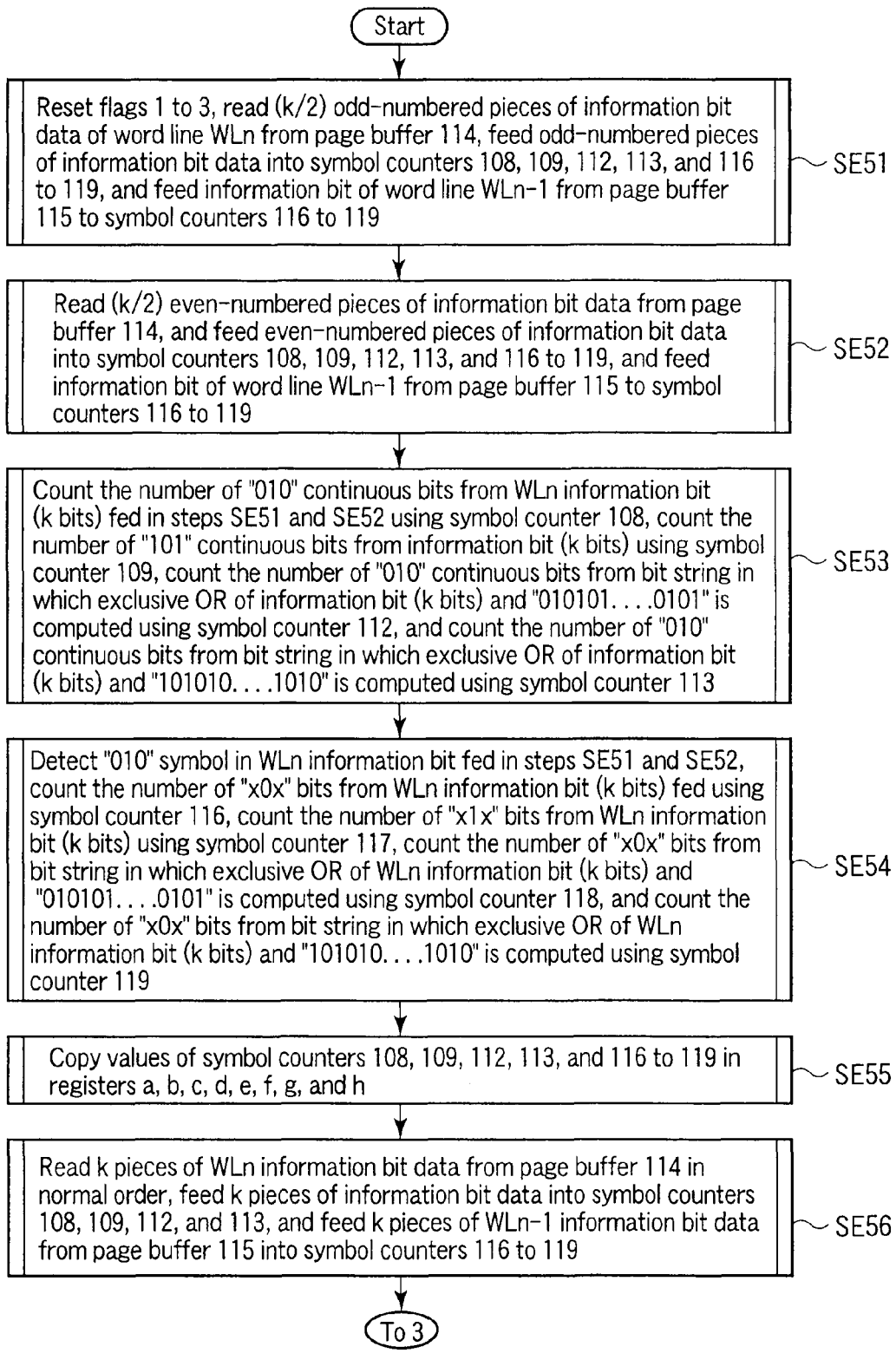
FIG. 23A is a flowchart showing second code conversion of the fourth embodiment.
Figure 23B:
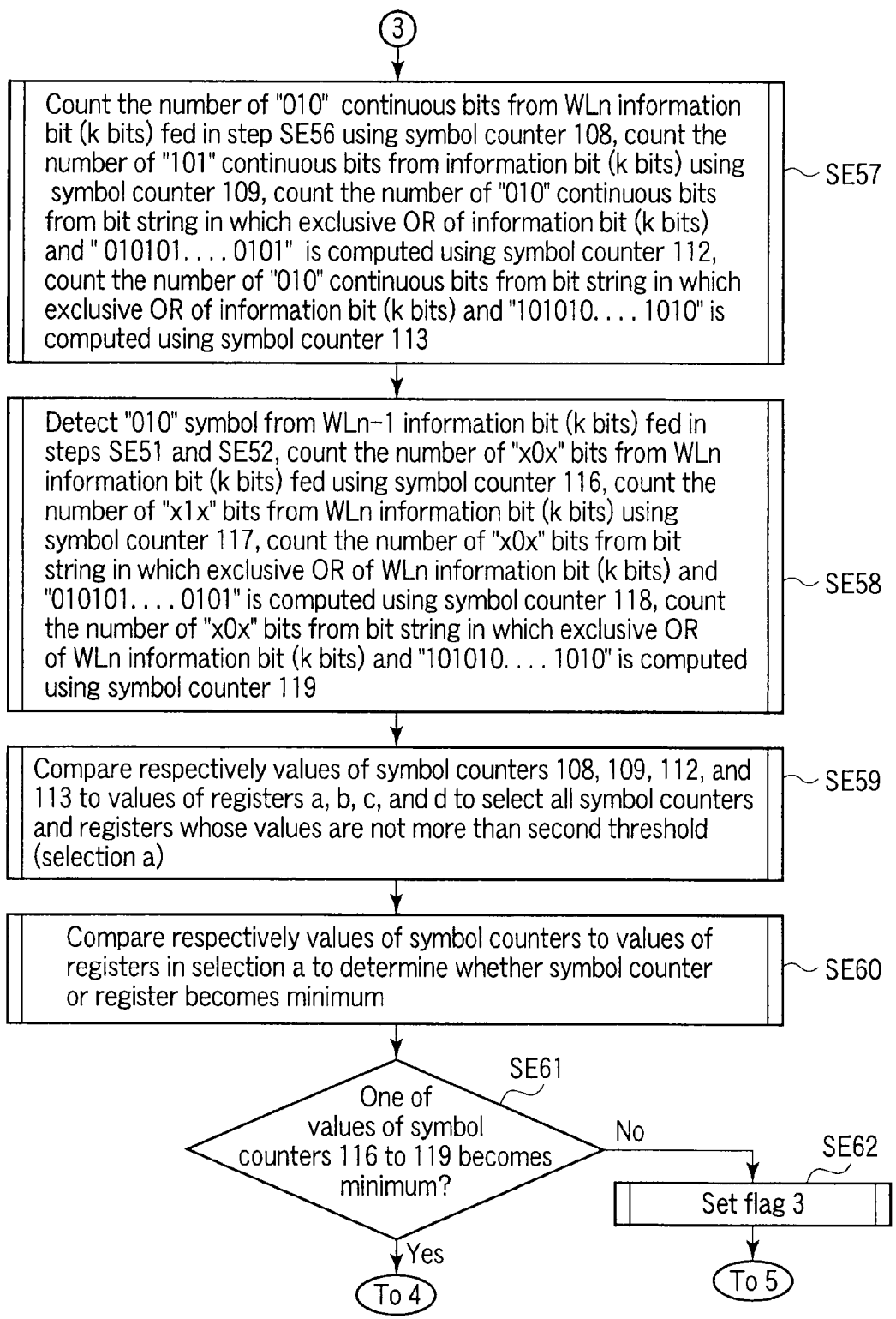
FIG. 23B is a flowchart showing the second code conversion of the fourth embodiment.
Figure 23C:
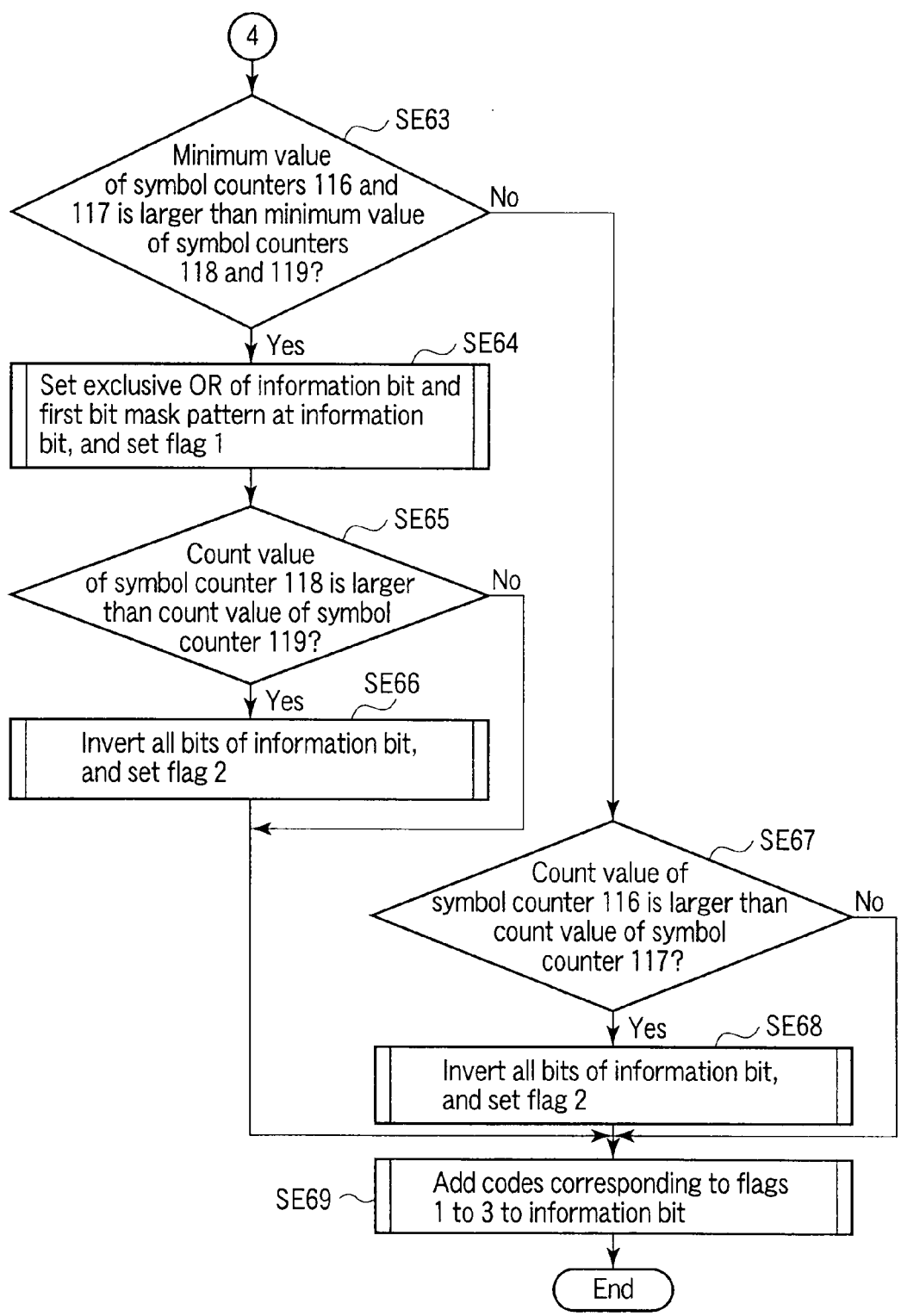
FIG. 23C is a flowchart showing the second code conversion of the fourth embodiment.

When the minimum value of the count values of the symbol counters 108, 109, 112, and 113 is smaller than the minimum value of the count values of the registers a, b, c, and d (YES in Step SE61), the sequence of FIG. 23C is performed while the flag 3 is reset. The sequences in Steps SE63 to SE69 are similar to those of FIG. 18B except for the branch conditions in Step SE63, SE65, and SE67, so that the description is omitted. The branch in Step SE17 of FIG. 18B is replaced with the branch in Step SE63. In Step SE17, the adjacent memory cell disturb reduction second-code conversion circuit 104 determines whether or not the smaller value of the count values of the symbol counters 108 and 109 is larger than the smaller value of the count values of the symbol counters 112 and 113. On the other hand, in Step SE63, the adjacent memory cell disturb reduction second-code conversion circuit 104 determines whether or not the smaller value of the count values of the symbol counters 116 and 117 is larger than the smaller value of the count values of the symbol counters 118 and 119. In Step SE17, the numbers of "010" continuous symbols of WLn after the second code conversion are compared to each other. However, in Step SE63, the "1" bit in the center of the "010" continuous symbol of WLn−1 in the memory cell M1$a$(α) and the numerical value of the combinations in which the WLn memory cell M2$a$(∈) adjacent in the direction of the word line WL becomes the programming bit of "0" are compared after the second code conversion is performed to the information bit written in WLn.

It is assumed that the register replacement is converted in the corresponding relationship between the registers described in Step SE59. The sequences in Steps SE19 and SE21 of FIG. 18B are also replaced with the sequences in Steps SE65 and SE67, so that the description is omitted.

In Step SE69, the adjacent memory cell disturb reduction second-code conversion circuit 104 add the codes corresponding to the flags 1 to 3 to the information bit (k-bit) to output the information bit to the error correcting code generation circuit 102.

Figure 23D:
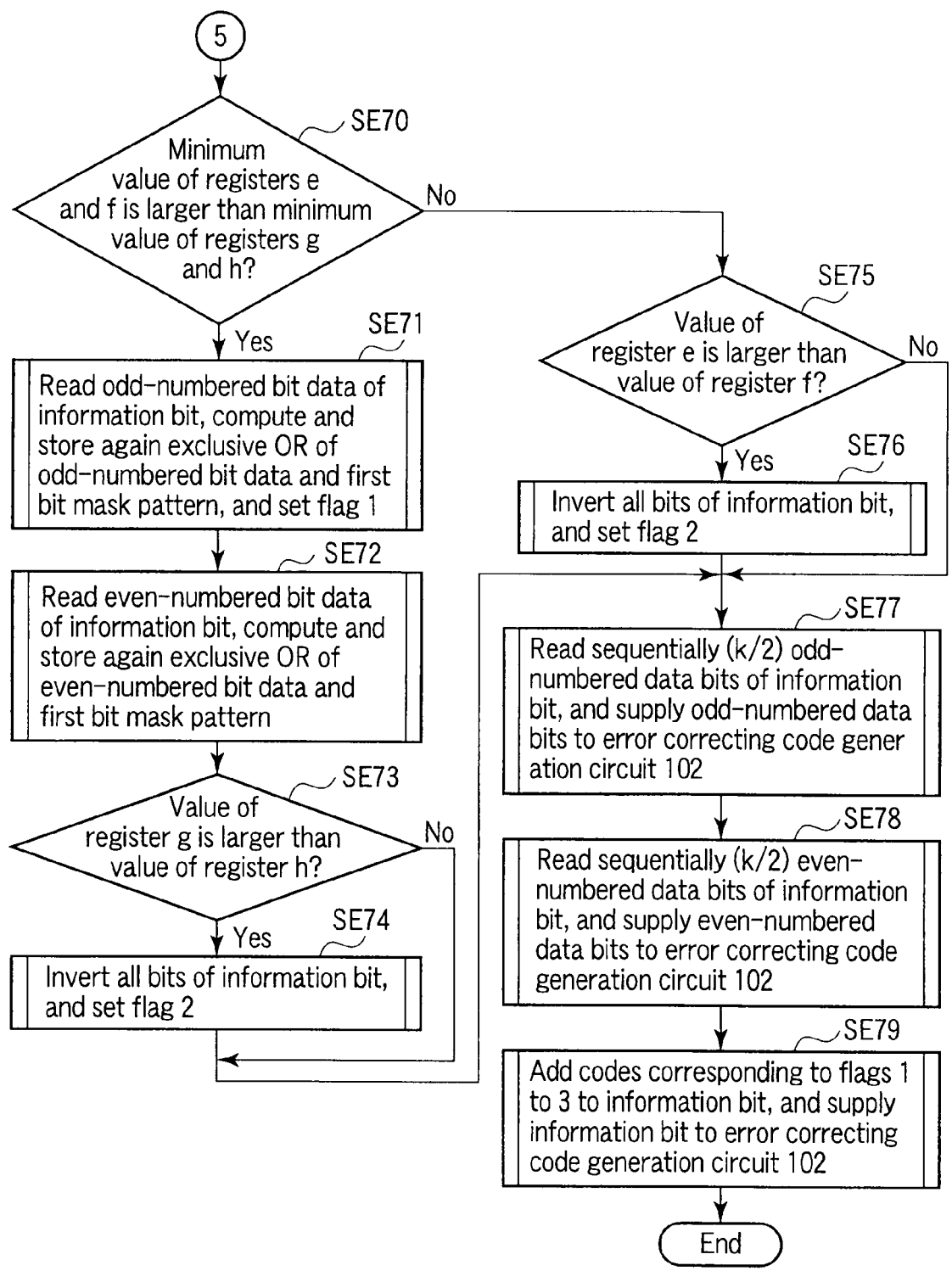
FIG. 23D is a flowchart showing the second code conversion of the fourth embodiment.

When the minimum value does not exist in the symbol counters 116, 117, 118, and 119 in Step SE61, the adjacent memory cell disturb reduction second-code conversion circuit 104 sets the flag 3 to perform the sequences of FIG. 23D in Step SE62.

Figure 18C:
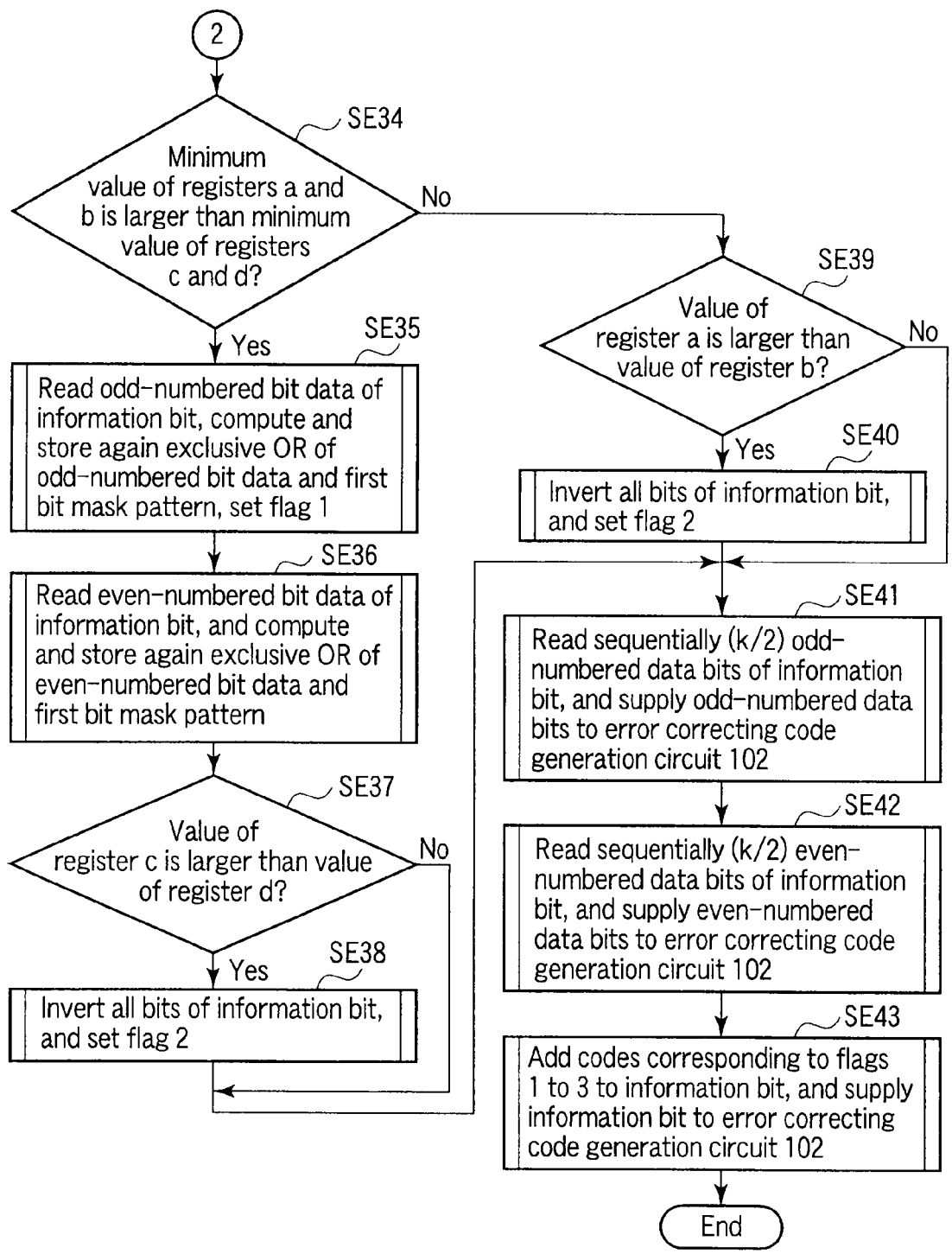
FIG. 18C is a flowchart showing the second code conversion of the third embodiment.

The sequences in Steps SE70 to SE79 are similar to those of FIG. 18C except for the branch conditions in Steps SE70, SE73, and SE75, so that the description is omitted. The sequences in Steps SE34, SE37, and SE39 of FIG. 18C are replaced with the sequences in Steps SE70, SE73, and SE75, so that the description is omitted.

Therefore, after the second code conversion, WLn is the code satisfying the string in which the number of "010" continuous symbols is not more than the second threshold voltage of the simultaneously-utilized embodiment, and the combination of the "1" bit in the center of the WLn−1 "010" continuous symbol in the memory cell M1$a$(α) and the programming bit of "0" in WLn adjacent in the direction of the word line WL in the memory cell M2$a$(∈) can be minimized.

Through the sequence, for the eight cases to which the code conversion of the third embodiment is performed, the number of "010" continuous symbols is previously counted in the information bit after the conversion, and the quantitative comparison is performed. Therefore, while the probability of occurrence of the troublesome "010" continuous symbol is maintained at the second threshold voltage or less, the influence of the capacitive interference of the memory cell in the direction of the word line WL in the part (iv) of FIG. 2 can be decreased lower than the comparative example.

For the adjacent memory cell disturb reduction second-code reverse conversion circuit 105, similarly to the third embodiment, the settings of the flags 1 to 3 and the second coding method correspond to each other. Therefore, the same decoding circuit as the third embodiment or the sequence 105 can be used.

For example, as shown in FIG. 20B, WLn−1 becomes the worst input pattern of the third embodiment and the input pattern of WLn is rearranged in each (k/3) bits. In such cases, when the fourth embodiment is applied to the worst "010" continuous symbol of WLn−1 of the third embodiment, a half of the points of WLn can be changed to not "0" but "1", and the increase in threshold voltage caused by the capacitive coupling in the WLn direction can be prevented. The WLn−1 code string is formed by (k/3)-bit "10101010 . . . 1010", (k/3)-bit "00000000 . . . 0000", and (k/3)-bit "00110011 . . . 0011", and the WLn code string is formed by (k/3)-bit "00110011 . . . 0011", (k/3)-bit "10101010 . . . 1010", and (k/3)-bit "00000000 . . . 0000". In such cases, the addition of the number of WLn−1 "010" continuous symbols and the number of WLn "x0x" continuous symbols are equalized to the addition of the number of WLn−1 "010" continuous symbols and the number of WLn "x1x" continuous symbols, and a half of the number of WLn−1 "010" continuous symbols can escape from the worst pattern in the part (iv) of FIG. 2. This is because, similarly to the description of the second embodiment, a half of the WLn points can be change to not "0" but "1" for the worst number of WLn−1 "010" continuous symbols at the minimum in the case where the number of WLn "010" continuous symbols is not changed by the whole bit inversion. When the WLn conversion of the third embodiment is applied, the WLn code string can be changed to the bit string including the (k/6)-bit "01010101 . . . 0101", (k/6)-bit "11111111 . . . 1111", (k/6)-bit "00000000 . . . 0000", (k/6)-bit "01010101 . . . 0101", and (k/3)-bit "00000000 . . . 0000" by the even number-odd number bit conversion. The number of WLn−1 "010" continuous symbols and the number of WLn "x0x" continuous symbols can be decreased to zero by the sequence of the fourth embodiment.

In one of modifications of the fourth embodiment, a cyclic shift of at least one bit is performed to the k bits which are the information bit, the addition (=α) of the number of WLn−1 "010" continuous symbols and the number of WLn "x0x" continuous symbols of the cyclically-shifted k bits is compared to that of the original k bits, and the minimum value is obtained when the number of WLn "010" continuous symbols is not more than the second threshold voltage.

In the case where the worst addition of the number of WLn−1 "010" continuous symbols and the number of WLn "x0x" continuous symbols is decreased, specifically the original information bit, the information bit cyclically shifted by one bit, the information bit cyclically shifted by two bits, the information bit cyclically shifted by three bits, the information bit cyclically shifted by four bits, . . . , and the information bit cyclically shifted by q bits are obtained. Desirably q is at least 15 bits from the viewpoint of the following discussion.

For example, in the page buffer of FIG. 16A, the cyclical shift means that, in the case of the information bit cyclically shifted by one bit, the output data of the second-bit flip-flop FF2 is fed and retained as the data of the first-bit flip-flop FF1, the output data of the third-bit flip-flop FF3 is fed and retained as the data of the second-bit flip-flop FF2, ..., the output data of the k-th-bit flip-flop FF(k) is fed and retained as the data of the (k−1)-th-bit flip-flop FF(k−1), and the output data of the first-bit flip-flop FF1 is fed and retained as the data of the k-th-bit flip-flop FF(k). This can be realized by an output state Dout2 shown in the left of FIG. 17A in which only one pulse of 0V→Vcc→0V is fed into the clocks $\phi1$ and $\phi2$. When the k bits which are the information bit are fed into the symbol counter of FIG. 22 of the fourth embodiment from the output of the page buffer 114 after the one pulse of 0V→Vcc→0V is fed, the addition of the number of WLn−1 "010" continuous symbols and the number of WLn "x0x" continuous symbols can be counted in the WLn information bit which is cyclically shifted by one bit. When the pulse of 0V→Vcc→0V is fed into the clocks $\phi1$ and $\phi2$ p times, the information bit which is cyclically shifted by p bits can easily be obtained. In order to restore the original information bit from the information bit which is cyclically shifted by p bits, the information bit is cyclically shifted by (k−p) bits when the information bit has the length k. The cyclic shift which is the coding and decoding can easily be realized by the configuration of the fourth embodiment. In the code which is subject to the cyclic shift and the original code, the number of "010" continuous symbols is influenced only by the first bit and k-th bit. When the number of cyclically-shifted bits is recorded, the information is not lost even if the configuration of the fourth embodiment is combined with the code conversion of the third embodiment.

In the modification, assuming that the cyclic shift is performed in q ways including the case in which the information bit is not cyclically shifted, the minimum value of $\alpha$ is obtained in 8×q conditions. In such cases, because only one bit located at the end contributes to the increase or decrease of the number of "010" continuous symbols in the cyclic shift, one point is increased at most even if the number of WLn−1 "010" continuous symbols is increased. On the other hand, the point where WLn−1 becomes the "010" continuous symbol and the point where WLn becomes the "x0x" continuous symbol are distant from each other by at least two bits. This is because the point which is distant from the "010" continuous symbol by one bit becomes the "10x" continuous symbol or the "x01" continuous symbol (x is any bit of "0" or "1") and does not become the "010" continuous symbol. Therefore, it is assumed as the worst value of the fourth embodiment that the addition of the number of WLn−1 "010" continuous symbols and the number of WLn−1 "x0x" continuous symbols is equal to the second threshold voltage while the number of worst states is not decreased by the one-bit shift, two-bit shift, three-bit shi, four-bit shift, . . . , q-bit shift. Because the number of worst states is not decreased from the zero-bit shift to (0+2)-bit shift, it is necessary that the one-bit shift pattern of the WLn bit corresponding to the point of the WLn−1 "010" continuous symbol becomes the "000" continuous symbol. Because the number of worst states is not decreased from the one-bit shift to (1+2)-bit shift, it is necessary that the two-bit shift pattern of the WLn bit corresponding to the point of the WLn−1 "010" continuous symbol becomes the "000" continuous symbol. In the case where the second threshold voltage is set at (value in which (k/6) is rounded up to the nearest integer)−10f the third embodiment, because (k/3)−1 becomes the minimum value in "01010101.01010", the pattern facing the WLn "010" continuous symbol in the number of worst states becomes the ((k/3)−1+(q−2))-bits continuous pattern of "00000000 . . . 0000". Therefore, in consideration of the same discussion as the conversion of the first embodiment, letting q>=(value in which (k/6) is rounded up to the nearest integer)+8 sets at least ((k/2)+5) bits of "00000000 . . . 0000", and the numbers of "010" continuous symbols and "101" continuous symbols included in the remaining bits become (value in which (k/4) is rounded up to the nearest integer)−3 or less. Therefore, in the case where the threshold voltage of the second embodiment is used, even if the whole bit inversion is performed to the WLn information bit, the number of "010" continuous symbols in the inverted WLn information bit can be restrained to the (value in which (k/4) is rounded up to the nearest integer)−3 or less. Additionally, the WLn corresponding to the point of the WLn−1 "010" continuous symbols can be changed from the "0" bit to the "1" bit by the bit inversion, which contradicts the assumption even if the number of "010" continuous symbols is increased by one due to the end state. That is, the q-bit shift is set at q>=(value in which (k/6) is rounded up to the nearest integer)+8, the upper limit of the addition of the number of WLn−1 "010" continuous symbols and the number of WLn "x0x" continuous symbols can be constrained compared with the case in which the shift is not performed. Letting q>=15 in the conversion of the third embodiment can set the pattern facing the WLn "010" continuous symbol in the number of worst state at (k/3)−1+(q−2)>=(k/3)+12 of "00000000 . . . 0000". Similarly to the discussion of the third embodiment, the upper limit of the addition of the number of WLn−1 "010" continuous symbols and the number of WLn "x0x" continuous symbols can be constrained compared with the worst upper limit in the case in which the shift is not performed.

In the case where the "010" continuous symbols are disposed while dispersed, the upper limit of the number of WLn "x0x" continuous symbols can be constrained by the cyclic shift of the q bits or less compared with the case in which the "010" continuous symbols are continuously disposed like "0101010".

Thus, before the code conversion (even number-odd number bit conversion) of the fourth embodiment, the cyclic shift is performed by the q bits in the modification, the addition of the number of WLn−1 "010" continuous symbols and the number of WLn "x0x" continuous symbols is obtained to fix the shift number which becomes the condition, and the information bit data is cyclically shifted, whereby the upper limit of the addition of the number of WLn−1 "010" continuous symbols and the number of WLn "x0x" continuous symbols can be decreased. On the other hand, similarly to the third embodiment, the bit corresponding to the flag of (value in which $\log_2(q+1)$ is rounded up to the nearest integer) can be added as the shift number q to the information bit and coded. Similarly the cyclic shift number q is separated from the code in separating the flag bit in Step SE44, and the (k−q)-bit pulse of 0V→Vcc→0V is previously fed into the clocks $\phi1$ and $\phi2$ of FIG. 17F in Step SE50, and therefore the restoring can easily be performed.

In the modification, it is not necessary to read WLn−1 in restoring WLn, and the bit error is not directly generated by the bit error in reading WLn−1, so that the high-speed reading can be realized.

[Fifth Embodiment (Example Applied to MONOS Type)]

A data memory system according to a fifth embodiment of the invention will be described with reference to FIGS. 24A and 24B. In the fifth embodiment, the NAND cell array block 49 in which the floating gate is used in the first to fourth embodiments is changed to a NAND cell array block in which a MONOS type gate is used. The detailed description of the portion overlapping the first to fourth embodiments is omitted in the fifth embodiment.

FIGS. 24A and 24B are sectional views taken on lines B-B' and A-A' of the NAND cell array block corresponding to that of FIGS. 6A and 6B. The plan view of the NAND cell array block of the fifth embodiment is omitted because the plan view is identical to that of FIG. 5B.

Referring to FIG. 24, the nonvolatile memory cells M0 to M31 including the MOS transistor whose charge accumulation electrode 26 is made of SiN or SiON are connected in series, one end of the series-connected nonvolatile memory cells M0 to M31 is connected to the data transfer line BL with the selection transistor S1 interposed therebetween, and the other end is connected to the common source line SL with the selection transistor S2 interposed therebetween. Each transistor is formed on the same well. In FIG. 24, the charge accumulation layer 26 is formed on the p-type silicon region 23 with the tunnel gate insulator interposed therebetween. The p-type silicon region 23 has a boron impurity concentration of $10^{14}$ cm$^{-3}$ to $10^{19}$ cm$^{-3}$. The charge accumulation layers 26 made of SiN or SiON has the thickness of 3 nm to 50 nm. The tunnel gate insulator is formed by the silicon oxide film or oxynitride film whose thickness ranges from 1 to 10 nm. The control gates 27 are formed on the charge accumulation layers 26 with the inter-layer insulator 50 interposed therebetween. The control gate 27 has the thickness of 10 nm to 500 nm, and is formed by a stacked structure of WSi (tungsten silicide) and polysilicon, a stacked structure of W and polysilicon, a stacked structure of NiSi, MoSi, TiSi, or CoSi and polysilicon, or a laminated structure of a barrier metal of TaN and TiN. The inter-layer insulator 50 has the thickness of 2 nm to 20 nm, and is formed by a silicon oxide film, Al$_2$O$_3$, HfSiO, ZrSiO, HfSiON, or ZrSiON. The control gate 27 is formed to the block boundary in the horizontal direction of FIG. 5B so as to be connected to the adjacent memory cell block, and the control gates 27 constitute the word lines WL0 to WL31 and the selection gate control lines SSL and GSL. In the p-type silicon region 23, desirably the voltage can be applied independently of the p-type semiconductor substrate 21 by the n-type silicon region 22 in order to reduce the load on the boosting circuit to restrain the power consumption during the erasing. In the gate shape of the fifth embodiment, because the sidewall of the semiconductor region 23 is covered with the isolation insulator 24, the semiconductor region 23 is not exposed by the etching before the charge accumulation layer 26 is formed, and the charge accumulation layer 26 can be prevented from being located below the semiconductor region 23. Therefore, the parasitic transistor in which the gate electric field concentration or the lowering of the threshold voltage is generated is hardly generated at the boundary between the semiconductor region 23 and the isolation insulator 24. Additionally, the phenomenon in which the programming threshold voltage is lowered due to the electric field concentration, that is, the sidewalk phenomenon is hardly generated, so that the high-reliability transistor can be formed.

The n-type diffusion layers 28 are formed on both sides of the gate electrode while the gate electrode is sandwiched between the sidewall insulators 43. The n-type diffusion layer 28 constitutes a source or drain electrode. The sidewall insulator 43 having a thickness of 5 nm to 200 nm is formed by the silicon nitride film or the silicon oxide film. The MONOS type nonvolatile EEPROM cell is formed by the diffusion layer 28, the charge accumulation layer 26, and the control gate 27. In the MONOS type nonvolatile EEPROM cell, a gate length of the charge accumulation layer ranges from 0.01 µm to 0.5 µm. The n-type diffusion layer 28 of the source or drain is formed in a depth of 10 nm to 500 nm such that a surface concentration of phosphorous, arsenic, or antimony ranges from $10^{17}$ cm$^{-3}$ to $10^{21}$ cm$^{-3}$. The n-type diffusion layer 28 is series-connected by the adjacent memory cells, thereby realizing the NAND connection. In FIG. 24B, the gate electrodes 27SSL and 27GSL are connected to the block selection lines SSL and GSL, and are formed in the same layer as the control electrode of the MONOS type EEPROM. The gate electrodes 27SSL and 27GSL face the p-type well 23 with the gate insulators 25SSL and 25GSL interposed therebetween, and the gate electrodes 27SSL and 27GSL constitute the MOS transistor. The gate insulators 25SSL and 25GSL are formed by the silicon oxide film or oxynitride film whose thickness ranges from 3 to 15 nm. The gate lengths of the gate electrodes 27SSL and 27GSL are longer than that of the memory cell gate electrode. For example, the gate electrodes 27SSL and 27GSL have the gate lengths of 0.02 µm to 1 µm, and an on-off ratio can largely be ensured during selecting and non-selecting the block to prevent the program disturbance or read disturbance.

The n-type diffusion layer 28d formed on one side of the control gate 27(SSL) constitutes the source or drain electrode, and is connected to the data transfer line 36(BL) through a contact 31d. The data transfer line 36(BL) is made of tungsten, tungsten silicide, titanium, titanium nitride, or aluminum. The data transfer line 36(BL) is formed to the block boundary in the vertical direction of FIG. 5B so as to be connected to adjacent memory cell blocks. On the other hand, the n-type diffusion layer 28S formed on one side of a control gate 27(GSL) constitutes the source or drain electrode, and is connected to the source line 33(SL) through the contact 31S. The source line 33(SL) is formed to the block boundary in the horizontal direction of FIG. 5B so as to be connected to adjacent memory cell blocks. Alternatively, the n-type diffusion layer 28S may be formed to the block boundary in the horizontal direction of FIG. 5B to form the source line. The contact 31d and the contact 31S are filled with the n-type or p-type doped polysilicon or tungsten and tungsten silicide, Al, TiN, or Ti to form the conductive region. The gap between the source line 33(SL) and the transistor and the gap between the data transfer line 36(BL) and the transistor are filled with the inter-layer film 28 made of SiO$_2$ or SiN. The insulator protective layer 37 made of SiO$_2$, SiN, or polyimide and an upper interconnection (not shown) made of W, Al, or Cu are formed on the data transfer line 36(BL).

In the fifth embodiment, in addition to the effects of the first to fourth embodiments, because the MONOS type cell is utilized, the programming voltage and erasing voltage can be lowered compared with the floating gate type EEPROM cell of the first to fourth embodiments, and the withstand voltage can be maintained even if the isolation interval is narrowed to thin the thickness of the gate insulator. Therefore, an area of the circuit to which the high voltage is applied can be reduced, and the chip area can be reduced.

Compared with the first to fourth embodiments, the thickness of the charge accumulation layer 26 can be decreased to 20 nm or less, an aspect ratio can be reduced in forming the gate, the forming shape of the gate electrode and the embedment of the inter-layer insulator 28 between the gates can be improved, and the withstand voltage can be enhanced. The process for forming the floating gate electrode and the process for producing the slit are not required, so that the process can be shortened.

The charge accumulation layer 26 is made of the insulating material, and the charges are trapped by each charge trap, so that the charges hardly drop out of the charge trap against a radioactive ray. Even if the sidewall insulator 43 of the charge accumulation layer 26 is thinned, all the charges trapped by the charge accumulation layer 26 do not drop out, so that a good retaining characteristic can be maintained. The charge accumulation layer 26 can be formed while aligned with the semiconductor region 23, and the even capacity between the charge accumulation layer and the semiconductor region 23 can be realized. Therefore, the fluctuation in capacity of the memory cell or the fluctuation in capacity among the memory cells can be reduced.

[Sixth Embodiment (Example Applied to NOR Type)]

A data memory system according to a sixth embodiment of the invention will be described with reference to FIG. 25. In the sixth embodiment, the NAND cell array blocks 49 of the first to fifth embodiments are changed to a NOR cell array block. The same component as the first to fifth embodiments is designated by the same numeral, and the detailed description is omitted. In the first to fifth embodiments, the description of the same effect which is not limited to the specific embodiment is omitted.

FIG. 25A is a circuit diagram showing the NOR cell array block of the sixth embodiment, FIG. 25B is a plan view showing the NOR cell array block, FIG. 25C is a sectional view showing a memory cell portion in the row direction, and FIG. 25D is a sectional view showing the memory cell portion in the column direction. Referring to FIG. 25A, in plural nonvolatile memory cells M0 to M2 which include MOS transistors having charge accumulation layer electrodes, current terminals are connected in parallel, and one end is connected to the data transfer line BL, and the other end is connected to the common source line SL. In the NOR memory cell, the memory cell block 49 is formed by one transistor. Each transistor is formed on the same well. The control electrodes of the memory cells M0 and M1 are connected to the word lines WL0 and WL1, respectively. FIG. 25B is the plan view of the memory cell block 49, FIG. 25C is the sectional view taken on a line B-B' of FIG. 25B, and FIG. 25D is the sectional view taken on a line A-A' of FIG. 25B. Particularly, FIG. 25B shows only the structure below a control gate electrode 27 for the sake of easy understanding of the cell structure. Referring to FIGS. 25C and 25D, the charge accumulation layer 26 is formed in the p-type silicon region 23 with the tunnel gate insulator 25 interposed therebetween. The tunnel gate insulator 25 is formed by the silicon oxide film or oxynitride film whose thickness ranges from 3 to 15 nm. The charge accumulation layer 26 is made of polysilicon in which phosphorous or arsenic of $10^{18}$ cm$^{-3}$ to $10^{21}$ cm$^{-3}$ is doped, and the charge accumulation layer 26 has the thickness of 10 nm to 500 nm. The charge accumulation layer 26 and the tunnel gate insulator 25 are formed on the p-type silicon region 23 in the region where the isolation insulator 24 including the silicon oxide film is not formed.

The block insulator 50 is formed on the charge accumulation layer 26. The block insulator 50 has the thickness of 5 nm to 30 nm, and is formed by a silicon oxide film or an oxynitride film, or silicon oxide film/silicon nitride film/silicon oxide film. The block insulator 50, the charge accumulation layer 26, and the tunnel gate insulator 25 are formed on the p-type silicon region 23 in the region where the isolation insulator 24 including the silicon oxide film is not formed.

The control gate 27 is formed on the block insulator 50. The control gate 27 has the thickness of 10 nm to 500 nm, and is formed by polysilicon, a stacked structure of WSi (tungsten silicide) and polysilicon, or a stacked structure of CoSi and polysilicon. The control gate 27 is formed to the block boundaries in the horizontal direction of FIG. 25B so as to be connected to adjacent memory cell blocks, and the control gates 27 constitute the word lines WL0 to WL2. In the p-type silicon region 23, desirably the voltage can be applied independently of the p-type semiconductor substrate 21 by the n-type silicon region 22 in order to reduce the load on the boosting circuit to restrain power consumption during the erasing.

As shown in FIG. 25D, in the section A-A' corresponding to the memory cell, the n-type diffusion layers 28 are formed below the gate electrode while the gate electrode is sandwiched between inter-layer insulators 56. The n-type diffusion layers 28 constitute the source or drain electrode. The inter-layer insulator 56 has the thickness of 5 nm to 200 nm, and is formed by the silicon oxide film or the oxynitride film. The diffusion layer 28, the charge accumulation layer 26, and the control gate 27 constitute the floating gate type EEPROM cell in which the charge amount accumulated in the charge accumulation layer is utilized as the information amount, and the floating gate type EEPROM cell has the gate length of 0.01 μm to 0.5 μm. As shown in FIGS. 25B and 25D, the n-type diffusion layer 28 is coupled with the n-type diffusion layer 28d connected to the data transfer line BL, and the n-type diffusion layer 28 is extended in the horizontal line of FIG. 25B to form the source line SL to which the adjacent memory cells are connected. In the NOR type cell, the insulator is formed in the data transfer line direction sandwiched between the source lines SL, and the insulator is formed between the charge accumulation layers of the memory cell adjacent in the word line direction. Therefore, the fluctuation in threshold voltage is generated due to the capacitive coupling between the charge accumulation layers. In the two memory cells M1a(α) and M2a(∈) of FIG. 25A which are adjacent to each other with the source line SL interposed therebetween, when the programming is performed in each bit while the reading is performed as the series of information bit strings, the first to fourth embodiments can be applied to the written or read information bit string to prevent the fluctuation in threshold voltage caused by the capacitive coupling between the charge accumulation layers.

As shown in FIG. 25A, because the insulator is also embedded between the two memory cells M1a(α) and M1b(β) or M1a(α) and M1b'(γ) adjacent in the row direction, the fluctuation in threshold voltage is generated due to the capacitive coupling between the charge accumulation layers. Therefore, in the two memory cells M1a(α) and M1b(β) or M1a(α) and M1b'(γ) of FIG. 25A which are adjacent to each other in the row direction, when the programming is performed in each bit while the reading is performed as the series of information bit strings, the first to fourth embodiments can be applied to the written or read information bit string to prevent the fluctuation in threshold voltage caused by the capacitive coupling between the charge accumulation layers.

[Seventh Embodiment (Example Applied to Virtual Ground MONOS Type)]

A data memory system according to a seventh embodiment of the invention will be described with reference to FIGS. 26 to 28. In the seventh embodiment, the NAND cell array blocks 49 of the first to fifth embodiments are changed to a virtual ground cell array block 49 having the MONOS structure. In the seventh embodiment, the same component as the first to sixth embodiments is designated by the same numeral, and the detailed description is omitted. In the first to sixth embodiments, the description of the same effect which is not limited to the specific embodiment is omitted.

Figure 26A:
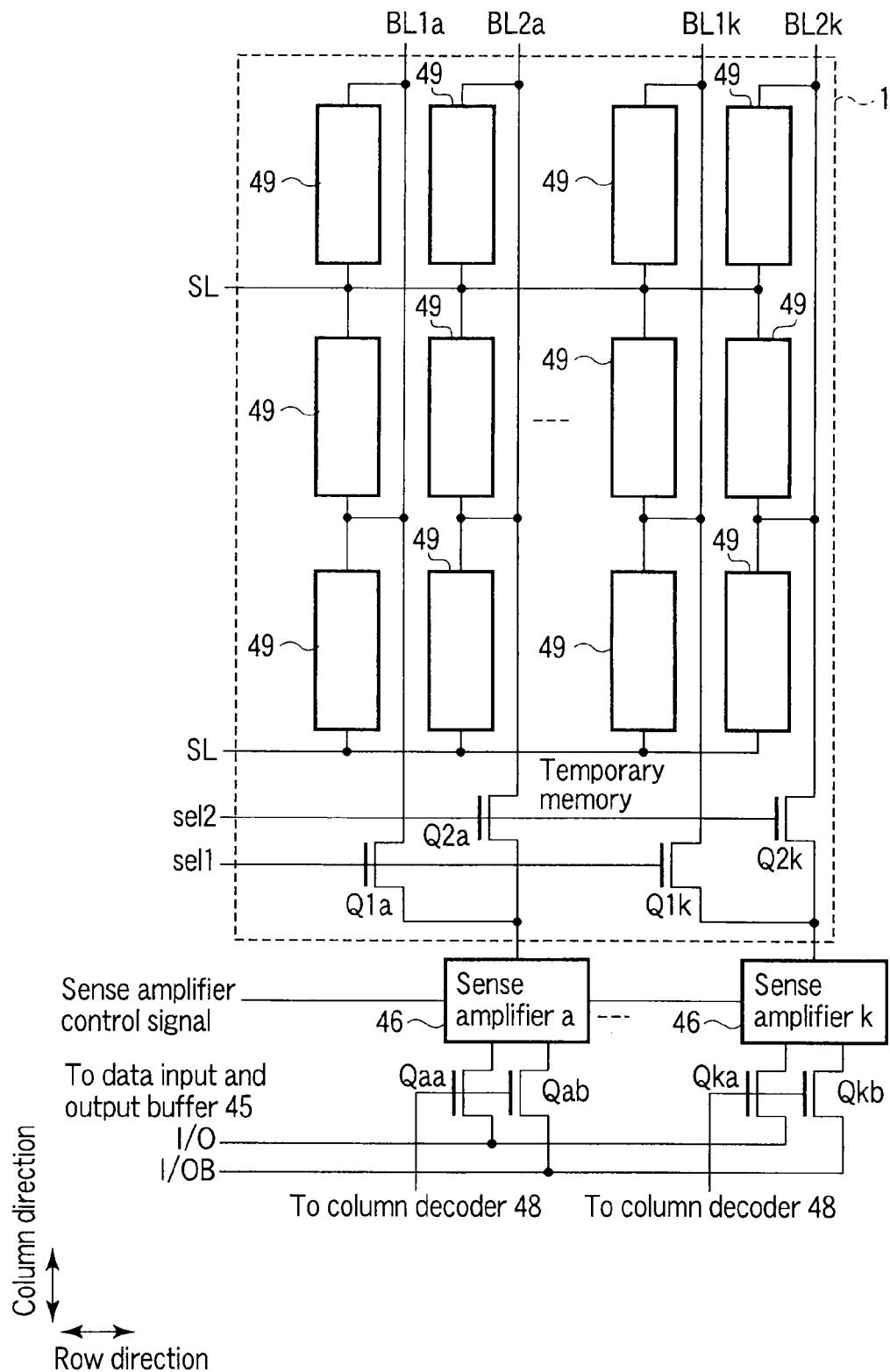
FIG. 26A is a layout diagram showing a NAND type memory cell array of the sixth embodiment.
Figure 26B:
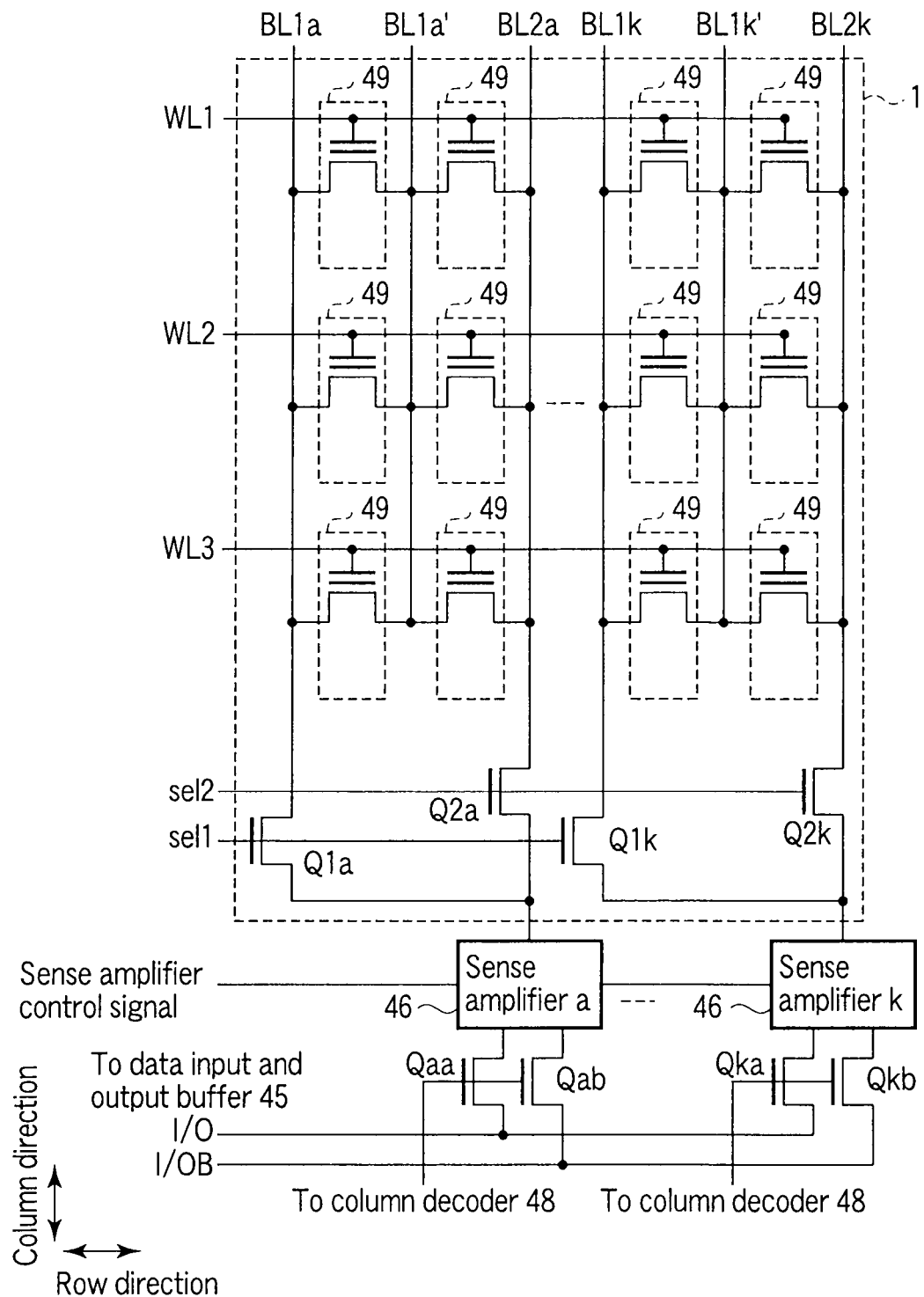
FIG. 26B is a layout diagram showing an NROM type memory cell array of the sixth embodiment.

FIG. 26A shows a wiring relationship of the NAND cell array matrix 1, and FIG. 26B shows a wiring relationship of the NROM cell array matrix 1. As shown in FIG. 26B, the NROM cell array is formed by arraying the memory cell blocks 49 in which the nonvolatile memory cells are connected in parallel. In order to sense the data on the data transfer line of the memory cell array 1, or in order to retain the programming data, sense amplifier/data registers 46 are provided while data transfer line selection transistors Q1a, Q2a, . . . , Q1k, and Q2k are interposed between the sense amplifier/data registers 46 and the NROM cell array, respectively. For example, the sense amplifier circuit is mainly formed by the flip-flop circuit. The sense amplifier/data registers 46 are connected to the data input and output buffer 45. The connections are controlled by the output of the column decoder 48 which receives the address signal from the address buffer 47, the data imparted to the data input and output buffer 45 can be written in the memory cell array 1, and the data can be read onto the second internal I/O line. In order to select the memory cell of the memory cell array 1, specifically the row decoder 3 is provided to control the data control lines WL0 to WL2 and the data transfer line selection transistors sel1 and sel2.

FIG. 27 is a sectional view showing the memory cell portion in the row direction of the virtual ground array block and FIG. 28 is a sectional view showing the memory cell portion in the column direction. FIGS. 27 and 28 show the structure in which the two memory cells are connected. FIG. 27 is the sectional view showing the MONOS memory of the seventh embodiment, and FIG. 27 shows the two memory cells whose gate electrodes 8 are connected. FIG. 28 shows the structure in the section orthogonal to the section of FIG. 27 passing through the gate electrodes.

In the seventh embodiment, the direction in which the data control line (corresponding to the numerals 11 and 8') connected to the gate electrode 8 is formed is matched with the direction in which the channel is formed. In the seventh embodiment, the charges are accumulated near the source and drain electrodes of each memory cell, and information on at least two bits is stored per one memory cell. In the structure of the seventh embodiment, each bit can be read according to the directions of the voltage at the source electrode and drain electrode by the method disclosed in U.S. Pat. No. 6,201,282. In such cases, equivalently the current terminal of the bit on the side where the information is not read and the current terminal of the bit on the side where the information is read are connected in series, so that the read disturb stress similar to that of the NAND type memory cell is applied to the bit on the side where the information is not read. Therefore, in the bit on the side where the information is not read, the reading is repeated to change the bit from the erasing state to the programming state.

Even in the structure of the seventh embodiment, adjacent charge accumulation areas 26 are formed in the data transfer line direction and the word line direction with the insulator interposed therebetween. Therefore, in the case where the pieces of information are simultaneously written in the plural adjacent memory cells, the fluctuation in threshold voltage is generated by the capacitive coupling of the adjacent memory cells. The effect of the second coding in the first to fourth embodiments can be obtained. In FIGS. 27 and 28, the first insulator 25 is formed on the p-type silicon semiconductor area 23. The first insulator 25 has the thickness of 0.5 nm to 10 nm, and is formed by the silicon oxide film or oxynitride film. The p-type silicon semiconductor area 23 has the boron or indium impurity concentration of $10^{14}$ $cm^{-3}$ to $10^{19}$ $cm^{-3}$. The charge accumulation layer 26 is formed on the first gate insulator 25. The charge accumulation layer 26 is formed by the silicon nitride film, and has the thickness of 3 nm to 50 nm. The polysilicon layers 51 and 27 are formed on the charge accumulation layer 26 with the block insulator (second insulator) 50 interposed therebetween. The boron, phosphorus, or arsenic having the impurity of $1\times10^{19}$ $cm^{-3}$ to $1\times10^{21}$ $cm^{-3}$ is doped in the polysilicon layers 51 and 27, and the polysilicon layers 51 and 27 have the thicknesses of 10 nm to 500 nm. The block insulator 50 has the thickness of 5 nm to 30 nm, and is formed by the silicon oxide film or oxynitride film, $Al_2O_3$, ZrSiO, HfSiO, ZrSiON or HfSiON. At this point, when the boron, phosphorus, or arsenic impurity concentration is set at $1\times10^{19}$ $cm^{-3}$ or more in the polysilicon layers 51 and 27, the electric field applied to the ONO laminated film is decreased by depletion of the control electrode, and the increase in erasing time or programming time is suitably prevented.

A metal backing layer 27' for the control gate may be formed on the polysilicon 27. The metal backing layer 27' has the thickness of 10 nm to 500 nm, and is made of WSi (tungsten silicide), NiSi, MoSi, TiSi, CoSi, W, Al, or AlCu. The polysilicon layer 51 constitutes the control electrode, and the metal backing layer 27' causes the resistance of the control electrode to be lowered.

An insulator 60 may be formed on the metal backing layer. The insulator 60 is made of the silicon nitride film or silicon oxide film, and has the thickness of 5 nm to 500 nm. The insulator 60 acts as an insulator which becomes a mask in forming the gate electrode. The sidewall insulators 19 made of the silicon oxide film or silicon oxynitride film are formed on both sides of the gate electrode. At least a side surface contacting the gate electrode 51 of the sidewall insulator 19 is formed by oxidizing or oxy-nitriding the gate electrode 51 containing silicon in order to decrease the charge trap density lower than that of the insulator formed by the deposit film, to increase dielectric breakdown voltage, and to decrease the interface state density between the gate electrode 51 and the insulator 19. Thus, the thermally-oxidized film having quality higher than that of the deposited film can be used as the gate sidewall.

FIG. 27 shows an example in which the charge accumulation film 26 is partially removed on the source area and drain area 28 to form the isolation insulator 12 made of the silicon oxide film. Because the charge accumulation layer 26 is made of the insulating material, it is not always necessary to remove the charge accumulation film 26 on the source area and drain area 28, but the isolation insulator 12 may be continuously formed.

The shape of FIG. 27 can be formed by the following procedure. For example, the gate electrode material 51 containing silicon is deposited without forming the metal backing layer 27', and the patterning and anisotropic etching are linearly performed to the first insulator 25 such that the direction perpendicular to the paper surface becomes the lengthwise direction, thereby removing the gate electrode material 51, the second insulator 50, the charge accumulation layer 26, and the first insulator 25. Then the sidewall insulator 19 is formed by oxidizing or oxy-nitriding the gate electrode 51, and the n-type layer 28 constituting the source area and drain area is formed by ion implantation of phosphorus, arsenic, or antimony. The ion implantation is performed in the depth of 10 nm to 500 nm such that the surface concentration of phosphorus, arsenic, or antimony ranges from $10^{17}$ $cm^{-3}$ to $10^{21}$ $cm^{-3}$. Then the silicon oxide film, silicate glass, or inorganic glass which constitutes the insulator 68 is deposited over the surface in the thickness range of 10 nm to 1000 nm, the insulator 68 is planarized by CMP (Chemical Mechanical Polishing), and the top surface of the gate electrode 51 is exposed by wet etching using, for example, an ammonium fluoride solution. Then the second gate electrode material 27 which constitutes the control electrode is deposited in the range of 10 nm to 300 nm. The second gate electrode material 27 is made of polysilicon or SiGe mixed crystal. Then the metal backing layer 27' and the mask insulator 60 are deposited over the surface. When the boron, phosphorus, or arsenic concentration of the second gate electrode material 27 is set at $1 \times 10^{19}$ cm$^{-3}$ or more, the electric field applied to the ONO laminated film is decreased by depletion of the control electrode, and the increase in erasing time or programming time is suitably prevented. Then, in the memory cell, the patterning is linearly performed in the direction orthogonal to the pattern of FIG. 27, and the anisotropic etching is performed to the mask insulator 60, the metal backing layer 27', the second gate electrode material 27, the gate electrode material 51, and the second insulator 50. Then, in order to reduce the leak current between the memory cell channels shown by the two gate electrodes 51 of FIG. 28, the ion implantation of boron, BF$_2$, or indium may be performed in the depth of 10 nm to 500 nm such that the surface concentration ranges from $10^{16}$ cm$^{-3}$ to $10^{18}$ cm$^{-3}$, thereby forming the p-type layer 18. Then the insulator 61 is formed over the surface in the thickness range of 5 nm to 200 nm. The insulator 61 is formed by the silicon nitride film, silicon oxynitride film, or alumina film.

The insulator 61 is deposited by a CVD (Chemical Vapor Deposition) method or a sputtering method. Desirably the full deposition of the insulator 61 on the memory cell prevents the gas, radical, or ion from the film formed above the insulator 61 from having an adverse influence on the memory cell.

The inter-layer insulator 62 having the thickness of 10 nm to 1000 nm is formed on the insulator 61. The inter-layer insulator 62 is made of silicate glass such as BPSG, PSG, and BSG which contains boron or phosphorus of $1 \times 10^{20}$ cm$^{-3}$ or more. Because the silicate glass has a function of gettering an alkaline ion, desirably the inter-layer insulator 62 is formed over the surface of the memory cell in order to prevent contamination of the alkaline ion. In FIGS. 27 and 28, the inter-layer insulator 62 is formed in direct contact with the insulator 61. However, it is not always necessary that the inter-layer insulator 62 be formed in direct contact with the insulator 61. For example, the inter-layer insulator 62 may be formed as an insulator between interconnection layers or an insulator on an interconnection layer because the inter-layer insulator 62 has the gettering effect.

Because generally the silicate glass has a bad embedding property immediately after the deposition, visco-flowing of the silicate glass is generated by annealing the silicate glass for 2 to 120 minutes at a temperature of 750° C. to 1000° C., thereby planarizing the silicate glass. The moisture or hydronium ion contained in the silicate glass is released during the annealing. However, the formation of the insulator 61 can prevent the moisture of the silicate glass from oxidizing the gate end of the memory cell. Therefore, the increase in thickness and the change in shape can be prevented in the block oxide film located at the end of the gate electrode 51.

Inorganic glass made of cyclopentasilane or polysilazane may be used as the inter-layer insulator 62. In such cases, an oxidizing process is required to convert the cyclopentasilane or polysilazane into the inorganic glass. However, because an oxidizing agent of cyclopentasilane or polysilazane oxidizes the gate edge portion of the memory cell, unfortunately the block oxide film at the end of the gate electrode 8 is thickened to change the shape. This problem can be prevented by forming the insulator 61. A laminated structure with other inter-layer films, such as the silicon oxide film and HSQ, which are formed by TEOS or HDP may be adopted in the inter-layer insulator 62.

The upper interconnection 36 made of W, Al, AlCu, or Cu is formed on the inter-layer insulator 62. In the seventh embodiment, only one interconnection layer is illustrated because the interconnection layer is not important as the constituent of the invention. However, a multi-layered interconnection structure may be adopted. The silicon nitride film layer 37' is deposited on the upper interconnection 36 by plasma chemical vapor deposition method while the silicon oxide film formed by TEOS or HDP or the inter-layer insulator 37 called HSQ is interposed therebetween. The silicon nitride film layer 37' has the thickness of 20 nm to 1 μm. The silicon nitride film layer has a function of blocking the moisture diffused from the outside (upper surface) of the chip.

In the seventh embodiment, at least the following effects (3) and (4) are obtained in addition to the effects of the first to fourth embodiments.

(3) The control electrode 27 is formed in the direction (horizontal direction of FIG. 27) orthogonal to the direction (direction perpendicular to the paper plane of FIG. 27) in which the source area and drain area 28 are formed, thereby realizing the structure in which the source electrodes and drain electrodes of the adjacent memory cells are connected in parallel, that is, the virtual ground array type.

Therefore, the series resistance of the memory cell blocks can be kept at a small constant value, and the virtual ground cell array block of the seventh embodiment is suitable for stabilizing the threshold voltage in the case of the multi-level threshold voltage.

Because the isolation film 12, the source area and drain area 28, and the charge accumulation layer 26 are formed in self aligning manner, it is not necessary to ensure a margin for aligning the isolation film 12, the source area and drain area 28, and the charge accumulation layer 26 between the layers, and the high-density memory cell can be realized. The array configuration and the effect are described in Japanese Patent Application No. 2001-264754 applied by the inventors, so that the description is omitted here.

(4) In addition to the features of the first and second embodiments, because the MONOS type cell is used in the seventh embodiment, the programming voltage and the erasing voltage can be lowered than those of the floating gate type EEPROM cell of the first and second embodiments, and the withstand voltage can be maintained even if the isolation interval is narrowed to thin the gate insulator film. Therefore, the area of the circuit to which the high voltage is applied can be reduced, and the chip area can be reduced. Compared with the first and second embodiments, the thickness of the charge accumulation layer 26 can be decreased to 20 nm or less, the aspect ratio can be reduced in forming the gate, the forming shape of the gate electrode and the embedment of the inter-layer insulator 62 between the gates can be improved, and the withstand voltage can be enhanced. The process for forming the floating gate electrode and the process for producing the slit are not required, so that the process can be shortened. The charge accumulation layer 26 is made of the insulating material, and the charges are trapped by each charge trap, so that the charges hardly drop out of the charge trap against the radioactive ray.

[Eighth Embodiment]

In an eighth embodiment of the invention, that the memory cell M1$a$(α) in the center of the WL(n−1) portion in which the "010" continuous symbol is generated and the adjacent memory cell M2$a$(∈) formed in WLn in which the data should be written are the "0" bit can largely be reduced, for example, to zero compared with the fourth embodiment. The eighth embodiment can be performed independently of the first to third embodiments. However, because the eighth embodiment has the same effect as the first to third embodiments, that is, because the eighth embodiment has the effect of lessening the influence of the adjacent memory cell of the capacitance interference, desirably the eighth embodiment is used while combined with the first to third embodiments. The same component and the same operation component as the first to third embodiments are designated by the same numerals, and the detailed description is omitted. Although the eighth embodiment can be applied to any one of the first to third embodiments, the most effective example in which the eighth embodiment is applied to the third embodiment will be described.

<Configuration>

Entire Configuration

Figure 30:
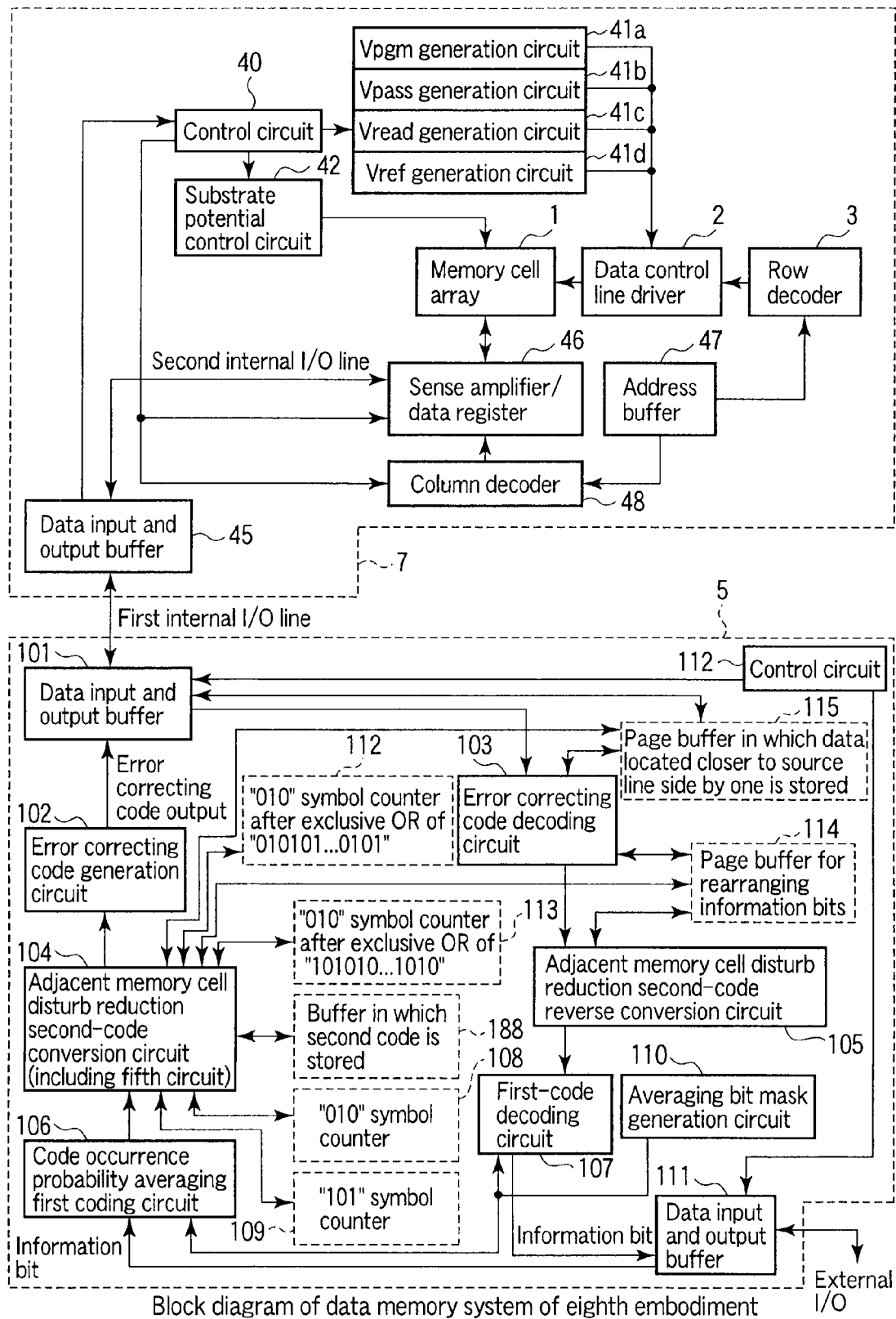
FIG. 30 is a block diagram showing a data memory system according to an eighth embodiment.

FIG. 30 is a block diagram showing an entire configuration of a data memory system of the eighth embodiment. In the eighth embodiment, similarly to the fourth embodiment of FIG. 21, the data memory system includes the page buffer 115 in which a memory cell located adjacent to the memory cell in which the data should be written in the WL direction, particularly a threshold voltage of the information bit of the word line (data selection line) including the memory cell in which the data is already written is stored. In the eighth embodiment, a page buffer that rearranges the information bits is used as the page buffer 114. It is only necessary that the bit recorded in the page buffer 114 be changed to the erase bit, so that the bit recorded in the page buffer 114 can be changed to the erase bit using the page buffer of FIG. 16. The page buffers 115 and 114 of the eighth embodiment differ from those of the fourth embodiment in that a code bit is added to lessen the influence of the memory cell of the capacitance interference in addition to the information bit. For example, in the third embodiment, it is necessary to prepare a (1+1/(6−1))-time code length in concert with the information bit. In the first and second embodiments, it is necessary to prepare a (1+1/(4−1))-time code length in concert with the information bit.

As shown in FIG. 30, the code conversion circuit includes a fifth circuit. The fifth circuit detects a sequence of continuous bits of "programming bit-erasing bit-programming bit" in information bits of a second page that is physically adjacent to a first page in which the data is should be written, and the fifth circuit supplies the first-page bit that is adjacent to the erase bit in the sequence of continuous bits of "programming bit-erasing bit-programming bit" of the second page. When the fifth circuit detects the sequence of continuous bits of "programming bit-erasing bit-programming bit", the first-page bit adjacent to the erase bit in the sequence of continuous bits of "programming bit-erasing bit-programming bit" of the second page is replaced with the erase bit to produce the coded information bit. The code conversion circuit also includes code generation circuits and decoding circuits. The code generation circuits sets a series of outputs of the first page of the fifth circuit at a second code and adds the second code to the coded information bit of the second page to produce a second information bit. When the sequence of continuous bits of "programming bit-erasing bit-programming bit" in the information bits of the second page is detected in the input of the second information bit, the decoding circuits replaces the first-page bit adjacent to the erase bit in the sequence of continuous bits of "programming bit-erasing bit-programming bit" of the second page with the sequence of bits of the second code.

In the eighth embodiment of FIG. 30, the adjacent memory cell disturb reduction second-code conversion circuit 104 includes the fifth circuit. The fifth circuit detects the sequence of continuous bits of "programming bit-erasing bit-programming bit" in the information bit of the second page physically adjacent to the first page in which the data is should be written, and the fifth circuit supplies the first-page bit adjacent to the erase bit in the sequence of continuous bits of "programming bit-erasing bit-programming bit" of the second page.

Configuration of Fifth Circuit

Figure 31:
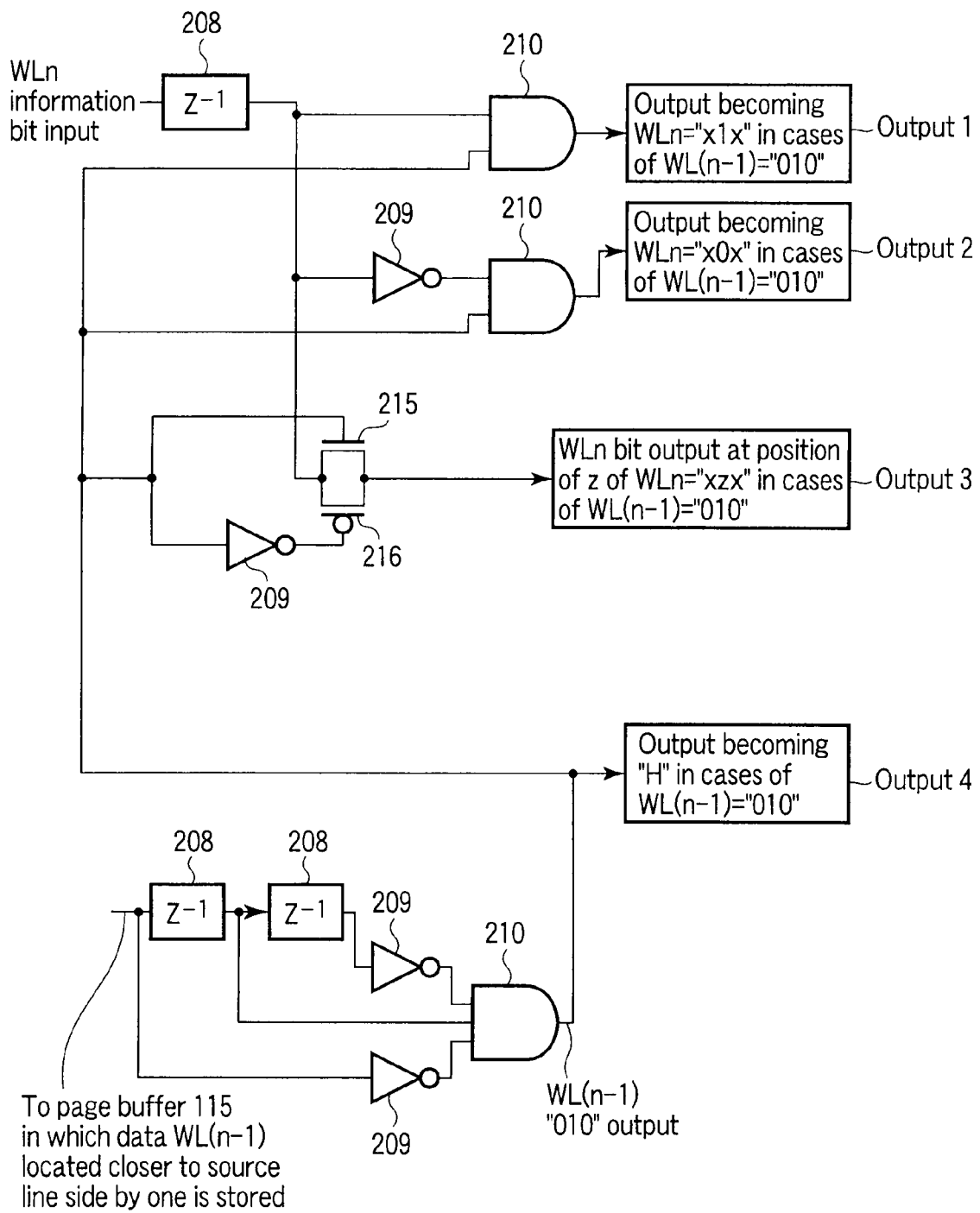
FIG. 31 is a circuit diagram showing a configuration of a fifth circuit of FIG. 30.

FIG. 31 shows a configuration of a fifth circuit of the eighth embodiment. As shown in FIG. 31, basically the components of the circuit that supplies the data to the symbol counters 116 and 117 of FIG. 22 are used as those of the fifth circuit. Therefore, the same component as that of FIG. 22 is designated by the same numeral, and the description thereof is omitted. In the fifth circuit, as shown in FIG. 31, for the output that becomes "010" in WL(n−1) while becoming "x1x" in WLn and the output that becomes "010" in WL(n−1) while becoming "x0x" in WLn can easily be implemented by a combination of a circuit in which the series of information bits is sequentially fed in time series into the one-unit-time delay circuit 208 from the beginning of the WLn information bits to detect the number of WL(n−1) "010" continuous bits whose center bit becomes the "1" bit in WLn and a circuit that detects the number of WL(n−1) "010" continuous bits whose center bit becomes the "0" bit in WLn.

In an output 2 of FIG. 31, when WL(n−1) becomes "010" while WLn becomes "x0x" in a unit time in which the "010" continuous bits of WL(n−1) are sequentially fed, the output is changed from "L" to "H" for one unit time in the unit time in which the last "0" bit of the "010" continuous bit of WL(n−1) is fed, and the output becomes "L" in other cases. In an output 1, when WL(n−1) becomes "010" while WLn becomes "x1x" in the unit time in which the "010" continuous bits of WL(n−1) are sequentially fed, the output is changed from "L" to "H" for one unit time in the unit time in which the last "0" bit of the "010" continuous bit of WL(n−1) is fed, and the output becomes "L" in other cases. It is assumed that the series of information bits is sequentially fed in time series from the beginning of the information bit from the page buffer 115 in which the WL(n−1) information bits are stored in synchronization with the Wn information bit.

A circuit that supplies an output 3 detects the sequence of continuous bits of "programming bit-erasing bit-programming bit" in the information bits of second WL(n−1) page physically adjacent to the first WLn page in which the data should be written, and the circuit supplies the WLn first-page bit adjacent to the erase bit in the sequence of continuous bits of "programming bit-erasing bit-programming bit" of the second WL(n−1) page. In the circuit that supplies the output 3, WL(n−1) becomes the "010" continuous bit in the unit time in which the "010" continuous bits are sequentially fed, and the WLn bit corresponding to the erase "1" bit in the center of WL(n−1) is supplied. As shown in FIG. 31, the output 4 can easily be formed using a bi-lateral gate including the inverter 209, an NMOS transistor 215, and a PMOS transistor 216.

In an output 4, when WL(n−1) becomes the "010" continuous bit in the unit time in which the "010" continuous bits are sequentially fed, the output is changed from "L" to "H" for one unit time in the unit time in which the last "0" bit of the "010" continuous bit of WL(n−1) is fed, and the output becomes "L" in other cases.

The data memory system of FIG. 30 also includes a buffer 188 in which a second code is stored while the bits supplied from the fifth circuit are set at the sequence of the second code. The output 3 is sequentially retained in the buffer 188 with the output 4 as a trigger, which allows the second code to be retained.

The adjacent memory cell disturb reduction second-code conversion circuit 104 of the eighth embodiment shown in FIG. 30 is similar to that of the fourth embodiment shown in FIG. 21 except that the fifth circuit is provided.

Configuration and Operation of Page Buffer Memory

FIGS. 32A and 32B show a circuit and an operation example of a page buffer memory. FIG. 32A shows an example of a page buffer 11 in which the second code bit having an aa bit length is temporarily stored. In the eighth embodiment, the D-type flip-flops 208 are series-connected in k stages, and the output of the final stage is connected to the bi-lateral switching circuit including the n-type transistor 215, the p-type transistor 216, and the inverter 209. An edge trigger type flip-flop is used as the D-type flip-flop 208. In the edge trigger type flip-flop, the output is confirmed at the instant a clock input rises from "L" (set at 0[V], for the sake of convenience) to "H" (set at Vcc, for the sake of convenience), and the output is not changed after that irrespective of the clock input. In the bi-lateral switching circuit, current terminals of the transistors 215 and 216 are put into a conduction state when the data output control input becomes "H", and the current terminals of the transistors 215 and 216 are put into a cutoff state when the data output control input becomes "L".

FIG. 32B shows an operation of the circuit. As shown in FIG. 32B, in cases where the data is stored in the D-type flip-flop, the data output control input is set at "L" such that the output of the flip-flop 208 is not supplied to the data input and output line. After digital data Din1 having Vcc ("H") or 0V ("L") is imparted to the data input and output (I/O) line, the clock is changed from "L" to "H". Therefore, the data Din1 is retained in the leftmost flip-flop 208 of FIG. 32A. Then, after digital data Din2 having Vcc ("H") or 0V ("L") is imparted to the data input and output (I/O) line, the clock is changed from "L" to "H". Therefore, the data Din1 is transferred to and retained in the second leftmost flip-flop 201 of FIG. 32A, and the data Din2 is retained in the leftmost flip-flop 208. Then, the digital data is sequentially imparted to the data input and output (I/O) line to aa [bit], and the clock is imparted. Therefore, the pieces of data Din1, Din2, . . . , and Dinaa are sequentially retained from the right flip-flop of FIG. 32A, and the aa-bit data can be retained.

An operation for reading the data from the page buffer 1 will be described below. The data output control input is set at "H", and the output of the rightmost flip-flop 208 is supplied to the data input and output line. Therefore, the same data as the data Din1 (Dout1) is supplied to the data input and output line. The clock input is changed from "L" to "H". Therefore, the one-bit data is transferred from the left flip-flop to the right flip-flop and retained in the right flip-flop, and the same data as the data Din2 (Dout2) is supplied to the data input and output line. Then the clock input is changed from "L" to "H" (aa-1) times in all. Therefore, the pieces of data Din1, Din2, . . . , and Dinaa are sequentially supplied from the right flip-flop of FIG. 32A to the data input and output (I/O) line, and the aa-bit data can be retained.

<Code Forming Flow>

Figure 33:
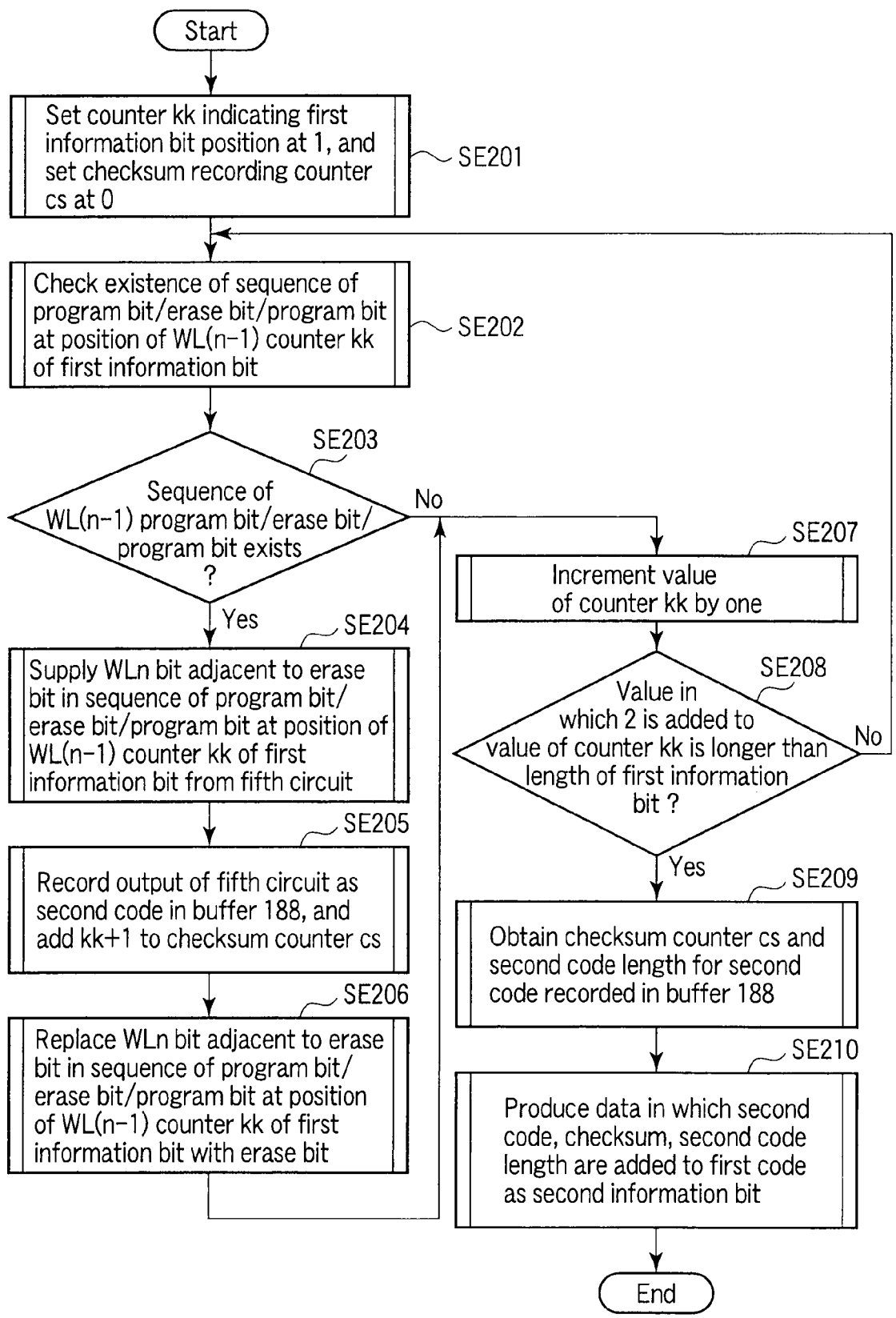
FIG. 33 is a flowchart showing code formation of the eighth embodiment.

An operation flow for forming the code of the eighth embodiment will be described with reference to FIG. 33. It is assumed that the one bit is written in the order of WL(n-1) and WL(n) (n is a natural number). As described in the third embodiment, when the number of continuous bits of "programming bit-erasing bit-programming bit" in the WLn information bit is decreased, desirably the upper limit of the number of continuous bits of "programming bit-erasing bit-programming bit" is reduced.

In Step SE201, a counter kk indicating the bit position in the first information bit is set at 1. A checksum recording counter cs is set at 0. The buffer 188 is previously reset at "L". In Step SE202, it is determined whether or not the sequence of "programming bit-erasing bit-programming bit" exists at the position kk of the first information bit. That is, it is necessary to detect whether the output 4 of the fifth circuit shown in FIG. 31 is "H" or "L".

In SE203, it is determined whether or not the sequence of "programming bit-erasing bit-programming bit" exists. When the sequence of "programming bit-erasing bit-programming bit" does not exist, the flow goes to Step SE207 to increment the value of the counter kk by one. In Step SE208, it is determined whether or not a value in which two added to the value of the counter kk is larger than the first information bit. When the value in which two added to the value of the counter kk is less than or equal to the first information bit, the flow returns to Step SE202 to check whether or not the sequence of "programming bit-erasing bit-programming bit" exists for the next bit of the first information bit.

On the other hand, when the flow goes to the affirmative side at the branch in SE203, the WLn bit adjacent to the erase bit in the sequence of WL(n-1) continuous bits of "programming bit-erasing bit-programming bit" of the first information bit is supplied from the output 3 of the fifth circuit in Step SE204. In Step SE205, the WLn bits are sequentially stored in the buffer 188 to form the second code. At this point a value of (kk+1) is added to the checksum counter cs. This means that the value indicating the position of the erase bit in the sequence of WL(n-1) continuous bits of "programming bit-erasing bit-programming bit", that is, the value of the address is added to the checksum counter cs.

In Step SE206, the WLn bit adjacent to the erase bit in the sequence of WL(n-1) continuous bits of "programming bit-erasing bit-programming bit" of the first information bit is replaced with the erase bit. Therefore, the WLn bit adjacent to the erase bit in the sequence of WL(n-1) continuous bits of "programming bit-erasing bit-programming bit" does not become the programming bit. It is assumed that the first code is the code after the replacement. Accordingly, the generation of the bit pattern having the large memory cell capacitance interference can be prevented. Then the flow merges with the sequence in Step SE207.

On the other hand, when the flow goes to the affirmative side at the branch in Step SE208, a second code length is obtained for the second code recorded in the buffer 188 in Step SE209. It is clear that the second code length is obtained by counting the number of outputs "H" of the buffer 188 in which the second code is stored.

The value of the checksum counter cs is obtained as a checksum. The data in which the second code, the checksum cs, and the information on the second code length are added to the first code is produced as the second information bit. The first code is recorded in the page buffer 114 that rearranges the information bits, and the output of the buffer 188 in which the second code is recorded, the checksum cs, and the information on the second code length are fed into the page buffer 114 so as to be recorded after the first code, which allows the data to be produced.

Figure 34:
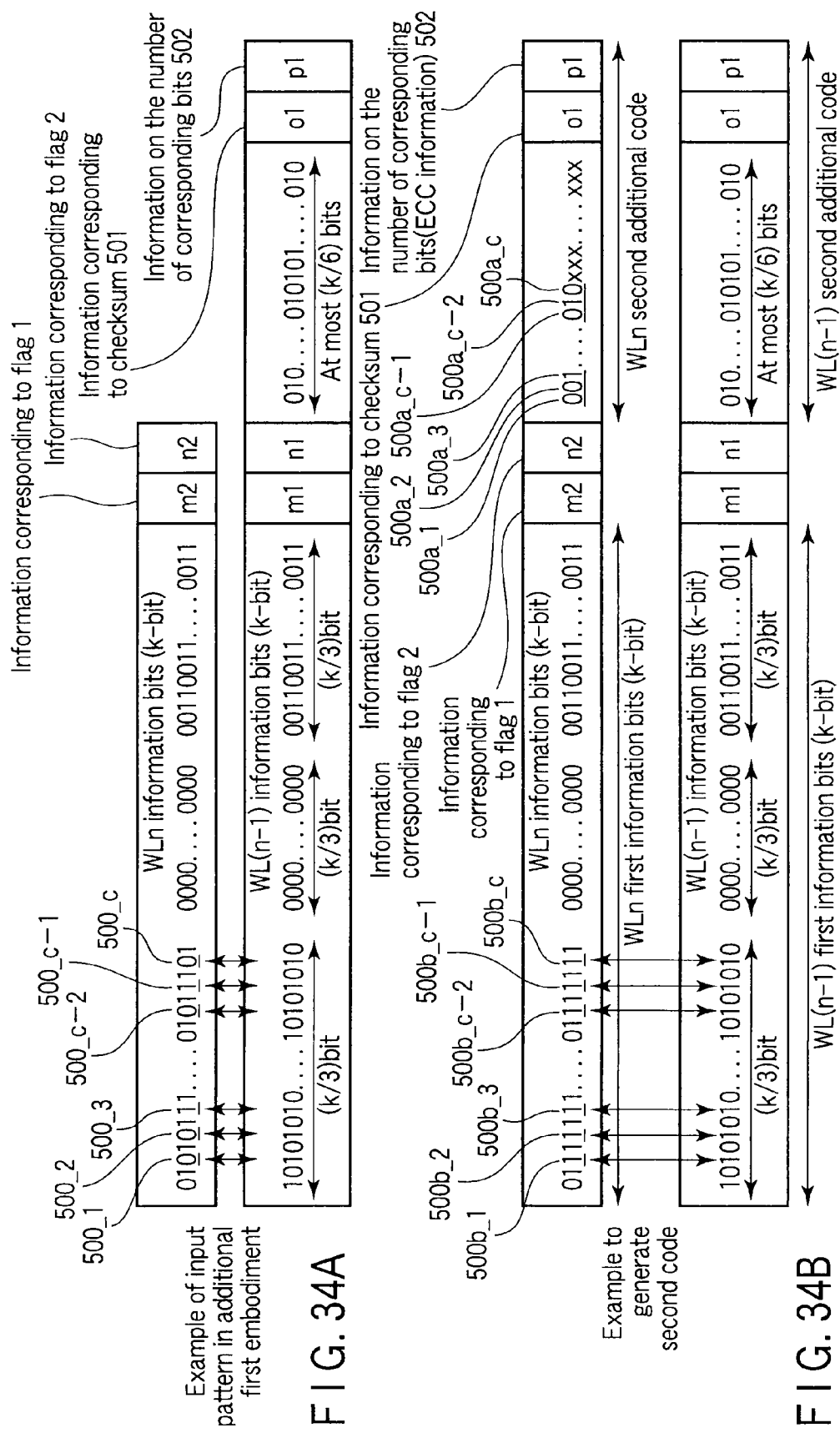
FIGS. 34A and 34B are views explaining an actual example of a second code of the eighth embodiment.
Figure 36:
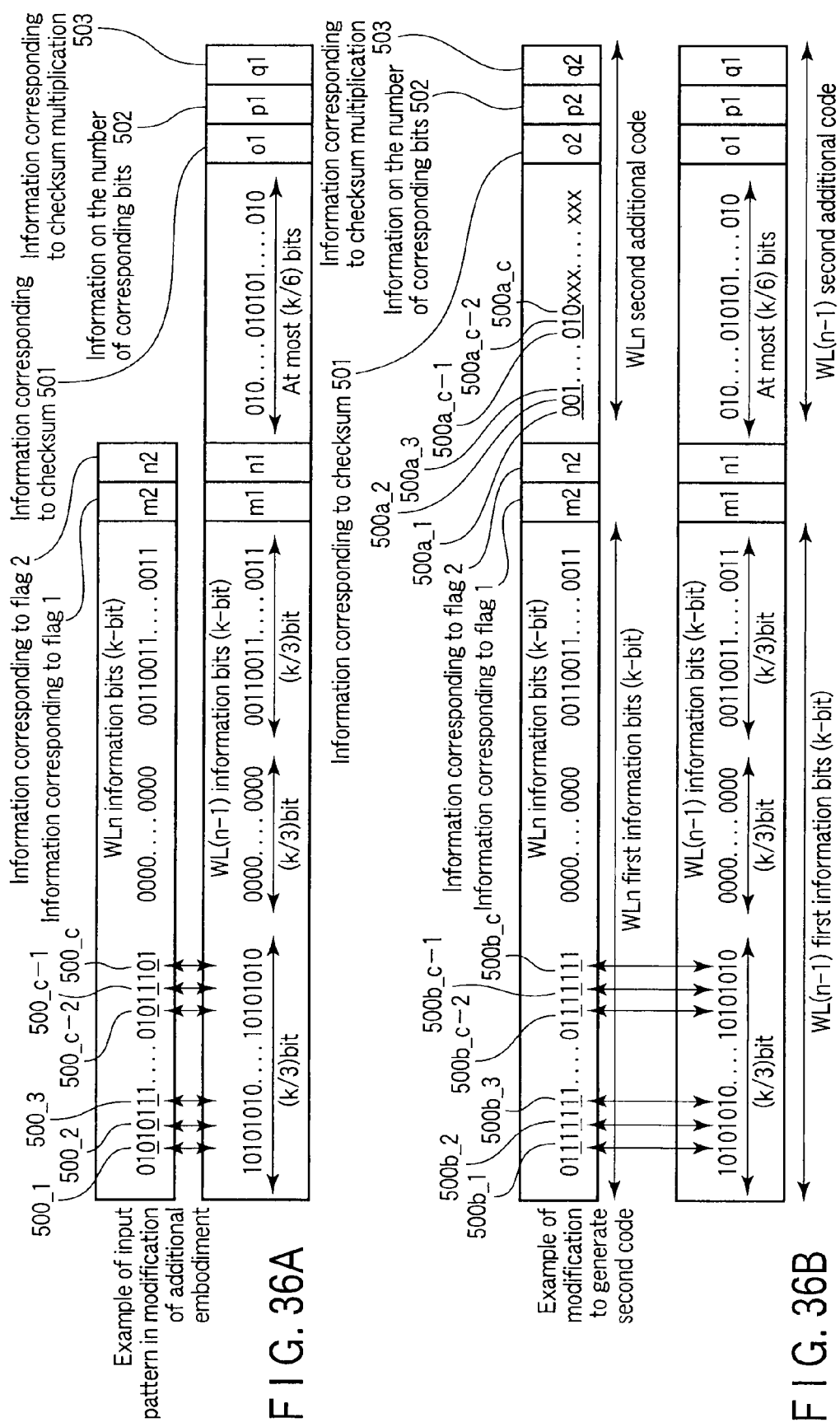
FIGS. 36A and 36B are views explaining an example of a second additional code of the eighth embodiment.

At this point, when the number of continuous bits of "programming bit-erasing bit-programming" bit in the WLn information bit is already decreased, as shown in FIG. 34, it is necessary that the data in which the second code, the checksum cs, and the information on the second code length are added to the data to which information corresponding to a flag 1 and information corresponding to a flag 2 are added to the first information bit be produced as the second information bit. The data to which the second code, the checksum cs, and the information on the second code length are added is referred to as a second additional code.

The following explanation, the programming bit denotes a "0" bit, and the erasing bit denotes a "1" bit for simplicity.

In the eighth embodiment, similarly to the fourth embodiment, the WLn information bit adjacent to the WL(n−1) "010" portion is set at 500_1, 500_2, 500_3, 500_c-2, 500_c-1, and 500_c. In the third embodiment, the total number of information bits of 500_1, 500_2, 500_3, . . . , 500_c-2, 500_c-1, and 500_c is equal to or less than (value obtained by rounding up (k/6) to the nearest integer)−1. In cases where the first or second embodiment is simultaneously applied, the total number becomes (value obtained by rounding up (k/4) to the nearest integer)−1.

The information bits of 500_1, 500_2, 500_3, 500_c-2, 500_c-1, and 500_c are arranged from the left side of the first information bit to the right side. The information bits may be arranged from the right side to the left side. Then the information bits of 500_1, 500_2, 500_3, . . . , 500_c-2, 500_c-1, and 500_c are extracted, and the information bits of 500_1, 500_2, 500_3, . . . , 500_c-2, 500_c-1, and 500_c are arranged as a part of the second additional code on the right side of the information corresponding to the flag 2 while set at 500a_1, 500a_2, 500a_3, . . . , 500a_c-2, 500a_c-1, and 500a_c. The information bits of 500_1, 500_2, 500_3, 500_c-2, 500_c-1, and 500_c are conveniently arranged from the left to the right of the first information bit in order. Alternatively, the information bits of 500_1, 500_2, 500_3, . . . , 500_c-2, 500_c-1, and 500_c may sequentially be arranged from the right to the left, or may be rearranged under a certain rule using a cyclic code in which c codes of 500_1, 500_2, 500_3, . . . , 500_c-2, 500_c-1, and 500_c are circulated in each time.

As described above, the length of second additional code becomes (value obtained by rounding up (k/6) to the nearest integer)−1 in the third embodiment, and the length becomes (value obtained by rounding up (k/4) to the nearest integer)−1 in cases where the first or second embodiment is simultaneously applied. The WLn information bits corresponding to 500_1, 500_2, 500_3, . . . , 500_c-2, 500_c-1, and 500_c are replaced with the "1" bit which is the erase bit, thereby obtaining the information bits of 500b_1, 500b_2, 500b_3, . . . , 500b_c-2, 500b_c-1, and 500b_c shown in FIG. 34. Therefore, all the WLn information bits adjacent to the WL(n−1) "010" portion are set at "1" in the first information bit, so that the state of the programming bit "0" adjacent to the worst "010" portion shown in the part (iv) of FIG. 2 can be eliminated in the k first information bits of FIG. 34.

In the second additional code, the information bits of 500a_1, 500a_2, 500a_3, . . . , 500a_c-2, 500a_c-1, and 500a_c are sequentially arranged for the sequence of pieces of information on the positions facing the "1" bits in the WL(n−1) "010" code string of the first code. Therefore, it is clear that the decoding can be performed by replacing the WLn information bits facing the "1" bits of the "010" code string of the WL(n−1) first information bit with 500a_1, 500a_2, 500a_3, 500a_c-2, 500a_c-1, and 500a_c counted from the left.

In the method for forming the code, the code length is possibly shortened compared with the case in which all the addresses of 500_1, 500_2, 500_3, 500_c-2, 500_c-1, 500_c are recorded. In cases where one WL(n−1) "010" portion is eliminated or in cases where the WL(n−1) "010" portion is mistakenly generated, an error is possibly generated in the length of the "010" portion of the second additional code due to the decoding method. Therefore, desirably the error correction can be performed to the WL(n−1) "010" portion facing, in particular, the information bits of 500_1, 500_2, 500_3, . . . , 500_c-2, 500_c-1, and 500-c.

As shown in FIG. 34, the address counted from the left end of the information bits of 500_1, 500_2, 500_3, 500_4, . . . , 500_c-2, 500_c-1, and 500_c in the portion corresponding to the information bits, the order of the bit is obtained, and the addition of the addresses, that is, the checksum 501 is added to the second additional code. The 502 information bits of 500_1, 500_2, 500_3, 500_4, . . . , 500_c-2, 500_c-1, and 500_c are added to the second additional code.

For example, in FIG. 34, 500_1 corresponds to the third bit when the address is counted from the left end, 500_2 corresponds to the fifth bit when the address is counted from the left end, and 500_3 corresponds to the seventh bit when the address is counted from the left end. The checksum 501 is obtained by 3+5+7+ . . . +(position of 500_c-1 from the left end of the first information bit)+(position of 500_c from the left end of the first information bit). When the first information bit has c pieces of the "010" portions in WL(n−1), c can be used as the number of information bits 502.

Decoding Sequence

The error correction can be performed by the checksum and the number of information bits even if the one-bit error is generated in the WL(n−1) "010" code string facing 500_1, 500_2, 500_3, 500_4, . . . , 500c-2, 500_c-1, and 500_c. The method for decoding the code possibly including the one-bit error is realized by the sequence of steps SE101 to SE107 shown in FIG. 35.

It is assumed that the one-bit error is generated in the WL(n−1) "011", "000", or "110" code string adjacent to 500_3 of WL(n). For the sake of convenience, one-bit error is described by way of example. However, the data can correctly be restored even if the "010" code string is converted into different word such as the "111" code string while the "010" continuous bit is set at one word.

In cases where the one-bit error is generated in the "010" code string, a difference between the information bit 502 and the sum of WL(n−1) "010" patterns of the first information bit is obtained. The obtained difference is set at a difference A. In cases where the difference A is not 1 or −1, it is determined whether or not the code error is generated, the WLn information bits facing the "1" bit of the WL(n−1) "010" code string of the first information bit are sequentially replaced with 500a_1, 500a_2, 500a_3, 500a_c-2, 500a_c-1, and 500a_c counted from the left (SE107). The information bits are arranged according to the arrangement order performed in the coding such that the original information bits can be decoded. The arrangement of the information bits can also be used in the following modification of the eighth embodiment.

In cases where the difference A becomes −1, the flow goes to the affirmative side at the branch in Step SE101, and the difference of −1 shows that one-word error is generated to eliminate one "010" code string in the WL(n−1) "010" code string facing 500_1, 500_2, 500_4, . . . , 500_c-2, 500_c-1, and 500_c. In the case of the affirmative side at the branch in Step SE101, the position of the "1" information bit in the WL(n−1) "010" code string, that is, the position of the information bit of 500_3 can be obtained by computing (checksum 501)−{sum of the positions of the "1" information bits in the WL(n−1) "010" code string from the left end} (SE102). It is found that the information bit adjacent to the WL(n−1) "010" code string exists at the position of the information bit of 500_3 between the information bit of 500_2 and the information bit of 500_4. Therefore, the position of the information bit of 500_3 is added to the WLn information bit adjacent to the "1" information bit of the WL(n−1) "010" code string, and the information bits of 500b_1, 500b_2, 500b_3, . . . , 500b_c-2, 500b_c-1, and 500b_c are replace with 500a_1, 500a_2, 500a_3, 500a_c-2, 500a_c-1, and 500a_c counted from the left, which allows the decoding to be correctly performed (SE103).

On the other hand, it is assumed that an error in which the word except "010" is changed to the word of "010" is generated in the WL(n−1). For example, the code of WL(n−1) is changed from "011" to "010" between the position of 500_4 and the position of 500_5.

In cases where the one-bit error is generated in the word except for the "010" sequence, the difference A becomes 1 when the number of information bits 502 is subtracted from the number of WL(n−1) "010" code strings in the information bit. In cases where the difference A becomes 1, that is, in cases where the flow goes to the affirmative side at the branch in Step SE104, the error is generated in the WL(n−1) code string of the first information bit facing 500_1, 500_2, 500_3, . . . , 500_c-2, 500_c-1, and 500_c, and the WL(n−1) "010" is mistakenly increased by one. In cases where the WL(n−1) "010" is mistakenly increased by one, a position a of the "1" information bit in the WL(n−1) "010" in which the error is generated can be obtained by computing {sum of the positions of the "1" information bits in the WL(n−1) "010" from the left end}−(checksum 501) (SE105). Therefore, the WLn bit corresponding to the position "a" of the information bit is skipped so as not to be changed, that is, the information bit can correctly be decoded by subtracting the WLn bit corresponding to the position "a" of the information bit from the WLn information bit string facing the "1" information bit in the WL(n−1) "010". In the eighth embodiment, it is found that WL(n−1) code of the first information bit mistakenly becomes "010" at the position between the information bit of 500_4 and the information bit of 500_5. Accordingly, the decoding can correctly be performed by replacing the WLn information bits of 500b_1, 500b_2, 500b_-3, 500b_c-2, 500b_c-1, and 500b_c facing the "1" information bit in the WL(n−1) "010" with the information bits of 500a_1, 500a_2, 500a_3, . . . , 500a_c-2, 500a_c-1, 500a_c counted from the left (SE106). The method for correcting the one-bit error can be realized by correcting the one bit according to the flowchart of FIG. 35.

[Modification of Eighth Embodiment]

Various modifications of the eighth embodiment will be described with reference to FIGS. 36 to 40. The description of the portion substantially overlapping the eighth embodiment is omitted.

FIGS. 36A and 36B show a method for constructing a code that can be corrected in cases where one-bit errors are generated at two points in the WL(n−1) "010". For example, in the portion corresponding to the information bit of 500_1, 500_2, 500_3, 500_4, 500_c-2, 500_c-1, and 500_c, the address counted from the left end of the information bit, that is, the order of the bit is obtained, and the checksum 501 in which the sum of the addresses is obtained is added to the second additional code.

The number of information bits 502 of 500_1, 500_2, 500_3, 500_4, . . . , 500_c-2, 500_c-1, and 500-c is further added to the second additional code. The address counted from the left end of the information bit, that is, the order of the bit is obtained, and the checksum multiplication 503 in which the multiplication of the addresses is obtained is added to the second additional code.

In FIGS. 36A and 36B, 500_1 corresponds to the third bit when the information bit is counted from the left end, 500_2 corresponds to the fifth bit when the information bit is counted from the left end, and 500_3 corresponds to the seventh bit when the information bit is counted from the left end. The check multiplication 503 can be set at 3× 5×7× . . . ×(position of 500_c-1 from the left end of the first information bit)×(position of 500_c from the left end of first information bit). For the information bits of 500_1, 500_2, 500_3, 500_4, . . . , 500_c-2, 500_c-1, and 500_c, c can be used as the number of information bits 502.

The error can be corrected by the checksum, the check multiplication, and the number of information bits, even if the two words are generated in the WL(n−1) "010" facing the information bits of 500_1, 500_2, 500_3, 500_4, . . . , 500_c-2, 500_c-1, and 500_c.

Correction Sequence of Bit at Position Corresponding to One-Word Error and Two-Word Error A sequence for decoding the code possibly including the two-word error will be described with reference to the sequence shown in Steps SE100 to SE124 of FIGS. 37 and 38. It is assumed that one-bit error is generated in the "010". In such cases, similarly to the eighth embodiment, the one-bit error can be corrected using the sequence in Steps SE100 to SE124 of FIG. 35.

The case in which the one-word errors are generated at two points in the WL(n−1) "010" while the WL(n−1) "010" is changed to the non-"010" at two points due to the information error will be described below.

In such cases, the difference A becomes −2 when the difference between the information bit 502 and the sum of the WL(n−1) "010" patterns of the first information bit is obtained. In cases where the difference A becomes −2, the flow goes to the affirmative side at the branch in Step SE108 of FIG. 38, and the difference A of −2 shows that the two-word errors are generated to eliminate two words in the WL(n−1) "010" facing 500_1, 500_2, 500_4, . . . , 500_c-2, 500_c-1, and 500_c. In cases where the flow goes to the affirmative side at the branch in Step SE108, that is, in cases where (checksum 501)−{sum of the positions from the left ends of the "1" information bits in the WL(n−1) "010"} is computed, the sum of the positions of the "1" first information bits can be obtained in the WL(n−1) "010" in which the error is generated. That is, sum aa can be obtained at the position of the information bit in which the two-word error is generated to eliminate the two words in the WL(n−1) first information bit (SE109). The multiplication of the positions of the "1" information bit in which the error is generated in the "010" word portion can be obtained when (check multiplication 503)/{multiplication of the positions from the left ends of the "1" information bits in the WL(n−1) "010"} is computed. That is, multiplication bb can be obtained for the information bits in which the two-word error is generated to eliminate the two words in the WL(n−1) "010" (SE110). The positions of the "1" information bits, that is, error positions 1 and 2 in which the "010" is generated can be obtained by solving an equation of x*x−aa*x+bb=0 with x as a variable (SE111). Using the data in which the error positions 1 and 2 are added to the positions of the WLn information bits facing the "1" information bits in the WL(n−1) "010"s, the decoding can correctly be performed by replacing the WLn information bits of 500b_1, 500b_2, 500b_3, . . . , 500b_c-2, 500b_c-1, and 500b_c facing the "1" information bits in the WL(n−1) "010"s with the information bits of 500a_1, 500a_2, 500a_3, . . . , 500a_c-2, 500a_c-1, and 500a_c counted from the left (SE112).

The case in which the one-bit errors are generated at two points in the WL(n−1) "010" while the WL(n−1) "010" is changed to the non-"010" due to the information error will be described below. In such cases, the difference A becomes 2 when the difference between the information bit 502 and the sum of the WL(n−1) "010" patterns of the first information bit is obtained. In cases where the difference A becomes 2, the flow goes to the affirmative side at the branch in Step SE113 of FIG. 38, and the difference A of 2 shows that the two-bit errors are generated to increase the two words in the WL(n−1) "010"s facing 500_1, 500_2, 500_4, ..., 500__c-2, 500__c-1, and 500__c. In cases where the flow goes to the affirmative side at the branch in Step SE113, that is, in cases where {sum of the positions from the left ends of the "1" information bits in the WL(n−1) "010"}−(checksum 501) is computed, the sum of the positions of the "1" information bits can be obtained in the WL(n−1) "010" in which the error is generated. That is, the sum aa can be obtained at the position of the information bit in which the two-word error is generated to increase the two words in the WL(n−1) "010" (SE114). The multiplication of the positions of the "1" information bit in which the error is generated in the "010" word portion can be obtained when {multiplication of the positions from the left ends of the "1" information bits in the WL(n−1) "010"}/(check multiplication 503) is computed. That is, the multiplication bb can be obtained for the information bits in which the two-word error is generated to increase the two words in the WL(n−1) "010" code string (SE115). The positions of the "1" information bits, that is, the error positions 1 and 2 in which the "010" is generated can be obtained by solving the equation of x*x−aa*x+bb=0 with x as a variable (SE111). Using the data in which the two positions of the information bits, that is, the error positions 1 and 2 are subtracted from the positions of the WLn information bits facing the "1" information bits in the WL(n−1) "010"s, the decoding can correctly be performed by replacing the WLn first information bits of 500*b*_1, 500*b*_2, 500*b*_3, ..., 500*b*__*c*-2, 500*b*__*c*-1, and 500*b*__*c* facing the "1" information bits in the WL(n−1) "010"s with the information bits of 500*a*_1, 500*a*_2, 500*a*_3, ..., 500*a*__*c*-2, 500*a*__*c*-1, and 500*a*__*c* counted from the left (SE117).

The case, in which the one-word errors are generated at two points in the WL(n−1) "010", the WL(n−1) non-"010" is changed to the "010" code string at one of the points due to the information error, and the WL(n−1) "010" is changed to the non-"010" at the other point due to the information error, will be described below.

In such cases, the difference A becomes 0 when the difference between the information bit 502 and the sum of the WL(n−1) "010" patterns of the first information bit is obtained. In cases where the difference A becomes the values except for −2, −1, 0, 1, and 2, the flow goes to the negative side at the branch in Step SE118 of FIG. 38, it is determined that the information bit cannot be restored, and the WLn information bits of 500*b*_1, 500*b*_2, 500*b*_3, ..., 500*b*__*c*-2, 500*b*__*c*-1, and 500*b*__*c* facing the "1" information bits in the WL(n−1) "010"s are sequentially replaced with the information bits of 500*a*_1, 500*a*_2, 500*a*_3, ..., 500*a*__*c*-2, 500*a*__*c*-1, and 500*a*__*c* (SE124). In cases where the flow goes to the affirmative side at the branch in Step SE118 of FIG. 38, (check multiplication) is compared to {multiplication of the positions from the left ends of the "1" information bits in the WL(n−1) "010"}. When (check multiplication) is equal to {multiplication of the positions from the left ends of the "1" information bits in the WL(n−1) "010"}, that is, when the flow goes to the negative side at the branch in Step SE119, it is determined that the error does not exist in the information bit, and the WLn first information bits of 500*b*_1, 500*b*_2, 500*b*_3, ..., 500*b*__*c*-2, 500*b*__*c*-1, and 500*b*__*c* facing the "1" information bits in the WL(n−1) "010" are sequentially replaced with the information bits of 500*a*_1, 500*a*_2, 500*a*_3, ..., 500*a*__*c*-2, 500*a*__*c*-1, and 500*a*__*c* counted from the left (SE124).

When the flow goes to the affirmative side at the branch in Step SE119, the WL(n−1) non-"010" is changed to the "010" at one point due to the information error, and the WL(n−1) "010" is changed to the non-"010" at the other point due to the information error. In such cases, (checksum 501)−(sum of the positions from the left ends of the "1" information bits in the WL(n−1) "010")=aa is obtained (SE120). The letter aa corresponds to (position of the "1" information bit in the eliminated WL(n−1) "010" information bit)−(position of the "1" information bit in the mistakenly increased WL(n−1) "010" information bit). Then, (check multiplication 503)/{multiplication of the positions from the left ends of the "1" information bits in the WL(n−1) "010"}=bb is obtained (SE121). The letter bb corresponds to (position of the "1" information bit in the eliminated WL(n−1) "010" information bit)/(position of the "1" information bit in the mistakenly increased WL(n−1) "010" information bit). The error position 1, that is, the position of the "0" information bit in the eliminated WL(n−1) "010" information bit is obtained by aa/(bb−1). The error position 2, that is, the position of the "1" information bit in the mistakenly increased WL(n−1) "010" information bit is obtained by aa*bb/(bb−1) (SE122). Then, the first information bits of 500*b*_1, 500*b*_2, 500*b*_3, ..., 500*b*__*c*-2, 500*b*__*c*-1, and 500*b*__*c* in which the WLn information bits at the error positions 1 and 2 are added to or subtracted from the WLn information bit facing the "1" information bit in the WL(n−1) "010" are sequentially replaced with the information bits of 500*a*_1, 500*a*_2, 500*a*_3, ..., 500*a*__*c*-2, 500*a*__*c*-1, and 500*a*__*c* (SE123).

Figure 38B:
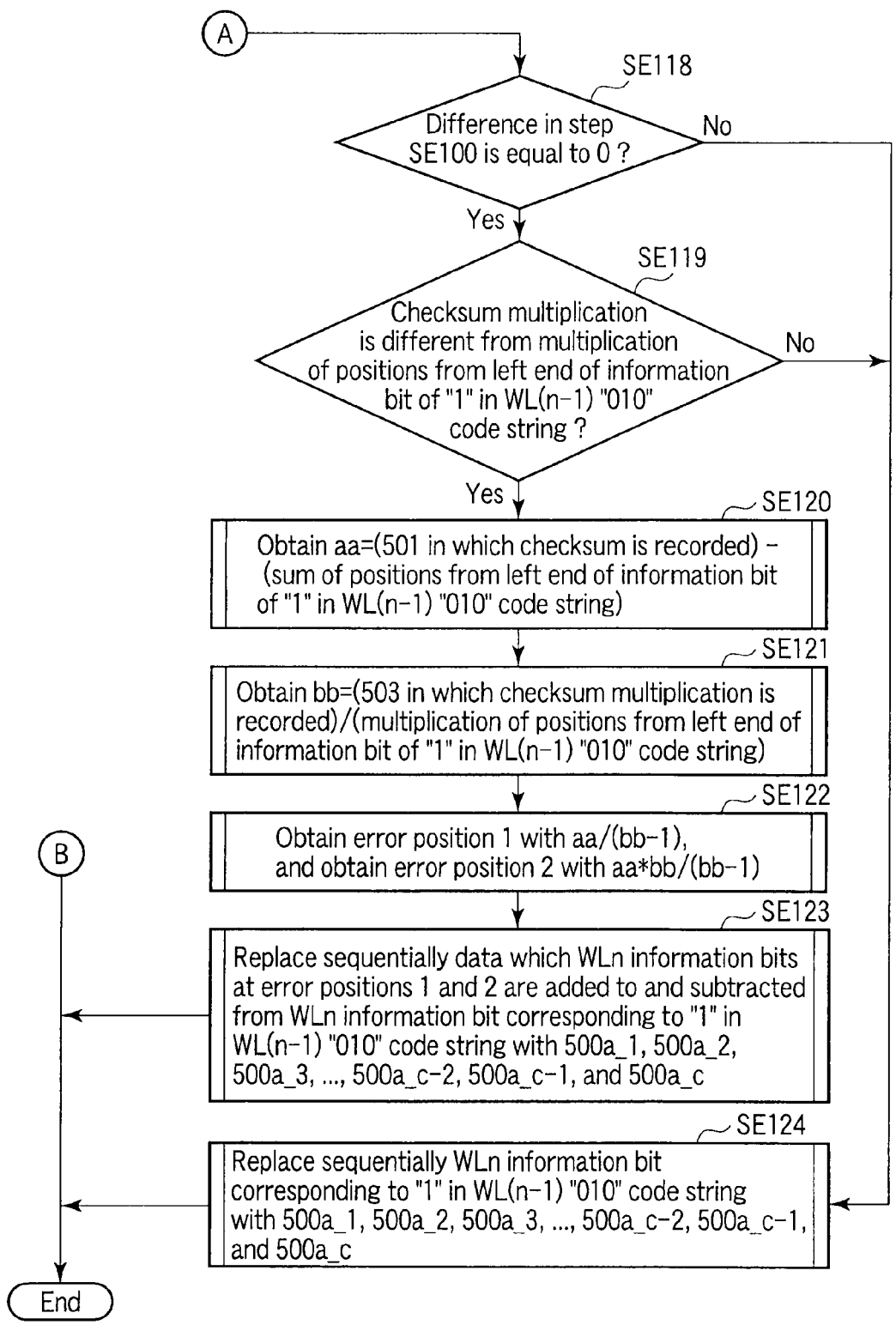

Thus, the correction can be performed according to the flowchart of FIGS. 37 and 38 even if the word errors are generated at two points in the WL(n−1) "010".

In the eighth embodiment, with reference to the number of information bits 502, it is necessary to prepare the number of bits of the value obtained by rounding up $\log_2\{\alpha\}$ to the nearest integer, in cases of α=(value obtained by rounding up (k/6) to the nearest integer)−1 for the third embodiment, and in cases of α=(value obtained by rounding up (k/4) to the nearest integer)−1 for the first and second embodiments. With reference to checksum 501, the sum can be stored without losing the information when the number of bits of the value obtained by rounding up $\log_2\{k(k+1)/2\}$ to the nearest integer is prepared. With reference to check multiplication 503, the multiplication can be stored without losing the information when the number of bits of the value obtained by rounding up α×$\log_2\{k\}$ to the nearest integer is prepared.

In cases where the two words are corrected, it is necessary that two words in k bits be specified as the checksum 501. Because the sum of the word error positions does not exceed 2k bits, it is necessary to prepare at least the number of bits of the value obtained by rounding up $\log_2\{2k\}$ to the nearest integer for the checksum 501. The decoding can correctly be performed even if the comparison is made while the sum of the addresses exceeding the number of prepared bits is ignored.

In cases where the two words are corrected, it is necessary that two bits in k bits be specified as the check multiplication 503. Because the multiplication of the word error positions does not exceed k*k bits, it is necessary to prepare at least the number of bits of the value obtained by rounding up $2\log_2\{k\}$ to the nearest integer for the check multiplication 503. The decoding can correctly be performed even if the comparison is made while the multiplication of the addresses exceeding the number of prepared bits is ignored.

Thus, the information bits of 500a_1, 500a_2, 500a_3, . . . , 500a_c-2, 500a_c-1, 500a_c in the second code have the code length of about a that is substantially proportional to k. When k is set at 1 kilobits=$2^{10}$ bits, it is necessary to prepare the checksum 501 ranging from the value obtained by rounding up $\log_2\{2k\}$ to the nearest integer to about 11 bits, it is necessary to prepare the number of information bits 502 ranging at most the value obtained by rounding up $\log_2\{\alpha\}$ to the nearest integer to 10 bits or less, and it is necessary to prepare the check multiplication 503 ranging at most from the value obtained by rounding up 2 $\log_2\{k\}$ to the nearest integer to about 20 bits. The sum of these values reaches at most 41 bits. Therefore, the sum is smaller than α ranging from (value obtained by rounding up (k/6) to the nearest integer)−1 to 170 bits by 25%. In cases where the two-bit error is corrected, the expansion of the code length of the second additional code can be suppressed by about 25% compared with the case in which the error is not corrected.

When k is larger than 1 kilobits, the code length necessary for the checksum 501, the number of information bits 502, and the check multiplication 503 is increased only in proportion to $\log_2(k)$, and the increase in code length is smaller than that of k, thereby lessening a ratio to α. Accordingly, the error can be corrected even if the ratio of the increases of the checksum 50, the number of information bits 502, and the check multiplication 503 to the code length is lessened.

When k is set at 64 kilobits=$2^{16}$ bits, it is necessary to prepare the checksum 501 ranging from the value obtained by rounding up $\log_2\{2k\}$ to the nearest integer to about 17 bits, it is necessary to prepare the number of information bits 502 ranging from at most the value obtained by rounding up $\log_2\{\alpha\}$ to the nearest integer to 16 bits or less, and it is necessary to prepare the check multiplication 503 ranging at most from the value obtained by rounding up 2 $\log_2\{k\}$ to the nearest integer to about 32 bits. The sum of these values reaches at most 65 bits. Therefore, the sum is smaller than α ranging from (value obtained by rounding up (k/6) to the nearest integer)−1 to 10922 bits by 0.6%. In cases where the two-word error is corrected, the expansion of the code length of the second additional code can be suppressed by about 0.6% compared with the case in which the error is not corrected.

Thus, using the coding in which the second additional code is formed from the k first information bits, the length of α is enough for 500a_1, 500a_2, 500a_3, . . . , 500a_c-2, 500a_c-1, 500a_c. When k is larger than 1024 bits, the code length of the second additional code length is expanded by 25% with respect to α to become 211 bits or less even if the checksum 501, the number of information bits 502, and the check multiplication 503 are added, so that the code length can largely be shortened compared with the k first information bits. The number of "0" information bits in the WLn information bit adjacent to the WL(n−1) "010" portion can be suppressed to the value obtained by rounding up a half of the second additional code length to the nearest integer or less.

Example in which Coding of First to Third Embodiments is applied to Second Additional Code of WL(n)

Figure 39A:
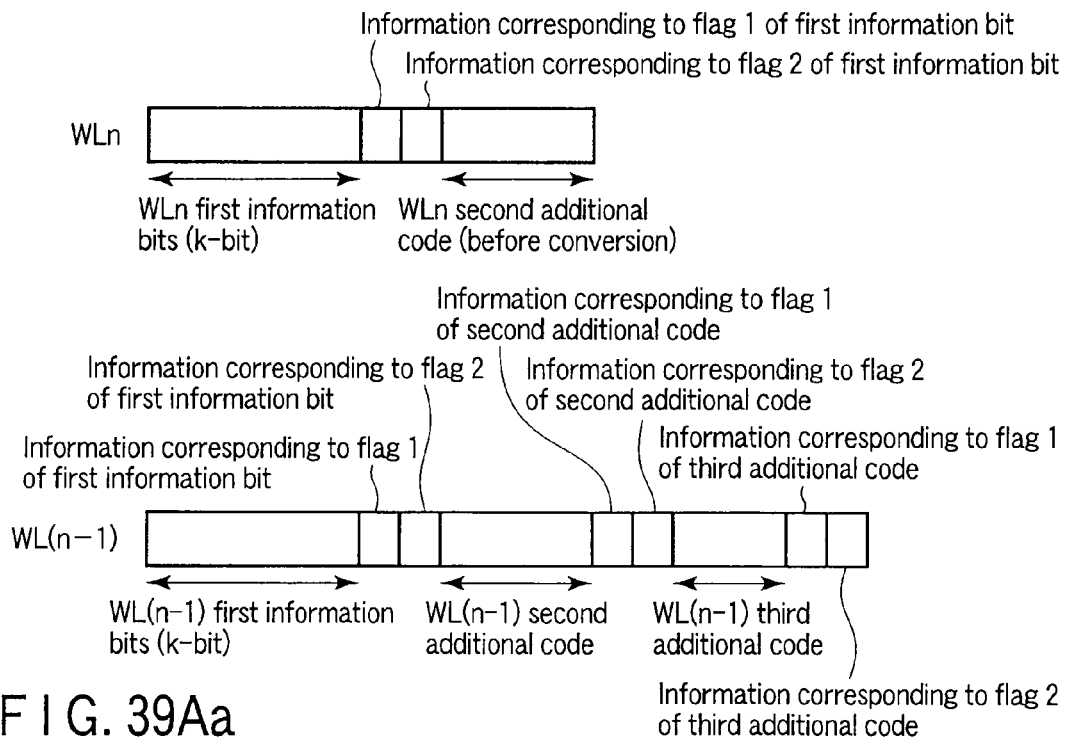
FIG. 39Aa is a view explaining an example in which adjacent memory cell disturb reduction code conversion is recursively used.
Figure 39A:
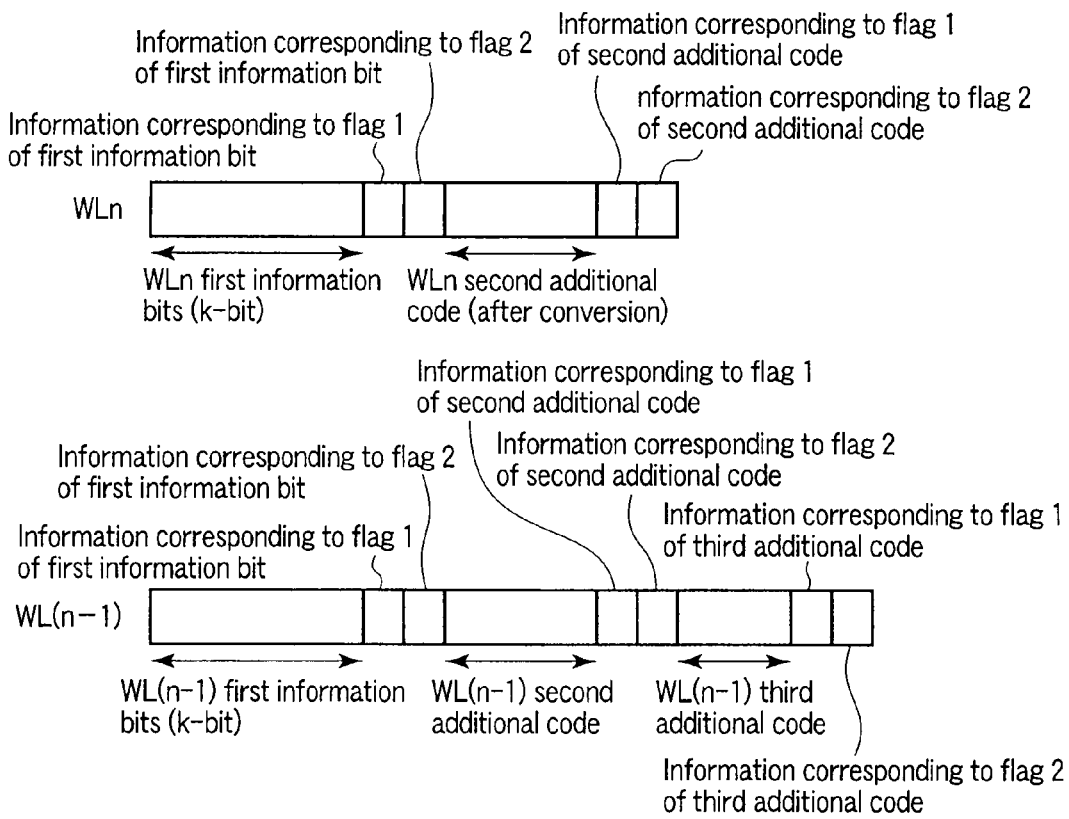
Figure 39B:
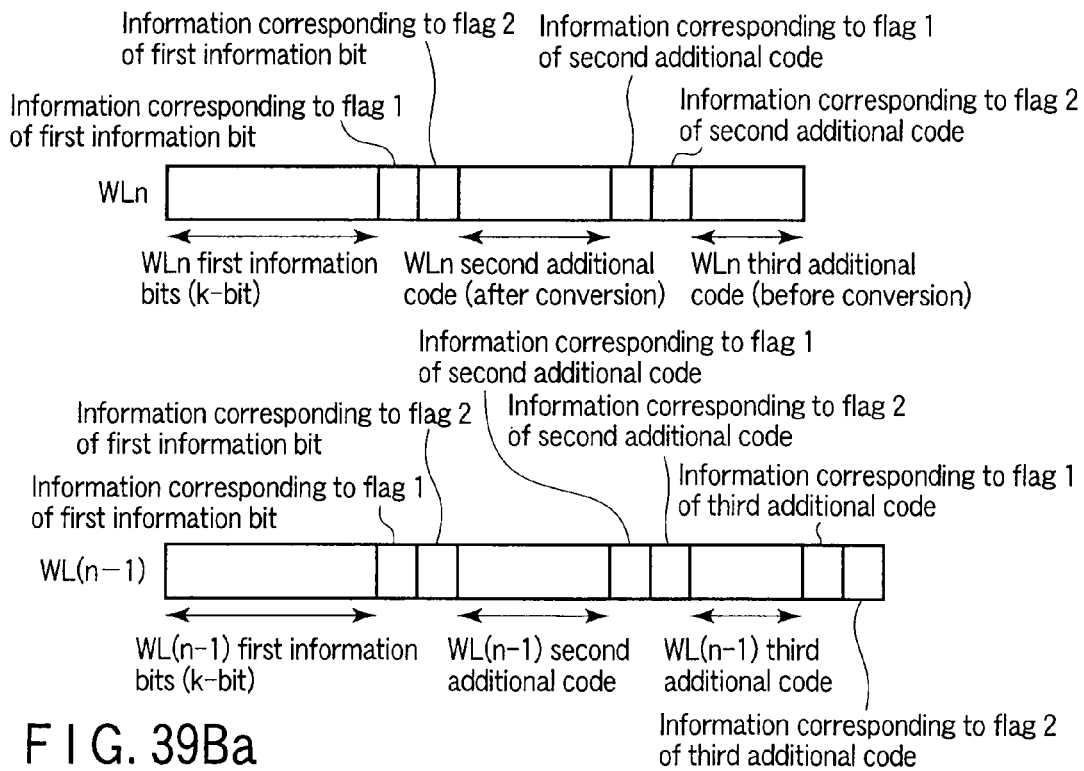
FIG. 39Ba is a view explaining an example in which adjacent memory cell disturb reduction code conversion is recursively used.
Figure 39B:
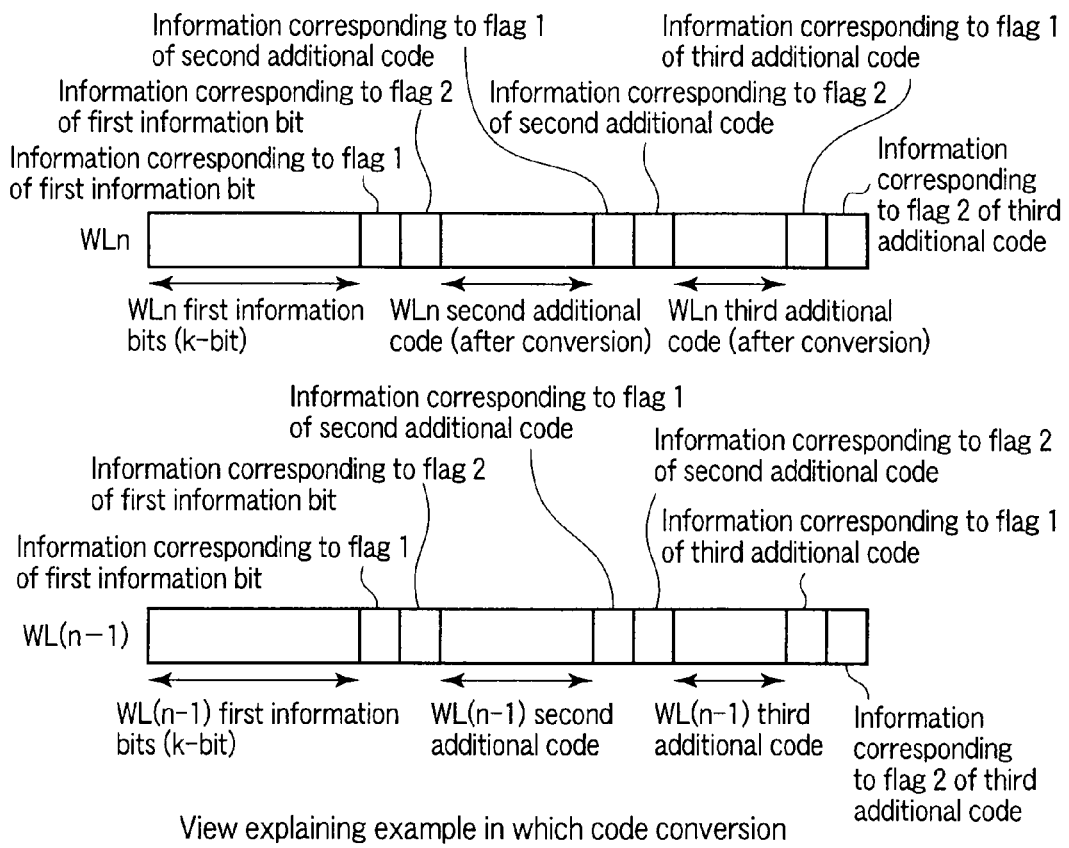

FIGS. 39Aa and 39Ab and FIGS. 39Ba and 39Bb show configurations in which the coding of the first to third embodiments is applied to the second additional code of WL(n) of the eighth embodiment. FIGS. 39Aa and 39Ab and FIGS. 39Ba and 39Bb show examples of the coding methods. Referring to FIG. 39A, a method of the first to third embodiments for decreasing the number of "0" information bits in the WLn information bit adjacent to the WL(n−1) "010" portion is applied to the second additional code.

FIG. 39A shows the relationship between the second additional code and WL(n−1) and WL(n) described in FIGS. 30 to 38. The information corresponding to the flag 1 of the second additional code, the information corresponding to the flag 2 of the second additional code, a third additional code, information corresponding to the flag 1 of the third additional code, and information corresponding to the flag 2 of the third additional code are added. In the flags 1 and 2, in order to decrease the number of "010" portions, the first to third embodiments are applied to the first information bit, the second additional code, and the third additional code, and the detailed description is omitted.

As shown in FIG. 39Ab, the first to third embodiments are applied to the second additional code to add the information corresponding to the flag 1 of the second additional code and the information corresponding to the flag 2 of the second additional code, whereby the number of "010"s included in the WLn second additional code can be decreased. Assuming that k2 is the second additional code length, the number of "010"s can be decreased to (value obtained by rounding up (k2/6) to the nearest integer)−1 in cases of the third embodiment, and the number of "010"s can be decreased to (value obtained by rounding up (k2/4) to the nearest integer)−1 in cases of the first and second embodiments. Therefore, the number of "0" information bits in the WL(n+1) information bit adjacent to the WLn "010" portion can be decreased.

Similarly, using the code conversion for the WL(n−1) information bit, the number of "010"s included in the WL(n−1) "010" can be decreased to (value obtained by rounding up (k2/6) to the nearest integer)−1 in cases of the third embodiment, and the number of "010"s can be decreased to (value obtained by rounding up (k2/4) to the nearest integer)−1 in cases of the first and second embodiments.

As shown in FIG. 39Ba, when the WL(n) second additional code is replaced with the first information bit while the second additional code is replaced with the third additional code, the WLn information bit adjacent to the WL(n−1) "010" portion of the second additional code is extracted to form a WLn third code. When k is 1024 bits or more, the second additional code has the length of 211 bits or less, the code length can largely be shortened, and k2 can be set at 211 bits. Additionally, in FIG. 39Ba, the number of "0" information bits in the WLn information bit adjacent to the WL(n−1) "010" portion can be decreased to a range of (value obtained by rounding up (k2/6) to the nearest integer)−1 to 35 bits.

Referring to FIG. 39Bb, similarly to the first to third embodiments, the number of "010"s included in the WLn third additional code can be decreased by adding the information corresponding to the flag 1 of the third additional code and the information corresponding to the flag 2 of the third additional code. Assuming that k3 is a third additional code length, the number of WLn "010"s can be decreased to (value obtained by rounding up (k3/6) to the nearest integer)−1 in cases of the third embodiment, and the number of WLn "010"s can be decreased to (value obtained by rounding up (k3/4) to the nearest integer)−1 in cases of the first and second embodiments. Therefore, the number of "0" information bits in the WL(n+1) information bit adjacent to the WLn "010" portion can be decreased.

Similarly, using the code conversion for the WL(n−1) information bit, the number of WL(n−1) "010"s can be decreased to (value obtained by rounding up (k2/6) to the nearest integer)−1 in cases of the third embodiment, and the number of WL(n−1) "010"s can be decreased to (value obtained by rounding up (k2/4) to the nearest integer)−1 in cases of the first and second embodiments.

Although not shown, clearly the number of "0" information bits in the WLn adjacent to the WL(n−1) "010" portion can sufficiently be decreased by repeating the code conversion in which the third additional code is formed from the second additional code. The number of "0" information bits in the WLn adjacent to the WL(n−1) "010" portion is easily eliminated without increasing the code length by 10 bits or more, when the number of WLn "0" information bits becomes 10 or less by repeating the code conversion plural times. As described above in the flags of the first to third embodiments, the method for allocating the flags 1 and 2 to each two bits can be used to decrease the number of "0" information bits in the WLn adjacent to the WL(n−1) "010" portion. Specifically, the WL(n−1) "010" portion is set at "0110", and the method can be performed by allocating "00" when the WLn adjacent to the WL(n−1) "010" portion becomes "0" or by allocating "11" when the WLn becomes "1".

On the other hand, in order to decode the code, the WLn second additional code string facing the "1" information bits in the WL(n−1) "010" is sequentially replaced with the third additional code. At this point, the information error may be reduced for the WL(n−1) "010" by correcting the information error with the checksum, the number of codes, and the check multiplication.

The code string of the WLn information bits facing the "1" information bits in the WL(n−1) "010" is sequentially replaced with the second additional code, thereby decoding the first information. Clearly the decoding can be performed by recursively repeating the method even in cases where a fourth additional code is formed from the third additional code.

In the eighth embodiment, the codes of the addition and multiplication are used to correct the two-word error. However, obviously at least three words can be corrected using a majority code.

The example combined with the first to third embodiments is shown in the eighth embodiment. When the code occurrence probability averaging circuit 106 is used for the code having 8 kilobits or more, a modification of the eighth embodiment in which the effect is obtained can be made without using the example combined with the first to third embodiments. The generation frequency of the code of the WL(n−1) "010" continuous bit portion is distributed in an extremely narrow range centered on (code length)×$(1/2)^{3-1}$= (code length)/8−1 by a law of great numbers when the code length is lengthened.

Distribution Width of Generation Frequency of "010" Continuous Bit

A distribution width of the generation frequency of "010" continuous bit obtained from the computation by the inventors will be described with reference to FIG. 40. As shown in FIG. 40, a horizontal axis indicates the number of "010" continuous bits included in the code length of 8 kilobits (=8192 bits) and a vertical axis indicates a logarithm (y in this case) while the base of logarithm is set at 10 of the generation frequency of the code with respect to the number of "010" continuous bits.

As can be seen from the distribution width of FIG. 40, the generation frequency of the code of the WL(n−1) "010" continuous bit portion becomes the maximum at the bit corresponding to (8 kilobits)/8−1=1023 bits, and γ has a substantially normal distribution. For the code length of 8 bits or more, the WL(n−1) "010" continuous bits of γ−10 of the maximum generation frequency of the code or less are generated, that is, the generation frequency of the code of $10^{-10}$ or less is generated in the range exceeding the code length of 1023 bits±20%. In the code of 8 kilobits or more in which the code occurrence probability averaging circuit 106 is used, the probabilities of occurrence of "0" and "1" can be averaged for the WLn information bit adjacent to the WL(n−1) information bit.

When the averaging of the probabilities of occurrence of "0" and "1" is applied, the number of "0" information bits in the WLn code string adjacent to the WL(n−1) "010" portion can be decreased to the value obtained by rounding up {(code length)×$(1/2)^3$−1}/2 to the nearest integer, that is, the value obtained by rounding up {(code length)/8−1}/2 to the nearest integer at the highest generation frequency of the "010" continuous portion. Therefore, in cases where the first to third embodiments are not combined, when the code occurrence probability averaging circuit 106 is used for the code of 8 kilobits or more, the code in which the number of "0" information bits in the WLn adjacent to the "010" portion in the WL(n−1) becomes α or less by setting α of the second coding at {(k/16 is rounded up to the nearest integer}×1.2 can be decreased to zero by recursively repeating the coding of FIGS. 39A and 39B.

Although the code in which the number of "0" information bits in the WLn adjacent to the "010" portion in the WL(n−1) is larger than α can not be decreased to zero, the "0" information bits can be decreased for α. That is, the number of "0" information bits can sufficiently be decreased to 1 ppm or less in all the codes. Accordingly, the second code can further be shortened when the generation of the errors corresponding to the number of "0" information bits in the WLn adjacent to the "010" portion in the WL(n−1) is permitted by a certain threshold voltage.

It is assumed that the code having the code length of (ka+kb) is constructed by the combination of all the codes having the code lengths ka and kb. The code having the code length of (ka+kb) is constructed by the multiplication of the combination of all the codes having the code length ka and the combination of all the codes having the code length kb. Therefore, when the logarithm is computed for the number of states of the probability of occurrence of the code, the law of great numbers holds because the multiplication is converted into the addition by the logarithm.

Thus, (variation)/(average value) of the generation frequency of the WL(n−1) "010" portion is further decreased for the code longer than 8 kilobits by the law of great numbers, so that the number of "0" information bit in the WLn adjacent to the "010" portion in the WL(n−1) can be decreased in all the codes compared with the code of 8 kilobits.

In the eighth embodiment, α of the second coding is set at {(k/16 is rounded up to the nearest integer)×1.2. Because γ is distributed in the substantially normal distribution, clearly the probability of occurrence of the number of "0" information bit in the WLn adjacent to the "010" portion in the WL(n−1) can be decreased to a setting value or less by increasing or decreasing {(k/16 is rounded up to the nearest integer)×1.2. For example, in the code of 8 kilobits, assuming that N(average, standard deviation) is a normal distribution function, the value of the logarithm having the base of 10 of the generation frequency of the code can well be approximated by a distribution function that is proportional to N(1023,2100) within the range where the number of "010" portions ranges from 800 to 1200, so that the probability of occurrence of the code and the accumulative probability of occurrence of the code of α or more are easily computed.

In the modification of the eighth embodiment, as described in the eighth embodiment, the information error may further be reduced for the WL(n−1) "010" by the combination of the information error corrections in which the checksum, the number of codes, and the check multiplication are used.

The modification of the eighth embodiment differs from the eighth embodiment in the following point. That is, similarly to the fourth embodiment of FIG. 21, the modification includes the first coding circuit 106 that averages the probability of occurrence of the code of the input bit to supply the information bit and the first decoding circuit 107 into which the information bit is fed to combine the input bit.

The branch of the flow is made by the comparisons between the count values of the counters 108, 109, 112, and 113 in the first and second embodiments, the registers a, b, c, and d in the third embodiment, and the counters 116, 117, 118, and 119 and the registers e, f, g, and h in the fourth embodiment. Alternatively, for example, when the values of the counters are equal to each other, or when the count values of the registers are equal to each other, the flow may go to the affirmative side or the negative side at the branch.

For example, when the count value of the counter 108 is larger than that of the counter 109 in Step SE7, the flow goes to the affirmative side at the branch. Alternatively, when the count value of the counter 108 is larger than or equal to that of the counter 109 in Step SE7, the flow may go to the affirmative side at the branch. Alternatively, the determination in Step SE7 needs not to be made. When the minimum value of the counters 108 and 109 is larger than that of the counters 112 and 113 in SE17, the flow goes to the affirmative side at the branch. Alternatively, when the minimum value of the counters 108 and 109 is larger than or equal to that of the counters 112 and 113 in SE17, the flow may go to the affirmative side at the branch. When the count value of the counter 112 is larger than that of the counter 113 in SE19, the flow goes to the affirmative side at the branch. Alternatively, the count value of the counter 112 is larger than or equal to that of the counter 113 in SE19, the flow may go to the affirmative side at the branch. When the count value of the counter 108 is larger than that of the counter 109 in Step SE21, the flow goes to the affirmative side at the branch. Alternatively, when the count value of the counter 108 is larger than or equal to that of the counter 109 in Step SE21, the flow may go to the affirmative side at the branch.

Similarly, the minimum value of the registers a and b is larger than that of the register c and d in Step SE34, the flow goes to the affirmative side at the branch. Alternatively, when the minimum value of the registers a and b is larger than or equal to that of the register c and d in Step SE34, the flow may go to the affirmative side at the branch. When the value of the register c is larger than that of the register d in Step SE37, the flow goes to the affirmative side at the branch. Alternatively, when the value of the register c is larger than or equal to that of the register d in Step SE37, the flow may go to the affirmative side at the branch. When the value of the register a is larger than that of the register b in Step SE39, the flow goes to the affirmative side at the branch. Alternatively, when the value of the register a is larger than or equal to that of the register b in Step SE39, the flow may go to the affirmative side at the branch.

Similarly, when the minimum value of the counters 116 and 117 is larger than that of the counters 118 and 119 in SE63, the flow goes to the affirmative side at the branch. Alternatively, when the minimum value of the counters 116 and 117 is larger than or equal to that of the counters 118 and 119 in SE63, the flow may go to the affirmative side at the branch. When the value of the counter 118 is larger than that of the counter 119 in Step SE65, the flow goes to the affirmative side at the branch. Alternatively, when the value of the counter 118 is larger than or equal to that of the counter 119 in Step SE65, the flow may go to the affirmative side at the branch. When the value of the counter 116 is larger than that of the counter 117 in Step SE67, the flow goes to the affirmative side at the branch. Alternatively, when the value of the counter 116 is larger than or equal to that of the counter 117 in Step SE67, the flow may go to the affirmative side at the branch.

Similarly, when the minimum value of the registers e and f is larger than that of the registers g and h in SE70, the flow goes to the affirmative side at the branch. Alternatively, when the minimum value of the registers e and f is larger than or equal to that of the registers g and h in SE70, the flow may go to the affirmative side at the branch. When the value of the register e is larger than that of the register f in Step SE75, the flow goes to the affirmative side at the branch. Alternatively, when the value of the register e is larger than or equal to that of the register f in Step SE75, the flow may go to the affirmative side at the branch. When the value of the register g is larger than that of the register h in Step SE73, the flow goes to the affirmative side at the branch. Alternatively, when the value of the register g is larger than or equal to that of the register h in Step SE73, the flow may go to the affirmative side at the branch.

The invention is not limited to the embodiments.

That is, the first to fourth embodiments have the effect of decreasing the number of bits, in which the threshold voltage is raised due to the program disturbance or the capacitive coupling of the adjacent memory cell, to $1/2$ to $1/3$ or less by adding the flag bit of at most four-bit or six-bit information. Therefore, in the case where the code length is lengthened by f(i) because i error bits are generated by the raised threshold voltage from the program disturbance or the capacitive coupling of the adjacent memory cell, the area of the NAND memory cell array can be reduced when condition of f(i)>f(i/2)+4 is satisfied using the first to fourth embodiments. In the third embodiment, the area of the NAND memory cell array can be reduced when condition of f(i)>f(i/3)+6 is satisfied. At this point, in the BCH code, the code after the BCH coding is extended by $f(i)=i\times(\text{value in which }\log_2 m+1\text{ is rounded down to the nearest integer})$ (m is an information bit length) in order to correct the i error bits. Therefore, in the case of the use of the BCH code, effectively f(i) is substituted for the range where the inequality holds. For example, the conditions of the first and second embodiments are sufficiently satisfied when m is set at least 16 bits while i is set at 2, and the conditions of the third and fourth embodiments are sufficiently satisfied when m is set at least 512 bits while i is set at 2.

In the RS code, assuming that the information bit is a code formed by $2^j$ bytes, the bit code length is lengthened by $i\times 2$ bytes$=i\times 2\times j$ bits in order to correct the i error bits. Therefore, in the case of the use of the RS code, effectively f(i) is substituted for the range where the inequality holds. For example, the conditions of the first to fourth embodiments are sufficiently satisfied when $2^j$ is set at least 8 bits while i is set at 2.

In the seventh embodiment, similarly to the first to third embodiments, the computation amount is required only to an extent proportional to the information bit length in the second coding or in the decoding of the second code, and the coding does not depend on the number of error bits. On the other hand, in the RS code or the BCH code, when the number of error correcting code error correcting bits is increased, the time necessary to decode the error correcting code decoding circuit 103 is increased to the square of the number of error correcting bits or more. Therefore, in the case where the second coding of the first to fourth embodiments is applied to the error correcting coding of the error correcting code generation circuit 102 or the decoding of the error correcting code of the error correcting code decoding circuit 103, the number of error bits which are caused by the program disturbance or the threshold voltage raised by the capacitive coupling of the adjacent memory cell can be decreased to shorten the code necessary for the error correction, and the total computation amount or circuit necessary for the decoding can be reduced.

The number of bits necessary for the symbol counters 108, 109, 112, and 113 of the first and second embodiments, the registers a, b, c, and d of the third embodiment, and the symbol counters 116, 117, 118, and 119 and registers e, f, g, and h of the fourth embodiment is (value in which $\log_2 m+1$ is rounded down to the nearest integer) (m is the number of information bits), so that the number of necessary bits can be realized with a circuit scale as small as a point indicating the position of the error correcting point.

The branch in each Step SE is made by comparing the number of counts between the symbol counters 108, 109, 112, and 113 of the first and second embodiments, the registers a, b, c, and d of the third embodiment, and the symbol counters 116, 117, 118, and 119 and registers e, f, g, and h of the fourth embodiment. For example, in the case where the counters or the registers are equal to each other in the number of counts, the flow may go to either the affirmative side or the negative side at the branch. For example, in Step SE7, when the symbol counter 108 is larger than the symbol counter 109, the flow goes to the affirmative side at the branch. However, when the symbol counter 108 is not lower than the symbol counter 109, the flow may go to the affirmative side at the branch. Similarly, in Step SE17, when the minimum value of the symbol counters 108 and 109 is larger than the minimum value of the symbol counters 112 and 113, the flow goes to the affirmative side at the branch. However, when the minimum value of the symbol counters 108 and 109 is not lower than the minimum value of the symbol counters 112 and 113, the flow may go to the affirmative side at the branch. In Step SE19, when the symbol counter 112 is larger than the symbol counter 113, the flow goes to the affirmative side. However, when the symbol counter 112 is not lower than the symbol counter 113, the flow may go to the affirmative side. In Step SE21, when the symbol counter 108 is larger than the symbol counter 109, the flow goes to the affirmative side. However, when the symbol counter 108 is not lower than the symbol counter 109, the flow may go to the affirmative side.

Similarly, in Step SE34, when the minimum value of the registers a and b is larger than the minimum value of the registers c and d, the flow goes to the affirmative side at the branch. However, when the minimum value of the registers a and b is not lower than the minimum value of the registers c and d, the flow may go to the affirmative side at the branch. In Step SE37, when the value of the register c is larger than the value of the register d, the flow goes to the affirmative side at the branch. However, when the value of the register c is not lower than the value of the register d, the flow may go to the affirmative side at the branch. In Step SE39, when the value of the register a is larger than the value of the register b, the flow goes to the affirmative side at the branch. However, when the value of the register a is not lower than the value of the register b, the flow may go to the affirmative side at the branch.

Similarly, in Step SE63, when the minimum value of the symbol counters 116 and 117 is larger than the minimum value of the symbol counters 118 and 119, the flow goes to the affirmative side at the branch. However, when the minimum value of the symbol counters 116 and 117 is not lower than the minimum value of the symbol counters 118 and 119, the flow may go to the affirmative side at the branch. In Step SE65, when the symbol counter 118 is larger than the symbol counter 119, the flow goes to the affirmative side at the branch. However, when the symbol counter 118 is not lower than the symbol counter 119, the flow may go to the affirmative side at the branch. In Step SE67, when the symbol counter 116 is larger than the symbol counter 117, the flow goes to the affirmative side at the branch. However, when the symbol counter 116 is not lower than the symbol counter 117, the flow may go to the affirmative side at the branch.

Similarly, in Step SE70, when the minimum value of the registers e and f is larger than the minimum value of the registers g and h, the flow goes to the affirmative side at the branch. However, when the minimum value of the registers e and f is not lower than the minimum value of the registers g and h, the flow may go to the affirmative side at the branch. In Step SE75, when the value of the register e is larger than the value of the register f, the flow goes to the affirmative side at the branch. However, when the value of the register e is not lower than the value of the register f, the flow may go to the affirmative side at the branch. In Step SE73, when the value of the register g is larger than the value of the register h, the flow goes to the affirmative side at the branch. However, when the value of the register g is not lower than the value of the register h, the flow may go to the affirmative side at the branch.

In the embodiments, the second coding is performed before the error correcting code. Alternatively, the order of the adjacent memory cell disturb reduction second-code conversion circuit 104 and the error correcting code generation circuit 102 and the order of the adjacent memory cell disturb reduction second-code reverse conversion circuit 105 and the error correcting code decoding circuit 103 may be rearranged as the method for performing the second coding to the information bit including the inspection bit after the formation of the error correcting code. At this point, the code corresponding to the flag bit may be added by forming a majority decision code such as aaa which indicates one piece of a-bit information by three bits. Another error correcting code may be produced and converted for the flag bit.

When the order of the adjacent memory cell disturb reduction second-code conversion circuit 104 and the error correcting code generation circuit 102 and the order of the adjacent memory cell disturb reduction second-code reverse conversion circuit 105 and the error correcting code decoding circuit 103 are rearranged, the second coding method of the first to fourth embodiments may be adopted to the whole of the error correcting code while the information bit is changed to the error correcting code, or the information bit included in the error correcting code may be extracted to perform the second coding to the extracted portion. When the second coding is performed to the whole of the error correcting code, more desirably the number of "010" continuous symbols including the inspection bit and the number of adjacent word lines can be decreased.

In the first to eighth embodiments, instead of the method for converting the silicon into the silicon oxide film or silicon nitride film, a method for implanting an oxygen ion in the deposited silicon or a method for oxidizing the deposited silicon may be used as the method for producing the isolation film or the inter-layer insulator. $TiO_2$, $Al_2O_3$, or a tantalum oxide film, a strontium titanate film, a barium titanate film, a zirconium-lead titanate film, or a laminated film thereof may be used as the charge accumulation layer 26. In the embodiments, the p-type S1 substrate is used as the semiconductor substrates 1 and 1'. Alternatively, any single-crystal semiconductor substrate containing silicon such as an n-type S1 substrate, an SOI silicon layer of an SOI substrate, a SiGe mixed crystal, and a SiGeC mixed crystal may be used. In the embodiments, the n-type MONOS-FET is formed on the p-type semiconductor layer 23. Alternatively, the p-type MONOS-FET may be formed on the n-type semiconductor layer 23. In such cases, the n-type is changed to the p-type and the p-type is changed to the n-type for the source-drain electrode and the semiconductor region of the embodiments, and the doping impurity pieces of As, P, and Sb may be replaced with one of In and B. The Si semiconductor, a SiGe mixed crystal, or a SiGeC mixed crystal can be used as the material for the gate electrodes 8 and 8', the polycrystalline material may be used, and the laminated structure of the Si semiconductor, the SiGe mixed crystal, or the SiGeC mixed crystal may be used. Amorphous Si, an amorphous SiGe mixed crystal, or an amorphous SiGeC mixed crystal can be used. A laminated structure of the amorphous Si, the amorphous SiGe mixed crystal, or the amorphous SiGeC mixed crystal can be used. However, when the material is a semiconductor, particularly when the material is a semiconductor containing Si, desirably the good sidewall insulator 19 can be formed by oxidizing or oxy-nitriding the gate electrode 51. The charge accumulation layer 5 may be divided into source and drain, or may be formed into a dot shape. In the embodiment, the metal backing layer 27' is formed on the gate electrode 8 or 8' by the deposition. Alternatively, a silicide may be formed by reaction between a metal such as Ti, Co, Ni, Mo, Pd, and Pt and the gate electrode 27, thereby forming the metal backing layer 11.

In the embodiments, the binary semiconductor memory cell transistor having the "0" and "1" bits is illustrated for the sake of easy understanding. However, in the case of the use of the semiconductor memory cell transistor in which at least three values are stored, the interval among the plural threshold voltages becomes narrower, and the increase in threshold caused by the capacitive coupling of the adjacent memory cell and the program disturbance become troublesome, so that the larger effect can clearly be obtained. Desirably the number of threshold voltages stored in one memory cell is set at $2^n$ to simplify the decoding of the information data.

The eighth embodiment includes the following aspects.

(1) A data memory system includes a nonvolatile memory cell array (49 of FIG. 5) which includes plural memory cells, pages formed adjacent to each other being collectively erased by the plural memory cells, at least pieces of binary digital data "1" and "0" being stored in a form of charges of a charge accumulation layer to use a difference between two charge amounts of the charge accumulation layer as a programming bit and an erase bit in the memory cell; an error correction code generation circuit (104 of FIG. 30) which generates a correction code to correct at least one-bit error data based on a second information bit; an error correction code decoding circuit (105 of FIG. 30) which corrects an error to restore the second information bit based on the correction code; a code conversion circuit (104 of FIG. 30) which supplies data to the error correction code generation circuit, the code conversion circuit (104 of FIG. 30) including the fifth circuit (105 of FIG. 30) that detects a sequence of a continuous bit of "programming bit-erasing bit-programming bit" in an information bit of a second page physically adjacent to a first page in which data is written, and supplies the bit of the first page in the sequence of the continuous bit of "programming bit-erasing bit-programming bit" in the second page, the bit of the first page being adjacent to the erase bit; code generation circuits for replacing the bit of the first page with the erase bit to generate the coded information bit, setting a series of outputs of the fifth circuit at a second code, and adding the second code to the coded information bit of the second page to generate second information bit, when the fifth circuit detects the sequence of the continuous bit of "programming bit-erasing bit-programming bit", the bit of the first page being adjacent to the erase bit; and decoding circuits for replacing the bit of the first page with a series of bits of the second code when the sequences of the continuous bits of "programming bit-erasing bit-programming bit" in the information bit of the second page is detected as the input of the second information bit, the bit of the first page being adjacent to the erase bit in the sequence of the continuous bit of "programming bit-erasing bit-programming bit" in the second page.

(2) The data memory system according to (1) further includes a first counter circuit (in FIG. 31, output that becomes "H" in the case of WL(n−1)) which detects the number of sequences of the continuous bit of "programming bit-erasing bit-programming bit" in the fed information bit; a second counter circuit which detects the number of sequences of the continuous bit of "programming bit-erasing bit-programming bit" by computing exclusive OR of the fed information bit and plural bits in which a sequence of "programming bit-erasing bit" is repeated plural times; and a code conversion circuit which computes the exclusive OR of the fed information bit and plural bits in which the sequence of "programming bit-erasing bit" is repeated plural times to supply the exclusive OR to the error correction code generation circuit when the number of sequences of the output of the second counter circuit is smaller than the number of sequences of the output of the first counter circuit.

(3) In the data memory system according to (1), information on addition of addresses of the sequences of the continuous bits of "programming bit-erasing bit-programming bit" in the second page and information on the number of continuous bits of "programming bit-erasing bit-programming bit" in the second page are added to the second information bit (FIG. 34).

(4) In the data memory system according to (1), information on multiplication of the addresses of the sequences of the continuous bits of "programming bit-erasing bit-programming bit" in the second page is added to the second information bit (FIG. 34).

(5) The data memory system according to (1) further includes code generation circuits for replacing the bit of the first page with the erase bit to produce the second code after coding, setting a series of outputs of the first page of the fifth circuit at a third code, and adding the third code to the second code of the second page to produce third information bit, when the fifth circuit detects the sequences of the continuous bits of "programming bit-erasing bit-programming bit" as the input of the second code, the bit of the first page being adjacent to an erase bit in the sequence of the continuous bit of "programming bit-erasing bit-programming bit" in the second page; and decoding circuits for replacing the second code of the first page with a series of bits of the third code when the sequences of the continuous bits of "programming bit-erasing bit-programming bit" in the information bit of the second page is detected as the input of the third information bit, the second code of the first page being adjacent to the erase bit in the sequence of the continuous bit of "programming bit-erasing bit-programming bit" in the second page (FIGS. 39A and 39B).

(6) The data memory system according to (1) further includes a first coding circuit (106 of FIG. 4) which averages a probability of occurrence of the code of the input bit to supply an information bit; and a first decoding circuit (107 of FIG. 4) in which the information bit is fed to decode the input bit.

Various modifications can be made without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data memory system comprising:
a nonvolatile memory cell array which includes a plurality of memory cells, a page adjacently formed by said plurality of memory cells being collectively erased, at least binary pieces of digital data of "1" and "0" being stored as charges of a charge accumulation layer in the memory cell, a programming bit and an erasing bit being formed by a difference between the charges of the charge accumulation layer;
an error correcting code generation circuit which generates a code for correcting error data of at least one bit from a first code, and produces an error correcting code recorded in the page;
an error correcting code decoding circuit which corrects an error from the error correcting code to restore the first code by digital data recorded in the page; and
a code conversion circuit which computes exclusive OR of a plurality of information bits and a plurality of bits in which a sequence of "programming bit-erasing bit" is repeated a plurality of times, and supplies the exclusive OR to the error correcting code generation circuit as the first code.

2. The system according to claim 1, further comprising a code reverse conversion circuit which computes exclusive OR of an output of the error correcting code decoding circuit and a plurality of bits in which a sequence of "programming bit-erasing bit" is repeated a plurality of times, and restores the plurality of information bits.

3. The system according to claim 1, further comprising a first counter circuit which separates the series of the plurality of information bits into a plurality of even-numbered bits and a plurality of odd-numbered bits, and detects the number of "programming bit-erasing bit-programming bit" continuous bits after rearrangement is performed by respectively collecting said plurality of even-numbered bits and said plurality of odd-numbered bits.

4. The system according to claim 3, wherein the arrangement of "programming bit-erasing bit-programming bit" in the plurality of information bits corresponds to the three physically-adjacent memory cells.

5. The system according to claim 1, wherein a number of "programming bit-erasing bit-programming bit" continuous bits in the first code is always smaller than a number of "programming bit-erasing bit-programming bit" continuous bits in the plurality of information bits.

6. The system according to claim 1, wherein a number of "programming bit-erasing bit-programming bit" continuous bits in the first code is always smaller than (value in which (k/4) is rounded up to the nearest integer)−1, where k represents a bit length of the plurality of information bits.

7. A data memory system comprising:
a nonvolatile memory cell array which includes a plurality of memory cells, a page adjacently formed by said plurality of memory cells being collectively erased, at least binary pieces of digital data of "1" and "0" being stored as charges of a charge accumulation layer in the memory cell, a programming bit and an erasing bit being formed by a difference between the charges of the charge accumulation layer;
an error correcting code generation circuit which generates a code for correcting error data of at least one bit from a first code, and produces an error correcting code recorded in the page;
an error correcting code decoding circuit which corrects an error from the error correcting code to restore the first code by digital data recorded in the page;
a first counter circuit which detects the number of "programming bit-erasing bit-programming bit" continuous bits of a plurality of information bits;
a second counter circuit which computes exclusive OR of the plurality of information bits and a plurality of bits in which a sequence of "programming bit-erasing bit" is repeated a plurality of times, and detects the number of "programming bit-erasing bit-programming bit" continuous bits; and
a code conversion circuit which computes exclusive OR of a plurality of the information bits and a plurality of bits in which a sequence of "programming bit-erasing bit" is repeated a plurality of times when the number of "programming bit-erasing bit-programming bit" continuous bits of the second counter circuit is smaller than the number of "programming bit-erasing bit-programming bit" continuous bits of the first counter circuit, the code conversion circuit supplying the exclusive OR to the error correcting code generation circuit.

8. The system according to claim 7, further comprising a code reverse conversion circuit which computes exclusive OR of an output of the error correcting code decoding circuit and a plurality of bits in which a sequence of "programming bit-erasing bit" is repeated a plurality of times, and restores the plurality of information bits.

9. The system according to claim 7, wherein the arrangement of "programming bit-erasing bit-programming bit" in the plurality of information bits corresponds to the three physically-adjacent memory cells.

10. The system according to claim 7, further comprising:
a third counter circuit which detects a sequence of "programming bit-erasing bit-programming bit" continuous three bits of a plurality of information bits of a second page physically adjacent to a first page in which programming is performed, and detects the number of programming bits and the number of erasing bits of the first page adjacent to a position of the erasing bit among the continuous three bits in the plurality of information bits of the second page; and
a fourth circuit which inverts the plurality of the information bits of the first page, when the number of programming bits is more than the number of erasing bits and which supplies the inverted information bits to the error correcting code generation circuit.

11. The system according to claim 10, further comprising:
a fifth counter circuit which detects a sequence of "programming bit-erasing bit-programming bit" continuous bits of,
a plurality of information bits of a second page physically adjacent to a first page in which programming is performed, and detects the first number of first programming bits of a bit state of the first page adjacent to a position of the erasing bit among the continuous three bits in the plurality of the information bits of the second page, and the second number of second programming bits of a bit state of the first page adjacent to a position of the erasing bit among the continuous three bits, in which a cyclic shift is performed by at least one bit in the plurality of the information bits; and a sixth circuit which circularly shifts the plurality of information bits when the second number of an output of the fifth counter circuit is less than the first number of the output of the fifth counter circuit, the sixth counter circuit supplying the shifted bits to the error correcting code generation circuit.

12. The system according to claim 7, wherein a number of the "programming bit-erasing bit-programming bit" continuous bits in the first code is always smaller than (value in which (k/6) is rounded up to the nearest integer)−1, where k represents a bit length of the plurality of information bits.

13. A data memory system comprising:
a nonvolatile memory cell array which includes a plurality of memory cells, a page adjacently formed by said plurality of memory cells being collectively erased, at least binary pieces of digital data of "1" and "0" being stored as charges of a charge accumulation layer in the memory cell, a programming bit and an erasing bit being formed by a difference between the charges of the charge accumulation layer;

an error correcting code generation circuit which generates a correcting code for correcting error data of at least one bit from a plurality of the information bits;

a code conversion circuit which computes exclusive OR of an error correcting code in which the correcting code supplied from the error correcting code generation circuit is added to the plurality of the information bits, and a plurality of bits in which a sequence of "programming bit-erasing bit" is repeated a plurality of times, and the code conversion circuit producing data to be recorded in the page;

an error correcting code decoding circuit which corrects an error from the error correcting code; and a code reverse conversion circuit which computes exclusive OR of the data recorded in the page and a plurality of bits in which a sequence of "programming bit-erasing bit" is repeated a plurality of times, and supplies the error correcting code to the error correcting code decoding circuit.

14. The system according to claim 13, further comprising a first counter circuit which separates a series of the error correcting code into a plurality of even-numbered bits and a plurality of odd-numbered bits, and detects the number of "programming bit-erasing bit-programming bit" continuous bits after rearrangement is performed by respectively collecting said plurality of even-numbered bits and said plurality of odd-numbered bits.

15. The system according to claim 14, wherein the arrangement of "programming bit-erasing bit-programming bit" in the plurality of information bits corresponds to the three physically-adjacent memory cells.

16. The system according to claim 13, wherein a number of "programming bit-erasing bit-programming bit" continuous bits in data to be recorded in the page is always smaller than a number of "programming bit-erasing bit-programming bit" continuous bits in the plurality of information bits.

17. The system according to claim 13, wherein a number of "programming bit-erasing bit-programming bit" continuous bits in data to be recorded in the page is always smaller than (value in which (k/4) is rounded up to the nearest integer)−1, where k represents a bit length of the plurality of information bits.

18. The system according to claim 13, further comprising:
a first counter circuit which detects the number of "programming bit-erasing bit-programming bit" continuous bits of an error correcting code; and a second counter circuit which computes exclusive OR of the error correcting code and a plurality of bits in which a sequence of "programming bit-erasing bit" is repeated a plurality of times, and detects the number of "programming bit-erasing bit-programming bit" continuous bits, wherein the code conversion circuit computes exclusive OR of the error correcting code and a plurality of bits in which a sequence of "programming bit-erasing bit" is repeated a plurality of times when the number of "programming bit-erasing bit-programming bit" continuous bits of the second counter circuit is smaller than the number of "programming bit-erasing bit-programming bit" continuous bits of the first counter circuit, the code conversion circuit supplying the exclusive OR to the data to be recorded in the page.

19. The system according to claim 18, wherein a number of the "programming bit-erasing bit-programming bit" continuous bits in the first code is always smaller than (value in which (k/6) is rounded up to the nearest integer)−1, where k represents a bit length of the plurality of information bits.

* * * * *